US010681815B2

(12) United States Patent
Tamagawa et al.

(10) Patent No.: US 10,681,815 B2
(45) Date of Patent: Jun. 9, 2020

(54) COMPOSITE CHIP COMPONENT, CIRCUIT ASSEMBLY AND ELECTRONIC APPARATUS

(71) Applicant: ROHM CO., LTD., Kyoto (JP)

(72) Inventors: Hiroshi Tamagawa, Kyoto (JP); Koichi Niino, Kyoto (JP); Eiji Nukaga, Kyoto (JP); Keishi Watanabe, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/286,503

(22) Filed: Feb. 26, 2019

(65) Prior Publication Data
US 2019/0200458 A1 Jun. 27, 2019

Related U.S. Application Data

(63) Continuation of application No. 14/781,964, filed as application No. PCT/JP2014/058995 on Mar. 27, 2014, now Pat. No. 10,321,570.

(30) Foreign Application Priority Data

Apr. 4, 2013 (JP) .................................. 2013-078825
Apr. 15, 2013 (JP) .................................. 2013-085087
(Continued)

(51) Int. Cl.
H05K 1/18 (2006.01)
H01C 1/14 (2006.01)
(Continued)

(52) U.S. Cl.
CPC .............. *H05K 1/181* (2013.01); *H01C 1/012* (2013.01); *H01C 1/14* (2013.01); *H01G 2/065* (2013.01);
(Continued)

(58) Field of Classification Search
CPC . H05K 1/181; H05K 5/02; H05K 1/11; H05K 2201/1003; H05K 2201/10022;
(Continued)

(56) References Cited

U.S. PATENT DOCUMENTS 5,394,294 A * 2/1995 Mei ..................... H01L 27/0218
257/E27.048
5,925,931 A * 7/1999 Yamamoto .......... H01L 23/3114
257/737
(Continued)

FOREIGN PATENT DOCUMENTS

CN 1627496 A 6/2005
CN 1893766 A 1/2007
(Continued)

*Primary Examiner* — Rockshana D Chowdhury
(74) *Attorney, Agent, or Firm* — Rabin & Berdo, P.C.

(57) ABSTRACT

The composite chip component includes: plurality of chip elements which are disposed so as to be mutually spaced apart upon a common substrate, and which have mutually different functions; and a pair of electrodes which, in each of the chip elements, are formed on the surface of the substrate. As a result, it is possible to reduce the bond area (footprint) for the mounting substrate, and therefore, it is possible to provide a composite chip component capable of achieving efficiency of mounting operation.

13 Claims, 89 Drawing Sheets

(30) Foreign Application Priority Data

Apr. 19, 2013 (JP) .................................. 2013-088586
May 7, 2013 (JP) .................................. 2013-097950

(51) Int. Cl.

| | | |
|---|---|---|
| H01G 4/228 | (2006.01) | |
| H05K 1/11 | (2006.01) | |
| H05K 5/02 | (2006.01) | |
| H01C 1/012 | (2006.01) | |
| H01G 2/06 | (2006.01) | |
| H05K 3/34 | (2006.01) | |
| H01G 4/40 | (2006.01) | |

(52) U.S. Cl.
CPC ............... *H01G 4/228* (2013.01); *H05K 1/11* (2013.01); *H05K 5/02* (2013.01); *H01G 4/40* (2013.01); *H05K 3/3442* (2013.01); *H05K 2201/1003* (2013.01); *H05K 2201/10015* (2013.01); *H05K 2201/10022* (2013.01)

(58) Field of Classification Search
CPC ....... H05K 2201/10015; H05K 3/3442; H01G 4/228; H01G 2/065; H01G 4/40; H01C 1/14; H01C 1/012
See application file for complete search history.

(56) References Cited

U.S. PATENT DOCUMENTS

| | | | | |
|---|---|---|---|---|
| 6,368,734 | B1* | 4/2002 | Mihara | C04B 35/01 257/703 |
| 8,044,511 | B2* | 10/2011 | Kato | H01L 24/11 257/737 |
| 8,081,059 | B2* | 12/2011 | Tanimura | H01C 1/148 338/307 |
| 8,111,130 | B2* | 2/2012 | Tsukada | H01C 1/012 338/195 |
| 2005/0127474 | A1 | 6/2005 | Matsuda | |
| 2008/0094169 | A1 | 4/2008 | Kinoshita et al. | |
| 2008/0290460 | A1* | 11/2008 | Iseki | H01C 17/28 257/536 |
| 2009/0001538 | A1* | 1/2009 | Takizawa | H05K 1/181 257/685 |
| 2009/0139757 | A1* | 6/2009 | Lee | H01G 4/005 174/260 |
| 2009/0283866 | A1* | 11/2009 | Schulze | H01L 21/22 257/607 |
| 2010/0019314 | A1* | 1/2010 | Kachi | H01L 29/42372 257/330 |
| 2010/0053842 | A1* | 3/2010 | Devoe | H01G 4/232 361/306.3 |
| 2010/0163886 | A1* | 7/2010 | Fukunaga | H01L 33/0095 257/76 |
| 2010/0258954 | A1* | 10/2010 | Andoh | H01L 23/49811 257/784 |
| 2011/0043963 | A1* | 2/2011 | Bultitude | H01G 2/16 361/321.4 |
| 2011/0057765 | A1* | 3/2011 | Ryu | H01C 1/034 338/252 |
| 2012/0178199 | A1* | 7/2012 | Savoy | G01N 27/4148 438/49 |

FOREIGN PATENT DOCUMENTS

| | | | |
|---|---|---|---|
| CN | 1930641 A | | 3/2007 |
| CN | 101336045 A | | 12/2008 |
| JP | 10135016 A | * | 5/1998 |
| JP | H10-135016 A | | 5/1998 |
| JP | 2001-076912 A | | 3/2001 |
| JP | 2002-075702 A | | 3/2002 |
| JP | 2007-095592 A | | 4/2007 |
| JP | 2008-270447 A | | 11/2008 |
| JP | 2008270447 A | * | 11/2008 |
| JP | 2011-238730 A | | 11/2011 |
| JP | 2012-004180 A | | 1/2012 |
| WO | WO-2006/085492 A1 | | 8/2006 |
| WO | WO-2006085492 A1 | * | 8/2006 ............... H01C 1/06 |

* cited by examiner

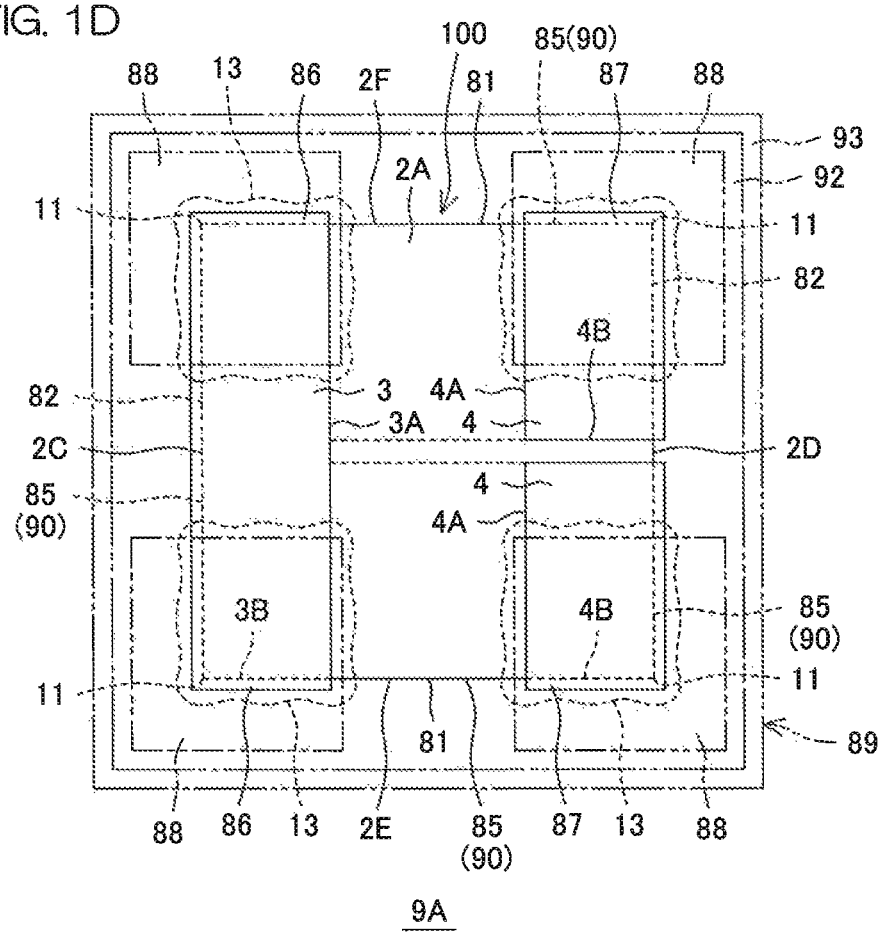

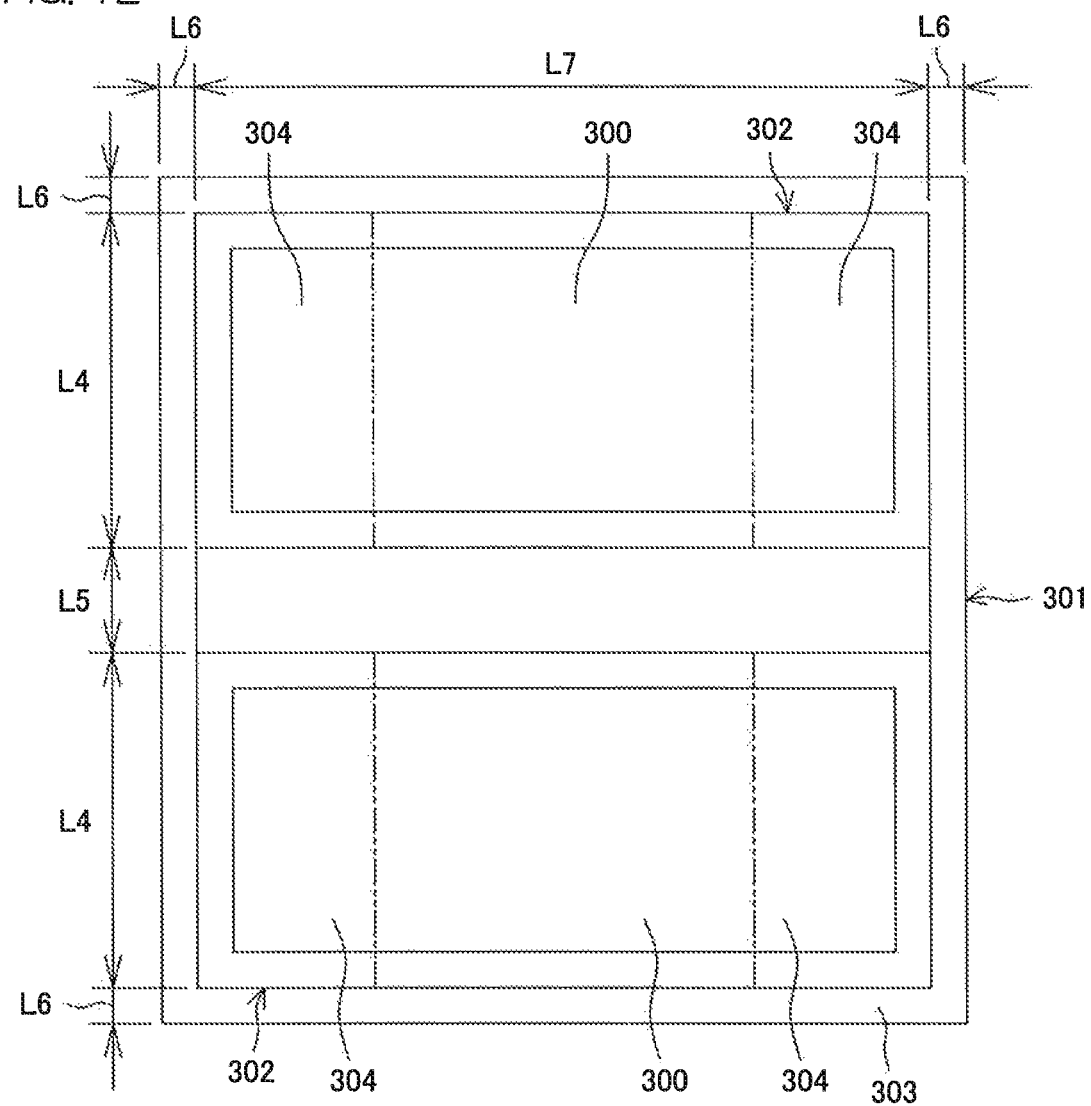

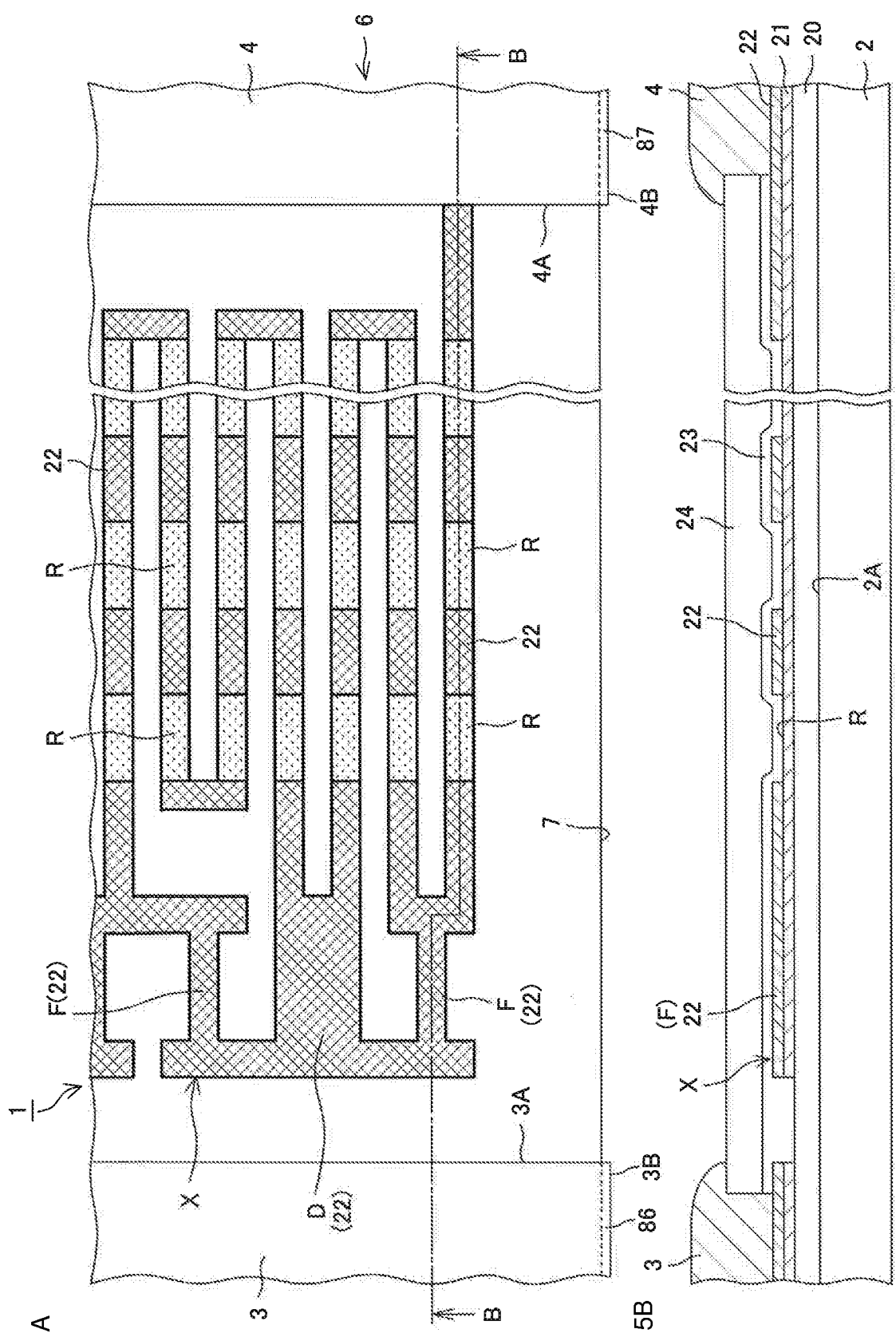

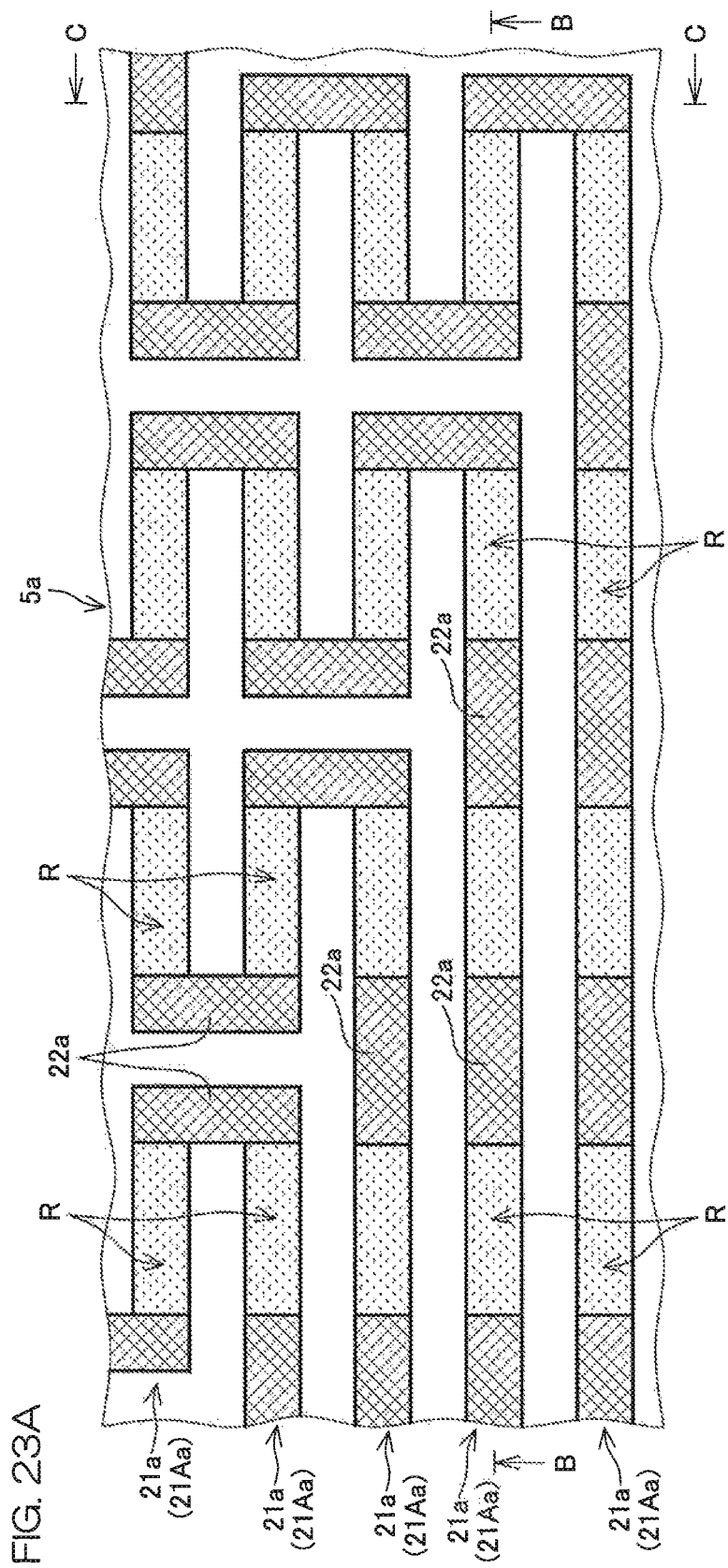

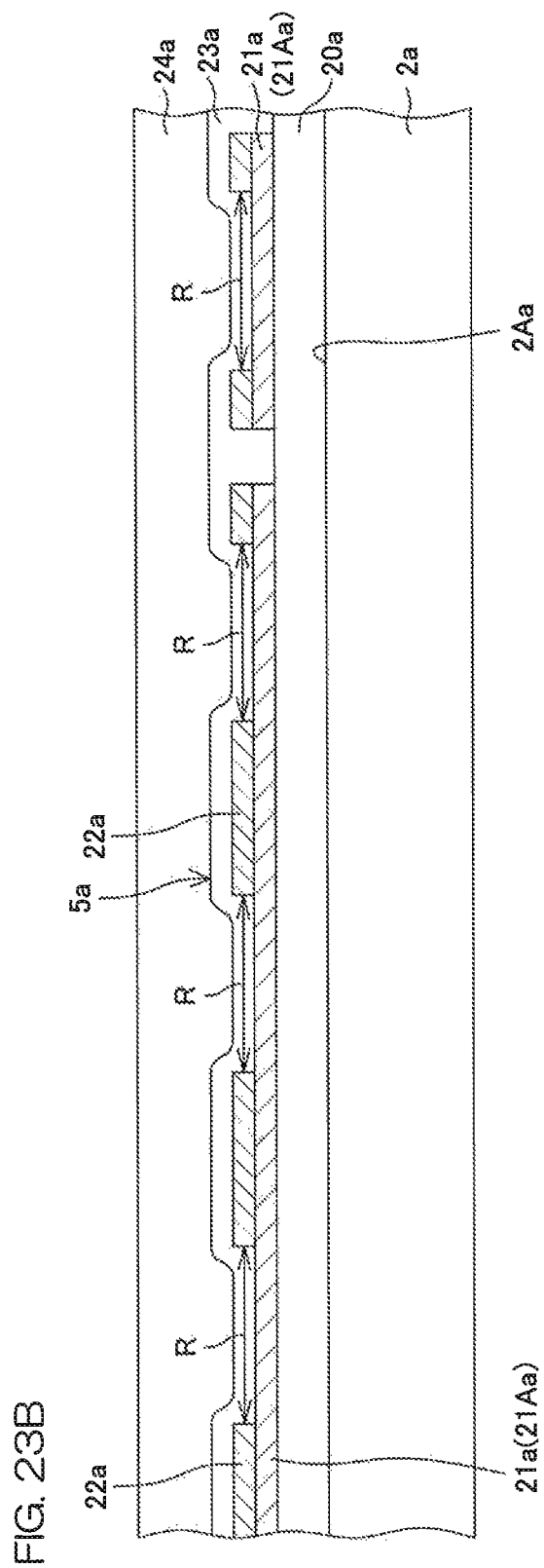

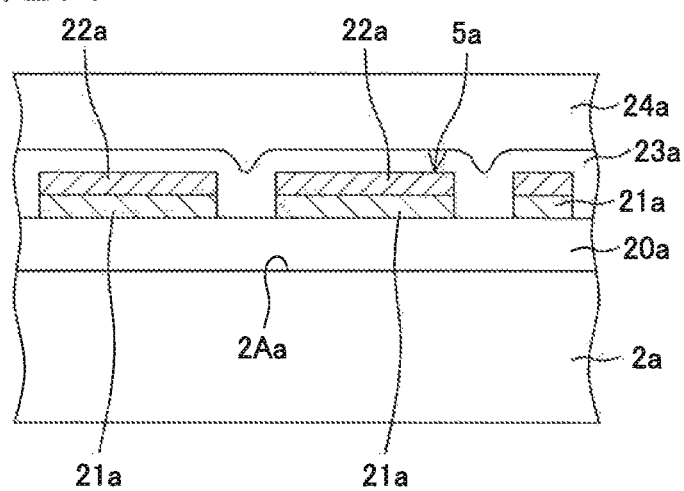

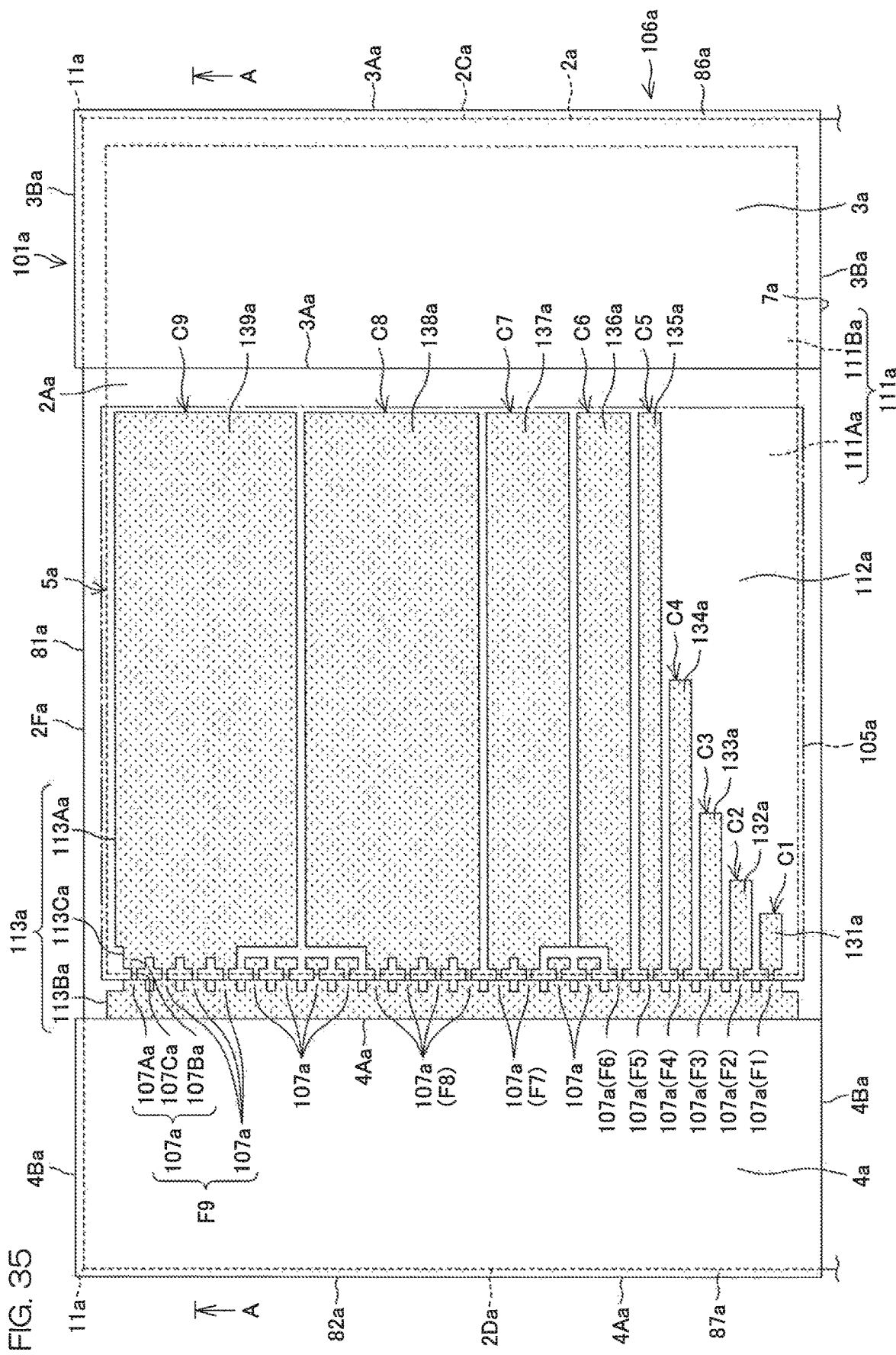

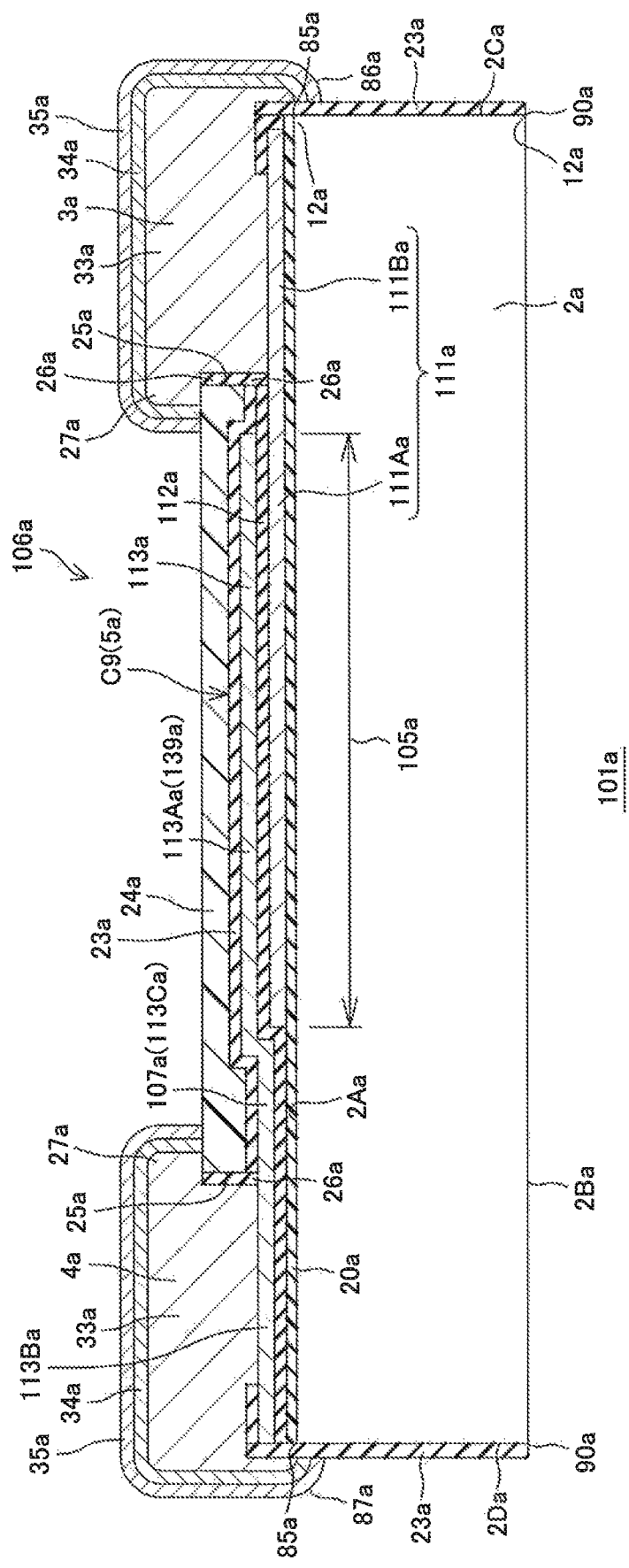

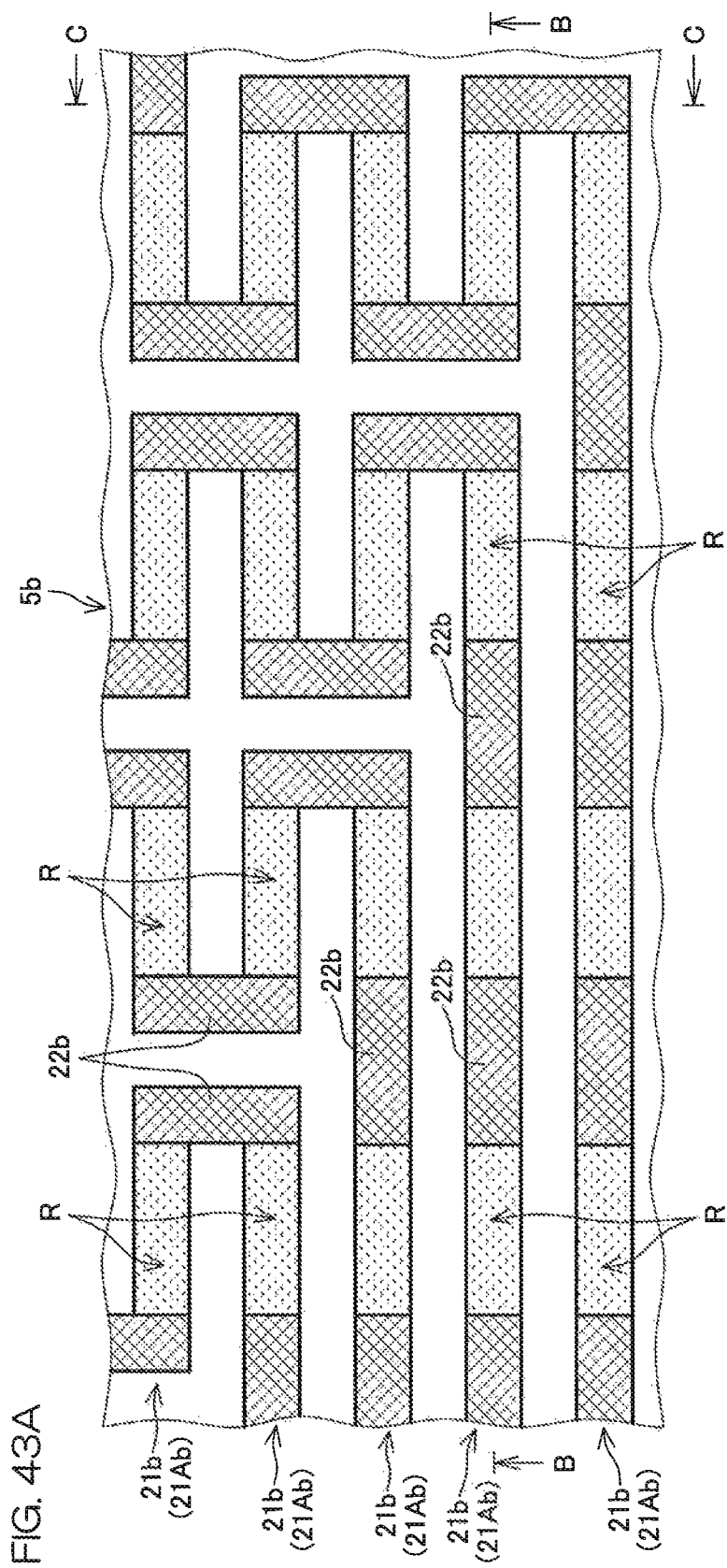

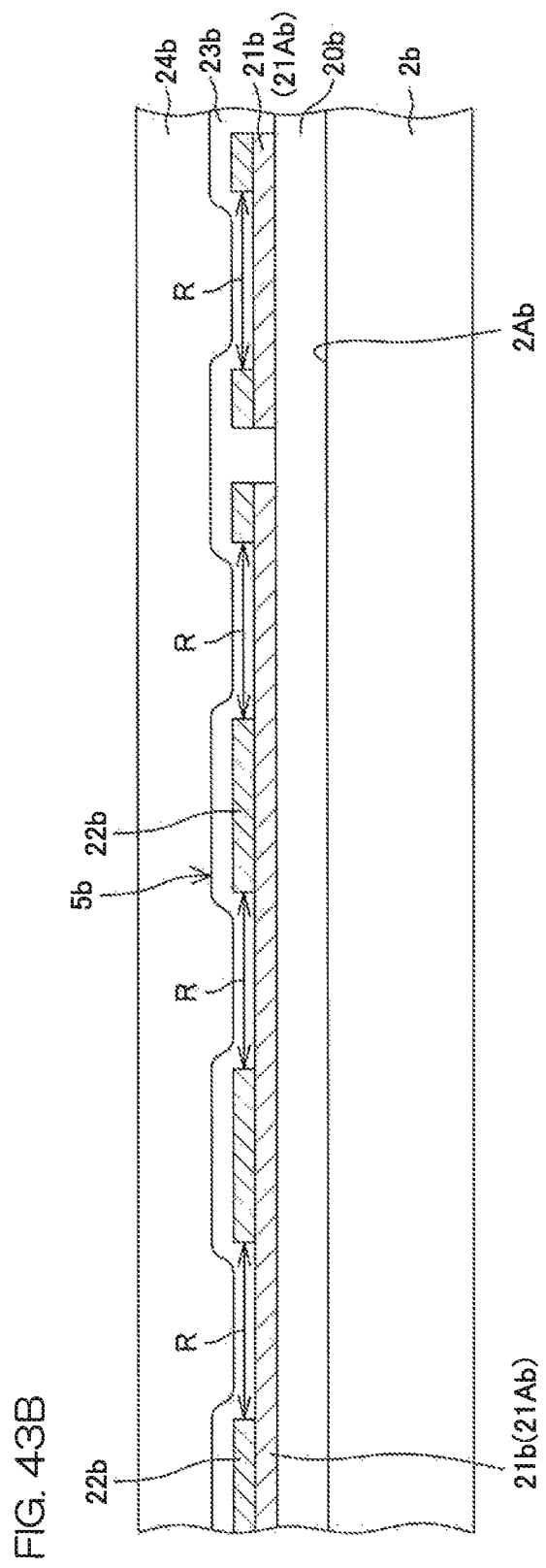

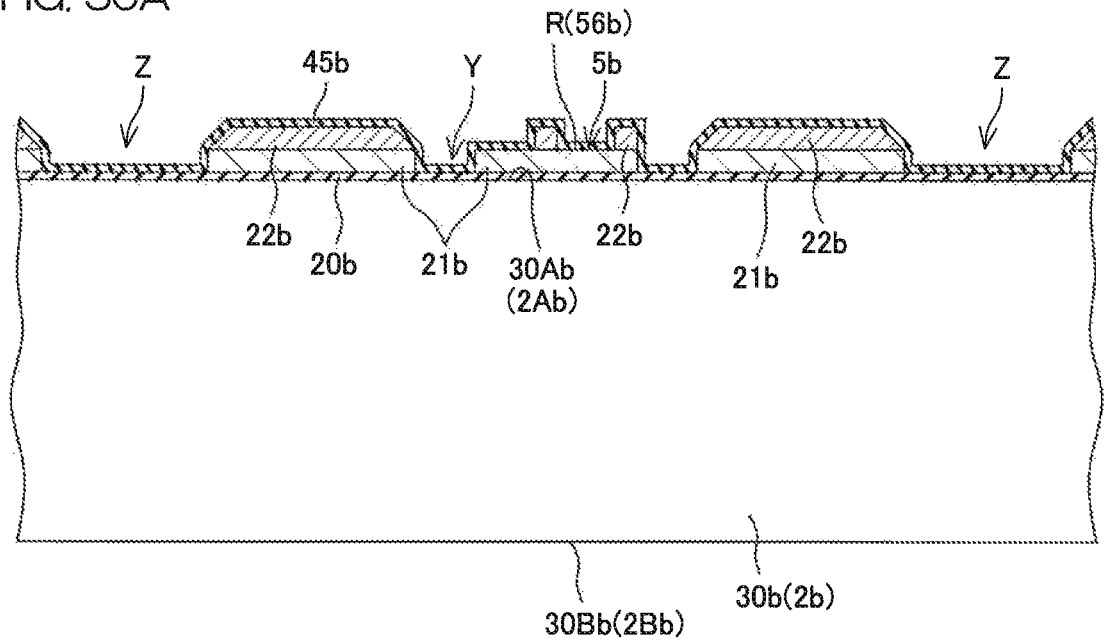
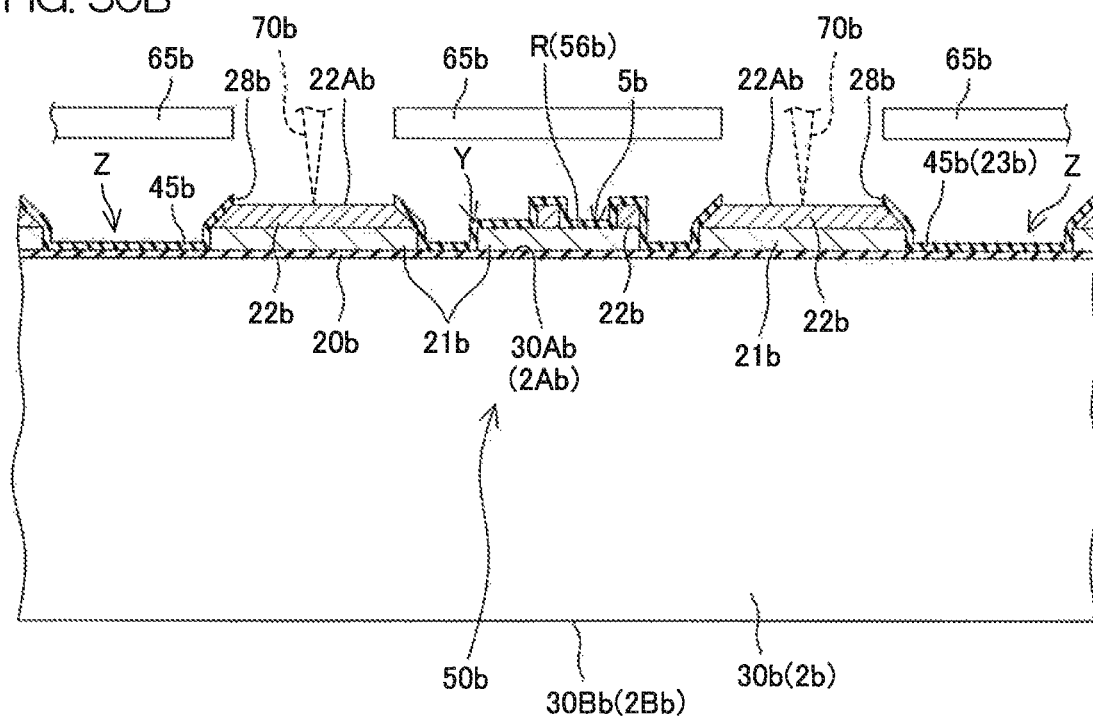

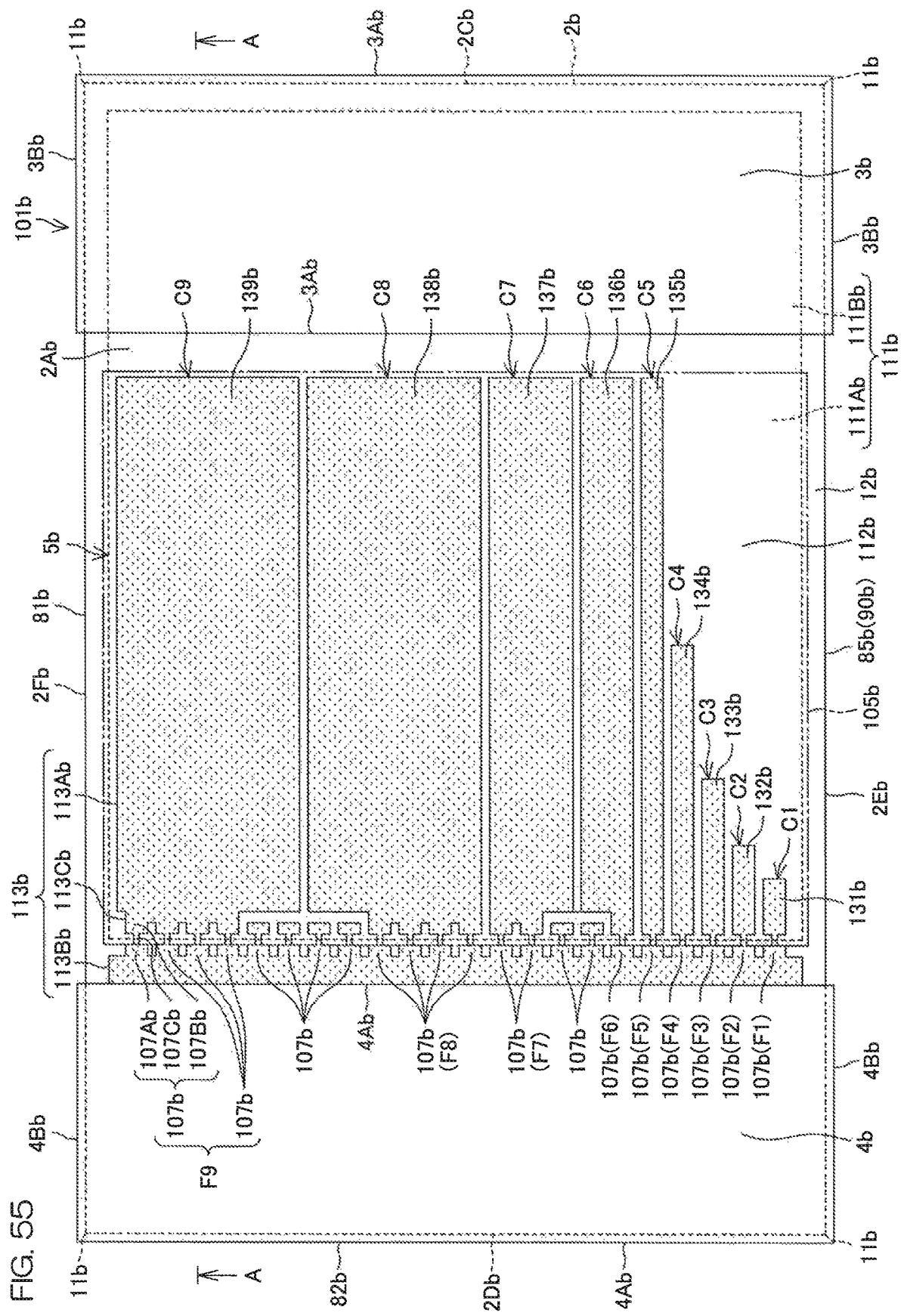

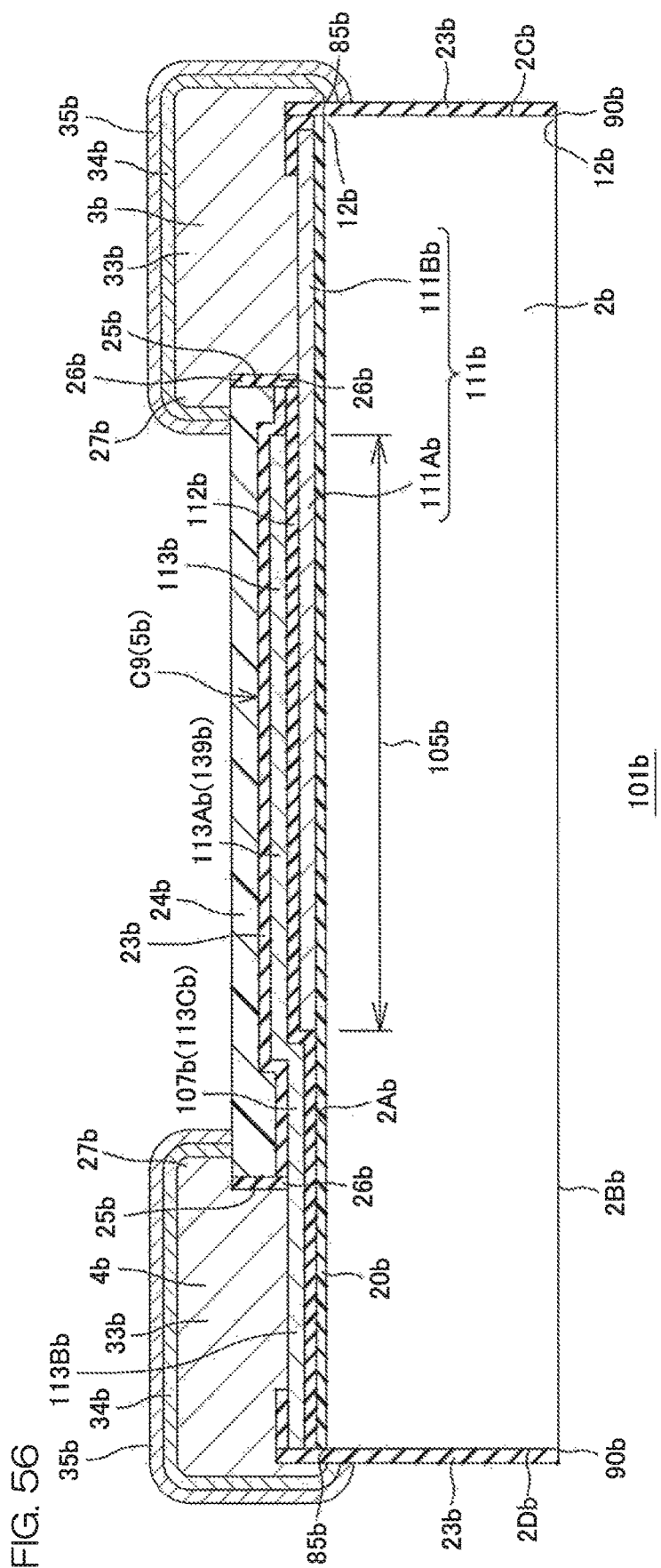

D-D

FIG. 64
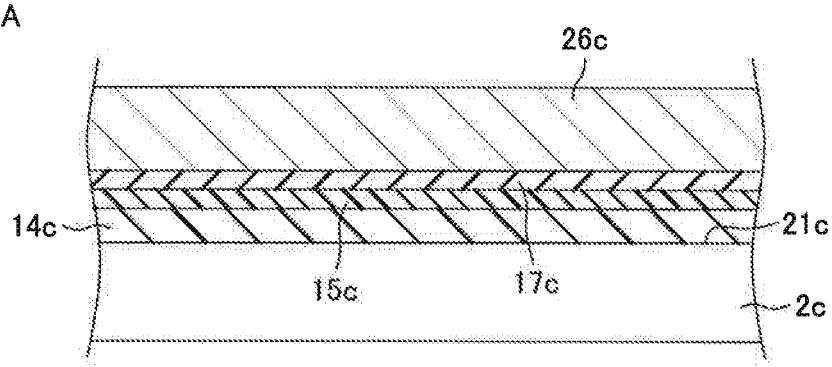
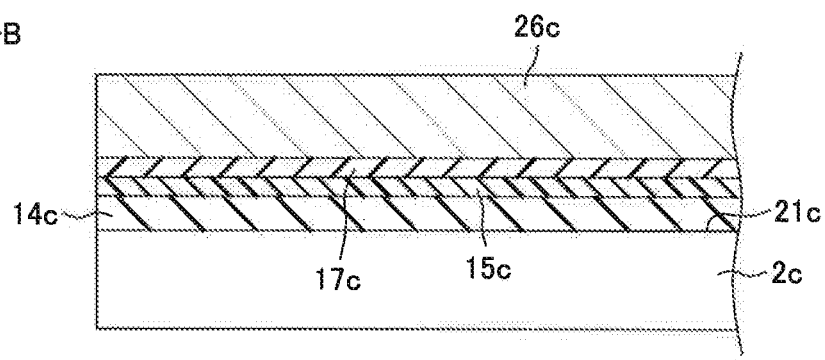
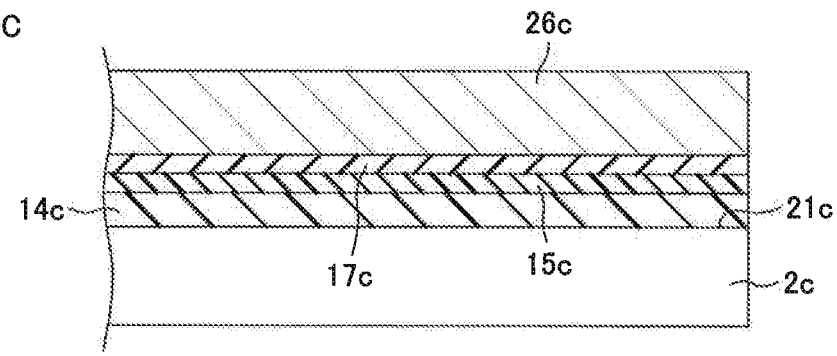

FIG. 65
A-A
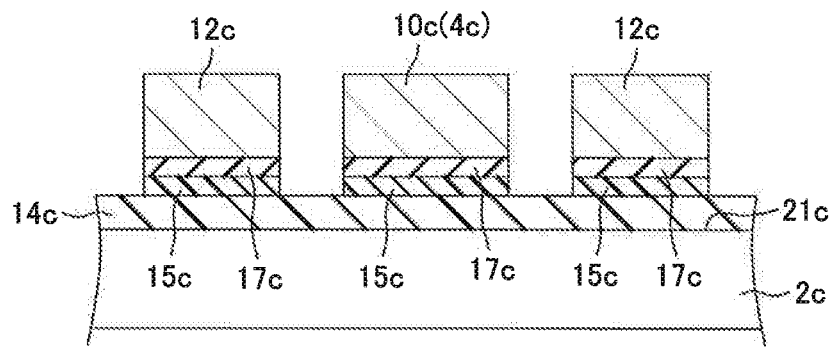
B-B
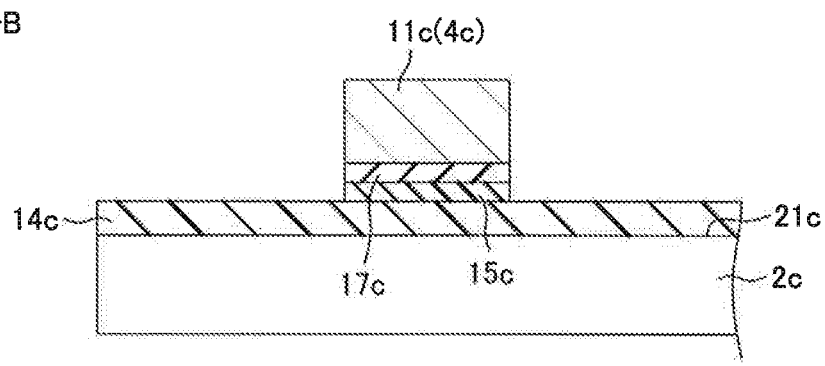
C-C
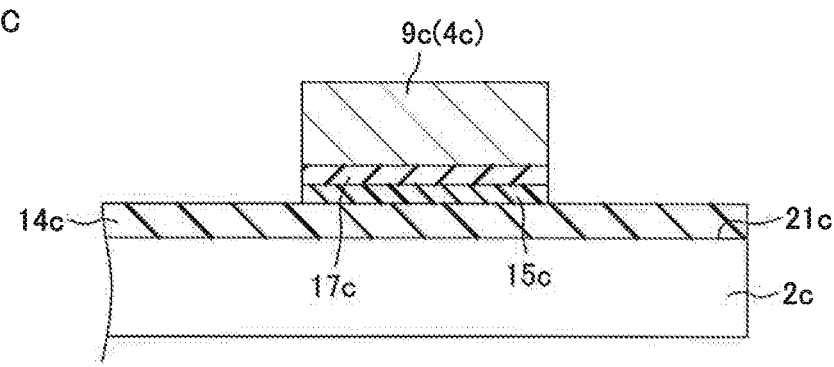

FIG. 66
A-A
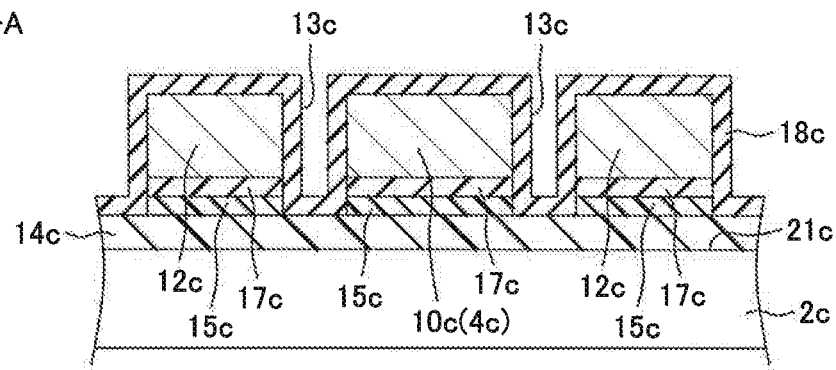
B-B
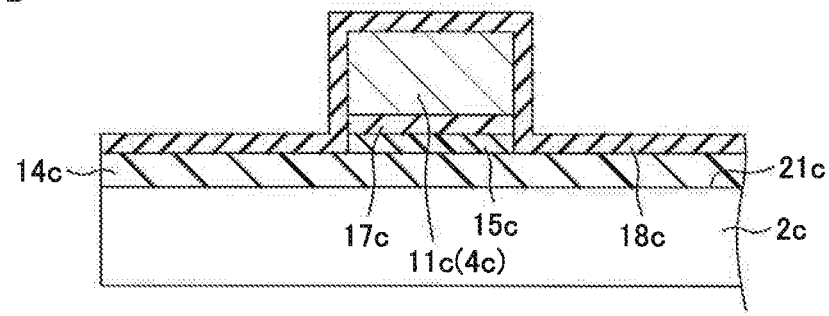
C-C
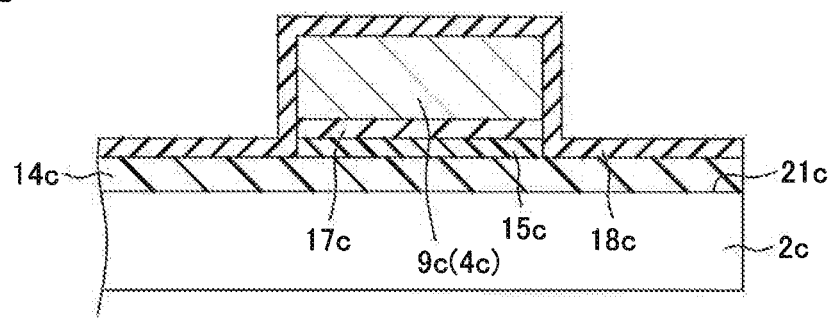

FIG. 67
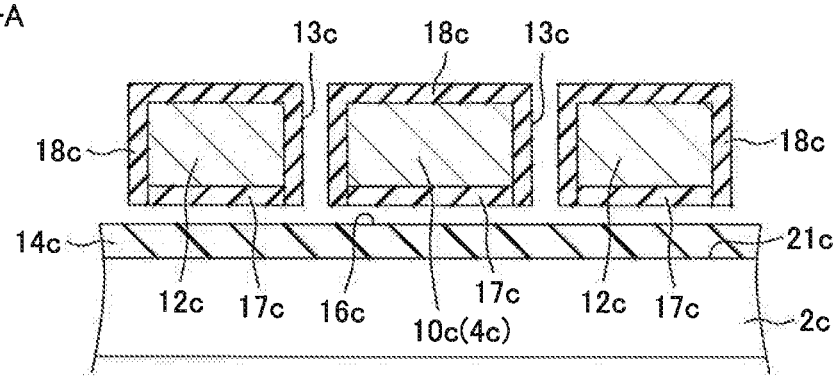
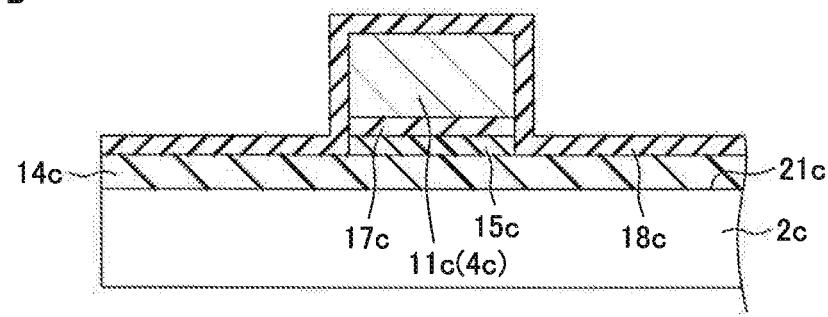
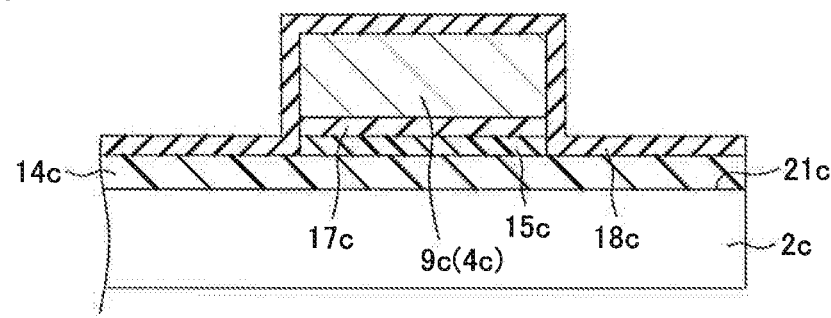

FIG. 68
A-A
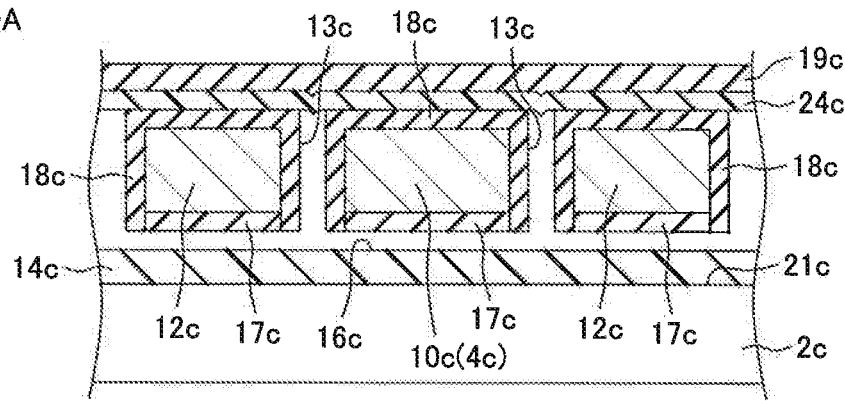
B-B
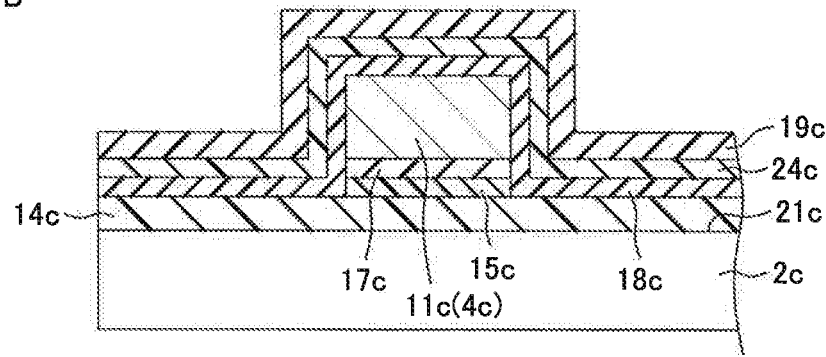
C-C
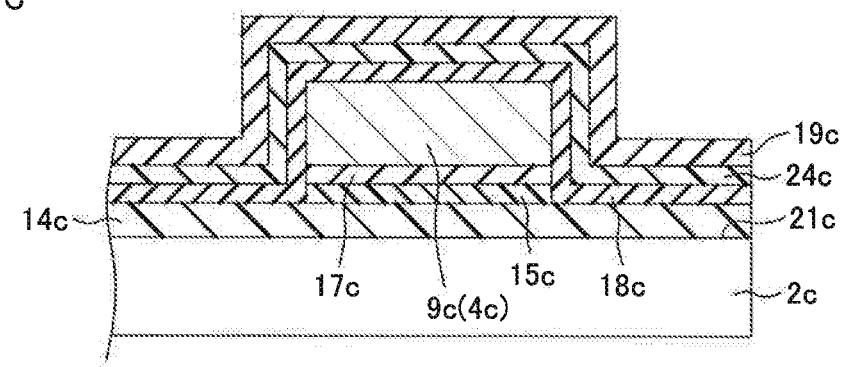

FIG. 69
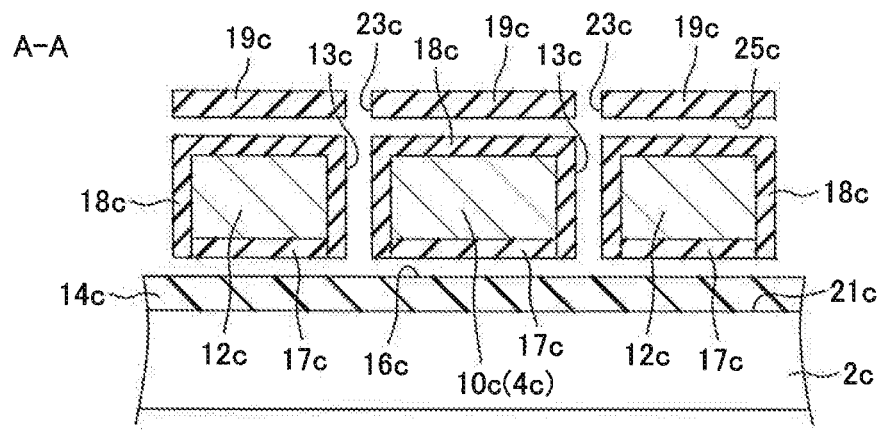
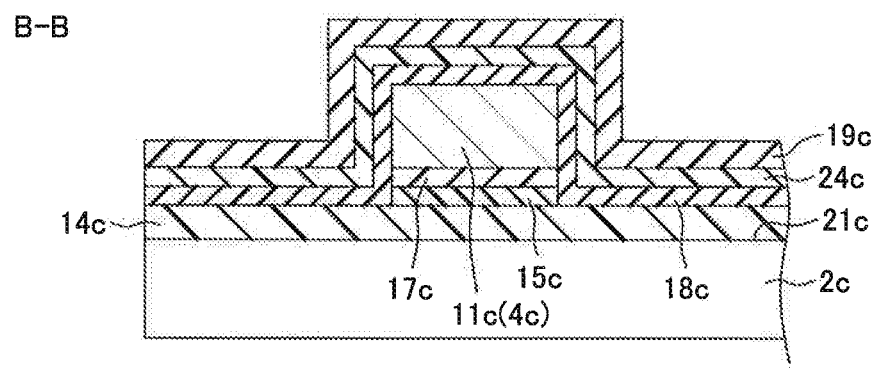
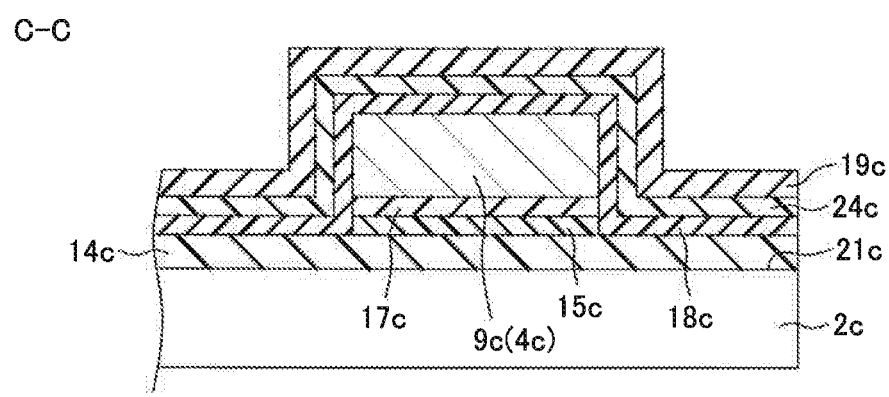

FIG. 70
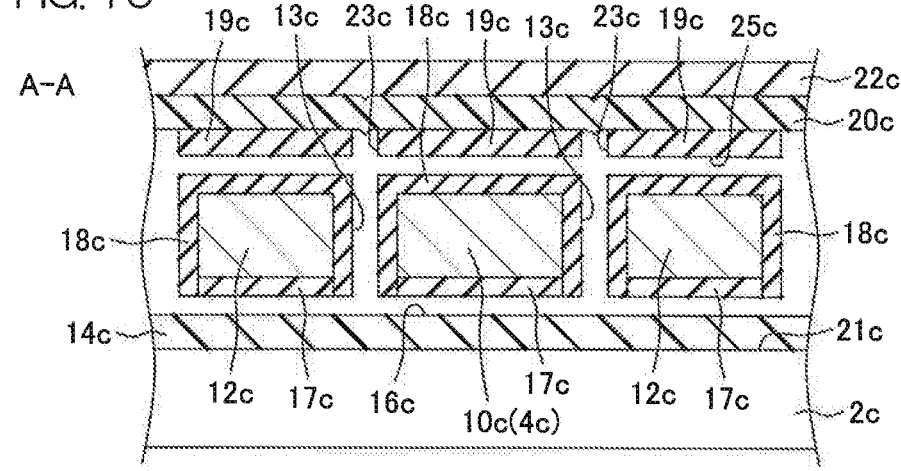
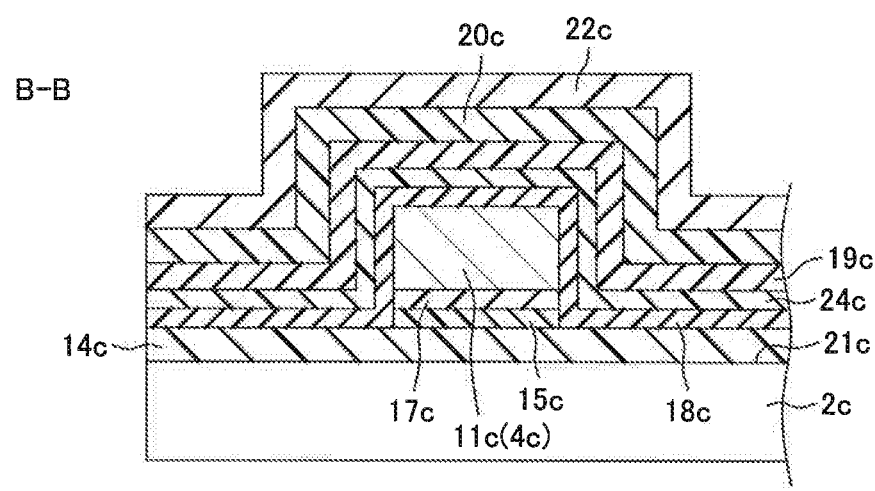
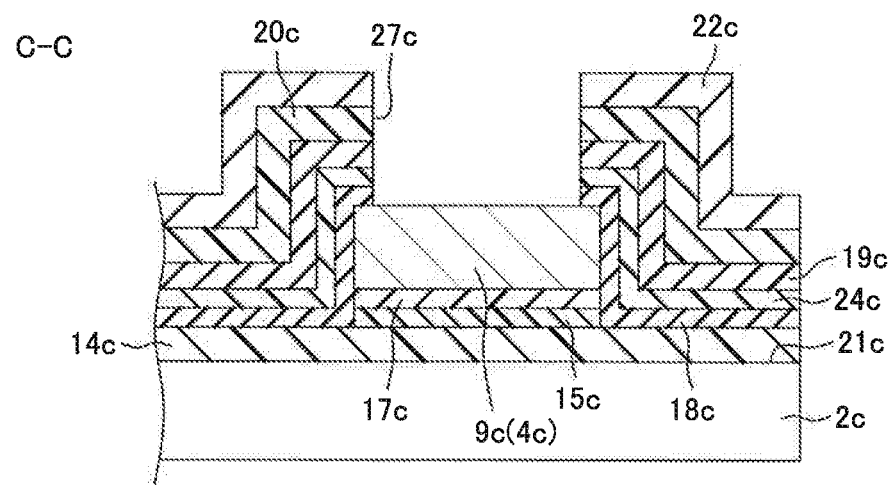

COMPOSITE CHIP COMPONENT, CIRCUIT ASSEMBLY AND ELECTRONIC APPARATUS

CROSS-REFERENCE TO RELATED APPLICATION

This is a continuation of U.S. application Ser. No. 14/781,964, filed on Oct. 2, 2015, and allowed on Nov. 20, 2018, which was a National Stage application of PCT/JP2014/058995, filed on Mar. 27, 2014, and claims the benefit of priority of Japanese Patent Applications No. 2013-078825, filed on Apr. 4, 2013, No. 2013-085087, filed on Apr. 15, 2013, No. 2013-088586, filed on Apr. 19, 2013, and No. 2013-097950, filed on May 7, 2013. The disclosures of these prior U.S. and foreign applications are incorporated herein by reference.

FIELD OF THE ART

The present invention relates to a composite chip part and a circuit assembly and an electronic device that include the composite chip part.

BACKGROUND ART

Patent Document 1 discloses a chip resistor in which a resistive film formed on an insulating substrate is laser-trimmed and thereafter a cover coat made of glass is formed.

PRIOR ART DOCUMENT

Patent Document

Patent Document 1: Japanese Patent Application Publication No. 2001-76912

SUMMARY OF THE INVENTION

Problem to be Solved by the Invention

An object of the present invention is to provide a composite chip part that can reduce the junction area (mounting area) of a mounting substrate and can enhance the efficiency of a mounting operation.

Another object of the present invention is to provide a circuit assembly that includes the composite chip part of the present invention and an electronic device that includes such a circuit assembly.

Means for Solving the Problem

A composite chip part of the present invention includes: a plurality of chip elements which are arranged a distance apart from each other on a common substrate and which have different functions; and a pair of electrodes which are formed on a surface of the substrate in each of the chip elements.

In this arrangement, since a plurality of chip elements are arranged on the common substrate, as compared with a conventional one, it is possible to reduce the junction area (mounting area) of the mounting substrate.

Since the composite chip part is an N-arrayed chip (N is a positive integer), as compared with a case where a chip part (single chip) on which only one element is mounted N times, the chip part having the same function can be mounted by performing only one mounting operation. Furthermore, since as compared with a single chip, it is possible to increase the area per chip, it is possible to stabilize a suction operation by a chip mounter.

Preferably, the composite chip part according to the present invention, further includes: an insulating film which is interposed between the electrode and the substrate, where the insulating film is formed so as to cover a boundary region of the chip elements adjacent to each other on the surface of the substrate.

The pair of electrodes may be respectively arranged on one side surface side of the substrate and an opposite side surface side opposite each other, and each of the electrodes may include a peripheral edge portion which is formed to straddle the surface and the side surface of the substrate so as to cover an edge portion of the substrate.

In this arrangement, since the electrode is formed not only on the surface of the substrate but also the side surfaces, it is possible to enlarge an adhesion area when the composite chip part is soldered to the mounting substrate. Consequently, since it is possible to increase the adsorbed amount of solder to the electrode, it is possible to enhance the adhesion strength. Since the solder is adsorbed so as to be moved from the surface of the substrate to the side surfaces, in the mounted state, it is possible to retain the chip part from the two directions of the surface and the side surfaces of the substrate. Hence, it is possible to stabilize the mounting shape of the chip part.

The composite chip part may be a pair chip part which includes a pair of the chip elements on the common substrate, and the peripheral edge portion of the electrode may be formed so as to cover four corner portions of the substrate.

In this arrangement, since the pair chip part mounted on the mounting substrate can be supported by four points, it is possible to further stabilize the mounting shape.

The composite chip part of the present invention may further include a wiring film which is formed, on the surface of the substrate, a distance apart from the edge portion and to which the electrode is electrically connected.

In this arrangement, since the wiring film is independent of the electrode for external connection, it is possible to perform wiring design corresponding to the element pattern formed on the surface of the substrate.

A part of the wiring film which is covered by the electrode and which is opposite the edge portion of the substrate may be selectively exposed, and a part other than the exposed part may be selectively covered by a resin film.

In this arrangement, it is possible to increase the junction area of the electrode and the wiring film, and thus it is possible to reduce the contact resistance.

The electrode may be formed so as to protrude from a surface of the resin film. The electrode may include a drawing portion which is drawn in a lateral direction along the surface of the resin film and which selectively covers the surface.

The electrode may include a Ni layer and an Au layer, and the Au layer is exposed to an uppermost surface.

In this arrangement, the surface of the Ni layer is covered by the Au layer, and thus it is possible to prevent the Ni layer from being oxidized.

The electrode may further include a Pd layer interposed between the Ni layer and the Au layer.

In this arrangement, even when a through-hole (pinhole) is formed in the Au layer as a result of the thickness of the Au layer being reduced, the Pd layer interposed between the Ni layer and the Au layer blocks the through-hole and thus it is possible to prevent the Ni layer from being exposed from the through-hole to the outside to become oxidized.

The plurality of chip elements preferably include a chip element of a 0402 size having a planar dimension of 0.4 mm×0.2 mm, and more preferably include a chip element of a 03015 size having a planar dimension of 0.3 mm×0.15 mm.

In this arrangement, it is possible to further decrease the size of the composite chip part, and thus it is possible to further reduce the junction area (mounting area) in the mounting substrate.

The plurality of chip elements may include a resistor which includes a resistor body connected between the pair of electrodes.

In this case, preferably, the resistor includes: a plurality of the resistor bodies; and a plurality of fuses which are provided on the substrate and which are connected to the electrode such that the resistor bodies can be individually separated.

In this arrangement, one or a plurality of fuses are selectively cut, and thus it is possible to easily and quickly cope with a plurality of types of resistance values. In other words, a plurality of resistor bodies having different resistance values are combined, and thus it is possible to realize the resistors of various resistance values with the common design.

The plurality of chip elements may include a capacitor which includes a capacitor connected between the pair of electrodes.

In this case, preferably, the capacitor includes: a plurality of capacitor factors which form the capacitor; and a plurality of fuses which are provided on the substrate and which are connected to the electrode such that the plurality of capacitor factors can be individually separated.

In this arrangement, one or a plurality of fuses are selectively cut, and thus it is possible to easily and quickly cope with a plurality of types of capacitance values. In other words, a plurality of capacitor factors having different capacitance values are combined, and thus it is possible to realize the capacitors of various capacitance values with the common design.

A circuit assembly of the present invention includes: the composite chip part of the present invention; and amounting substrate which includes, on amounting surface opposite the surface of the substrate, a land joined by solder to the electrode.

In this arrangement, it is possible to provide a circuit assembly including the composite chip part that can reduce the junction area (mounting area) in the mounting substrate and that can enhance the efficiency of the mounting operation.

An electronic device of the present invention is an electronic device which includes: the circuit assembly of the present invention and a housing which holds the circuit assembly.

With this arrangement, it is possible to provide an electronic part including the composite chip part that can reduce the junction area (mounting area) of the mounting substrate and can enhance the efficiency of the mounting operation.

BRIEF DESCRIPTION OF THE DRAWINGS

FIG. 1D is a schematic plan view when the circuit assembly is seen from the side of the element formation surface of the composite chip;

FIG. 1E is a drawing showing a state where two single chips are mounted on the mounting substrate;

FIG. 5A is a partially enlarged plan view of a region including fuses depicting an enlarged part of a plan view of the resistor of FIG. 2; and FIG. 5B is a drawing showing a cross-sectional structure along line B-B of FIG. 5A;

FIG. 23A A plan view depicting an enlarged part of the element shown in FIG. 22;

FIG. 23B A vertical cross-sectional view depicted for illustrating the arrangement of resistor bodies of the element in a length direction along line B-B of FIG. 23A;

FIG. 23C A vertical cross-sectional view depicted for illustrating the arrangement of the resistor bodies of the element in a width direction along line C-C of FIG. 23A;

FIG. 35 is a plan view showing a part of a chip capacitor according to another preferred embodiment of the first reference example;

FIG. 36 is a schematic cross-sectional view of the chip capacitor, a drawing showing a cross-sectional structure along line A-A of FIG. 35;

FIG. 43A is a plan view depicting an enlarged part of the element shown in FIG. 42;

FIG. 43B is a vertical cross-sectional view depicted for illustrating the arrangement of resistor bodies of the element in a length direction along line B-B of FIG. 43A;

FIG. 55 is a plan view of the chip capacitor according to another preferred embodiment of the second reference example;

FIG. 56 is a cross-sectional view when seen from section line A-A of FIG. 55;

FIG. 64 is a cross-sectional view for illustrating a part of a step of manufacturing the chip-type fuse of FIG. 61;

FIG. 65 is a drawing showing the subsequent step of FIG. 64;

FIG. 66 is a drawing showing the subsequent step of FIG. 65;

FIG. 67 is a drawing showing the subsequent step of FIG. 66;

FIG. 68 is a drawing showing the subsequent step of FIG. 67;

FIG. 69 is a drawing showing the subsequent step of FIG. 68; and

FIG. 70 is a drawing showing the subsequent step of FIG. 69.

MODES FOR CARRYING OUT THE INVENTION

Preferred embodiments of the present invention will be described in detail below with reference to accompanying drawings.

Figure 1A:
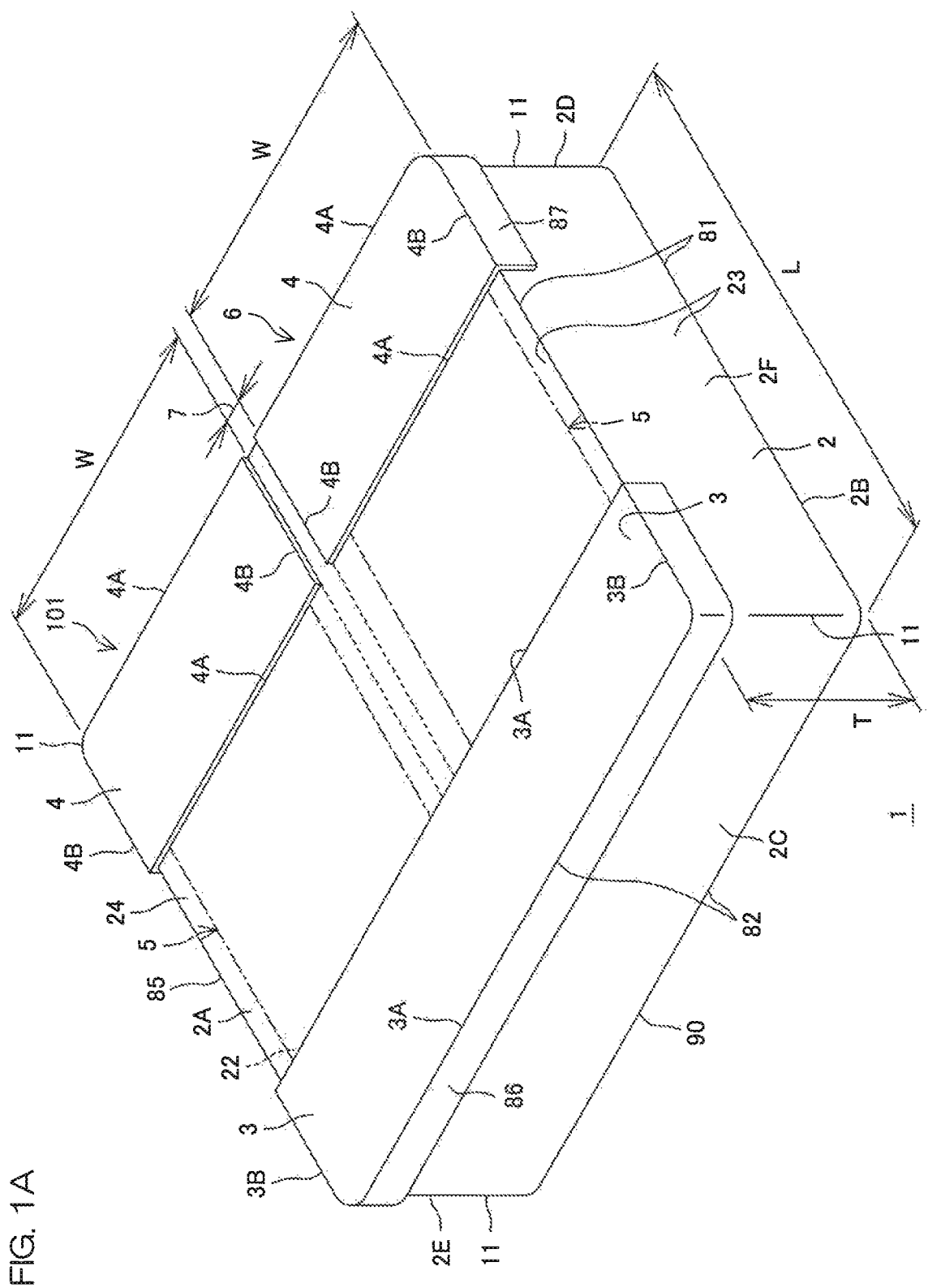
FIG. 1A is a schematic perspective view for illustrating the arrangement of a composite chip according to a preferred embodiment of the present invention.

FIG. 1A is a schematic perspective view for illustrating the arrangement of a composite chip 1 according to a preferred embodiment of the present invention.

As shown in FIG. 1A, the composite chip 1 is a pair chip in which on a common substrate 2, as an example of the chip element of the present invention, a resistor 6 and a capacitor 101 are mounted. The resistor 6 and the capacitor 101 are arranged adjacent to each other so as to be symmetric with respect to the boundary region 7 thereof.

The composite chip 1 is formed in the shape of a rectangular parallelepiped. The planar shape of the composite chip 1 is a quadrangle that has a side (horizontal side 82) along the direction (hereinafter, the horizontal direction of the substrate 2) in which the resistor 6 and the capacitor 101 are aligned and a side (vertical side 81) perpendicular to the horizontal side 82. The planar dimensions of the composite chip 1 are, for example, a 0303 size that is formed by combining, with the capacitor 101, the resistor 6 of a 03015 size having a length L (the length of the vertical side 81) of about 0.3 mm and a width W of about 0.15 mm. As a matter of course, the planar dimensions of the composite chip 1 are not limited to the above size, and for example, may be a 0404 size that is formed by combining together elements of a 0402 size having a length L of about 0.4 mm and a width W of about 0.2 mm. Preferably, the thickness T of the composite chip 1 is about 0.1 mm, and the width of the boundary region 7 between the resistor 6 and the capacitor 101 adjacent to each other is about 0.03 mm.

The composite chip 1 is obtained by forming, on a wafer, a large number of composite chips 1 in a lattice, then forming grooves in the wafer, thereafter performing back polishing (or separating the substrate with the grooves) and thereby separating them into individual composite chips 1.

The resistor 6 and the capacitor 101 mainly include the substrate 2 forming the main body of the composite chip 1, a first connection electrode 3 and a second connection electrode 4 serving as external connection electrodes and an element 5 externally connected by the first connection electrode 3 and the second connection electrode 4. In the preferred embodiment, the first connection electrode 3 is formed so as to straddle the resistor 6 and the capacitor 101, and serves as an electrode common to the resistor 6 and the capacitor 101.

The substrate 2 has a chip shape substantially in the form of a rectangular parallelepiped. In FIG. 1A, one surface of the substrate 2 that forms the upper surface is an element formation surface 2A. The element formation surface 2A is the surface of the substrate 2 on which the element 5 is formed, and is formed substantially in the shape of a rectangle. The surface on the opposite side to the element formation surface 2A in the direction of the thickness of the substrate 2 is a back surface 2B. The element formation surface 2A and the back surface 2B have substantially the same dimensions and sizes, and are parallel to each other. It is assumed that a quadrangular edge partitioned by a pair of the vertical side 81 and the horizontal side 82 in the element formation surface 2A is referred to as a peripheral edge portion 85, and that a quadrangular edge partitioned by a pair of the vertical side 81 and the horizontal side 82 in the back surface 2B is referred to as a peripheral edge portion 90. When seen in a normal direction perpendicular to the element formation surface 2A (the back surface 2B), the peripheral edge portion 85 and the peripheral edge portion 90 are overlaid (see FIGS. 1C and 1D that will be described later). For example, the substrate 2 may be a substrate whose thickness is reduced by grinding or polishing it from the side of the back surface 2B. As the material of the substrate 2, a semiconductor substrate such as a silicon substrate, a glass substrate or a resin film may be used.

The substrate 2 has, as surfaces other than the element formation surface 2A and the back surface 2B, a plurality of side surfaces (a side surface 2C, a side surface 2D, a side surface 2E and a side surface 2F). The side surfaces 2C to 2F extend so as to intersect (specifically, perpendicularly intersect) the element formation surface 2A and the back surface 2B, and thereby connect the element formation surface 2A and the back surface 2B.

The side surface 2C is provided between the horizontal sides 82 on one side (the left front side in FIG. 1A) in the vertical direction (hereinafter, the vertical direction of the substrate 2) perpendicularly intersecting the horizontal direction of the substrate 2 in the element formation surface 2A and the back surface 2B, and the side surface 2D is provided between the horizontal sides 82 on the other side (the right rear side in FIG. 1A) in the vertical direction of the substrate 2 in the element formation surface 2A and the back surface 2B. The side surface 2C and the side surface 2D are both end surfaces of the substrate 2 in the vertical direction.

The side surface 2E is provided between the vertical sides 81 on one side (the left rear side in FIG. 1A) in the horizontal direction of the substrate 2 in the element formation surface 2A and the back surface 2B, and the side surface 2F is provided between the vertical sides 81 on the other side (the right front side in FIG. 1A) in the horizontal direction of the substrate 2 in the element formation surface 2A and the back surface 2B. The side surface 2E and the side surface 2F are both end surfaces of the substrate 2 in the horizontal direction.

The side surface 2C and the side surface 2D intersect (specifically, perpendicularly intersect) each of the side surface 2E and the side surface 2F. Hence, parts adjacent to each other in the area from the element formation surface 2A to the side surface 2F form a right angle.

In the substrate 2, the entire region of the element formation surface 2A and the side surfaces 2C to 2F is covered by a passivation film 23. Hence, strictly speaking, in FIG. 1A, the entire region of the element formation surface 2A and the side surfaces 2C to 2F is located on the inner side (back side) of the passivation film 23, and is thereby prevented from being exposed to the outside. Furthermore, the composite chip 1 includes a resin film 24.

The resin film 24 covers the entire region (the peripheral edge portion 85 and the inside region thereof) of the passivation film 23 on the element formation surface 2A. The passivation film 23 and the resin film 24 will be described in detail later.

The first connection electrode 3 and the second connection electrode 4 include peripheral edge portions 86 and 87 that are formed so as to cover the peripheral edge portion 85 on the element formation surface 2A of the substrate 2 and to straddle the element formation surface 2A and the side surfaces 2C to 2F. In the preferred embodiment, the peripheral edge portions 86 and 87 are formed so as to cover corner portions 11 where the surfaces 2C to 2F of the substrate 2 intersect each other. The substrate 2 is rounded such that the corner portions 11 are chamfered in plan view. In this way, the substrate 2 has such a structure that chipping can be reduced in a step of manufacturing the composite chip 1 and at the time of mounting.

Each of the first connection electrode 3 and the second connection electrode 4 is formed by laminating, for example, Ni (nickel), Pd (palladium) and Au (gold) in this order on the element formation surface 2A.

The first connection electrode 3 has a pair of long sides 3A and a pair of short sides 3B, which form four sides in plan view. The long sides 3A perpendicularly intersect the short sides 3B in plan view. The second connection electrode 4 has a pair of long sides 4A and a pair of short sides 4B, which form four sides in plan view. The long sides 4A perpendicularly intersect the short sides 4B in plan view. The long sides 3A and the long sides 4A extend in parallel to the horizontal side 82 of the substrate 2, and the short sides 3B and the short sides 4B extend parallel to the vertical side 81 of the substrate 2. The composite chip 1 has no electrode on the back surface 2B of the substrate 2.

Figure 1B:
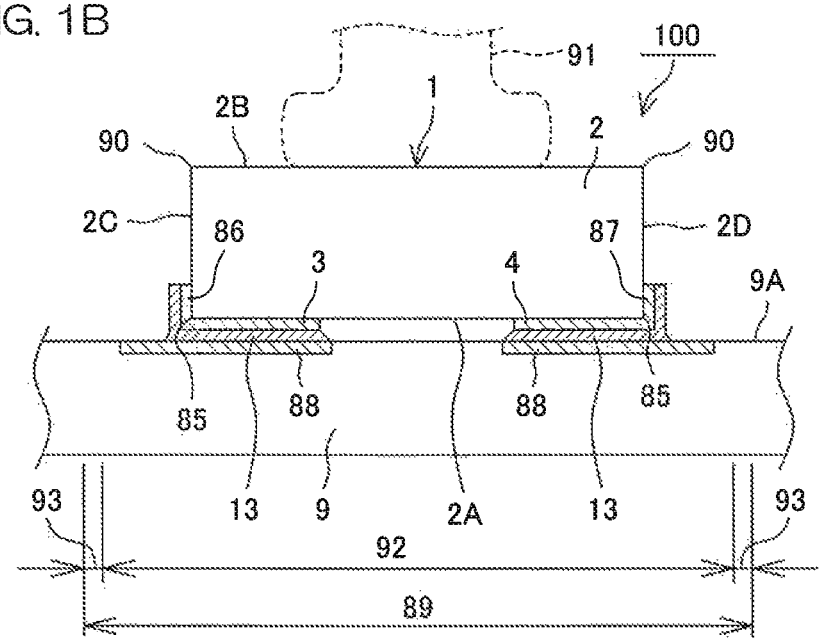
FIG. 1B is a schematic cross-sectional view of a circuit assembly with the composite chip mounted on a mounting substrate.
Figure 1C:
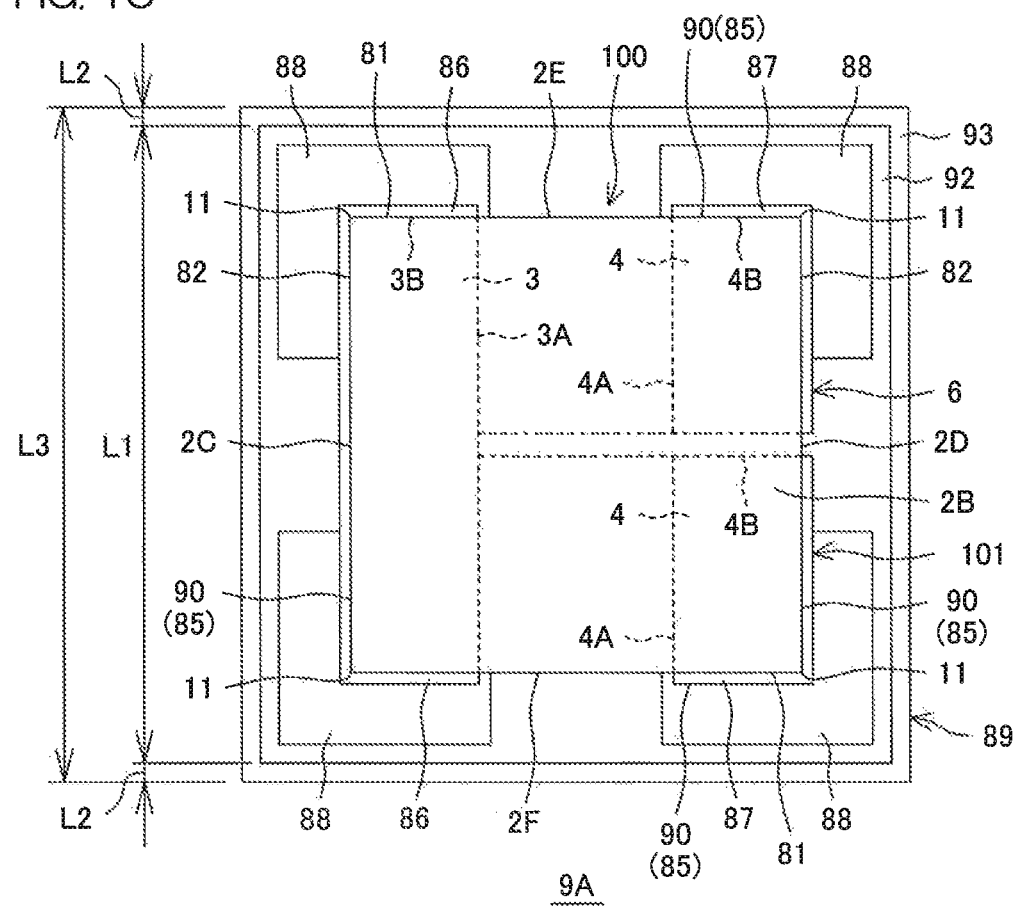
FIG. 1C is a schematic plan view when the circuit assembly is seen from the side of the back surface of the composite chip.

FIG. 1B is a schematic cross-sectional view of a circuit assembly 100 with the composite chip 1 mounted on a mounting substrate 9. FIG. 1C is a schematic plan view when the circuit assembly 100 is seen from the side of the back surface 2B of the composite chip 1. FIG. 1D is a schematic plan view when the circuit assembly 100 is seen from the side of the element formation surface 2A of the composite chip 1. FIGS. 1B to 1D show only main portions.

As shown in FIGS. 1B to 1D, the composite chip 1 is mounted on the mounting substrate 9. The composite chip 1 and the mounting substrate 9 in this state form the circuit assembly 100.

As shown in FIG. 1B, the upper surface of the mounting substrate 9 is a mounting surface 9A. In the mounting surface 9A, a mounting region 89 for the composite chip 1 is partitioned. In the preferred embodiment, as shown in FIGS. 1C and 1D, the mounting region 89 is formed in the shape of a square in plan view, and includes a land region 92 where a land 88 is arranged and a solder resist region 93 that surrounds the land region 92.

For example, when the composite chip 1 is a pair chip in which the composite chip 1 has one resistor 6 having a 03015 size and one capacitor 101, the land region 92 is formed in the shape of a quadrangle (square) having a planar size of 410 μm×410 μm. In other words, the length L1 of one side of the land region 92 is 410 μm. On the other hand, the solder resist region 93 is formed in the shape of a square ring having, for example, a width L2 of 25 μm so as to frame the land region 92.

A total of four lands 88 are individually arranged in the four corners of the land region 92. In the preferred embodiment, the lands 88 are provided in positions a predetermined distance apart from the sides partitioning the land region 92. For example, the distance from each side of the land region 92 to the corresponding land 88 is 25 μm. Between the lands 88 adjacent to each other, a distance of 80 μm is provided. Each land 88 is formed of, for example, Cu, and is connected to the internal circuit (not shown) of the mounting substrate 9. As shown in FIG. 1B, on the surface of each land 88, a solder 13 is provided so as to protrude from the surface thereof.

When the composite chip 1 is mounted on the mounting substrate 9, as shown in FIG. 1B, the suction nozzle 91 of an automatic mounting machine (not shown) is made to suck the back surface 2B of the composite chip 1, then the suction nozzle 91 is moved and thus the composite chip 1 is transported. Here, the suction nozzle 91 sucks a substantially center part of the back surface 2B of the substrate 2 in the vertical direction. As described above, the first connection electrode 3 and the second connection electrode 4 are provided on only one surface (the element formation surface 2A) of the composite chip 1 and the end portions of the side surfaces 2C to 2F on the side of the element formation surface 2A, and thus in the composite chip 1, the back surface 2B is a flat surface without any electrode (projections and recesses). Hence, when the suction nozzle 91 is made to suck the composite chip 1 and is moved, the suction nozzle 91 can be made to suck the flat back surface 2B. In other words, when the back surface 2B is flat, it is possible to increase the margin of a part that the suction nozzle 91 can suck. In this way, it is possible to reliably make the suction nozzle 91 suck the composite chip 1 and to reliably transport the composite chip 1 without the composite chip 1 being dropped from the suction nozzle 91 halfway through.

Since the composite chip 1 is a pair chip that includes a pair of the resistor 6 and the capacitor 101, as compared with a case where a single chip on which only one of the resistor and the capacitor is mounted twice, the chip part having the same function can be mounted by performing only one mounting operation. Furthermore, as compared with a single chip, the area of the back surface per chip can be increased beyond the area of the back surface corresponding to two resistors or two capacitors, with the result that it is possible to stabilize the suction operation by the suction nozzle 91.

Then, the suction nozzle 91 sucking the composite chip 1 is moved to the mounting substrate 9. Here, the element formation surface 2A of the composite chip 1 and the mounting surface 9A of the mounting substrate 9 are opposite each other. In this state, the suction nozzle 91 is moved to be pressed onto the mounting substrate 9, and thus in the composite chip 1, the first connection electrode 3 and the second connection electrode 4 are brought into contact with the solder 13 of each land 88.

Then, when the solder 13 is heated, the solder 13 is melted. Thereafter, when the solder 13 is cooled to be solidified, the first connection electrode 3, the second connection electrode 4 and the land 88 are joined via the solder 13. In other words, each land 88 is joined by solder to the corresponding electrode in the first connection electrode 3 and the second connection electrode 4. In this way, the mounting (flip-chip connection) of the composite chip 1 on the mounting substrate 9 is finished, with the result that the circuit assembly 100 is completed.

In the completed circuit assembly 100, the element formation surface 2A of the composite chip 1 and the mounting surface 9A of the mounting substrate 9 are opposite each other through a gap, and extend parallel to each other. In the first connection electrode 3 or the second connection electrode 4, the dimension of the gap corresponds to the total of the thickness of a part protruding from the element formation surface 2A and the thickness of the solder 13.

In the circuit assembly 100, the peripheral edge portions 86 and 87 of the first connection electrode 3 and the second connection electrode 4 are formed so as to straddle the element formation surface 2A and the side surfaces 2C to 2F (in FIG. 1B, only the side surfaces 2C and 2D are shown) of the substrate 2. Hence, it is possible to enlarge an adhesion area when the composite chip 1 is soldered to the mounting substrate 9. Consequently, since it is possible to increase the adsorbed amount of solder 13 to the first connection electrode 3 and the second connection electrode 4, it is possible to enhance the adhesion strength.

In the mounted state, the chip part can be retained from at least two directions of the element formation surface 2A and the side surfaces 2C to 2F of the substrate 2. Hence, it is possible to stabilize the mounting shape of the chip part 1. Moreover, since the chip part 1 mounted on the mounting substrate 9 can be supported by four points, that is, the four lands 88, it is possible to further stabilize the mounting shape of the chip part 1.

The composite chip 1 is a pair chip that includes a pair of the resistor 6 having a 03015 size and the capacitor 101. Hence, it is possible to significantly reduce the area of the mounting region 89 for the composite chip 1 as compared with a conventional one.

For example, in the preferred embodiment, with reference to FIG. 1C, the area of the mounting region 89 is only L3×L3=(L2+L1+L2)×(L2+L1+L2)=(25+410+25)×(25+410+25)=211600 μm².

On the other hand, as shown in FIG. 1E, when two single chips 300 having a 0402 size, which is the minimum size that can be conventionally produced, are mounted on the mounting surface 9A of the mounting substrate 9, a mounting region 301 of 319000 μm² is needed. Hence, when the area of the mounting region 89 of the preferred embodiment is compared with the area of the conventional mounting region 301, it is found that in the arrangement of the preferred embodiment, it is possible to reduce the mounting area by about 34%.

The area of the mounting region 301 of FIG. 1E is calculated to be (L6+L4+L5+L4+L6)×(L6+L7+L6)=(25+250+30+250+25)×(25+500+25)=319000 μm² based on the width L4 of the mounting area 302 of each single chip 300 where lands 304 are arranged=250 μm, the distance L5 between the adjacent mounting areas 302=30 μm, the width L6 of a solder resist region 303 forming the outer periphery of the mounting region 301=25 μm and the length L7 of the mounting area 302=500 μm.

Then, the arrangement of the resistor 6 will be described in more detail with reference to FIGS. 2 to 9, and thereafter the arrangement of the capacitor 101 will be described in more detail with reference to FIGS. 10 to 13.

Figure 2:
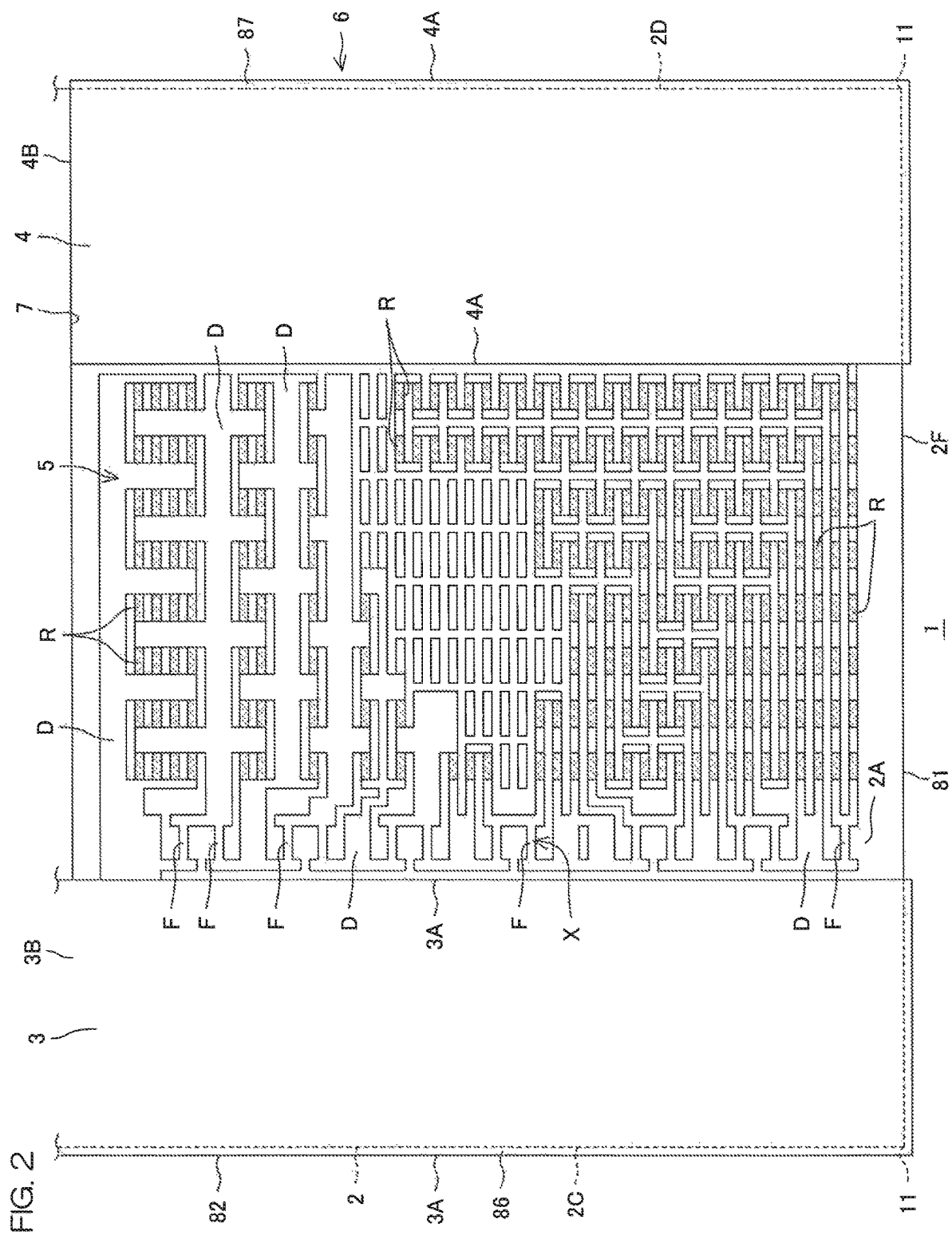
FIG. 2 is a plan view of the resistor of the composite chip, a drawing showing a positional relationship between a first connection electrode, a second connection electrode and an element and the arrangement of the element in plan view.

FIG. 2 is a plan view of the resistor 6 of the composite chip 1, a drawing showing a positional relationship between the first connection electrode 3, the second connection electrode 4 and the element 5 and the arrangement (layout pattern) of the element 5 in plan view.

With reference to FIG. 2, the element 5 is a circuit element, is formed in a region between the first connection electrode 3 and the second connection electrode 4 in the element formation surface 2A of the substrate 2 and is coated from above with the passivation film 23 and the resin film 24. In the resistor 6, the element 5 is a resistor portion.

The element 5 (resistor portion) of the resistor 6 is a resistor circuit network in which a plurality of (unit) resistor bodies R having equal resistance values are arrayed on the element formation surface 2A in a matrix. Specifically, the element 5 includes a total of 352 resistor bodies R formed with 8 resistor bodies R arrayed along a row direction (the vertical direction of the substrate 2) and 44 resistor bodies R arrayed along a column direction (the horizontal direction of the substrate 2). These resistor bodies R are a plurality of element factors that form the resistor circuit network of the element 5.

A large number of the resistor bodies R are collected every predetermined number of 1 to 64 pieces and are electrically connected, and thus a plurality of types of resistor circuits are formed. The plurality of types of resistor circuits formed are connected by a conductive film D (wiring film formed with a conductor) so as to have a predetermined aspect. Furthermore, in the element formation surface 2A of the substrate 2, a plurality of fuses F are provided which can be cut (blown) such that the resistor circuit is electrically incorporated into the element 5 or is electrically separated from the element 5.

The plurality of fuses F and the conductive film D are arrayed along the inner side of the first connection electrode 3 such that the arrangement region thereof is formed linearly. More specifically, the plurality of fuses F and the conductive film D are arranged so as to be adjacent to each other, and the direction of the array thereof is linear. The plurality of fuses F connect the plurality of types of resistor circuits (a plurality of resistor bodies R per resistor circuit) to the first connection electrode 3 such that the types of resistor circuits can be individually cut (separated) from the first connection electrode 3.

Figure 3A:
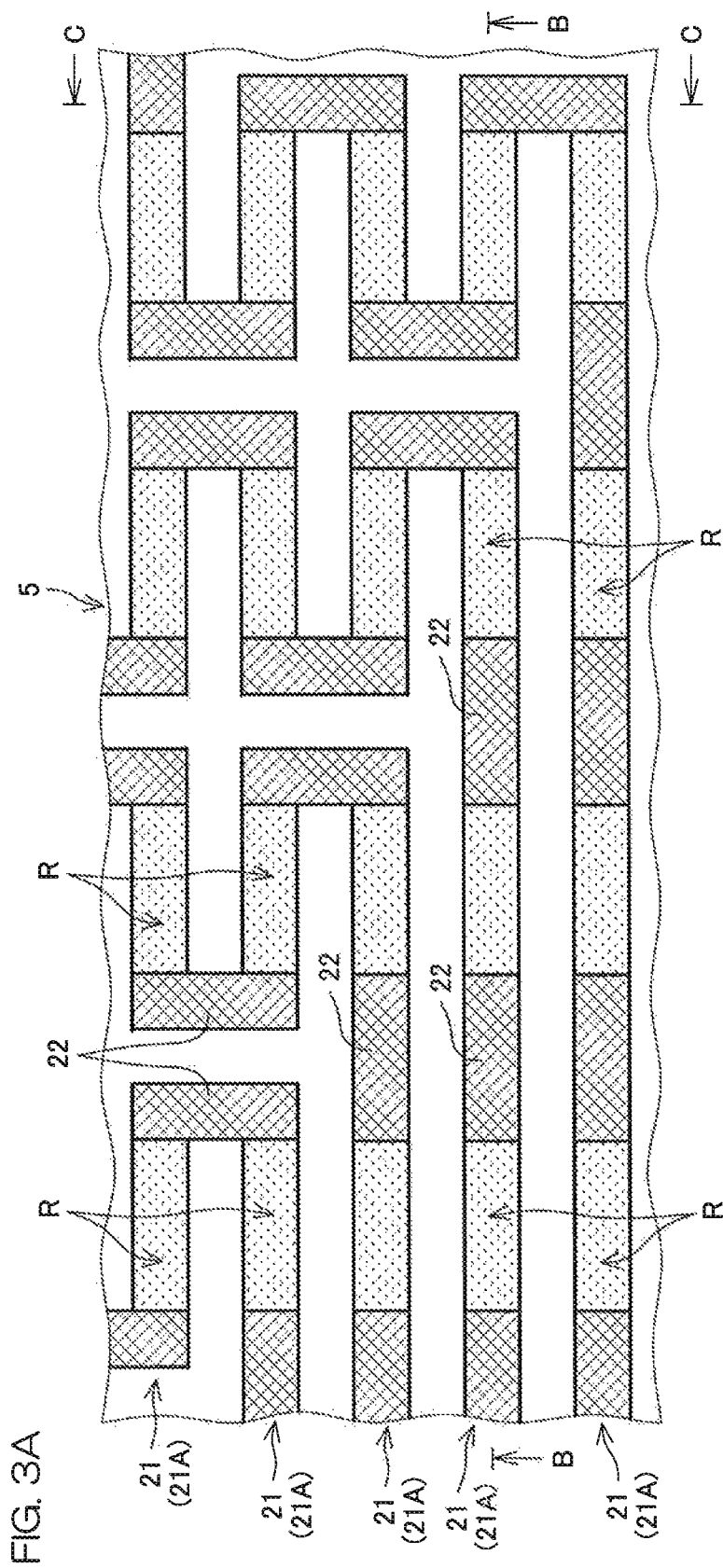
FIG. 3A is a plan view depicting an enlarged part of the element shown in FIG. 2.
Figure 3B:
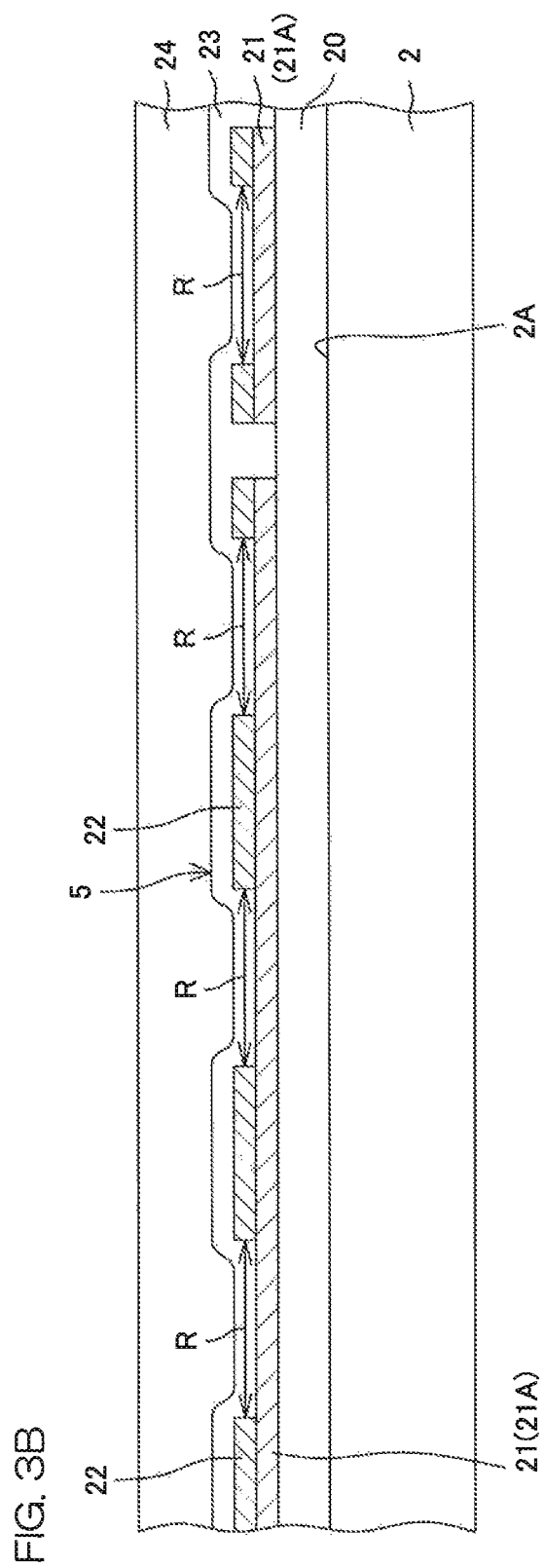
FIG. 3B is a vertical cross-sectional view depicted for illustrating the arrangement of resistor bodies of the element in a length direction along line B-B of FIG. 3A.
Figure 3C:
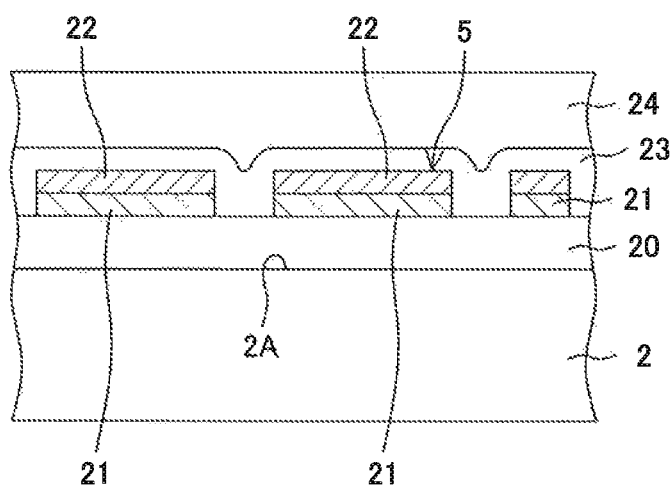
FIG. 3C is a vertical cross-sectional view depicted for illustrating the arrangement of the resistor bodies of the element in a width direction along line C-C of FIG. 3A.

FIG. 3A is a plan view depicting an enlarged part of the element 5 shown in FIG. 2. FIG. 3B is a vertical cross-sectional view depicted for illustrating the arrangement of the resistor bodies R of the element 5 in a length direction along line B-B of FIG. 3A. FIG. 3C is a vertical cross-sectional view depicted for illustrating the arrangement of the resistor bodies R of the element 5 in a width direction along line C-C of FIG. 3A.

The arrangement of the resistor bodies R will be described with reference to FIGS. 3A, 3B and 3C.

The resistor 6 of the composite chip 1 further includes an insulating film 20 and a resistor body film 21 in addition to the wiring film 22, the passivation film 23 and the resin film 24 described above (see FIGS. 3B and 3C). The insulating film 20, the resistor body film 21, the wiring film 22, the passivation film 23 and the resin film 24 are formed on the substrate 2 (the element formation surface 2A).

The insulating film 20 is formed of $SiO_2$ (oxide silicon). The insulating film 20 covers the entire region of the element formation surface 2A of the substrate 2 including a boundary region 7 (see FIG. 1A) between the resistor 6 and the capacitor 101. The thickness of the insulating film 20 is about 10000 angstroms.

The resistor body film 21 is formed on the insulating film 20. The resistor body film 21 is formed of TiN, TiON or TiSiON. The thickness of the resistor body film 21 is about 2000 angstroms. The resistor body film 21 forms a plurality of lines of resistor body film (hereinafter referred to as "resistor body film lines 21A") that extend linearly parallel to each other between the first connection electrode 3 and the second connection electrode 4. The resistor body film line 21A may be cut in a predetermined position in the direction of the line (see FIG. 3A).

On the resistor body film line 21A, the wiring film 22 is laminated. The wiring film 22 is formed of Al (aluminum) or an alloy (AlCu alloy) of aluminum and Cu (copper). The thickness of the wiring film 22 is about 8000 angstroms. The wiring films 22 are laminated on the resistor body film line 21A a given distance R apart in the direction of the line, and are in contact with the resistor body film line 21A.

Figure 4A:
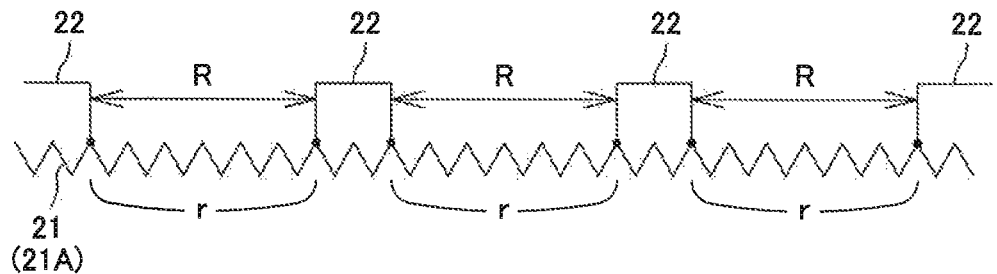
FIG. 4A, FIG. 4B, and FIG. 4C are drawings showing the electrical characteristics of a resistor body film line and a wiring film with circuit symbols and electrical circuit diagrams.
Figure 4B:
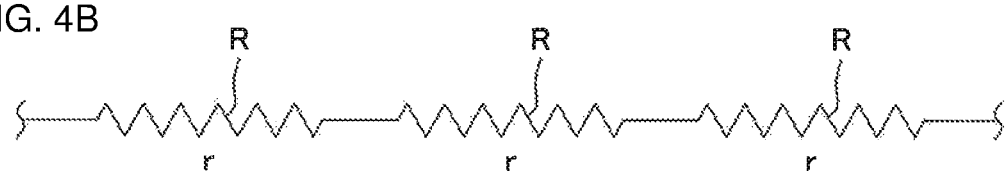
Figure 4C:
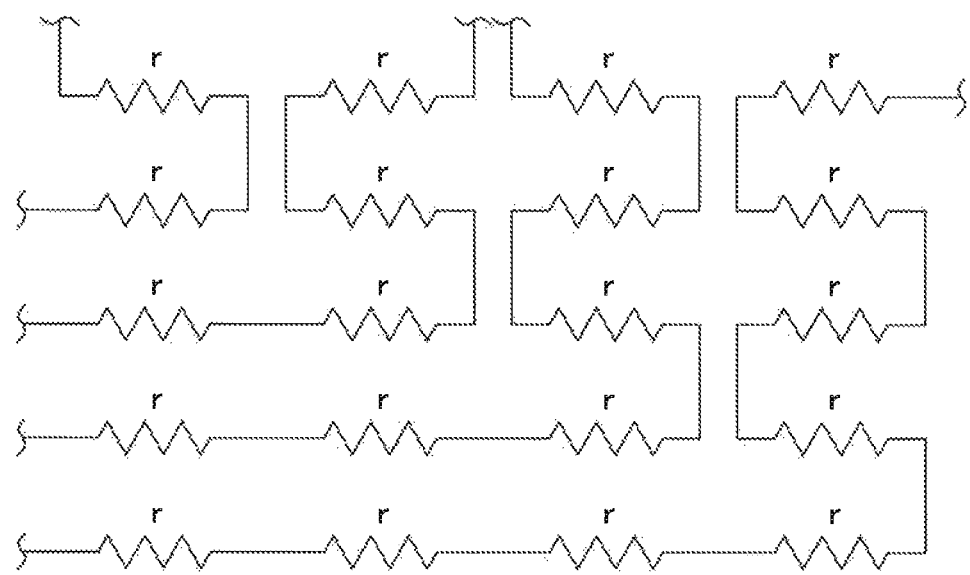

The electrical characteristics of the resistor body film line 21A and the wiring film 22 in this arrangement are shown with circuit symbols in FIG. 4. Specifically, as shown in FIG. 4($a$), the part of the resistor body film line 21A in the region of the given distance R forms one resistor body R having a given resistance value r.

In the region where the wiring film 22 is laminated, the wiring film 22 electrically connects the adjacent resistor bodies R, and thus the resistor body film line 21A is short-circuited by the wiring film 22. Consequently, the resistor circuit is formed with the resistor bodies R of the resistor portion r shown in FIG. 4($b$) and connected in series.

The adjacent resistor body film lines 21A are connected with the resistor body film 21 and the wiring film 22, and thus the resistor circuit network of the element 5 shown in FIG. 3A forms the resistor circuit shown in FIG. 4($c$) (formed with the unit resistor portions of the resistor bodies R described above). As described above, the resistor body film 21 and the wiring film 22 form the resistor bodies R and the resistor circuit (that is, the element 5). Each resistor body R includes the resistor body film line 21A (the resistor body film 21) and a plurality of wiring films 22 laminated the given distance apart on the resistor body film line 21A in the direction of the line, and the resistor body film line 21A in the part of the given distance R where the wiring film 22 is not laminated forms one resistor body R. All the shapes and the sizes of the resistor body film lines 21A in the parts forming the resistor bodies R are equal to each other. Hence, a large number of resistor bodies R arrayed in a matrix on the substrate 2 have equal resistance values.

The wiring film 22 laminated on the resistor body film line 21A forms the resistor bodies R and also functions as the conductive film D for forming the resistor circuit by connecting the plurality of resistor bodies R (see FIG. 2).

FIG. 5(a) is a partially enlarged plan view of a region including fuses F depicting an enlarged part of a plan view of the resistor 6 shown in FIG. 2, and FIG. 5(b) is a drawing showing a cross-sectional structure along line B-B of FIG. 5(a).

As shown in FIGS. 5(a) and 5(b), the fuses F and the conductive film D described above are also formed with the wiring film 22 laminated on the resistor body film 21 forming the resistor bodies R. Specifically, in the same layer as the wiring film 22 laminated on the resistor body film line 21A forming the resistor bodies R, the fuses F and the conductive film D are formed of Al or AlCu alloy, which is the same metal material as the wiring film 22. As described previously, in order to form the resistor circuit, the wiring film 22 is also used as the conductive film D electrically connecting the plurality of resistor bodies R.

In other words, in the same layer laminated on the resistor body film 21, the wiring film for forming the resistor bodies R, the fuses F, the conductive film D and furthermore, the wiring film for connecting the element 5 to the first connection electrode 3 and the second connection electrode 4 are formed, as the wiring film 22, of the same metal material (Al or AlCu alloy). The fuse F differs from (is distinguished from) the wiring film 22 in that the fuse F is formed to be thin so as to be easily cut and that other circuit elements are prevented from being present around the fuses F.

Here, in the wiring film 22, a region where the fuse F is arranged is referred to as a trimming target region X (see FIGS. 2 and 5(a).) The trimming target region X is a linear region along the inner side of the first connection electrode 3, and in the trimming target region X, not only the fuse F but also the conductive film D is arranged. Below the wiring film 22 in the trimming target region X, the resistor body film 21 is also formed (see FIG. 5(b)). The fuse F is a wiring in which a wiring-to-wiring distance is larger than that in the parts other than the trimming target region X in the wiring film 22 (which is separated from the surrounding area).

The fuse F may indicate not only a part of the wiring film 22 but also a combination (fuse element) of a part of the resistor body R (the resistor body film 21) and a part of the wiring film 22 on the resistor body film 21.

Although only the case where in the fuse F, the same layer as the conductive film D is used is described, in the conductive film D, another conductive film may be further laminated thereon such that the resistance value of the entire conductive film D is lowered. Even in this case, unless the conductive film is laminated on the fuse F, the blowing property of the fuse F is prevented from being degraded.

Figure 6:
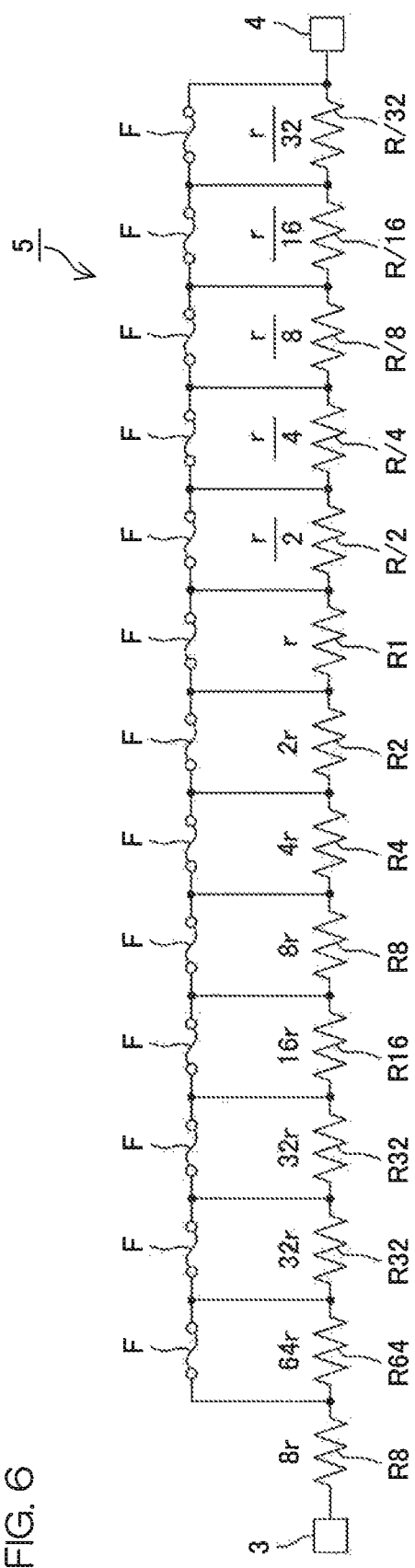
FIG. 6 is an electrical circuit diagram according to a preferred embodiment of the element of the resistor.

FIG. 6 is an electrical circuit diagram of a preferred embodiment of the element 5 of the resistor 6.

With reference to FIG. 6, the element 5 is formed by connecting in series, from the first connection electrode 3, in the following order, a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16 and a resistor circuit R/32.

Each of the reference resistor circuit R8 and the resistor circuits R64 to R2 is formed by connecting in series the same number of resistor bodies R as the number at the end of itself (in the case of R64, "64"). The resistor circuit R1 is formed with one resistor body R. Each of the resistor circuits R/2 to R/32 is formed by connecting in parallel the same number of resistor bodies R as the number at the end of itself (in the case of R/32, "32"). The meaning of the number at the end of the resistor circuit is the same as in FIGS. 7 and 8, which will be described later.

One fuse F is connected in parallel to each of the resistor circuits R64 to R/32 other than the reference resistor circuit R8. The fuses F are connected in series either directly or via the conductive film D (see FIG. 5(a)).

As shown in FIG. 6, in a state where no fuses F are blown, the element 5 forms the resistor circuit of the reference resistor circuit R8 that is formed with 8 resistor bodies R connected in series between the first connection electrode 3 and the second connection electrode 4. For example, when the resistance value r of one resistor body R is assumed to be r=8Ω, the resistor circuit (the reference resistor circuit R8) of 8r=64Ω forms the resistor 6 to which the first connection electrode 3 and the second connection electrode 4 are connected.

In the state where no fuses F are blown, a plurality of types of resistor circuits other than the reference resistor circuit R8 are short-circuited. Specifically, although 13 resistor circuits R64 to R/32 of 12 types are connected in series to the reference resistor circuit R8, since each of the resistor circuits is short-circuited by the fuse F which is connected in parallel thereto, the resistor circuits are not electrically incorporated into the element 5.

In the resistor 6 according to the preferred embodiment, the fuse F is selectively blown by, for example, laser light according to the required resistance value. In this way, the resistor circuit in which the fuse F connected in parallel thereto is blown is incorporated into the element 5. Hence, the resistance value of the entire element 5 can be changed into a resistance value obtained by connecting in series and incorporating the resistor circuit corresponding to the blown fuse F.

In particular, a plurality of types of resistor circuits include a plurality of types of series resistor circuits in which the resistor bodies R having equal resistance values are connected while the number of resistor bodies R is being increased geometrically with a geometric ratio of 2 such that 1 piece, 2 pieces, 4 pieces, 8 pieces, 16 pieces, 32 pieces, . . . are connected in series and a plurality of types of parallel resistor circuits in which the resistor bodies R having equal resistance values are connected while the number of resistor bodies R is being increased geometrically with a geometric ratio of 2 such that 2 pieces, 4 pieces, 8 pieces, 16 pieces, . . . are connected in parallel. Hence, the fuses F (including the fuse element described above) are selectively blown, and thus the resistance value of the entire element 5 (resistor portion) is finely and digitally adjusted to be an arbitrary resistance value, with the result that the resistor portion of a desired value can be produced in each resistor 6.

Figure 7:
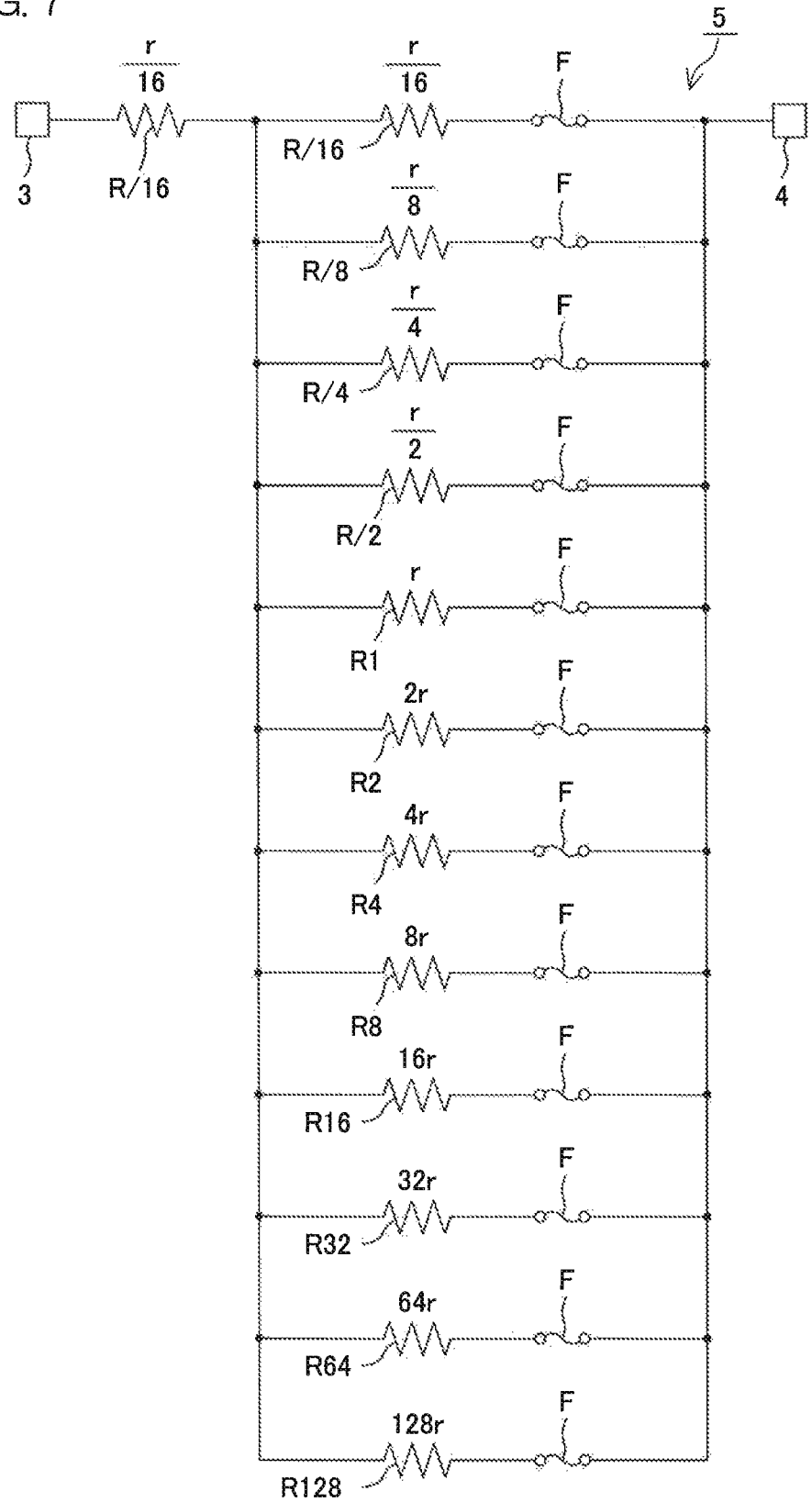
FIG. 7 is an electrical circuit diagram according to another preferred embodiment of the element of the resistor.

FIG. 7 is an electrical circuit diagram of another preferred embodiment of the element 5 of the resistor 6.

Instead of forming the element 5 by connecting, in series, the reference resistor circuit R8 and the resistor circuits R64 to R/32 as shown in FIG. 6, as shown in FIG. 7, the element 5 may be formed. Specifically, between the first connection electrode 3 and the second connection electrode 4, the element 5 may be formed with a series connection circuit of the reference resistor circuit R/16 and a parallel connection circuit of 12 types of resistor circuits R/16, R/8, R/4, R/2, R1, R2, R4, R8, R16, R32, R64 and R128.

In this case, the fuse F is connected in series to each of the 12 types of resistor circuits other than the reference resistor circuit R/16. In the state where no fuses F are blown, the resistor circuits are electrically incorporated into the element 5. The fuses F are selectively blown by, for example, laser light according to the required resistance value, and thus the resistor circuits (the resistor circuits to which the fuses F are connected in series) corresponding to the blown fuses F are electrically separated from the element 5, with the result that the resistance value of the entire resistors 6 can be adjusted.

Figure 8:
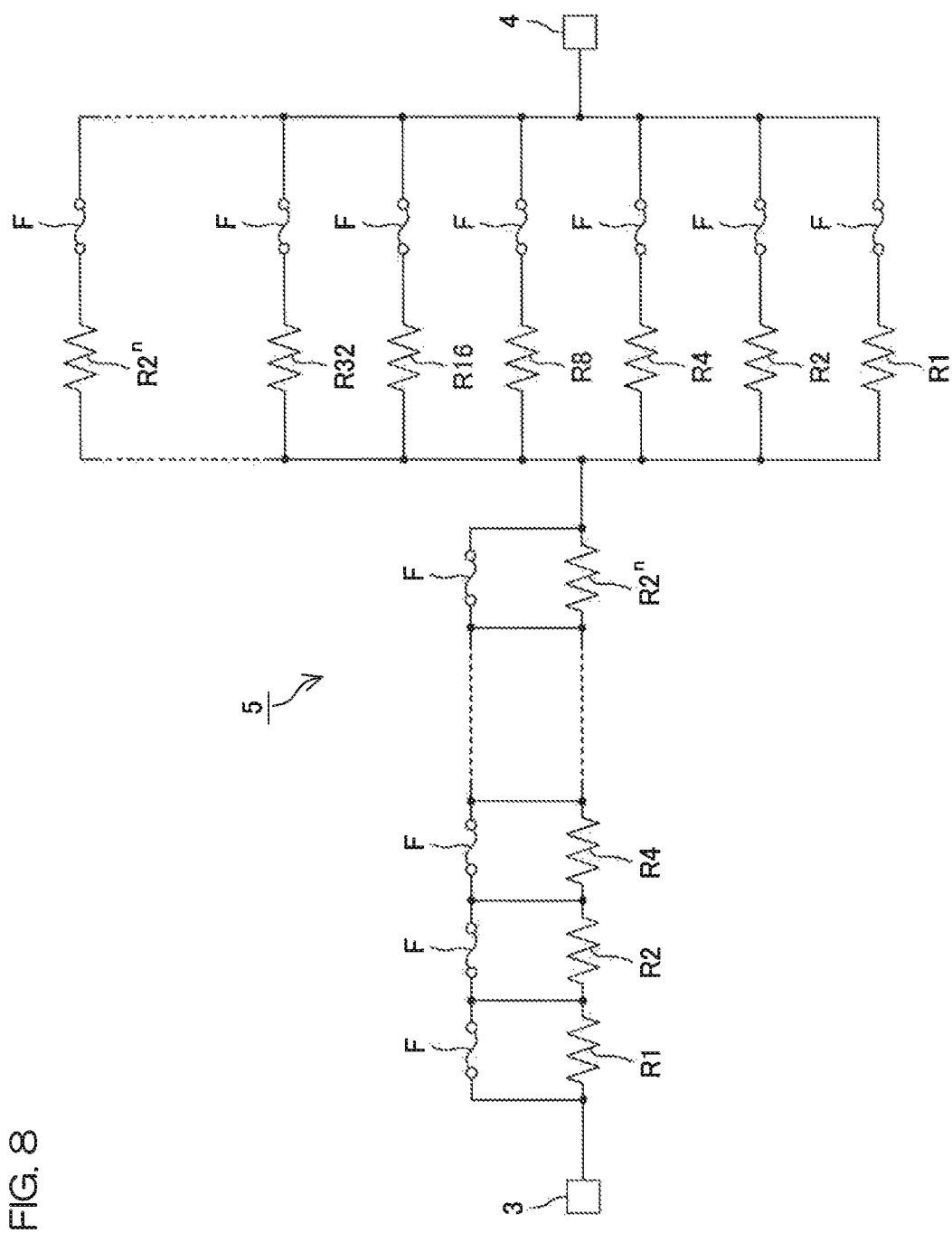
FIG. 8 is an electrical circuit diagram according to yet another preferred embodiment of the element of the resistor.

FIG. 8 is an electrical circuit diagram according to yet another preferred embodiment of the element 5 of the resistor 6.

The feature of the element 5 shown in FIG. 8 is a circuit arrangement in which a series connection of a plurality of types of resistor circuits and a parallel connection of a plurality of types of resistor circuits are connected in series. In the plurality of types of resistor circuits connected in series, as in the preferred embodiment described previously, the fuse F is connected in parallel to each of the resistor circuits, and all the types of the resistor circuits connected in series are short-circuited by the fuses F. Hence, when the fuse F is blown, the resistor circuit short-circuited by the blown fuse F is electrically incorporated into the element 5.

On the other hand, the fuse F is connected in series to each of the types of resistor circuits connected in parallel. Hence, the fuse F is blown, and thus it is possible to electrically separate the resistor circuit to which the blown fuse F is connected in series from the parallel connection of the resistor circuits.

In the arrangement described above, for example, small resistor portions of 1 kΩ or less are produced on the side of the parallel connection, and the resistor circuits of 1 kΩ or more are produced on the side of the series connection, and thus the resistor circuits in a wide range from small resistor portions of a few ohms to large resistor portions of a few mega ohms can be produced with a resistor circuit network formed with the same basic design. That is, in each resistor 6, one or a plurality of fuses F are selectively cut, and thus it is possible to easily and quickly cope with a plurality of types of resistance values. In other words, a plurality of resistor bodies R having different resistance values are combined, and thus it is possible to realize the resistors 6 of various resistance values with the common design.

As described above, in the composite chip 1, the state of the connection of a plurality of resistor bodies R (resistor circuits) can be changed in the trimming target region X.

Figure 9:
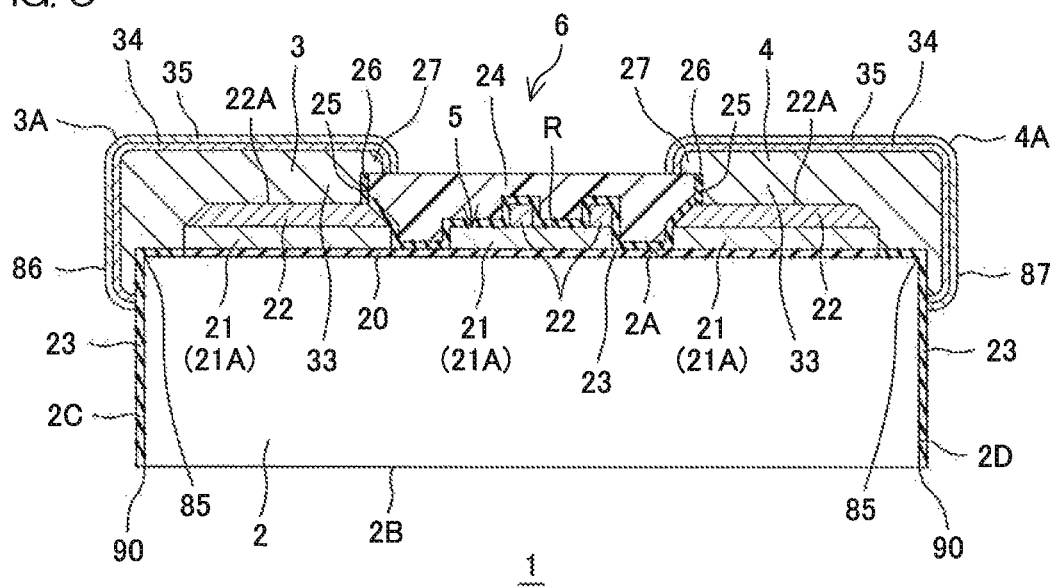
FIG. 9 is a schematic cross-sectional view of the resistor.

FIG. 9 is a schematic cross-sectional view of the resistor 6.

The resistor 6 will then be described in more detail with reference to FIG. 9. For ease of description, in FIG. 9, the element 5 described above is shown by being simplified and the factors other than the substrate 2 are hatched.

Here, the insulating film 20, the passivation film 23 and the resin film 24 discussed above will be described.

As described above, the insulating film 20 covers the entire region of the element formation surface 2A of the substrate 2.

The passivation film 23 is formed of, for example, SiN (silicon nitride), and its thickness is 1000 to 5000 angstroms (here, about 3000 angstroms). The passivation film 23 is provided substantially over the entire regions of the element formation surface 2A and the side surfaces 2C to 2F. As shown in FIG. 9, the passivation film 23 on the element formation surface 2A coats, from the surface (the upper side of FIG. 9), the resistor body film 21 and the wiring films 22 on the resistor body film 21 (that is, the element 5) to cover the upper surface of the resistor bodies R in the element 5. Hence, the passivation film 23 also covers the wiring film 22 in the trimming target region X described above (see FIG. 5(b)). The passivation film 23 is in contact with the element 5 (the wiring film 22 and the resistor body film 21), and is also in contact with the insulating film 20 in the region other than the resistor body film 21. The passivation film 23 also covers the boundary region 7. In this way, the passivation film 23 on the element formation surface 2A functions as a protective film that covers the entire region of the element formation surface 2A to protect the element 5 and the insulating film 20. On the element formation surface 2A, the passivation film 23 prevents the part other than the wiring film 22 between the resistor bodies R from being short-circuited (short-circuited between the adjacent resistor body film lines 21A).

On the other hand, the passivation film 23 provided on the side surfaces 2C to 2F is interposed between the side surface parts of the first connection electrode 3 and the second connection electrode 4 and the side surfaces 2C to 2F of the substrate 2, and functions as a protective layer that protects the side surfaces 2C to 2F. In this way, when it is desired to prevent the first connection electrode 3 and the second connection electrode 4 and the substrate 2 from being short-circuited, it is possible to cope with such a requirement. Since the passivation film 23 is an extremely thin film, in the preferred embodiment, the passivation film 23 that covers the side surfaces 2C to 2F is assumed to be a part of the substrate 2. Hence, the passivation film 23 that covers the side surfaces 2C to 2F is assumed to be the side surfaces 2C to 2F themselves.

The resin film 24 protects, together with the passivation film 23, the element formation surface 2A of the composite chip 1, and is formed of a resin such as polyimide. The thickness of the resin film 24 is about 5 μm.

As shown in FIG. 9, the resin film 24 coats the entire region of the surface (including the resistor body film 21, the wiring film 22 and the boundary region 7 coated with the passivation film 23) of the passivation film 23 on the element formation surface 2A.

In the resin film 24, a cutout portion 25 that exposes a peripheral edge portion opposite the side surface parts of the first connection electrode 3 and the second connection electrode 4 in the wiring film 22 is individually formed in the resistor 6. Each cutout portion 25 continuously penetrates the resin film 24 and the passivation film 23 in the direction of the thickness thereof. Hence, the cutout portions 25 are formed not only in the resin film 24 but also in the passivation film 23. In this way, in each wiring film 22, a peripheral edge portion on the inner side close to the element 5 and a peripheral edge portion opposite the capacitor 101 are selectively covered by the resin film 24, and the other peripheral edge portion along the peripheral edge portion 85 of the substrate 2 is selectively exposed via the cutout portion 25. The surface exposed from each cutout portion 25 in the wiring film 22 serves as a pad region 22A for external connection.

The wiring film 22 exposed from the cutout portion 25 is arranged a predetermined distance (for example, 3 to 6 μm) apart, inwardly from the peripheral edge portion 85 of the substrate 2 in the element formation surface 2A. On the side surface of the cutout portion 25, an insulating film 26 is formed overall.

Among the two cutout portions 25 in the resistor 6, the first connection electrode 3 is completely embedded in one cutout portion 25, and the second connection electrode 4 is completely embedded in the other cutout portion 25. As described previously, the first connection electrode 3 and the second connection electrode 4 include the peripheral edge portions 86 and 87 covering not only the element formation surface 2A but also the side surfaces 2C to 2F. The first connection electrode 3 and the second connection electrode 4 are formed so as to protrude from the resin film 24, and include a drawing portion 27 that is drawn along the surface of the resin film 24 to the side of the element 5 and the side of the boundary region 7 of the substrate 2.

Here, each of the first connection electrode 3 and the second connection electrode 4 has, from the side of the element formation surface 2A and the side of the side surfaces 2C to 2F, a Ni layer 33, a Pd layer 34 and an Au layer 35 in this order. In other words, each of the first connection electrode 3 and the second connection electrode 4 has a laminated structure formed with the Ni layer 33, the Pd layer 34 and the Au layer 35 not only in the region on the element formation surface 2A but also in the region on the side surfaces 2C to 2F. Hence, in each of the first connection electrode 3 and the second connection electrode 4, the Pd layer 34 is interposed between the Ni layer 33 and the Au layer 35. In each of the first connection electrode 3 and the second connection electrode 4, the Ni layer 33 covers a large proportion of the connection electrodes, and the Pd layer 34 and the Au layer 35 are formed to be significantly thin as compared with the Ni layer 33. When the composite chip 1 is mounted on the mounting substrate 9 (see FIGS. 1B to 1D), the Ni layer 33 has a role in relaying the Al of the wiring film 22 in the pad region 22A of each cutout portion 25 to the solder 13 described previously.

As described above, since in the first connection electrode 3 and the second connection electrode 4, the surface of the Ni layer 33 is covered by the Au layer 35, the Ni layer 33 is prevented from being oxidized. In the first connection electrode 3 and the second connection electrode 4, even if the thickness of the Au layer 35 is reduced, and thus a through-hole (pinhole) is produced in the Au layer 35, since the through-hole is blocked by the Pd layer 34 interposed between the Ni layer 33 and the Au layer 35, it is possible to prevent the Ni layer 33 from being exposed from the through-hole to the outside so as to be oxidized.

In each of the first connection electrode 3 and the second connection electrode 4, the Au layer 35 is exposed to the uppermost surface. The first connection electrode 3 is electrically connected via one cutout portion 25 to the wiring film 22 in the pad region 22A of this cutout portion 25. The second connection electrode 4 is electrically connected via the other cutout portion 25 to the wiring film 22 in the pad region 22A of this cutout portion 25. In each of the first connection electrode 3 and the second connection electrode 4, the Ni layer 33 is connected to the pad region 22A. In this way, each of the first connection electrode 3 and the second connection electrode 4 is electrically connected to the element 5. Here, the wiring film 22 forms the wiring connected to each of a collection of the resistor bodies R, the first connection electrode 3 and the second connection electrode 4.

As described above, the resin film 24 and the passivation film 23 where the cutout portions 25 are formed cover the element formation surface 2A with the first connection electrode 3 and the second connection electrode 4 exposed from the cutout portions 25. Hence, via the first connection electrode 3 and the second connection electrode 4 projected (protruded) from the cutout portions 25 in the surface of the resin film 24, electrical connection between the composite chip 1 and the mounting substrate 9 can be achieved (see FIGS. 1B to 1D).

Figure 10:
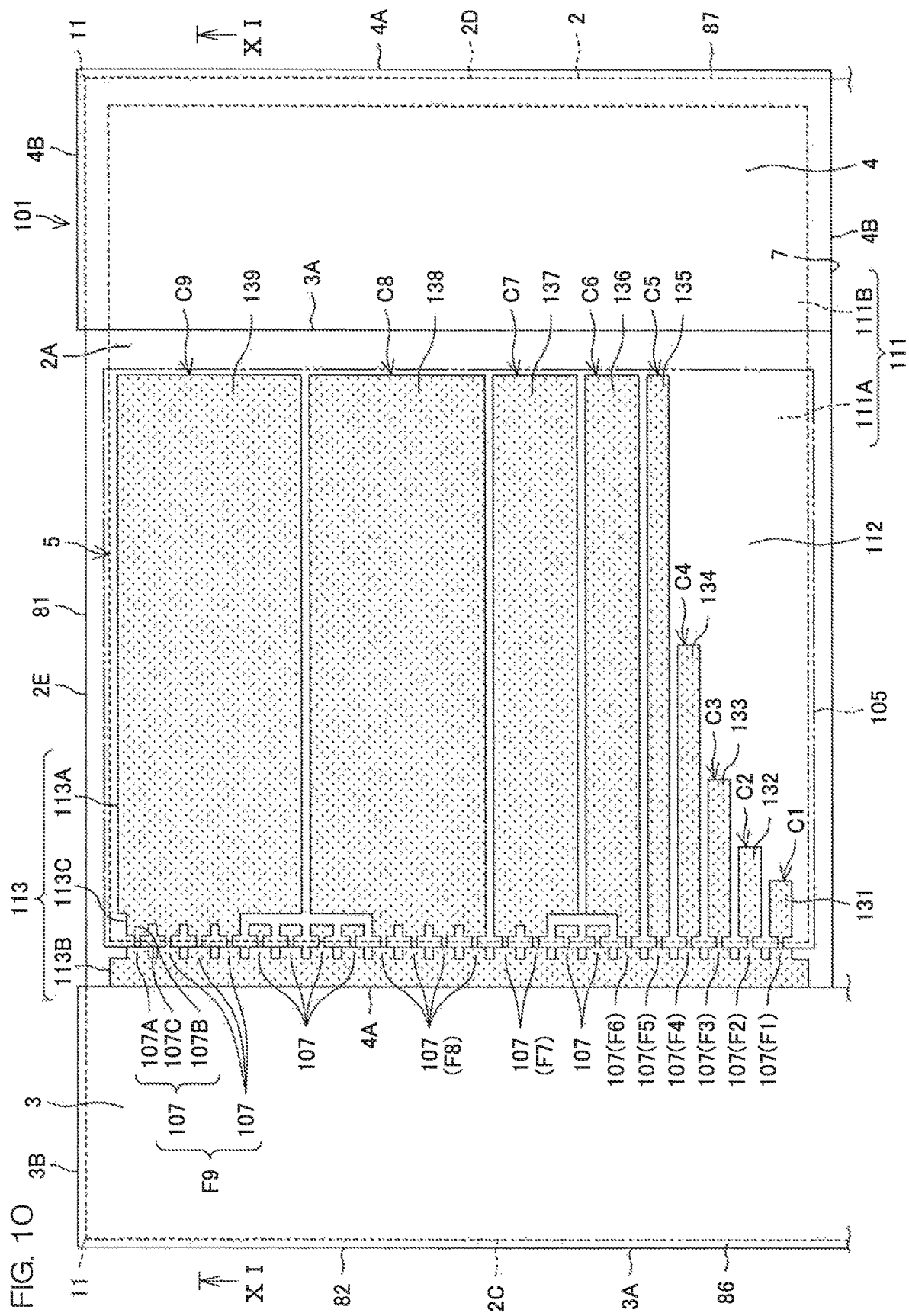
FIG. 10 is a plan view of the capacitor of the composite chip, a drawing showing a positional relationship between a first connection electrode, a second connection electrode and an element and the arrangement of the element in plan view.
Figure 11:
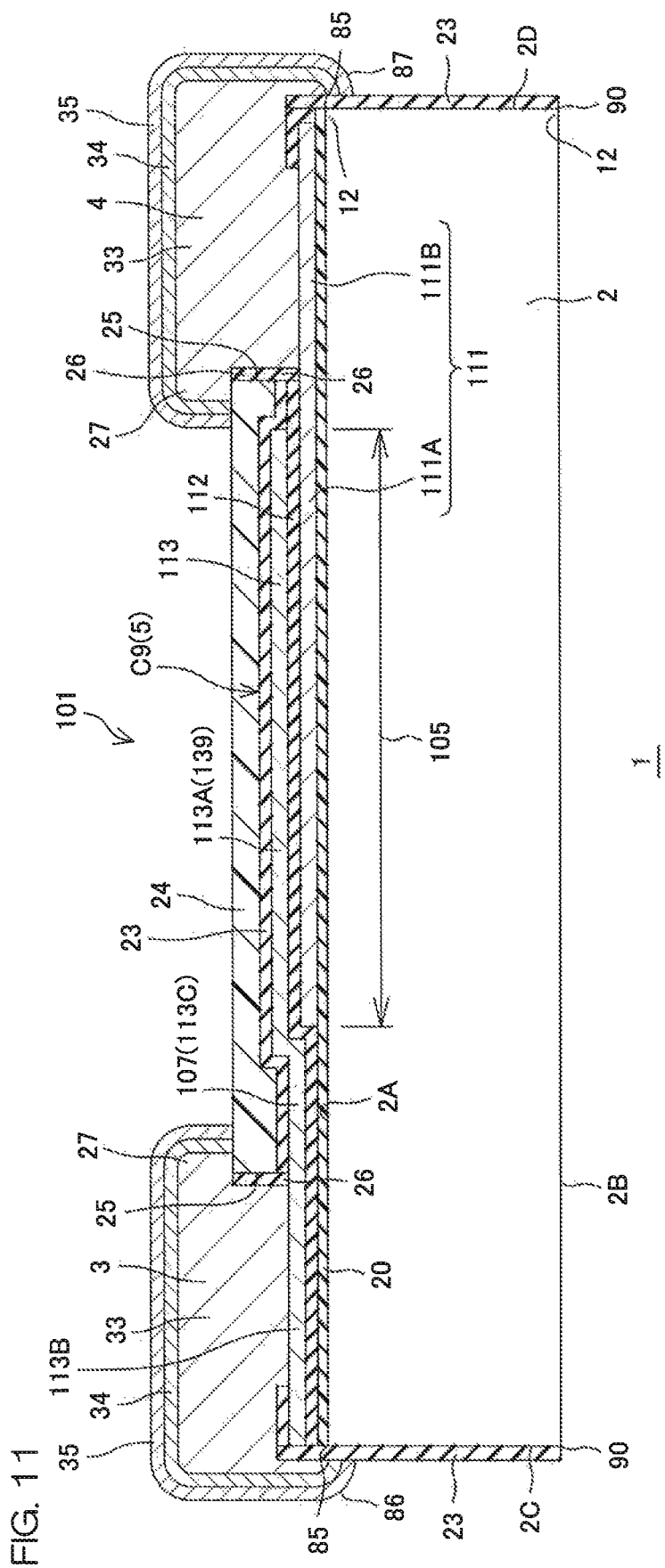
FIG. 11 is a schematic cross-sectional view of the capacitor, a drawing showing a cross-sectional structure along line XI-XI of FIG. 10.
Figure 12:
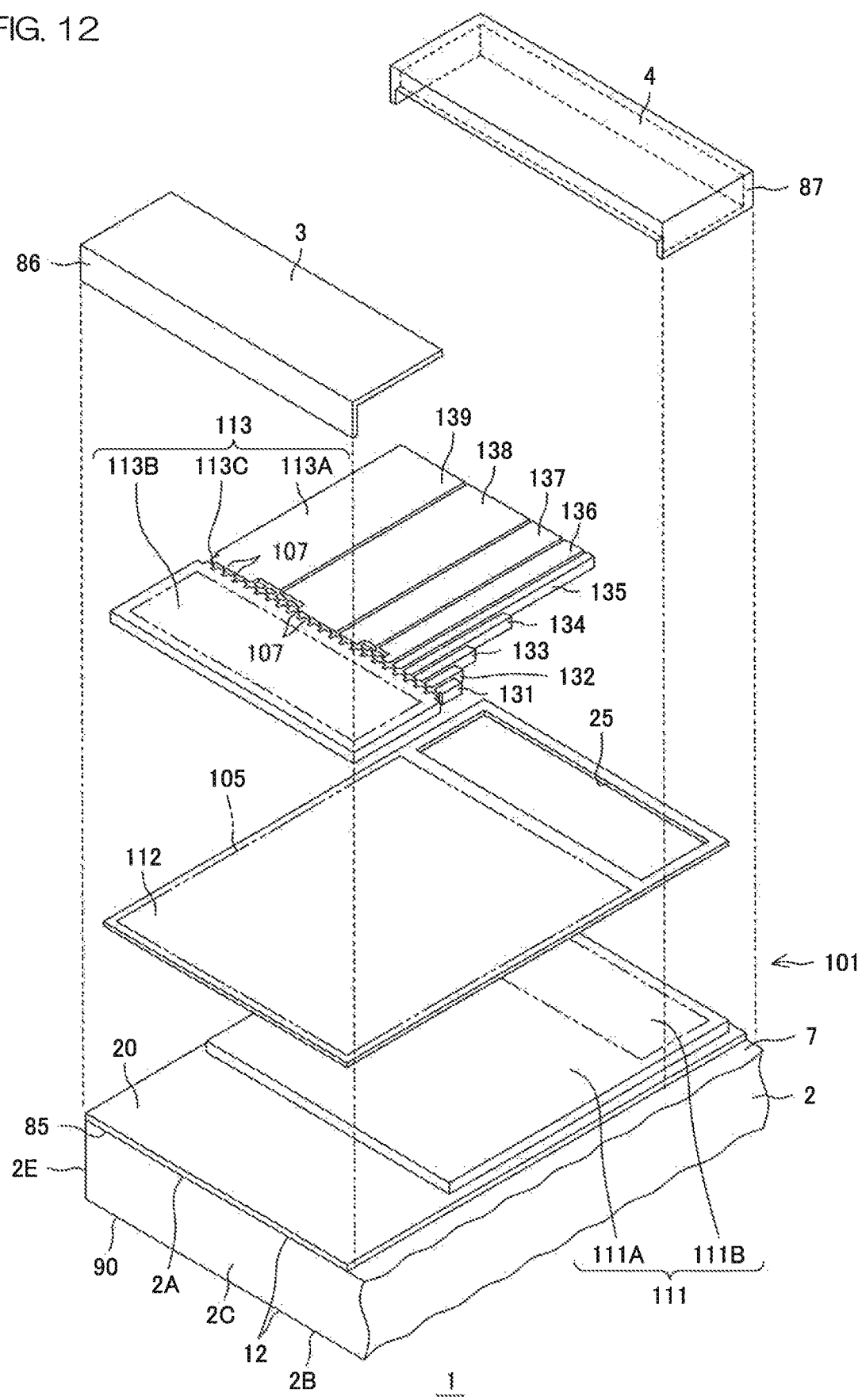
FIG. 12 is an exploded perspective view separately showing the arrangement of part of the capacitor.

FIG. 10 is a plan view of the capacitor 101 of the composite chip 1, a drawing showing a positional relationship between the first connection electrode 3, the second connection electrode 4 and the element 5 and the arrangement of the element 5 in plan view. FIG. 11 is a schematic cross-sectional view of the capacitor 101, a drawing showing a cross-sectional structure along line XI-XI of FIG. 10. FIG. 12 is an exploded perspective view separately showing the arrangement of a part of the capacitor 101. In the capacitor 101, which will be described below, parts corresponding to the parts of the resistor 6 described previously are identified with the same reference symbols, and the detailed description of the parts will be omitted.

The capacitor 101 includes the substrate 2, the first connection electrode 3 arranged on the substrate 2 (the side of the element formation surface 2A of the substrate 2) and the second connection electrode 4 arranged on the same substrate 2.

In the capacitor 101, as in the resistor 6, the first connection electrode 3 and the second connection electrode 4 include the peripheral edge portions 86 and 87 that are formed so as to cover the peripheral edge portion 85 on the element formation surface 2A of the substrate 2 and to straddle the element formation surface 2A and the side surfaces 2C to 2F.

In the element formation surface 2A of the substrate 2, within a capacitor arrangement region 105 between the first connection electrode 3 and the second connection electrode 4, a plurality of capacitor factors C1 to C9 are formed. The plurality of capacitor factors C1 to C9 are a plurality of element factors that form the element 5 (here, a capacitor element) of the capacitor 101, and are connected between the first connection electrode 3 and the second connection electrode 4. Specifically, the plurality of capacitor factors C1 to C9 are electrically connected via a plurality of fuse units 107 (corresponding to the fuses F described previously) to the second connection electrode 4 such that they can be separated from the second connection electrode 4.

As shown in FIGS. 11 and 12, on the element formation surface 2A of the substrate 2, the insulating film 20 is formed, and on the surface of the insulating film 20, a lower electrode film 111 is formed. The lower electrode film 111 is extended substantially over the entire region of the capacitor arrangement region 105. Furthermore, the lower electrode film 111 is formed so as to be extended to a region immediately below the first connection electrode 3.

More specifically, the lower electrode film 111 includes a capacitor electrode region 111A that functions as a lower electrode common to the capacitor factors C1 to C9 in the capacitor arrangement region 105 and a pad region 111B for drawing an external electrode arranged immediately below the second connection electrode 4. The capacitor electrode region 111A is located in the capacitor arrangement region 105, and the pad region 111B is located immediately below the second connection electrode 4 and is in contact with the second connection electrode 4.

A capacitor film (dielectric film) 112 is formed so as to cover and make contact with the lower electrode film 111 (the capacitor electrode region 111A) in the capacitor arrangement region 105. The capacitor film 112 is formed over the entire region of the capacitor electrode region 111A (the capacitor arrangement region 105). In the preferred embodiment, the capacitor film 112 further covers the insulating film 20 outside the capacitor arrangement region 105.

On the capacitor film 112, an upper electrode film 113 is formed. In FIG. 10, for clarity, the upper electrode film 113 is shown by being colored. The upper electrode film 113 includes a capacitor electrode region 113A located in the capacitor arrangement region 105, a pad region 113B that is located immediately below the first connection electrode 3 and that is in contact with the first connection electrode 3 and a fuse region 113C that is arranged between the capacitor electrode region 113A and the pad region 113B.

In the capacitor electrode region 113A, the upper electrode film 113 is divided (separated) into a plurality of electrode film parts (upper electrode film parts) 131 to 139. In the preferred embodiment, each of the electrode film parts 131 to 139 is formed in the shape of a quadrangle, and extends in the shape of a band from the fuse region 113C toward the second connection electrode 4. The plurality of electrode film parts 131 to 139 have a plurality of types of opposite areas, and are opposite the lower electrode film 111 through the capacitor film 112 (while being in contact with the capacitor film 112). More specifically, the opposite areas of the plurality of electrode film parts 131 to 139 with respect to the lower electrode film 111 may be determined so as to be 1:2:4:8:16:32:64:128:128. In other words, the electrode film parts 131 to 139 include a plurality of electrode film parts having different opposite areas, and more specifically, include a plurality of electrode film parts 131 to 138 (or 131 to 137 and 139) having opposite areas that are set so as to be geometric with a geometric ratio of 2. In this way, the plurality of capacitor factors C1 to C9 formed by electrode film parts 131 to 139 and the lower electrode film 111 opposite them through the capacitor film 112 include a plurality of capacitor factors having different capacitance values.

When the ratio of the opposite areas in the electrode film parts 131 to 139 is as described above, the ratio of the capacitance values of the capacitor factors C1 to C9 is equal to the ratio of the opposite areas so as to be 1:2:4:8:16:32:64:128:128. In other words, the plurality of capacitor factors C1 to C9 include a plurality of capacitor factors C1 to C8 (or C1 to C7 and C9) in which the capacitance values are set so as to be geometric with a geometric ratio of 2.

In the preferred embodiment, the electrode film parts 131 to 135 are formed such that they are equal in width and that the ratio of the lengths thereof is set at 1:2:4:8:16. The electrode film parts 135, 136, 137, 138 and 139 are formed in the shape of a band such that they are equal in length and that the ratio of the widths thereof is set at 1:2:4:8:8. The electrode film parts 135 to 139 are formed to extend over the range from the end edge on the side of the first connection electrode 3 to the end edge on the side of the second connection electrode 4 in the capacitor arrangement region 105, and the electrode film parts 131 to 134 are formed to be shorter than them.

The pad region 113B has a planar shape of an approximate quadrangle. As shown in FIG. 11, the upper electrode film 113 in the pad region 113B is in contact with the first connection electrode 3.

On the substrate 2, the fuse region 113C is arranged along one long side (the long side on the inner side with respect to the periphery of the substrate 2) of the pad region 113B. The fuse region 113C includes a plurality of fuse units 107 arrayed along the one long side of the pad region 113B described above.

The fuse units 107 are integrally formed of the same material as the pad region 113B of the upper electrode film 113. The plurality of electrode film parts 131 to 139 are integrally formed with one or a plurality of fuse units 107, are connected via the fuse units 107 to the pad region 113B and are electrically connected via the pad region 113B to the first connection electrode 3.

As shown in FIG. 10, the electrode film parts 131 to 136 having relatively small areas are connected by one fuse unit 107 to the pad region 113B, and the electrode film parts 137 to 139 having relatively large areas are connected via a plurality of fuse units 107 to the pad region 113B. It is not necessary to use all the fuse units 107, and in the preferred embodiment, one fuse unit 107 is not used.

The fuse unit 107 includes a first wide width portion 107A for connection to the pad region 113B, a second wide width portion 107B for connection to the electrode film parts 131 to 139 and a narrow width portion 107C for connection between the first and second wide width portions 107A and 107B. The narrow width portion 107C is formed such that it can be cut (blown) by laser light. In this way, it is possible to electrically separate, from the first and second connection electrodes 3 and 4, unnecessary electrode film parts of the electrode film parts 131 to 139 by cutting the fuse units 107.

Although not shown in FIGS. 10 and 12, as shown in FIG. 11, the surface of the capacitor 101 including the surface of the upper electrode film 113 is covered by the passivation film 23 described previously. The passivation film 23 is formed with, for example, a nitride film, extends not only to the upper surface of the capacitor 101 but also to the side surfaces 2C to 2F of the substrate 2 and is formed so as to cover the entire region of the side surfaces 2C to 2F. On the side surfaces 2C to 2F, the passivation film 23 is interposed between the substrate 2 and the first connection electrode 3 and the second connection electrode 4. Furthermore, on the passivation film 23, the resin film 24 described previously is formed. The resin film 24 covers the element formation surface 2A.

The passivation film 23 and the resin film 24 are protective films that protect the surface of the capacitor 101. In these films, the cutout portions 25 described previously are formed in the regions corresponding to the first connection electrode 3 and the second connection electrode 4. The cutout portion 25 penetrates the passivation film 23 and the resin film 24. Furthermore, in the preferred embodiment, the cutout portion 25 corresponding to the first connection electrode 3 also penetrates the capacitor film 112.

The first connection electrode 3 and the second connection electrode 4 are individually embedded in the cutout portions 25. In this way, the first connection electrode 3 is joined to the pad region 113B of the upper electrode film 113, and the second connection electrode 4 is joined to the pad region 111B of the lower electrode film 111. The first and second connection electrodes 3 and 4 include the drawing portion 27 that protrudes from the surface of the resin film 24 and that is drawn along the surface of the resin film 24 inwardly (to the side of the element 5) of the substrate 2.

Figure 13:
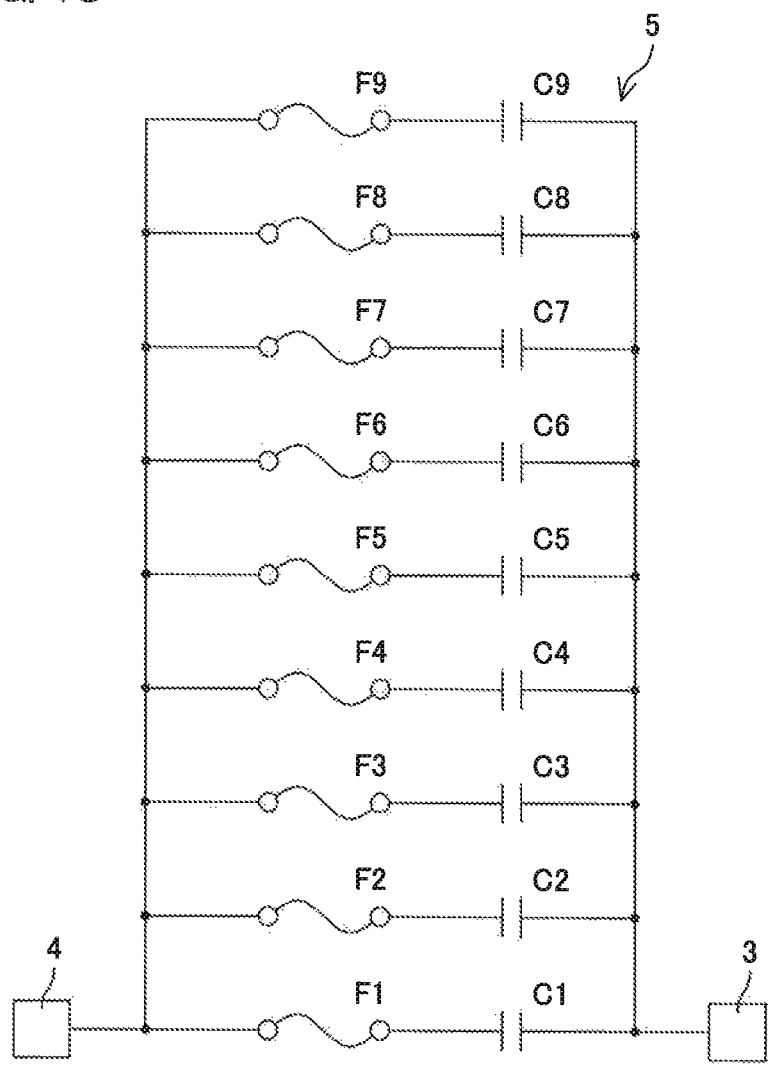
FIG. 13 is a circuit diagram showing the electrical arrangement of the interior of the capacitor.

FIG. 13 is a circuit diagram showing the electrical arrangement of the interior of the capacitor 101. The plurality of capacitor factors C1 to C9 are connected in parallel between the first connection electrode 3 and the second connection electrode 4. Between each of the capacitor factors C1 to C9 and the second connection electrode 4, fuses F1 to F9 each of which is formed with one or a plurality of fuse units 107 are interposed in series.

When all the fuses F1 to F9 are connected, the capacitance value of each capacitor 101 is equal to the total of the capacitance values of the capacitor factors C1 to C9. When one or two or more of fuses selected from the plurality of fuses F1 to F9 are cut, the capacitor factors corresponding to the cut fuses are separated, and the capacitance value of the capacitor 101 is reduced only by the capacitance value of the separated capacitor factors.

Hence, the capacitance value (the total of the capacitance values of the capacitor factors C1 to C9) between the pad regions 111B and 113B is measured, and thereafter one or a plurality of fuses appropriately selected from the fuses F1 to F9 according to the desired capacitance value are blown by laser light, with the result that it is possible to perform conversion (laser trimming) into the desired capacitance value. In particular, when the capacitance values of the capacitor factors C1 to C8 are set so as to be geometric with a geometric ratio of 2, it is possible to finely adjust the capacitance value to perform conversion to the desired capacitance value with accuracy corresponding to the capacitance value of the capacitor factor C1 of the minimum capacitance value (the value of the first term of the geometric progression).

For example, the capacitance values of the capacitor factors C1 to C9 may be determined as follows.

C1=0.03125 pF
C2=0.0625 pF
C3=0.125 pF
C4=0.25 pF
C5=0.5 pF
C6=1 pF
C7=2 pF
C8=4 pF
C9=4 pF

In this case, it is possible to finely adjust the capacitance of the capacitor 101 with accuracy of conversion to the minimum of 0.03125 pF. Fuses to be cut are appropriately selected from the fuses F1 to F9, and thus it is possible to provide the capacitor 101 having an arbitrary capacitance value between 10 and 18 pF.

As described above, in the preferred embodiment, between the first connection electrode 3 and the second connection electrode 4, the plurality of capacitor factors C1 to C9 that can be separated by the fuses F1 to F9 are provided. The capacitor factors C1 to C9 include a plurality of capacitor factors having different capacitance values, and more specifically, include a plurality of capacitor factors whose capacitance values are set so as to be geometric. In this way, one or a plurality of fuses are selected from the fuses F1 to F9 and are blown by laser light, and thus it is possible to cope with a plurality of types of capacitance values without any change in the design, and it is possible to accurately convert to the desired capacitance value, with the result that it is possible to realize the capacitor 101 with the common design.

The individual parts of the capacitor 101 will be described in more detail below.

The lower electrode film 111 is a conductive film and is particularly preferably a metal film, and may be an aluminum film. The lower electrode film 111 formed with an aluminum film can be formed by a sputtering method. Likewise, the upper electrode film 113 is a conductive film and is particularly preferably a metal film, and may be, for example, an aluminum film. The upper electrode film 113 formed with an aluminum film can be formed by a sputtering method. The capacitor electrode region 113A of the upper electrode film 113 is divided into electrode film parts 131 to 139, and furthermore, the patterning of the fuse region 113C to form a plurality of fuse units 107 can be performed by photolithography and an etching process.

The capacitor film 112 can be formed with, for example, a silicon nitride film, and the film thickness thereof can be 500 to 2000 angstroms (for example, 1000 angstroms). The capacitor film 112 may be a silicon nitride film formed by plasma CVD (chemical vapor deposition).

FIGS. 14A to 14I are schematic cross-sectional views showing a part of a method of manufacturing the composite chip 1 shown in FIG. 1A in the order of the step. In FIGS. 14A to 14I, only the cross-sectional structure of the resistor 6 corresponding to FIG. 9 is shown.

In the step of manufacturing the composite chip 1, for example, the element 5 (the capacitor factors C1 to C9 and the fuse units 107) of the capacitor 101 is first formed, and thereafter the element 5 (the resistor bodies R and the wiring film 22 connected to the resistor bodies R) of the resistor 6 is formed.

Figure 14A:
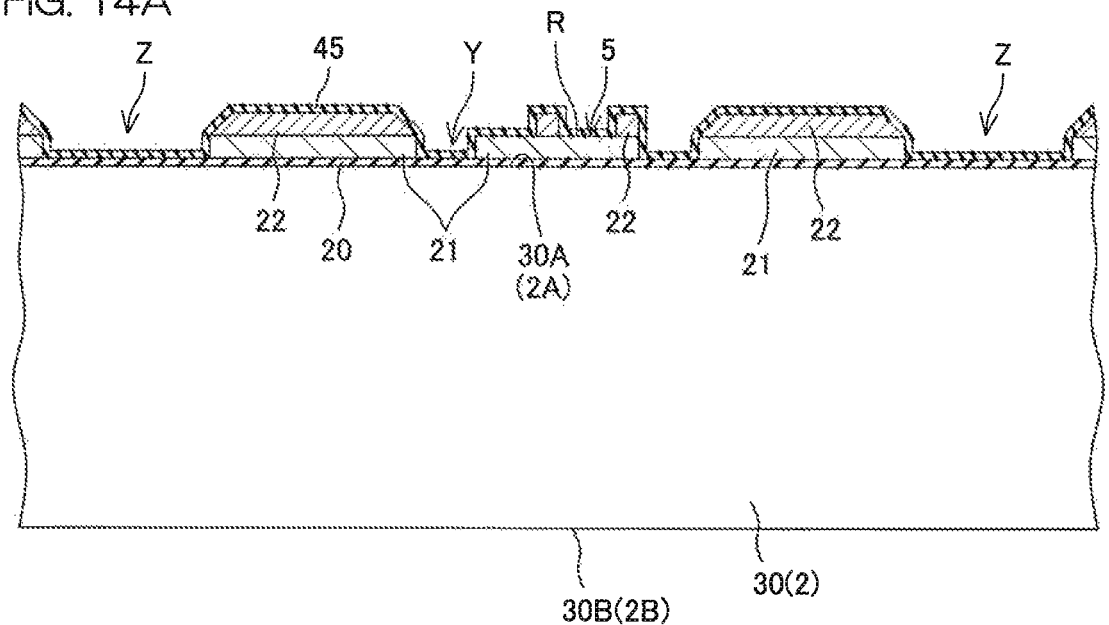
FIG. 14A is a cross-sectional view showing part of a method of manufacturing the composite chip.

Specifically, as shown in FIG. 14A, a wafer 30 that is the base of the substrate 2 is prepared. In this case, the surface 30A of the wafer 30 is the element formation surface 2A of the substrate 2, and the back surface 30B of the wafer 30 is the back surface 2B of the substrate 2.

Then, the surface 30A of the wafer 30 is thermally oxidized, and thus the insulating film 20 made of $SiO_2$ or the like is formed in both the regions of the surface 30A where the resistor 6 and the capacitor 101 need to be formed.

Then, for example, by a sputtering method, as shown in FIG. 11, the lower electrode film 111 formed with an aluminum film is formed over the entire region of the surface of the insulating film 20. The film thickness of the lower electrode film 111 may be set at about 8000 angstroms.

Then, in the surface of the lower electrode film 111, a resist pattern corresponding to the final shape of the lower electrode film 111 is formed by photolithography. The resist pattern is used as a mask, and thus the lower electrode film is etched, with the result that it is possible to obtain the lower electrode film 111 having a pattern shown in FIG. 10 and the like. The etching of the lower electrode film 111 can be performed by, for example, reactive ion etching.

Then, for example, by a plasma CVD method, as shown in FIG. 11, the capacitor film 112 formed with a silicon nitride film or the like is formed on the lower electrode film 111. In the region where the lower electrode film 111 is not formed, on the surface of the insulating film 20, the capacitor film 112 is formed.

Then, on the capacitor film 112, the upper electrode film 113 is formed. The upper electrode film 113 is formed with, for example, an aluminum film, and can be formed by a sputtering method. The film thickness thereof may be set at about 8000 angstroms.

Then, in the surface of the upper electrode film 113, a resist pattern corresponding to the final shape of the upper electrode film 113 is formed by photolithography. The resist pattern is used as a mask, and thus the upper electrode film 113 is etched, with the result that the upper electrode film 113 is patterned into the final shape (see FIG. 10 and the like). In this way, the upper electrode film 113 is formed into a pattern that has, in the capacitor electrode region 113A, the plurality of separated electrode film parts 131 to 139, that has, in the fuse region 113C, the fuse units 107 and that has the pad region 113B connected to the fuse units 107. The etching for patterning the upper electrode film 113 may be performed by wet etching using an etching solution such as phosphoric acid or may be performed by reactive ion etching.

As described above, the element 5 (the capacitor factors C1 to C9 and the fuse units 107) in the capacitor 101 is formed.

Then, as shown in FIG. 14A, on the insulating film 20, the element 5 (the resistor bodies R and the wiring film 22 connected to the resistor bodies R) is formed.

Specifically, by sputtering, the resistor body film 21 of TiN, TION or TiSiON is first formed on the entire surface of the insulating film 20, and furthermore, the wiring film 22 of aluminum (Al) is laminated on the resistor body film 21 so as to make contact with the resistor body film 21.

Thereafter, a photolithography process is used, and for example, by dry etching such as RIE (Reactive Ion Etching), the resistor body film 21 and the wiring film 22 are selectively removed to perform patterning, with the result that as shown in FIG. 3A, in plan view, the resistor body film lines 21A in which the resistor body film 21 is laminated and which has a given width are arrayed a given distance apart in the column direction. Here, a region where the resistor body film line 21A and the wiring film 22 are partially cut is also formed, and in the trimming target region X described previously, the fuses F and the conductive film D are formed (see FIG. 2).

Then, for example, by wet etching, the wiring film 22 laminated on the resistor body film line 21A is selectively removed. Consequently, it is possible to obtain the element 5 in which on the resistor body film line 21A, the wiring films are laminated the given distance R apart. Here, the resistance value of the entire element 5 may be measured so that whether or not the resistor body film 21 and the wiring film 22 are formed to have target dimensions is checked.

The element 5 of the resistor 6 and the capacitor 101 is formed at a large number of points on the surface 30A of the wafer 30 according to the number of composite chips 1 formed on one wafer 30. When one region on the wafer 30 formed by placing one element 5 of the resistor 6 and the capacitor 101 adjacently to one element 5 of the resistor 6 and the capacitor 101 is referred to as a chip part region Y, on the surface 30A of the wafer 30, a plurality of chip part regions Y (that is, the elements 5) having the elements (resistor portions) of the resistors 6 and the elements (capacitors) of the capacitors 101 are formed (set).

One chip part region Y coincides with one completed composite chip 1 in plan view. On the surface 30A of the wafer 30, a region between the chip part regions Y adjacent to each other is referred to as a boundary region Z. The boundary region Z is formed in the shape of a band, and extends in a lattice in plan view. One chip part region Y is arranged in one lattice unit partitioned by the boundary region Z. The width of the boundary region Z is extremely narrow so as to be 1 to 60 μm (for example, 20 μm), and thus a large number of chip part regions Y can be secured on the wafer 30, with the result that it is possible to produce a large number of composite chips 1.

Then, as shown in FIG. 14A, by a CVD (Chemical Vapor Deposition) method, an insulating film 45 made of SiN is formed over the entire region of the surface 30A of the wafer 30. The insulating film 45 covers and makes contact with all the insulating film 20 and the element 5 (such as the fuse unit 107, the resistor body film 21 and the wiring film 22) on the insulating film 20. Hence, the insulating film 45 also covers, in the resistor 6, the wiring film 22 in the trimming target region X (see FIG. 2).

Since the insulating film 45 is formed over the entire region of the surface 30A of the wafer 30, on the surface 30A, the insulating film 45 is formed so as to extend to the region other than the trimming target region X. In this way, the insulating film 45 serves as a protective film that protects the entire region of the surface 30A (including the element 5 on the surface 30A).

Figure 14B:
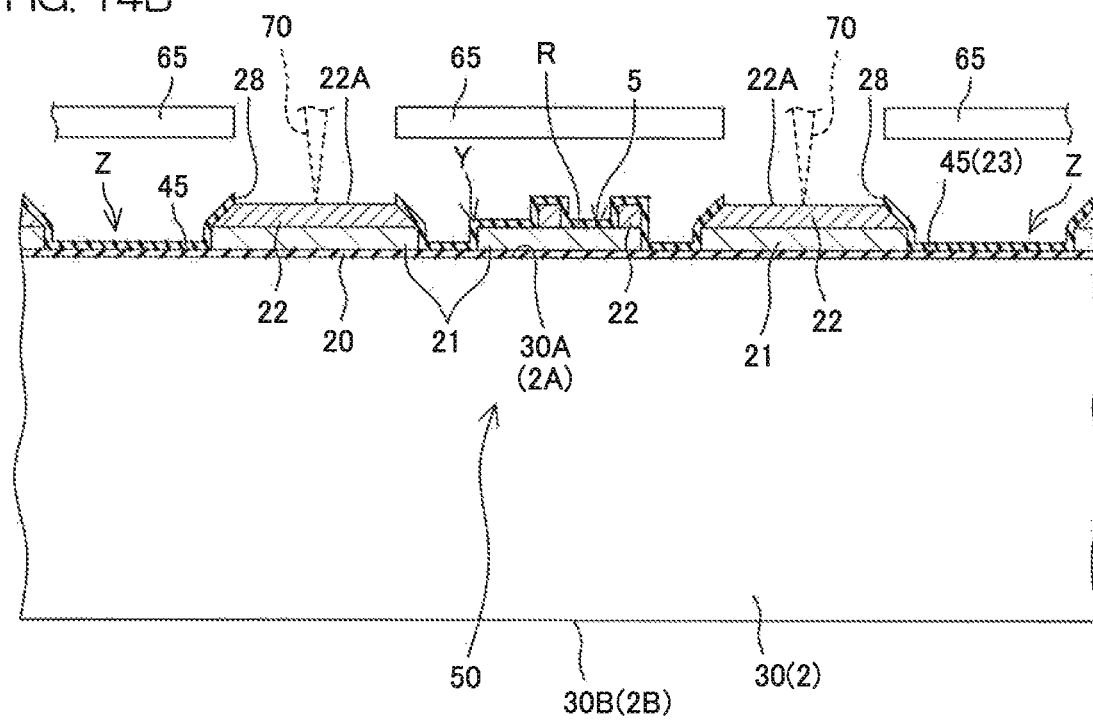
FIG. 14B is a cross-sectional view showing the subsequent step of FIG. 14A.

Then, as shown in FIG. 14B, by etching using a mask 65, the insulating film 45 is selectively removed. In this way, in the resistor 6, an opening 28 is formed in a part of the insulating film 45, and each pad region 22A is exposed through the opening 28. For the semifinished product 50 of one composite chip 1, two openings 28 are formed in the resistor 6. On the other hand, in the capacitor 101, an opening is likewise formed in a part of the insulating film 45, and thus the pad regions 111B and 113B are exposed.

The subsequent step is a step of trimming the resistor 6 and the capacitor 101.

In the resistor 6, a probe 70 of a resistance measuring device (not shown) is brought into contact with the pad region 22A of each opening 28, and thus the resistance value of the entire element 5 is detected. Then, laser light (not shown) is applied to an arbitrary fuse F (see FIG. 2) through the insulating film 45, and thus the wiring film 22 in the trimming target region X described previously is trimmed by the laser light, with the result that the fuse F is blown. As described above, the fuse F is blown (trimmed) such that a necessary resistance value is acquired, and thus as described previously, it is possible to adjust the resistance value of the entire semifinished product 50 (in other words, the resistor 6 of each composite chip 1).

Then, in the capacitor 101, the total capacitance value of the entire element 5 is detected, and thereafter the laser trimming for blowing the fuse unit 107 is performed (see FIG. 14B). Specifically, the laser light is applied to the fuse unit 107 forming the fuse that is selected according to the result of the measurement of the total capacitance value, and the narrow width portion 107C (see FIG. 10) of the fuse unit 107 is blown. In this way, the corresponding capacitor factor is separated from the pad region 113B.

Since in the trimming of the element 5 of the resistor 6 and the capacitor 101, the insulating film 45 serves as a cover film for covering the element 5, it is possible to prevent a short circuit from occurring as a result of the adherence of a fragment or the like produced by blowing to the element 5. Since the insulating film 45 covers the fuse F (the resistor body film 21) and the fuse unit 107, the energy of the laser light is stored in the fuse F and the fuse unit 107, and thus it is possible to reliably blow the fuse F.

Thereafter, as necessary, by a CVD method, SiN is formed on the insulating film 45 to increase the thickness of the insulating film 45. The final insulating film 45 (the state shown in FIG. 14C) has a thickness of 1000 to 5000 angstroms (here, about 3000 angstroms). Here, a part of the insulating film 45 enters each opening 28 to block the opening 28.

Figure 14C:
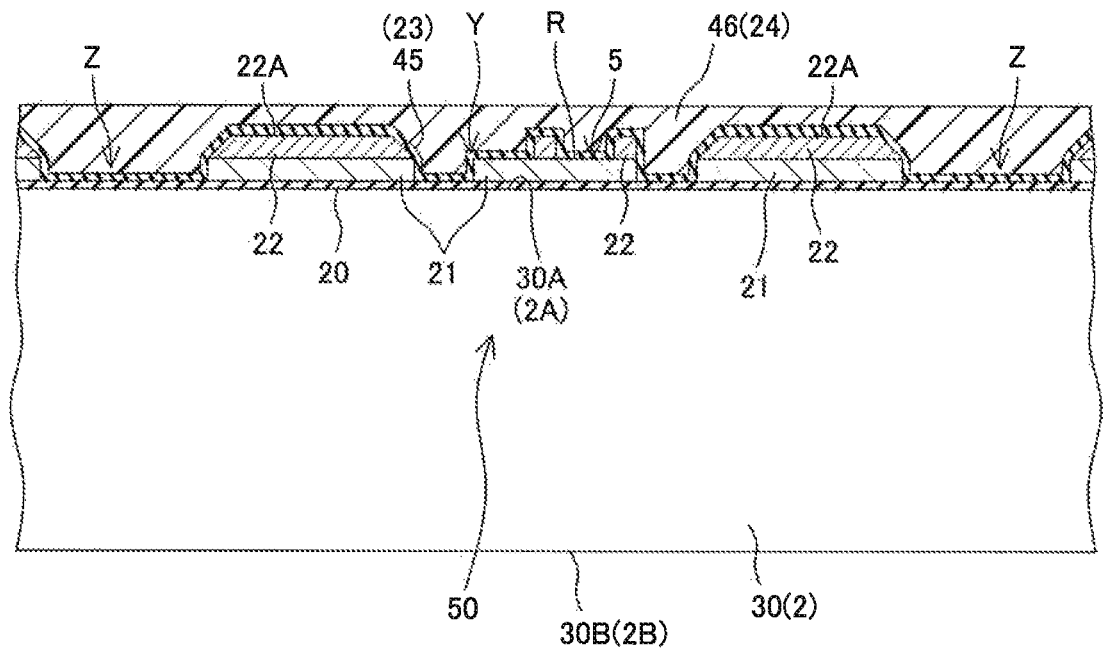
FIG. 14C is a cross-sectional view showing the subsequent step of FIG. 14B.

Then, as shown in FIG. 14C, a liquid of a light-sensitive resin formed of polyimide is sprayed on the wafer 30 from above the insulating film 45 to form the resin film 46 of the light-sensitive resin. The surface of the resin film 46 on the surface 30A is flat along the surface 30A. Then, thermal processing (cure processing) is performed on the resin film 46. In this way, the thickness of the resin film 46 is thermally contracted, and the resin film 46 is cured, with the result that the film quality is stabilized.

Figure 14D:
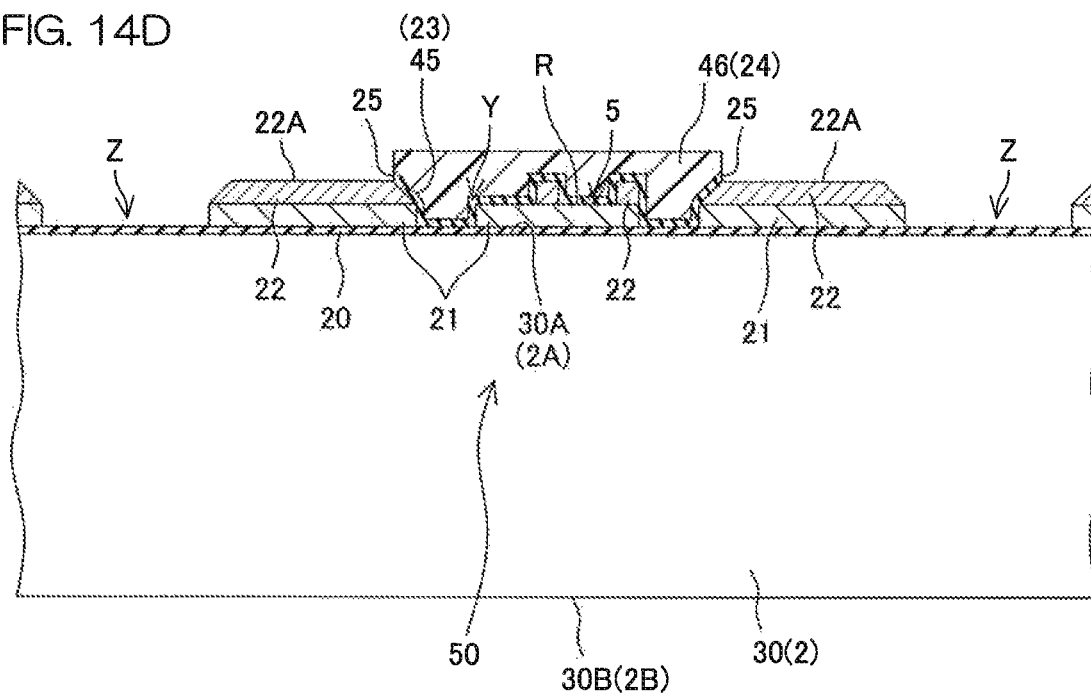
FIG. 14D is a cross-sectional view showing the subsequent step of FIG. 14C.

Then, as shown in FIG. 14D, the resin film 46, the insulating film 45 and the insulating film 20 are patterned, and thus parts that coincide with the cutout portions 25 of these films are selectively removed. In this way, the cutout portions 25 are formed, and in the boundary region Z, the surface 30A (the insulating film 20) is exposed.

Figure 14E:
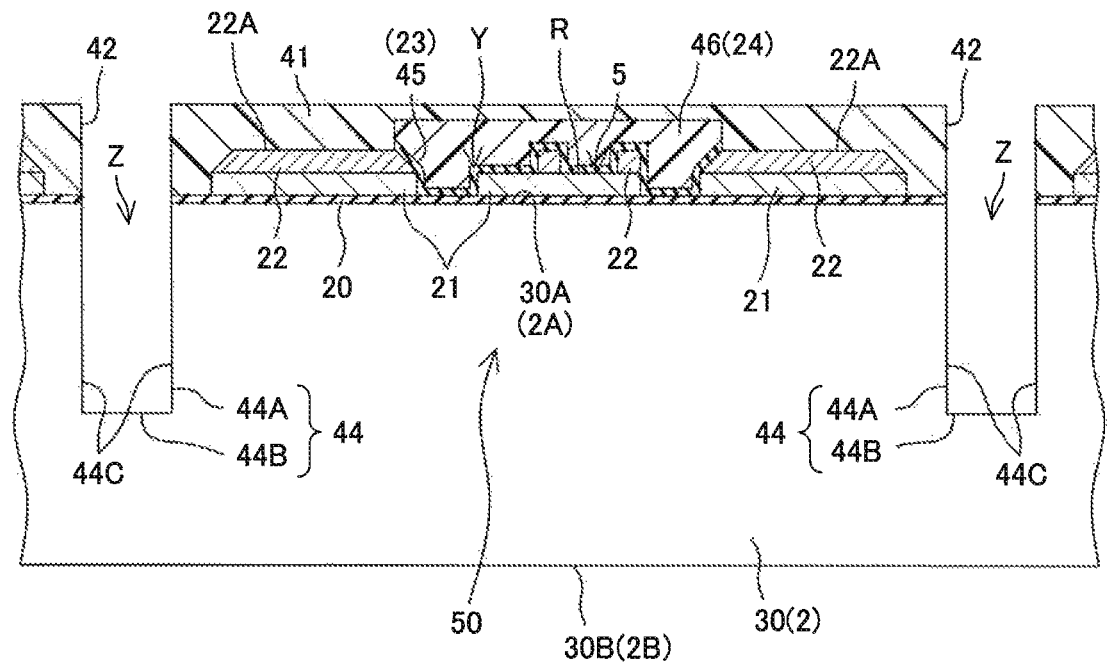
FIG. 14E is a cross-sectional view showing the subsequent step of FIG. 14D.

Then, as shown in FIG. 14E, a resist pattern 41 is formed over the entire region of the surface 30A of the wafer 30. In the resist pattern 41, an opening 42 is formed.

Figure 15:
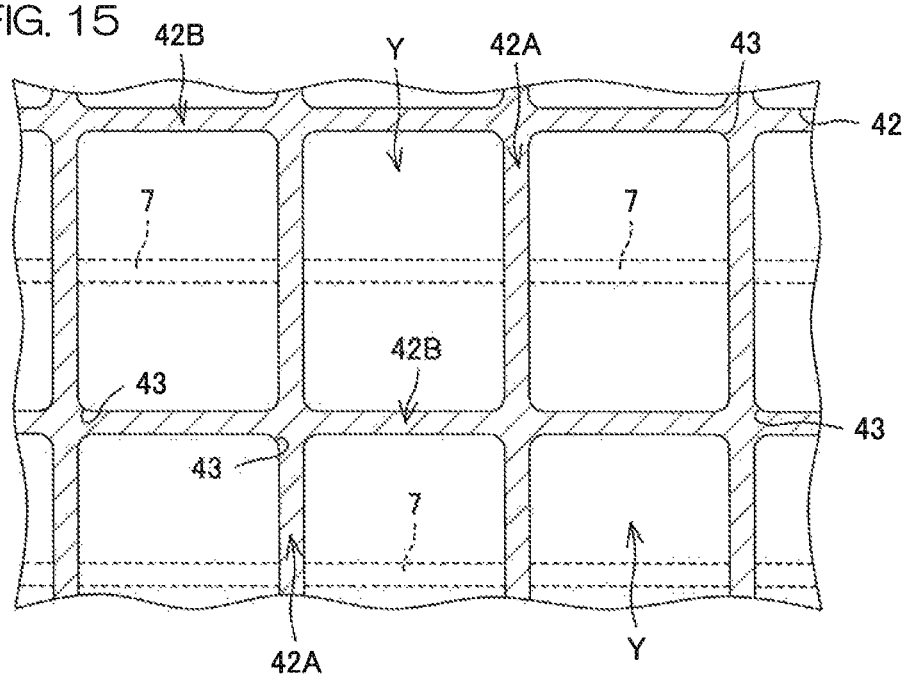
FIG. 15 is a schematic plan view of part of a resist pattern used for formation of a groove in the step of FIG. 14E.

FIG. 15 is a schematic plan view of a part of the resist pattern used for formation of a groove in the step of FIG. 14E.

With reference to FIG. 15, when a large number of composite chips 1 (that is, the chip part region Y described above) are arranged in a matrix (also in a lattice), in plan view, the opening 42 of the resist pattern 41 coincides with (corresponds to) a region (a hatched part of FIG. 15, that is, the boundary region Z) between the outlines of the adjacent composite chips 1. Hence, the overall shape of the opening 42 is the shape of a lattice that has a plurality of straight parts 42A and straight parts 42B perpendicular to each other.

In the resist pattern 41, in positions touching the four corners of the chip part region Y, round shaped portions 43 in the shape of a convex curve are present outside the chip part region Y. The round shaped portion 43 is formed such that two sides adjacent to the chip part region Y are connected by a smooth curve. Hence, when a groove 44 (described later) is formed by plasma etching using the resist pattern 41 as a mask, the groove 44 includes, in the positions touching the four corners of the chip part region Y, the round shaped portions in the shape of a convex curve outside the chip part region Y. Hence, in the step of forming the groove 44 for cutting the chip part region Y out of the wafer 30, it is possible to form the corner portions 11 of the chip part 1 into the round shape at the same time. In other words, it is possible to process the corner portions 11 into the round shape without addition of a dedicated step.

With reference to FIG. 14E, by plasma etching using the resist pattern 41 as a mask, the wafer 30 is selectively removed. In this way, the material of the wafer 30 is removed in a position a distance apart from the wiring film 22 in the boundary region Z between the chip part regions Y adjacent to each other. Consequently, in plan view, in a position (the boundary region Z) coinciding with the opening 42 of the resist pattern 41, the groove 44 is formed which extends from the surface 30A of the wafer 30 halfway through the thickness of the wafer 30 and which has a predetermined depth.

The groove 44 is partitioned by a pair of side walls 44A opposite each other and a bottom wall 44B that connects the lower ends (the ends on the side of the back surface 30B of the wafer 30) of the pair of the side walls 44A. The depth of the groove 44 with respect to the surface 30A of the wafer 30 is about 100 μm, and the width (the distance between the side walls 44A opposite each other) of the groove 44 is about 20 μm and is constant over the entire region in the direction of the depth.

The overall shape of the groove 44 in the wafer 30 is formed in a lattice which coincides with the opening 42 (see FIG. 11) of the resist pattern 41 in plan view. On the surface 30A of the wafer 30, the chip part region Y where each element 5 is formed is surrounded by a quadrangular frame part (the boundary region Z) of the groove 44. The part of the wafer 30 where the element 5 is formed is the semifinished product 50 of the composite chip 1. On the surface 30A of the wafer 30, one semifinished product 50 is located in each of the chip part regions Y surrounded by the grooves 44, and these semifinished products 50 are arranged in a matrix.

By forming the grooves 44 in this way, the wafer 30 is separated into a plurality of substrates 2 by the chip part regions Y. After the formation of the grooves 44, the resist pattern 41 is removed.

Figure 14F:
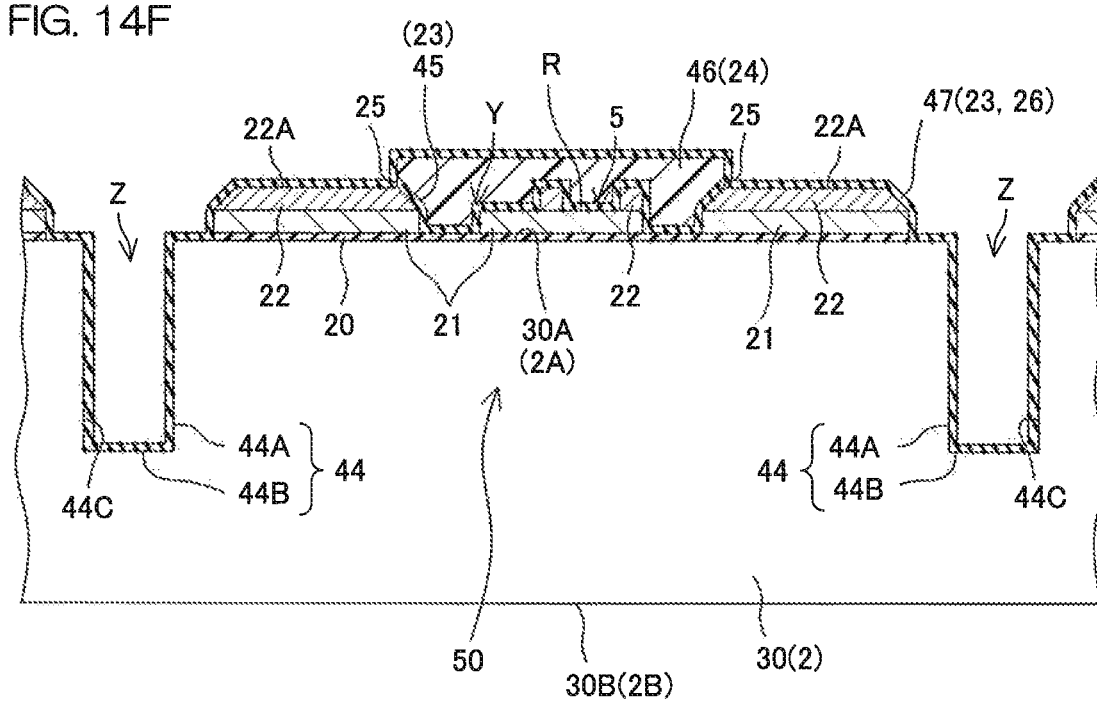
FIG. 14F is a cross-sectional view showing the subsequent step of FIG. 14E.

Then, as shown in FIG. 14F, by a CVD method, an insulating film 47 made of SiN is formed over the entire region of the surface 30A of the wafer 30. Here, the insulating film 47 is also formed over the entire region of the inner peripheral surface (the partition surface 44C of the side wall 44A and the upper surface of the bottom wall 44B described above) of the groove 44.

Figure 14G:
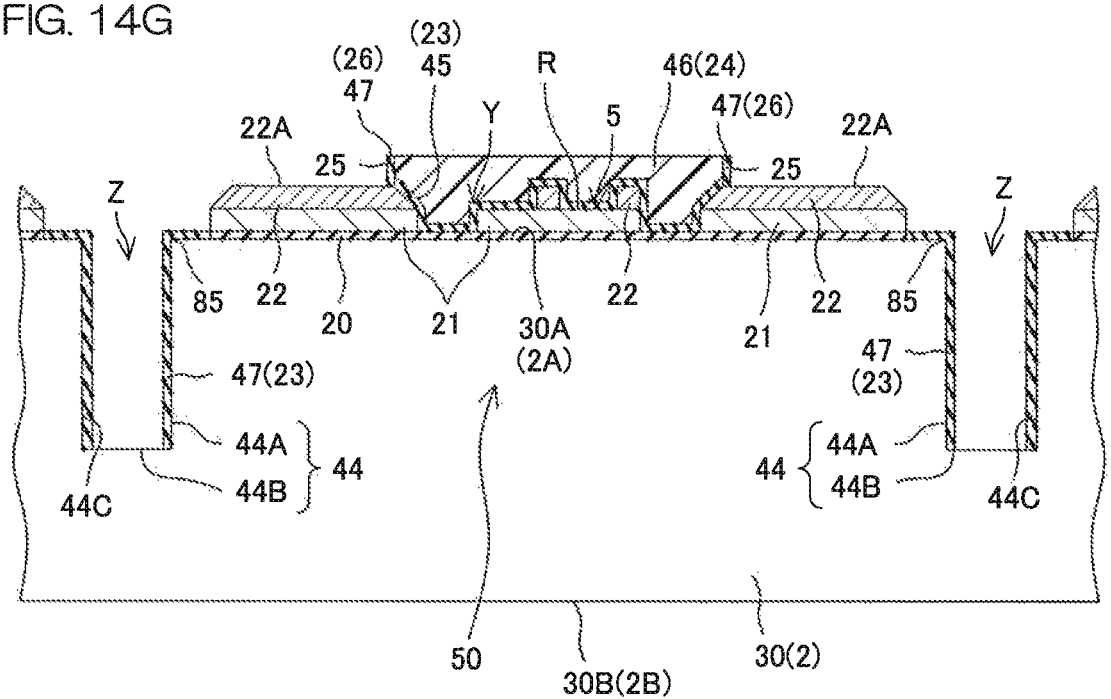
FIG. 14G is a cross-sectional view showing the subsequent step of FIG. 14F.

Then, as shown in FIG. 14G, the insulating film 47 is selectively etched. Specifically, the part of the insulating film 47 parallel to the surface 30A is selectively etched. In this way, the pad region 22A of the wiring film 22 is exposed, and in the groove 44, the insulating film 47 on the bottom wall 44B is removed.

Figure 14H:
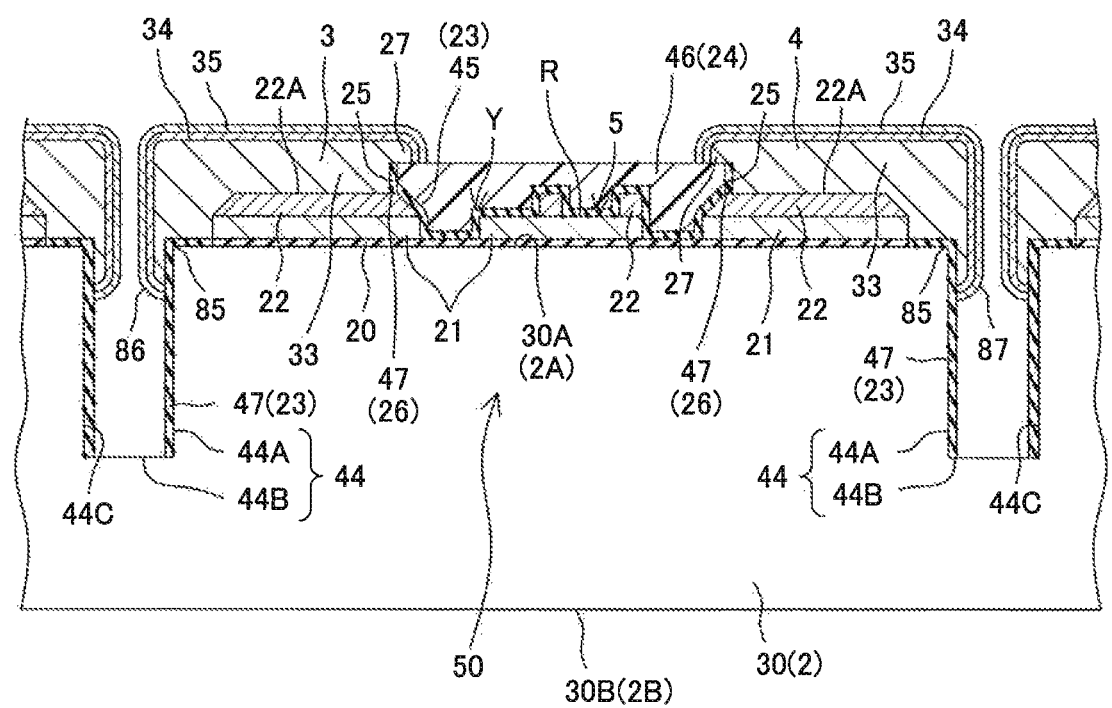
FIG. 14H is a cross-sectional view showing the subsequent step of FIG. 14G.
Figure 14:
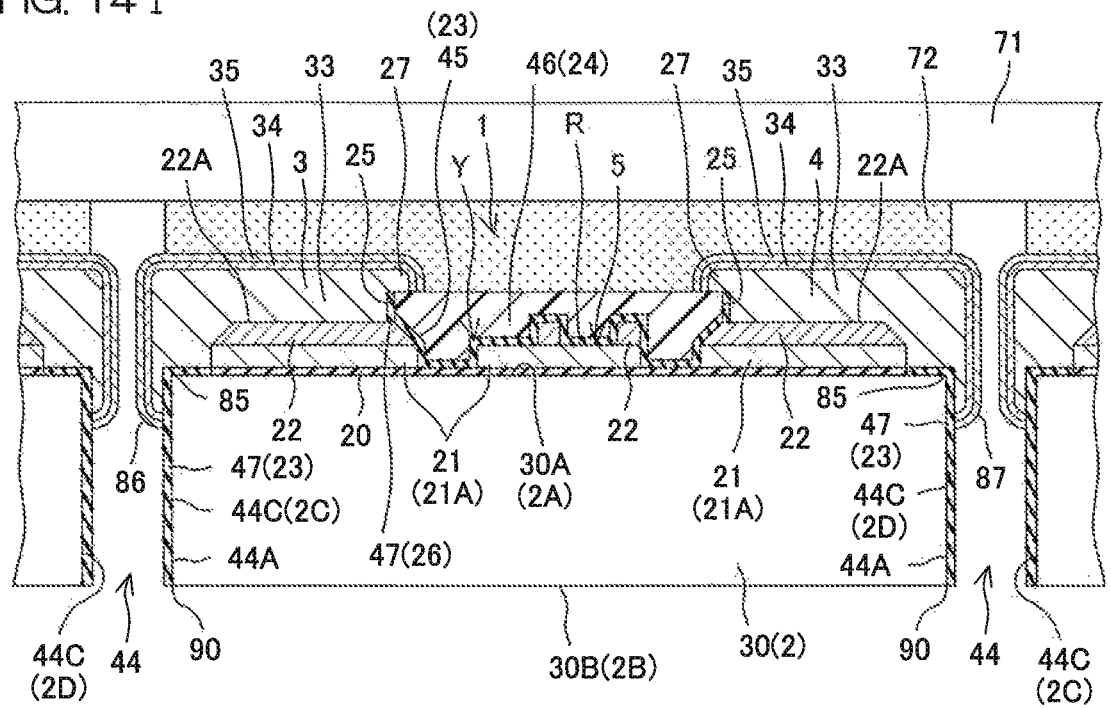
FIG. 14I is a cross-sectional view showing the subsequent step of FIG. 14H.

Then, by non-electrolytic plating, Ni, Pd and Au are sequentially grown by plating from the wiring film 22 exposed from each cutout portion 25. The plating is continued until each plating film is grown in the horizontal direction along the surface 30A to cover the insulating film 47 on the side wall 44A of the groove 44. In this way, as shown in FIG. 14H, the first connection electrode 3 and the second connection electrode 4 formed with Ni/Pd/Au laminated films are formed.

Figure 16:
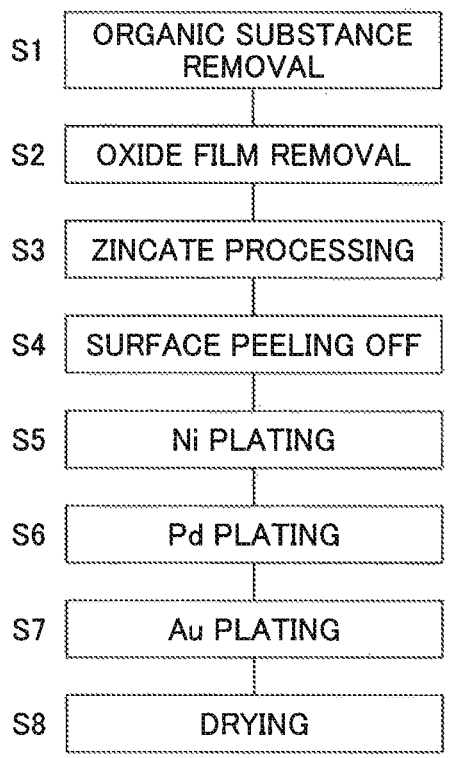
FIG. 16 is a drawing for illustrating a step of manufacturing the first connection electrode and the second connection electrode.

FIG. 16 is a drawing for illustrating a step of manufacturing the first connection electrode 3 and the second connection electrode 4.

Specifically, with reference to FIG. 16, the surfaces of the pad region 22A and the pad regions 111B and 113B are first purified, and thus organic substances (including smut such as a stain of carbon and greasy dirt) on the surfaces are removed (degreased) (step S1).

Then, the oxide film on the surfaces is removed (step S2). Then, zincate processing is performed on the surfaces, and thus Al on the surfaces (of the wiring film 22, the lower electrode film 111 and the upper electrode film 113) is replaced by Zn (step S3).

Then, Zn on the surfaces is peeled off with nitric acid or the like, and in the pad region 22A and the pad regions 111B and 113B, new Al is exposed (step S4).

Then, the pad region 22A and the pad regions 111B and 113B are immersed in a plating liquid, and thus Ni plating is applied to the surface of the new Al in the pad region 22A and the pad regions 111B and 113B. In this way, Ni in the plating liquid is chemically reduced and precipitated, and thus the Ni layer 33 is formed on the surfaces (step S5).

Then, the Ni layer 33 is immersed in another plating liquid, and thus Pd plating is applied to the surface of the Ni layer 33. In this way, Pd in the plating liquid is chemically reduced and precipitated, and thus a Pd layer 34 is formed on the surface of the Ni layer 33 (step S6).

Then, the Pd layer 34 is immersed in another plating liquid, and thus Au plating is applied to the surface of the Pd layer 34. In this way, Au in the plating liquid is chemically reduced and precipitated, and thus the Au layer 35 is formed on the surface of the Pd layer 34 (step S7).

In this way, the first connection electrode 3 and the second connection electrode 4 are formed, and when the formed first connection electrode 3 and the formed second connection electrode 4 are dried (step S8), the step of manufacturing the first connection electrode 3 and the second connection electrode 4 is completed. Between the preceding and subsequent steps, a step of washing the semifinished product 50 with water is performed as necessary. The zincate processing may be performed a plurality of times.

FIG. 14H shows a state where in each semifinished product 50, the first connection electrode 3 and the second connection electrode 4 have already been formed.

As described above, since the first connection electrode 3 and the second connection electrode 4 are formed by non-electrolytic plating, Ni, Pd and Al serving as electrode materials can be satisfactorily grown on the insulating film 47 by plating. As compared with a case where the first connection electrode 3 and the second connection electrode 4 are formed by electrolytic plating, the number of steps (for example, a lithography step and a step of peeling off a resist mask necessary in electrolytic plating) in the step of forming the first connection electrode 3 and the second connection electrode 4 is reduced, with the result that it is possible to enhance the productivity of the composite chip 1. Furthermore, since in non-electrolytic plating, the resist mask necessary in electrolytic plating is not needed, the position of the formation of the first connection electrode 3 and the second connection electrode 4 is prevented from being displaced by the displacement of the position of the resist mask, and thus the accuracy of the position of the formation of the first connection electrode 3 and the second connection electrode 4 is enhanced, with the result that it is possible to enhance the yield.

In this method, the wiring film 22, the lower electrode film 111 and the upper electrode film 113 are exposed from the cutout portion 25, and there is no obstruction to the plating growth in a region from the wiring film 22, the lower electrode film 111 and the upper electrode film 113 to the groove 44. Hence, it is possible to perform plating growth straight from the wiring film 22, the lower electrode film 111 and the upper electrode film 113 to the groove 44. Consequently, it is possible to reduce the time necessary to form the electrode.

The first connection electrode 3 and the second connection electrode 4 are formed as described above, then an energization test is performed between the first connection electrode 3 and the second connection electrode 4 and thereafter the wafer 30 is ground from the back surface 30B.

Specifically, after the formation of the groove 44, as shown in FIG. 14I, a support tape 71 that is formed of PET (polyethylene terephthalate), that is formed in the shape of a thin plate and that has an adhesive surface 72 is adhered, in the adhesive surface 72, to the side (that is, the surface 30A) of the first connection electrode 3 and the second connection electrode 4 in each semifinished product 50. In this way, each semifinished product 50 is supported by the support tape 71. Here, as the support tape 71, for example, a laminate tape can be used.

With each semifinished product 50 supported by the support tape 71, the wafer 30 is grounded from the side of the back surface 30B. When by the grinding, the wafer 30 is decreased in thickness so as to reach the upper surface of the bottom wall 44B (see FIG. 14H) of the groove 44, since there is nothing that couples the adjacent semifinished products 50, the wafer 30 is divided with the groove 44 being a boundary and the semifinished products 50 are individually separated, with the result that the finished product of the composite chip 1 is formed.

In other words, the wafer 30 is cut (separated) in the groove 44 (that is, the boundary region Z), and thus the composite chips 1 are individually cut out. By etching the wafer 30 from the side of the back surface 30B to the bottom wall 44B of the groove 44, the composite chips 1 may be cut out.

In each completed composite chip 1, the part serving as the partition surface 44C of the side wall 44A of the groove 44 is any one of the side surfaces 2C to 2F of the substrate 2, and the back surface 30B is the back surface 2B. In other words, as described previously, the step (see FIG. 14E) of forming the groove 44 by etching is included in the step of forming the side surfaces 2C to 2F. Moreover, the insulating film 45 and a part of the insulating film 47 are the passivation film 23, the resin film 46 is the resin film 24 and a part of the insulating film 47 is the insulating film 26.

As described above, after the formation of the groove 44, the wafer 30 is ground from the side of the back surface 30B, and thus a plurality of chip part regions Y formed in the wafer 30 can be simultaneously divided into individual composite chips 1 (chip parts) (the individual pieces of a plurality of composite chips 1 can be obtained at one time). Hence, the time in which the composite chips 1 are manufactured is reduced, and thus it is possible to enhance the productivity of the composite chip 1.

By grinding or etching the back surface 2B of the substrate 2 in the completed composite chip 1 into a mirror surface, the back surface 2B may be cleaned.

FIGS. 17A to 17D are schematic cross-sectional views showing a collection step of the composite chip 1 after the step of FIG. 14I.

Figure 17A:
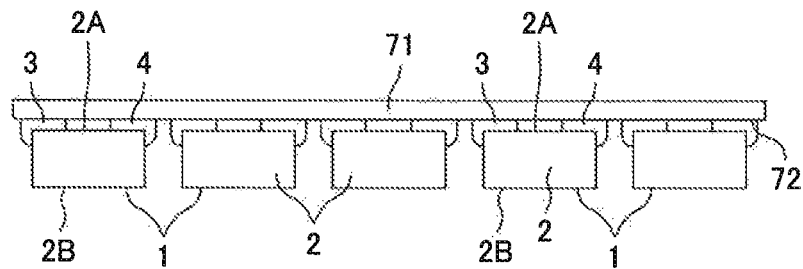
FIG. 17A is a schematic cross-sectional view showing the collection step of the composite chip after the step of FIG. 14I.

FIG. 17A shows a state where a plurality of composite chips 1 separated into pieces still stick to the support tape 71.

Figure 17B:
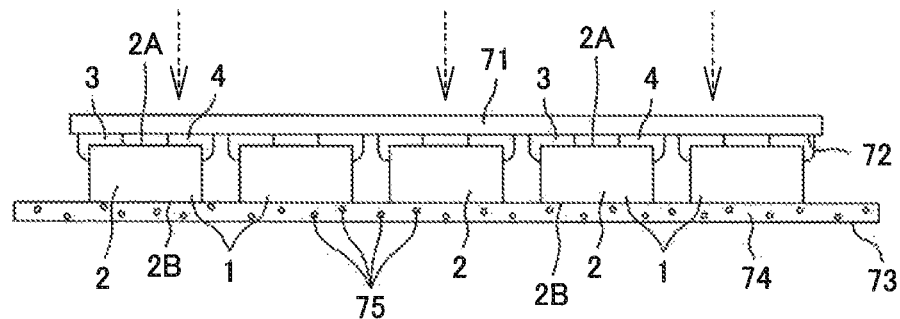
FIG. 17B is a cross-sectional view showing the subsequent step of FIG. 17A.

In this state, as shown in FIG. 17B, a thermally foamed sheet 73 is adhered to the back surface 2B of the substrate 2 of each composite chip 1. The thermally foamed sheet 73 includes a sheet main body 74 in the shape of a sheet and a large number of foamed particles 75 kneaded into the sheet main body 74. The adhesive force of the sheet main body 74 is greater than that of the adhesive surface 72 of the support tape 71.

Figure 17C:
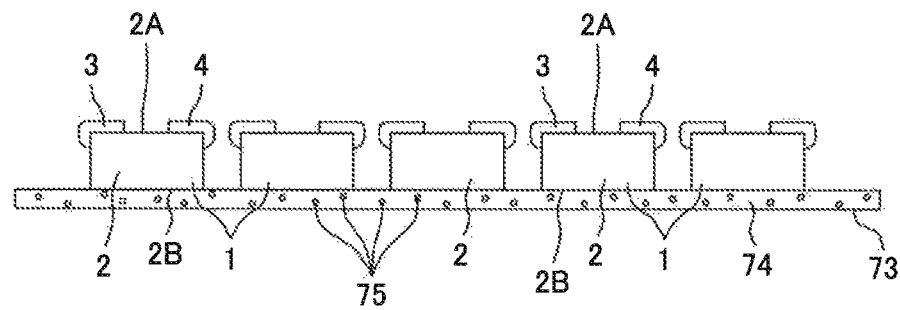
FIG. 17C is a cross-sectional view showing the subsequent step of FIG. 17B.

Hence, after the thermally foamed sheet 73 is adhered to the back surface 2B of the substrate 2 of each composite chip 1, as shown in FIG. 17C, the support tape 71 is torn off from each composite chip 1, and the composite chip 1 is transferred to the thermally foamed sheet 73. Here, since the adherence property of the adhesive surface 72 is lowered by the application of ultraviolet rays to the support tape 71 (see dotted arrows in FIG. 17B), the support tape 71 is easily torn off from each composite chip 1.

Figure 17D:
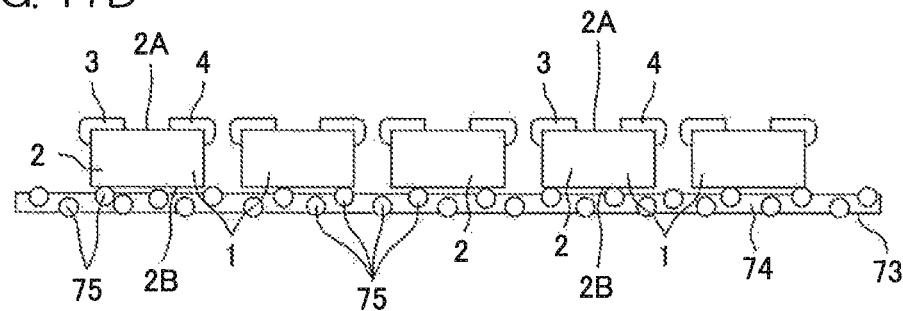
FIG. 17D is a cross-sectional view showing the subsequent step of FIG. 17C.

Then, the thermally foamed sheet 73 is heated. In this way, as shown in FIG. 17D, in the thermally foamed sheet 73, the foamed particles 75 within the sheet main body 74 are foamed and are expanded out of the surface of the sheet main body 74. Consequently, the contact area between the thermally foamed sheet 73 and the back surface 2B of the substrate 2 of each composite chip 1 is decreased, and thus all the composite chips 1 are naturally torn off from the thermally foamed sheet 73 (come off).

The composite chips 1 collected in this way are mounted on the mounting substrate 9 (see FIG. 1B) or are stored in a storage space formed on an emboss carrier tape (not shown). In this case, as compared with a case where the composite chips 1 are torn off from the support tape 71 or the thermally foamed sheet 73 one by one, it is possible to reduce the processing time. As a matter of course, with a plurality of composite chips 1 sticking to the support tape 71 (see FIG. 17A), without use of the thermally foamed sheet 73, the composite chips 1 may be directly torn off from the support tape 71 by a predetermined number of pieces.

Figure 18A:
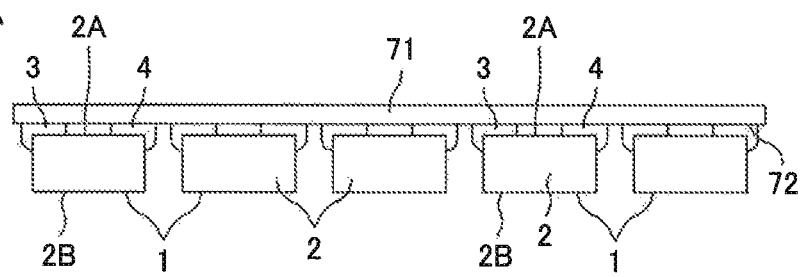
FIG. 18A is a schematic cross-sectional view showing the collection step (variation) of the composite chip after the step of FIG. 14I.
Figure 18B:
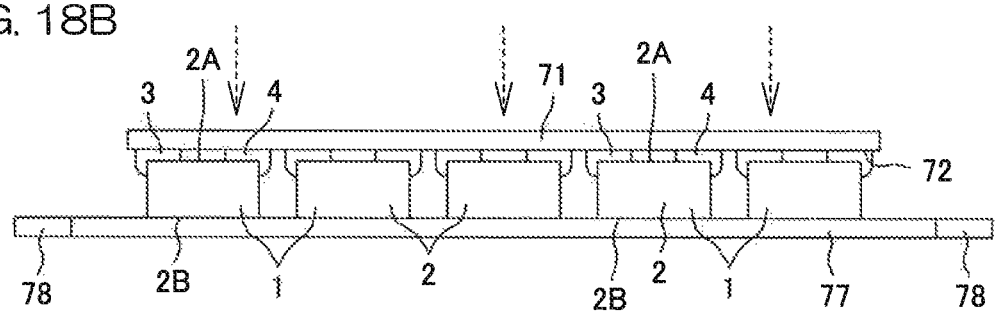
FIG. 18B is a cross-sectional view showing the subsequent step of FIG. 18A.
Figure 18C:
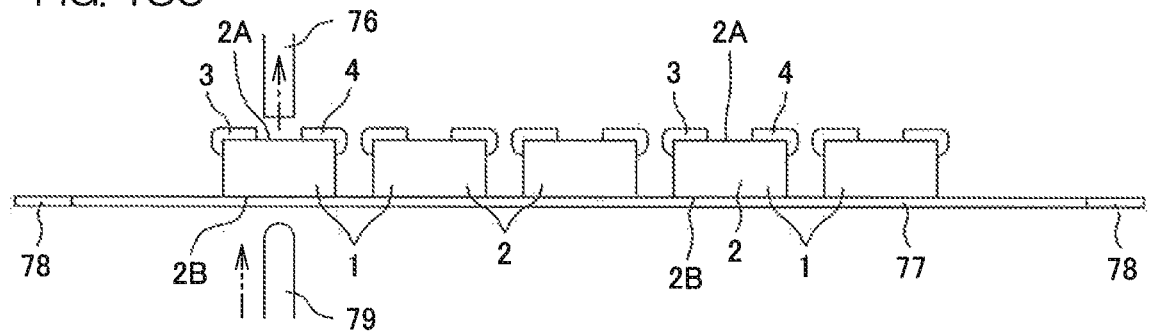
FIG. 18C is a cross-sectional view showing the subsequent step of FIG. 18B.

FIGS. 18A to 18C are schematic cross-sectional views showing the collection step (variation) of the composite chip 1 after the step of FIG. 14I.

Each composite chip 1 can be collected by another method shown in FIGS. 18A to 18C.

As with FIG. 17A, FIG. 18A shows a state where a plurality of composite chips 1 separated into pieces still stick to the support tape 71.

In this state, as shown in FIG. 18B, a transfer tape 77 is adhered to the back surface 2B of the substrate 2 of each composite chip 1. The transfer tape 77 has an adhesive force greater than that of the adhesive surface 72 of the support tape 71.

Hence, as shown in FIG. 18C, after the transfer tape 77 is adhered to each composite chip 1, the support tape 71 is torn off from each composite chip 1. Here, as described previously, ultraviolet rays (see dotted arrows in FIG. 18B) may be applied to the support tape 71 so that the adherence property of the adhesive surface 72 is lowered.

The frames 78 of a collection device (not shown) are adhered to both ends of the transfer tape 77. The frames 78 on both sides can be moved either in a direction in which they approach each other or in a direction in which they are separated. After the support tape 71 is torn off from each composite chip 1, the frames 78 on both sides are moved in the direction in which they are separated, and thus the transfer tape 77 is extended so as to become thin. In this way, the adhesive force of the transfer tape 77 is lowered, and thus each composite chip 1 is easily torn off from the transfer tape 77.

When in this state, the suction nozzle 76 of a transport device (not shown) is directed to the side of the element formation surface 2A of the composite chip 1, the composite chip 1 is torn off from the transfer tape 77 by the suction force produced by the transport device (not shown) and is sucked by the suction nozzle 76. Here, the composite chip 1 is pushed up by a protrusion 79 shown in FIG. 18C from the side opposite to the suction nozzle 76 through the transfer tape 77 to the side of the suction nozzle 76, and thus the composite chip 1 can be smoothly torn off from the transfer tape 77. The composite chip 1 collected in this way is transported by the transport device (not shown) while being sucked by the suction nozzle 76.

Although the preferred embodiments of the present invention are described above, the present invention can be carried out with still other preferred embodiments.

For example, although in the preferred embodiments described above, as an example of the composite chip part of the present invention, the composite chip 1 including, as elements having different functions, the resistor 6 and the capacitor 101 is disclosed, the composite chip 1 may include a diode or an inductor.

For example, when the composite chip 1 includes an inductor, the element 5 formed on the substrate 2 in the inductor includes an inductor element containing a plurality of inductor factors (element factors), and is connected between the first connection electrode 3 and the second connection electrode 4. The element 5 is provided in the multilayer wiring of the multilayer substrate described previously, and is formed with the wiring film 22. In the inductor, on the substrate 2, a plurality of fuses F described previously are provided, and the inductor factors are separably connected via the fuses F to the first connection electrode 3 and the second connection electrode 4.

In this case, in the inductor, one or a plurality of fuses F are selected and cut, and thus a pattern of combinations of a plurality of inductor factors can be an arbitrary pattern, with the result that it is possible to realize chip inductors having various electrical characteristics with the common design.

On the other hand, when the composite chip 1 includes a diode, the element 5 formed on the substrate 2 described above in the diode includes a diode circuit network (diode element) containing a plurality of diode factors (element factors). The diode element is formed on the substrate 2. In the diode, one or a plurality of fuses F are selected and cut, and thus a pattern of combinations of a plurality of diode factors in the diode circuit network can be an arbitrary pattern, with the result that it is possible to realize chip diodes in which the diode circuit network has various electrical characteristics with the common design.

Although in the preferred embodiments described above, an example of the pair chip having a pair of the resistor 6 and the capacitor 101 is described, for example, the composite chip part of the present invention may be a three-arrayed chip where three elements having different functions are arrayed, a four-arrayed chip where four elements having different functions are arrayed or an N-arrayed chip (N is an integer of 5 or more).

Although an example where the resistor 6 includes a plurality of resistor circuits having resistance values that are set so as to be geometric with a geometric ratio of r (0<r, r≠1)=2 is described, the geometric ratio in the geometric progression may be a number other than 2. Moreover, although an example where the capacitor 101 includes a plurality of capacitor factors having capacitance values that are set so as to be geometric with a geometric ratio of r (0<r, r≠1)=2 is described, the geometric ratio in the geometric progression may be a number other than 2.

Although in the capacitor 101, the arrangement in which only the upper electrode film 113 is divided into a plurality of electrode film parts is described, only the lower electrode film 111 may be divided into a plurality of electrode film parts or both the upper electrode film 113 and the lower electrode film 111 may be divided into a plurality of electrode film parts. Furthermore, although in the preferred embodiments described above, the example where the upper electrode film, the lower electrode film and the fuse unit are integrally formed is described, the fuse unit may be formed with a conductive film other than the upper electrode film and the lower electrode film. Although in the capacitor 101 described above, the capacitor structure of one layer having the upper electrode film 113 and the lower electrode film 111 is formed, on the upper electrode film 113, another electrode film is laminated via the capacitor film, with the result that a plurality of capacitor structures may be laminated.

In the first connection electrode 3 and the second connection electrode 4 described above, the Pd layer 34 interposed between the Ni layer 33 and the Au layer 35 can be omitted. When the adhesion properties of the Ni layer 33 and the Au layer 35 are satisfactory, and thus the pinhole described previously is not produced in the Au layer 35, the Pd layer 34 may be omitted.

Figure 19:
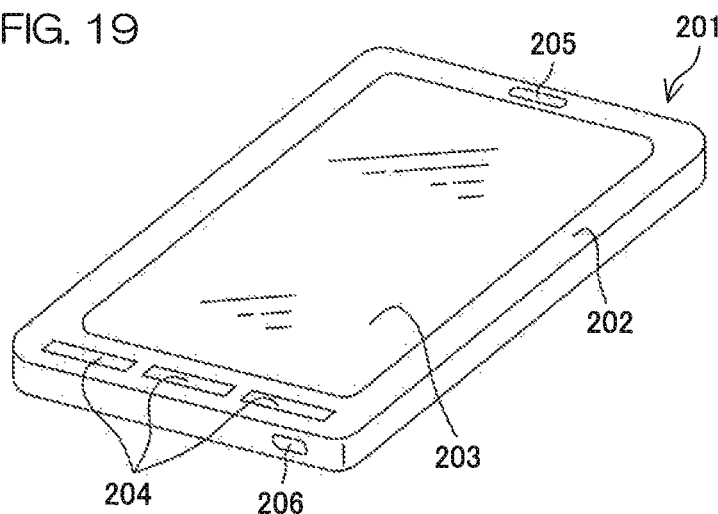
FIG. 19 is a perspective view showing an external view of a smartphone which is an example of an electronic device using the composite chip part of the present invention.

FIG. 19 is a perspective view showing an external view of a smartphone which is an example of an electronic device using the composite chip 1.

In the smartphone 201, electronic parts are stored within a housing 202 in the shape of a flat rectangular parallelepiped. In the housing 202, a pair of rectangular main surfaces are provided on the front side and the back side, and the pair of main surfaces are coupled by four side surfaces. The display surface of a display panel 203 formed with a liquid crystal panel, an organic EL panel or the like is exposed to one of the main surfaces of the housing 202. The display surface of the display panel 203 forms a touch panel, and provides an input interface for a user.

The display panel 203 is formed in the shape of a rectangle that covers a large proportion of the one main surface of the housing 202. Operation buttons 204 are arranged along one short side of the display panel 203. In the preferred embodiment, a plurality of (three) operation buttons 204 are arrayed along the short side of the display panel 203. The user operates the operation buttons 204 and the touch panel to perform an operation on the smartphone 201 and thereby can call and perform the necessary function.

In the vicinity of the other short side of the display panel 203, a speaker 205 is arranged. The speaker 205 provides an ear piece for a telephone function, and is also used as an acoustic unit for reproducing music data and the like. On the other hand, near the operation buttons 204, a microphone 206 is arranged on one side surface of the housing 202. The microphone 206 provides a mouth piece for the telephone function, and can also be used as a recording microphone.

Figure 20:
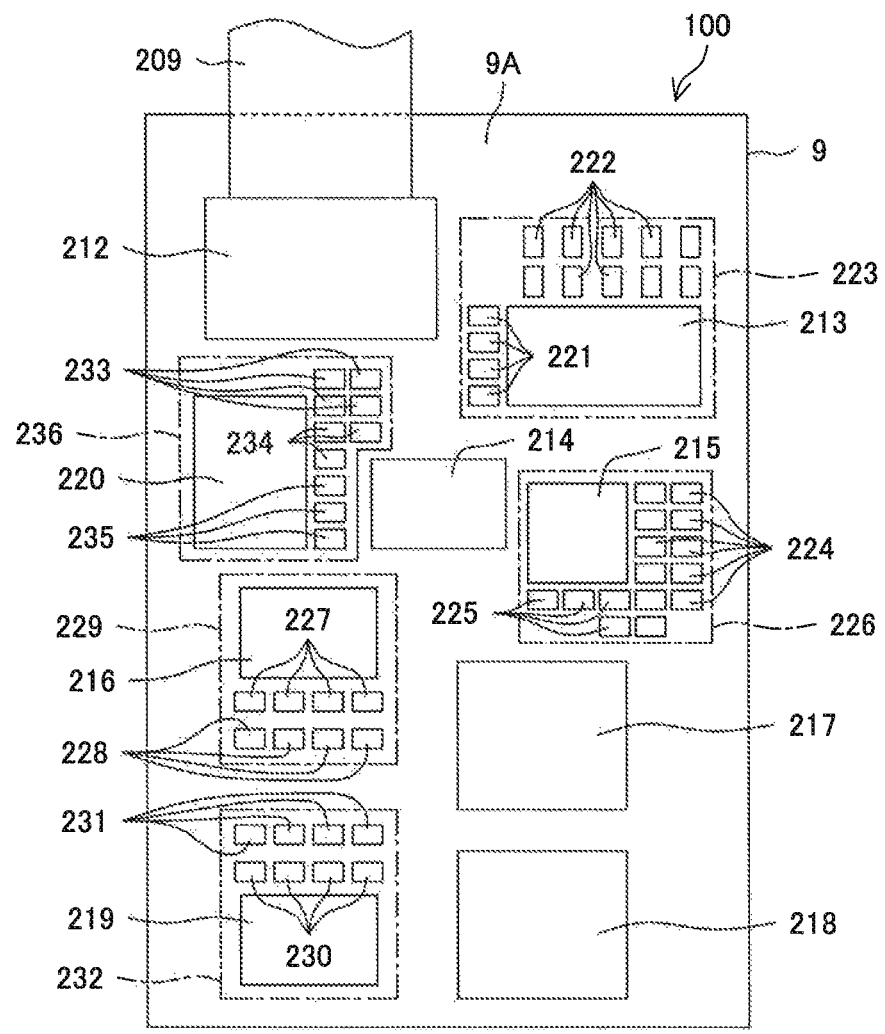
FIG. 20 is a schematic plan view showing the arrangement of the circuit assembly held within the housing of the smartphone.

FIG. 20 is a schematic plan view showing the arrangement of the circuit assembly 100 held within the housing 202. The circuit assembly 100 includes the mounting substrate 9 described above and circuit parts mounted on the mounting surface 9A of the mounting substrate 9. A plurality of circuit parts include a plurality of integrated circuit elements (IC) 212 to 220 and a plurality of chip parts. The plurality of ICs include a transmission processing IC 212, a one segment TV reception IC 213, a GPS reception IC 214, an FM tuner IC 215, a power supply IC 216, a flash memory 217, a microcomputer 218, a power supply IC 219 and a baseband IC 220. The plurality of chip parts include chip inductors 221, 225 and 235, chip resistors 222, 224 and 233, chip capacitors 227, 230 and 234 and chip diodes 228 and 231.

The transmission processing IC 212 incorporates an electronic circuit for generating a display control signal for the display panel 203 and receiving an input signal from the touch panel on the surface of the display panel 203. For connection to the display panel 203, a flexible wiring 209 is connected to the transmission processing IC 212.

The one segment TV reception IC 213 incorporates an electronic circuit forming a receiver for receiving radio waves of the one segment broadcasting (digital terrestrial TV broadcasting having a portable device as a reception target). In the vicinity of the one segment TV reception IC 213, a plurality of chip inductors 221 and a plurality of chip resistors 222 are arranged. The one segment TV reception IC 213, the chip inductor 221 and the chip resistor 222 form a one segment broadcasting reception circuit 223. The chip inductor 221 and the chip resistor 222 respectively have an inductance and a resistor portion adjusted accurately, and provide an accurate circuit constant to the one segment broadcasting reception circuit 223.

The GPS reception IC 214 incorporates an electronic circuit that receives radio waves from the GPS satellites to output positional information of the smartphone 201.

The FM tuner IC 215 forms an FM broadcasting reception circuit 226 together with a plurality of chip resistors 224 and a plurality of chip inductors 225 mounted on the mounting substrate 9 in the vicinity thereof. The chip resistor 224 and the chip inductor 225 respectively have a resistance value and an inductance adjusted accurately, and provide an accurate circuit constant to the FM broadcasting reception circuit 226.

In the vicinity of the power supply IC 216, a plurality of chip capacitors 227 and a plurality of chip diodes 228 are mounted on the mounting surface of the mounting substrate 9. The power supply IC 216 forms a power supply circuit 229 together with the chip capacitor 227 and the chip diode 228.

The flash memory 217 is a storage device for recording an operating system program, data generated within the smartphone 201, data and programs acquired by a communication function from the outside and the like.

The microcomputer 218 is a computation processing circuit that incorporates a CPU, a ROM and a RAM and that performs various types of computation processing to realize a plurality of functions in the smartphone 201. More specifically, image processing and computation processing for various types of application programs are realized by the function of the microcomputer 218.

Near the power supply IC 219, a plurality of chip capacitors 230 and a plurality of chip diodes 231 are mounted on the mounting surface of the mounting substrate 9. The power supply IC 219 forms a power supply circuit 232 together with the chip capacitor 230 and the chip diode 231.

Near the baseband IC 220, a plurality of chip resistors 233, a plurality of chip capacitors 234 and a plurality of chip inductors 235 are mounted on the mounting surface 9A of the mounting substrate 9. The baseband IC 220 forms a baseband communication circuit 236 together with the chip resistor 233, the chip capacitor 234 and the chip inductor 235. The baseband communication circuit 236 provides a communication function for telephone communication and data communication.

In the arrangement described above, power appropriately adjusted by the power supply circuits 229 and 232 is supplied to the transmission processing IC 212, the GPS reception IC 214, the one segment broadcasting reception circuit 223, the FM broadcasting reception circuit 226, the baseband communication circuit 236, the flash memory 217 and the microcomputer 218. The microcomputer 218 performs computation processing in response to an input signal input via the transmission processing IC 212, and outputs a display control signal from the transmission processing IC 212 to the display panel 203 to make the display panel 203 produce various types of displays.

When an instruction to receive the one segment broadcasting is provided by the operation of the touch panel or the operation buttons 204, the one segment broadcasting is received by the function of the one segment broadcasting reception circuit 223. Then, computation processing for outputting an image received to the display panel 203 and converting sound received into acoustic sound from the speaker 205 is performed by the microcomputer 218.

When the positional information of the smartphone 201 is needed, the microcomputer 218 acquires the positional information output by the GPS reception IC 214, and performs computation processing using the positional information.

Furthermore, when an instruction to receive FM broadcasting is input by the operation of the touch panel or the operation buttons 204, the microcomputer 218 starts up the FM broadcasting reception circuit 226, and performs computation processing for outputting the received sound from the speaker 205.

The flash memory 217 is used to store data acquired by communication and to store data produced by the computation of the microcomputer 218 and input from the touch panel. As necessary, the microcomputer 218 writes data into the flash memory 217 and reads data from the flash memory 217.

The function of telephone communication or data communication is realized by the baseband communication circuit 236. The microcomputer 218 controls the baseband communication circuit 236 to perform processing for transmitting and receiving sound or data.

The composite chip part of the present invention is used in the smartphone 201 of such an arrangement, and thus it is possible to mount a plurality of chip parts as one chip on the mounting substrate 9. For example, in the baseband communication circuit 236, the chip resistor 233 and the chip capacitor 234 are mounted as one chip, and thus it is possible to reduce the mounting area of the baseband communication circuit 236.

Moreover, various types of design changes can be performed in the range recited in the scope of claims.

First Reference Example

An object of the first reference example is to provide a multiple-arrayed chip part that can reduce the junction area (mounting area) of a mounting substrate and can enhance the efficiency of a mounting operation.

Another object of the first reference example is to provide a circuit assembly that includes the multiple-arrayed chip part of the first reference example and an electronic device that includes such a circuit assembly.

Preferred embodiments of the first reference example will be described in detail below with reference to accompanying drawings.

Figure 21A:
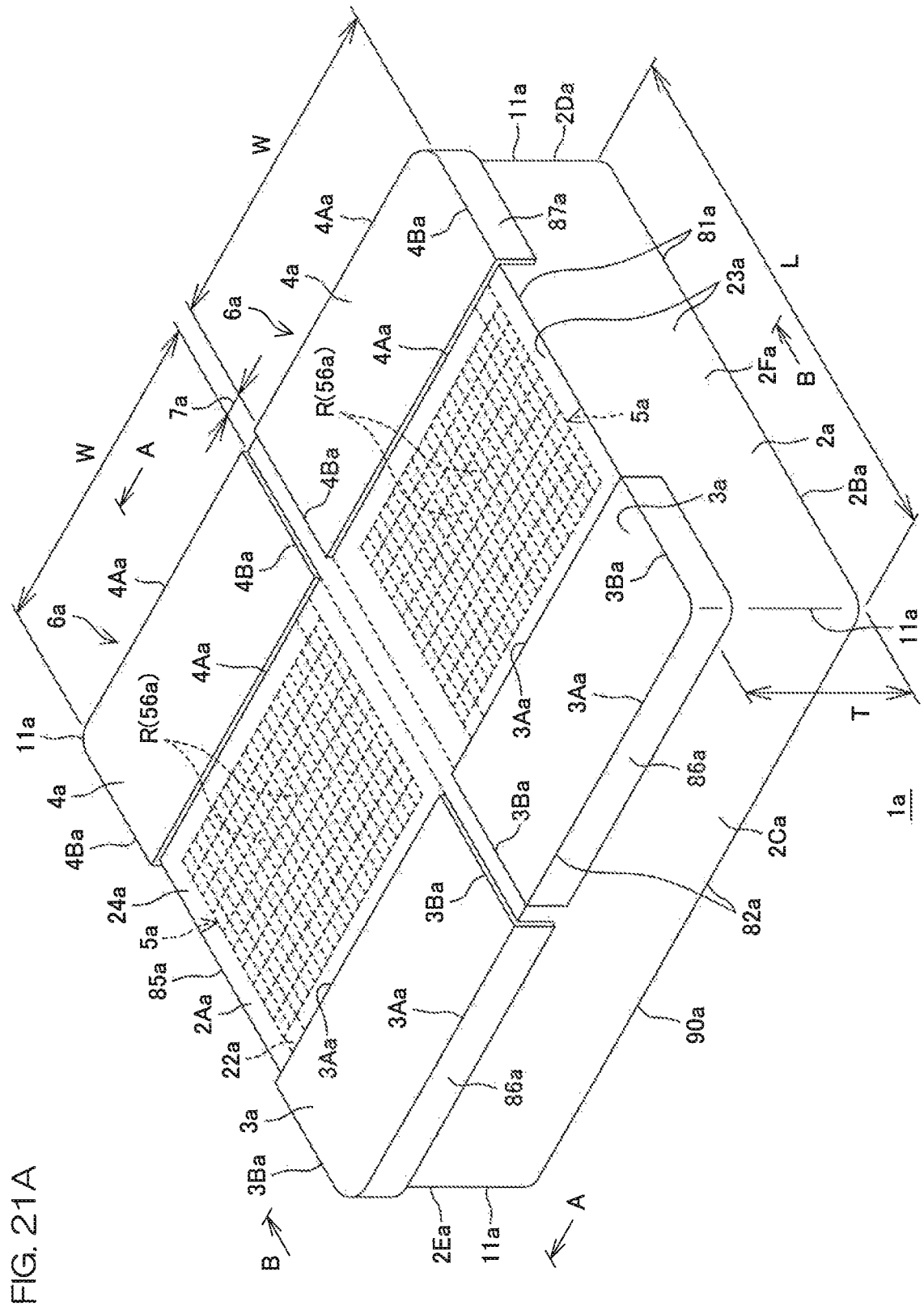
FIG. 21A is a schematic perspective view for illustrating the arrangement of a chip resistor according to a preferred embodiment of a first reference example.

FIG. 21A is a schematic perspective view for illustrating the arrangement of a chip resistor 1a according to a preferred embodiment of a first reference example.

As shown in FIG. 21A, the chip resistor 1a which is an example of the multiple-arrayed chip part of the first reference example is a pair chip in which a pair of resistors 6a are mounted on a common substrate 2a as an example of a plurality of chip elements of the first reference example. The pair of resistors 6a are arranged adjacent to each other so as to be symmetric with respect to the boundary region 7a thereof.

The chip resistor 1a is formed in the shape of a rectangular parallelepiped. The planar shape of the chip resistor 1a is a quadrangle in which a side (horizontal side 82a) along the direction (hereinafter, the horizontal direction of the substrate 2a) in which the pair of resistors 6a are arrayed and a side (vertical side 81a) perpendicular to the horizontal side 82a are less than 0.63 mm and less than 0.6 mm, respectively. Preferably, each resistor 6a mounted on the chip resistor 1a is smaller than a 0603 size in which planar dimensions are 0.6 mm×0.3 mm. For example, each resistor 6a may have a 03015 size in which the length L (the length of the vertical side 81a) is about 0.3 mm and the width W is about 0.15 mm or a 0402 size in which the length L is about 0.4 mm and the width W is about 0.2 mm. Preferably, the thickness T of the chip resistor 1a is about 0.1 mm, and the width of the boundary region 7a between the resistors 6a adjacent to each other is about 0.03 mm.

The chip resistor 1a is obtained by forming, on the substrate, a large number of chip resistors 1a in a lattice, then forming grooves in the substrate, thereafter performing back polishing (or separating the substrate with the grooves) and thereby separating them into individual chip resistors 1a.

Each resistor 6a mainly includes the substrate 2a forming the main body of the chip resistor 1a, a first connection electrode 3a and a second connection electrode 4a serving as external connection electrodes and an element 5a externally connected with the first connection electrode 3a and the second connection electrode 4a.

The substrate 2a has a chip shape substantially in the form of a rectangular parallelepiped. In FIG. 21A, one surface of the substrate 2a that forms the upper surface is an element formation surface 2Aa. The element formation surface 2Aa is the surface of the substrate 2a on which the element 5a is formed, and is formed substantially in the shape of a rectangle. The surface on the opposite side to the element formation surface 2Aa in the direction of the thickness of the substrate 2a is a back surface 2Ba. The element formation surface 2Aa and the back surface 2Ba have substantially the same dimensions and shapes and are parallel to each other. It is assumed that a quadrangular edge partitioned by a pair of the vertical side 81a and the horizontal side 82a in the element formation surface 2Aa is referred to as a peripheral edge portion 85a, and that a quadrangular edge partitioned by a pair of the vertical side 81a and the horizontal side 82a in the back surface 2Ba is referred to as a peripheral edge portion 90a. When seen in a normal direction perpendicular to the element formation surface 2Aa (the back surface 2Ba), the peripheral edge portion 85a and the peripheral edge portion 90a are overlaid (see FIGS. 21C and 21D that will be described later).

The substrate 2a has, as surfaces other than the element formation surface 2Aa and the back surface 2Ba, a plurality of side surfaces (a side surface 2Ca, a side surface 2Da, a side surface 2Ea and a side surface 2Fa). The plurality of side surfaces 2Ca to 2Fa extend so as to intersect (specifically, perpendicularly intersect) the element formation surface 2Aa and the back surface 2Ba, and thereby connect the element formation surface 2Aa and the back surface 2Ba.

The side surface 2Ca is provided between the horizontal sides 82a on one side (the left front side in FIG. 21A) in the vertical direction (hereinafter, the vertical direction of the substrate 2a) perpendicularly intersecting the horizontal direction of the substrate 2a in the element formation surface 2Aa and the back surface 2Ba, and the side surface 2Da is provided between the horizontal sides 82a on the other side (the right rear side in FIG. 21A) in the vertical direction of the substrate 2a in the element formation surface 2Aa and the back surface 2Ba. The side surface 2Ca and the side surface 2Da are both end surfaces of the substrate 2a in the vertical direction.

The side surface 2Ea is provided between the vertical sides 81a on one side (the left rear side in FIG. 21A) in the horizontal direction of the substrate 2a in the element formation surface 2Aa and the back surface 2Ba, and the side surface 2Fa is provided between the vertical sides 81a on the other side (the right front side in FIG. 21A) in the horizontal direction of the substrate 2a in the element formation surface 2Aa and the back surface 2Ba. The side surface 2Ea and the side surface 2Fa are both end surfaces of the substrate 2a in the horizontal direction.

The side surface 2Ca and the side surface 2Da intersect (specifically, perpendicularly intersect) each of the side surface 2Ea and the side surface 2Fa. Hence, parts adjacent to each other in the area from the element formation surface 2Aa to the side surface 2Fa form a right angle.

In the substrate 2a, the entire region of the element formation surface 2Aa and the side surfaces 2Ca to 2Fa is covered by a passivation film 23a. Hence, strictly speaking, in FIG. 21A, the entire region of the element formation surface 2Aa and the side surfaces 2Ca to 2Fa is located on the inner side (back side) of the passivation film 23a, and is thereby prevented from being exposed to the outside. Furthermore, the chip resistor 1a includes a resin film 24a.

The resin film 24a covers the entire region (the peripheral edge portion 85a and the inside region thereof) of the passivation film 23a on the element formation surface 2Aa. The passivation film 23a and the resin film 24a will be described in detail later.

The first connection electrode 3a and the second connection electrode 4a include peripheral edge portions 86a and 87a that are formed so as to cover the peripheral edge portion 85a on the element formation surface 2Aa of the substrate 2a and to straddle the element formation surface 2Aa and the side surfaces 2Ca to 2Fa. In the preferred embodiment, the peripheral edge portions 86a and 87a are formed so as to cover corner portions 11a where the side surfaces 2Ca to 2Fa of the substrate 2a intersect each other. The substrate 2a is rounded such that the corner portions 11a are chamfered in plan view. In this way, the substrate 2a has such a structure that chipping can be reduced in a step of manufacturing the chip resistor 1a and at the time of mounting.

Each of the first connection electrode 3a and the second connection electrode 4a is formed by laminating, for example, Ni (nickel), Pd (palladium) and Au (gold) in this order on the element formation surface 2Aa.

The first connection electrode 3a and the second connection electrode 4a have substantially the same dimensions and sizes in plan view when seen in the normal direction described previously. The first connection electrode 3a has a pair of long sides 3Aa and a pair of short sides 3Ba, which form four sides in plan view. The long sides 3Aa perpendicularly intersect the short sides 3Ba in plan view. The second connection electrode 4a has a pair of long sides 4Aa and a pair of short sides 4Ba, which form four sides in plan view. The long sides 4Aa perpendicularly intersect the short sides 4Ba in plan view. The long sides 3Aa and the long sides 4Aa extend parallel to the horizontal side 82a of the substrate 2a, and the short sides 3Ba and the short sides 4Ba extend parallel to the vertical side 81a of the substrate 2a. The chip resistor 1a has no electrode on the back surface 2Ba of the substrate 2a.

The element 5a is a circuit element, is formed in a region between the first connection electrode 3a and the second connection electrode 4a in the element formation surface 2Aa of the substrate 2a and is coated from above with the passivation film 23a and the resin film 24a. The element 5a of the preferred embodiment is a resistor portion 56a.

The resistor portion 56a is formed with a circuit network in which a plurality of (unit) resistor bodies R having equal resistance values are arrayed on the element formation surface 2Aa in a matrix. The resistor body R is formed of TiN (titanium nitride), TiON (titanium oxide nitride) or TiSiON. The element 5a is electrically connected to the wiring film 22a which will be described later, and is electrically connected via the wiring film 22a to the first connection electrode 3a and the second connection electrode 4a. In other words, the element 5a is formed on the substrate 2a and is connected between the first connection electrode 3a and the second connection electrode 4a.

Figure 21B:
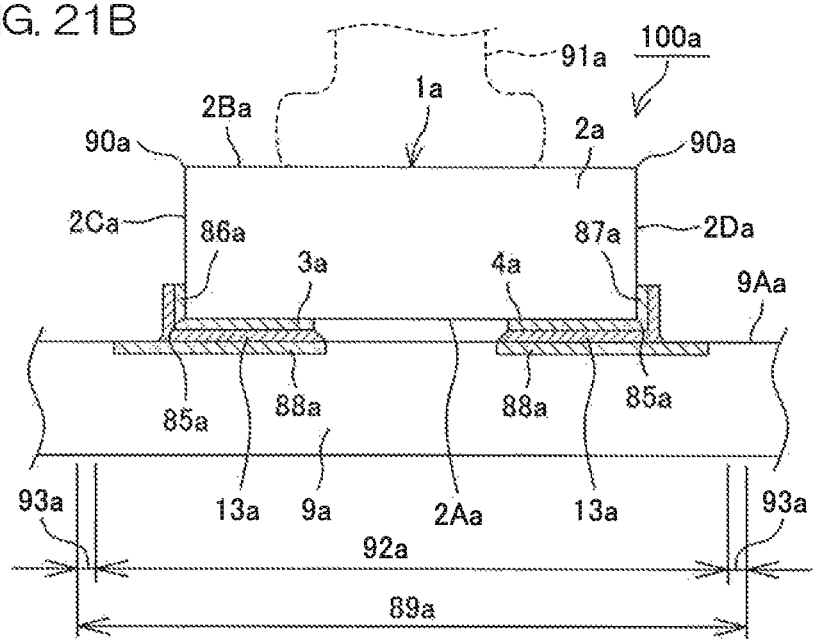
FIG. 21B is a schematic cross-sectional view of a circuit assembly with the chip resistor mounted on a mounting substrate.
Figure 21C:
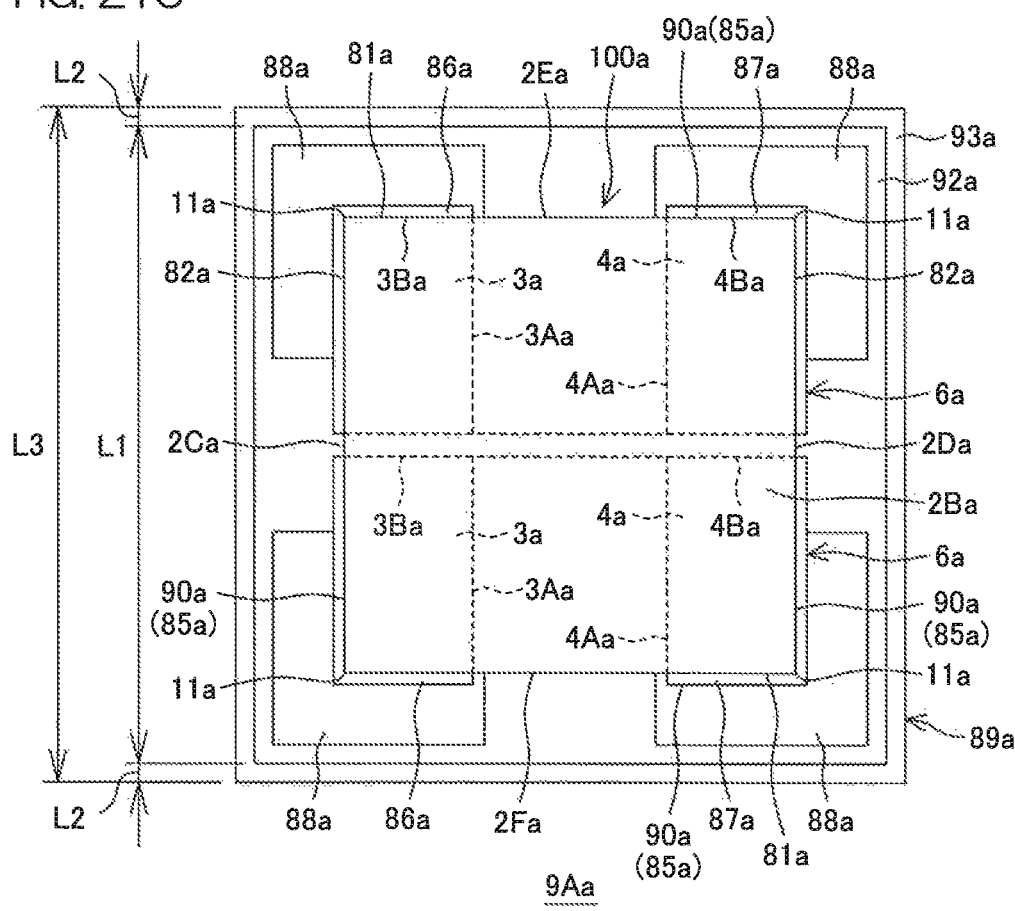
FIG. 21C is a schematic plan view when the circuit assembly is seen from the side of the back surface of the chip resistor.
Figure 21D:
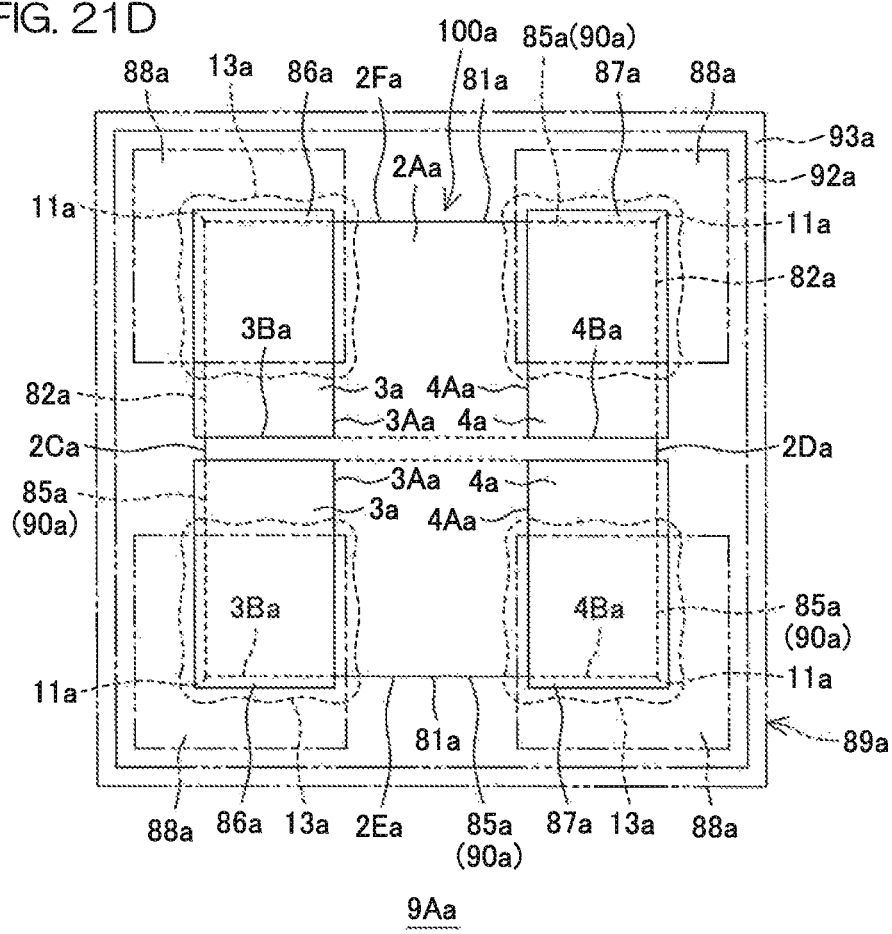
FIG. 21D is a schematic plan view when the circuit assembly is seen from the side of the element formation surface of the chip resistor.

FIG. 21B is a schematic cross-sectional view of a circuit assembly 100a with the chip resistor 1a mounted on a mounting substrate 9a. FIG. 21C is a schematic plan view when the circuit assembly 100a is seen from the side of the back surface 2Ba of the chip resistor 1a. FIG. 21D is a schematic plan view when the circuit assembly 100a is seen from the side of the element formation surface 2Aa of the chip resistor 1a. FIGS. 21B to 21D show only main portions.

As shown in FIGS. 21B to 21D, the chip resistor 1a is mounted on the mounting substrate 9a. The chip resistor 1a and the mounting substrate 9a in this state form the circuit assembly 100a.

As shown in FIG. 21B, the upper surface of the mounting substrate 9a is a mounting surface 9Aa. In the mounting surface 9Aa, a mounting region 89a for the chip resistor 1a is partitioned. In the preferred embodiment, as shown in FIGS. 21C and 21D, the mounting region 89a is formed in the shape of a square in plan view, and includes a land region 92a where a land 88a is arranged and a solder resist region 93a that surrounds the land region 92a.

For example, when the chip resistor 1a is a pair chip that has a pair of resistors 6a having a 03015 size, the land region 92a is formed in the shape of a quadrangle (square) having a planar size of 410 μm×410 μm. In other words, the length L1 of one side of the land region 92a is 410 μm. On the other hand, the solder resist region 93a is formed in the shape of a square ring having, for example, a width L2 of 25 μm so as to frame the land region 92a.

A total of four lands 88a are individually arranged in the four corners of the land region 92a. In the preferred embodiment, the lands 88a are provided in positions a predetermined distance apart from the sides partitioning the land region 92a. For example, the distance from each side of the land region 92a to the corresponding land 88a is 25 μm. Between the lands 88a adjacent to each other, a distance of 80 μm is provided. Each land 88a is formed of, for example, Cu, and is connected to the internal circuit (not shown) of the mounting substrate 9a. As shown in FIG. 21B, on the surface of each land 88a, a solder 13a is provided so as to protrude from the surface thereof.

When the chip resistor 1a is mounted on the mounting substrate 9a, as shown in FIG. 21B, the suction nozzle 91a of an automatic mounting machine (not shown) is made to suck the back surface 2Ba of the chip resistor 1a, then the suction nozzle 91a is moved and thus the chip resistor 1a is transported. Here, the suction nozzle 91a sucks a substantially center part of the back surface 2Ba of the substrate 2a in the vertical direction. As described above, the first connection electrode 3a and the second connection electrode 4a are provided on only one surface (the element formation surface 2Aa) of the chip resistor 1a and the end portions of the side surfaces 2Ca to 2Fa on the side of the element formation surface 2Aa, and thus in the chip resistor 1a, the back surface 2Ba is a flat surface without any electrode (projections and recesses). Hence, when the suction nozzle 91a is made to suck the chip resistor 1a and is moved, the suction nozzle 91a can be made to suck the flat back surface 2Ba. In other words, when the back surface 2Ba is flat, it is possible to increase the margin of a part that the suction nozzle 91a can suck. In this way, it is possible to reliably make the suction nozzle 91a suck the chip resistor 1a and to reliably transport the chip resistor 1a without the chip resistor 1a being dropped from the suction nozzle 91a halfway through.

Since the chip resistor 1a is a pair chip that includes a pair of the resistors 6a, as compared with a case where a single chip on which only one of the resistors 6a is mounted twice, the chip part having the same function can be mounted by performing only one mounting operation. Furthermore, as compared with a single chip, the area of the back surface per chip can be increased beyond the area of the back surface corresponding to two resistors, with the result that it is possible to stabilize the suction operation by the suction nozzle 91a.

Then, the suction nozzle 91a sucking the chip resistor 1a is moved to the mounting substrate 9a. Here, the element formation surface 2Aa of the chip resistor 1a and the mounting surface 9Aa of the mounting substrate 9a are opposite each other. In this state, the suction nozzle 91a is moved to be pressed onto the mounting substrate 9a, and thus in the chip resistor 1a, the first connection electrode 3a and the second connection electrode 4a are brought into contact with the solder 13a of each land 88a. Then, when the solder 13a is heated, the solder 13a is melted. Thereafter, when the solder 13a is cooled to be solidified, the first connection electrode 3a, the second connection electrode 4a and the land 88a are joined via the solder 13a. In other words, each land 88a is joined by solder to the corresponding electrode in the first connection electrode 3a and the second connection electrode 4a. In this way, the mounting (flip-chip connection) of the chip resistor 1a on the mounting substrate 9a is finished, with the result that the circuit assembly 100a is completed. In the completed circuit assembly 100a, the element formation surface 2Aa of the chip resistor 1a and the mounting surface 9Aa of the mounting substrate 9a are opposite each other through a gap, and extend parallel to each other. In the first connection electrode 3a and the second connection electrode 4a, the dimension of the gap corresponds to the total of the thickness of apart protruding from the element formation surface 2Aa and the thickness of the solder 13a.

In the circuit assembly 100a, the peripheral edge portions 86a and 87a of the first connection electrode 3a and the second connection electrode 4a are formed so as to straddle the element formation surface 2Aa and the side surfaces 2Ca to 2Fa (in FIG. 21B, only the side surfaces 2Ca and 2Da are shown) of the substrate 2a. Hence, it is possible to enlarge an adhesion area when the chip resistor 1a is soldered to the mounting substrate 9a. Consequently, since it is possible to increase the adsorbed amount of solder 13a to the first connection electrode 3a and the second connection electrode 4a, it is possible to enhance the adhesion strength. In the mounted state, the chip part can be retained from at least two directions of the element formation surface 2Aa and the side surfaces 2Ca to 2Fa of the substrate 2a. Hence, it is possible to stabilize the mounting shape of the chip part 1a. Moreover, since the chip part 1a mounted on the mounting substrate 9a can be supported by four points, that is, the four lands 88a, it is possible to further stabilize the mounting shape of the chip part 1a.

The chip resistor 1a is a pair chip that includes a pair of the resistors 6a having a 03015 size. Hence, it is possible to significantly reduce the area of the mounting region 89a for the chip resistor 1a as compared with a conventional one.

For example, in the preferred embodiment, with reference to FIG. 21C, the area of the mounting region 89a is only L3×L3=(L2+L1+L2)×(L2+L1+L2)=(25+410+25)×(25+410+25)=211600 μm².

Figure 21E:
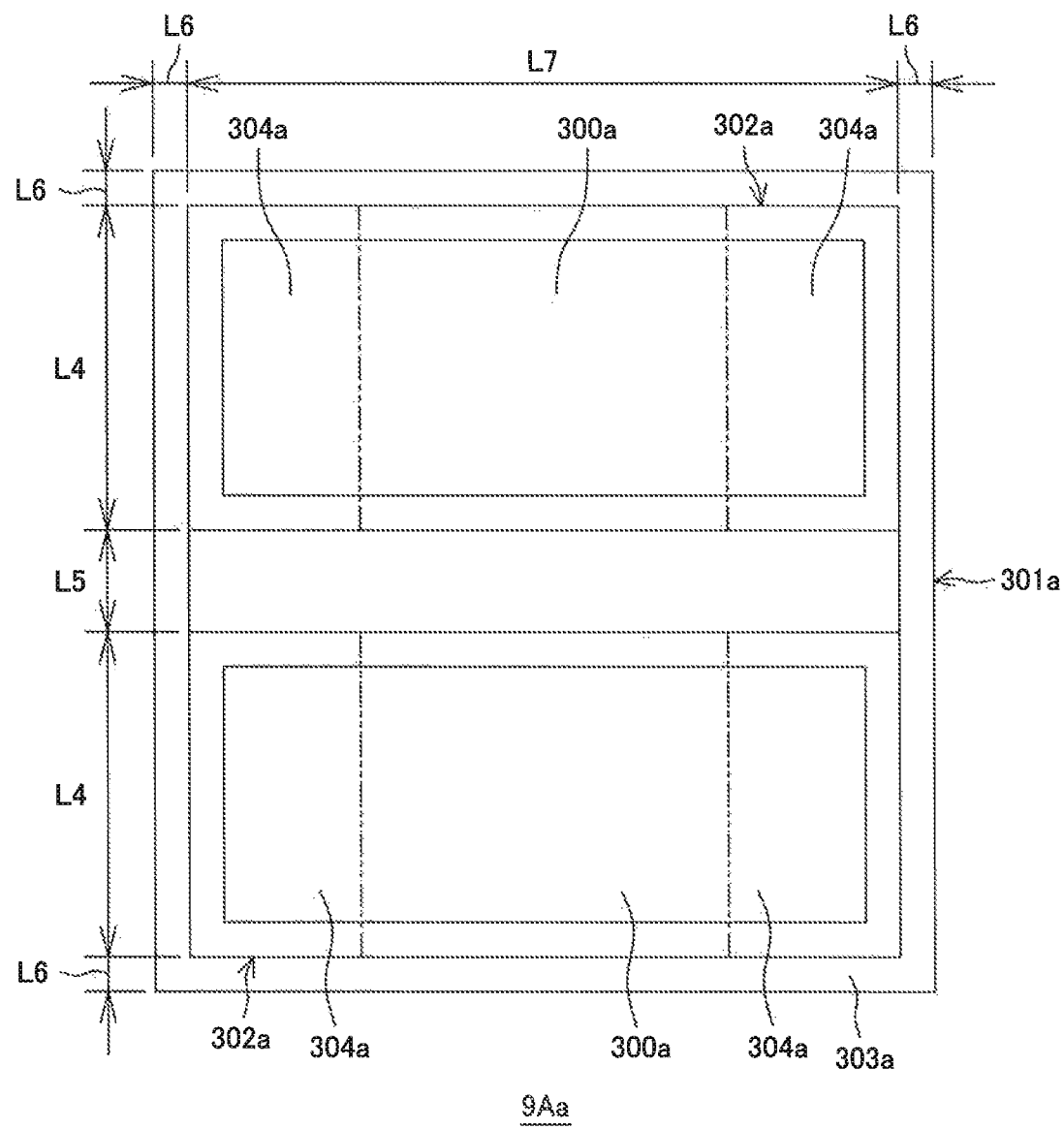
FIG. 21E is a drawing showing a state where two single chips are mounted on the mounting substrate.

On the other hand, as shown in FIG. 21E, when two single chips 300a having a 0402 size, which is the minimum size that can be conventionally produced, are mounted on the mounting surface 9Aa of the mounting substrate 9a, a mounting region 301a of 319000 μm² is needed. Hence, when the area of the mounting region 89a of the preferred embodiment is compared with that of the conventional mounting region 301a, it is found that in the arrangement of the preferred embodiment, it is possible to reduce the mounting area by about 34%.

The area of the mounting region 301a of FIG. 21E is calculated to be (L6+L4+L5+L4+L6)×(L6+L7+L6)=(25+250+30+250+25)×(25+500+25)=319000 μm² based on the width L4 of the mounting area 302a of each single chip 300a where lands 304a are arranged=250 μm, the distance L5 between the adjacent mounting areas 302a=30 μm, the width L6 of a solder resist region 303a forming the outer periphery of the mounting region 301a=25 μm and the length L7 of the mounting area 302a=500 μm.

Another arrangement of the chip resistor 1a will then be mainly described.

Figure 22:
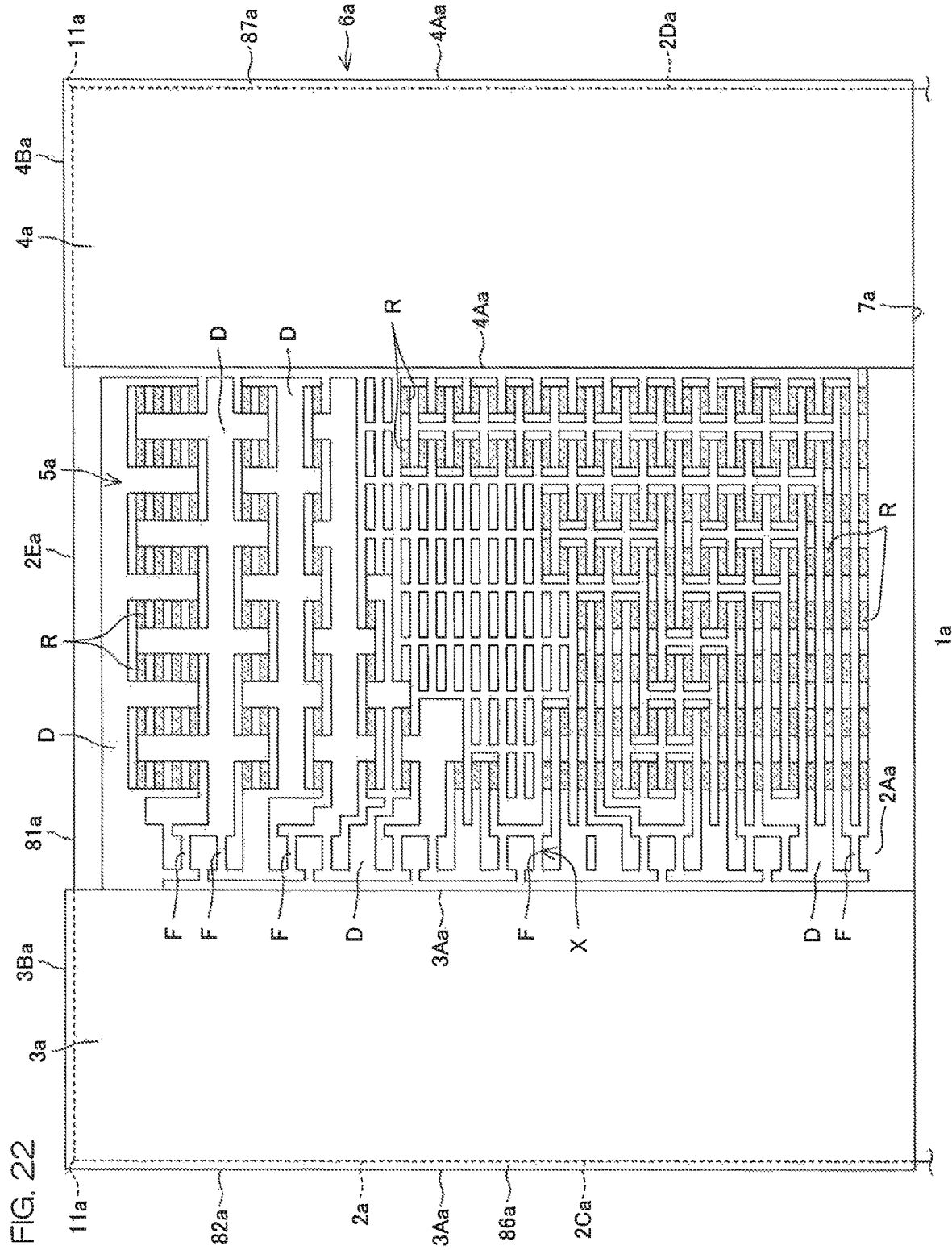
FIG. 22 A plan view of one resistor of the chip resistor, a drawing showing a positional relationship between a first connection electrode, a second connection electrode and an element and the arrangement of the element in plan view.

FIG. 22 is a plan view of one resistor 6a of the chip resistor 1a, a drawing showing a positional relationship between the first connection electrode 3a, the second connection electrode 4a and the element 5a and the arrangement (layout pattern) of the element 5a in plan view.

With reference to FIG. 22, the element 5a is a resistor circuit network. Specifically, the element 5a includes a total of 352 resistor bodies R formed with 8 resistor bodies R arrayed along a row direction (the vertical direction of the substrate 2a) and 44 resistor bodies R arrayed along a column direction (the horizontal direction of the substrate 2a). These resistor bodies R are a plurality of element factors that form the resistor circuit network of the element 5a.

A large number of resistor bodies R described above are collected every predetermined number of 1 to 64 pieces and are electrically connected, and thus a plurality of types of resistor circuits are formed. The plurality of types of resistor circuits formed are connected by a conductive film D (wiring film formed with a conductor) so as to have a predetermined aspect. Furthermore, in the element formation surface 2Aa of the substrate 2a, a plurality of fuses F are provided which can be cut (blown) such that the resistor circuit is electrically incorporated into the element 5a or is electrically separated from the element 5a. The plurality of fuses F and the conductive film D are arrayed along the inner side of the first connection electrode 3a such that the arrangement region thereof is formed linearly. More specifically, the plurality of fuses F and the conductive film D are arranged so as to be adjacent to each other, and the direction of the array thereof is linear. The plurality of fuses F connect the plurality of types of resistor circuits (a plurality of resistor bodies R per resistor circuit) to the first connection electrode 3a such that the resistor circuits can be individually cut (separated) from the first connection electrode 3a.

FIG. 23A is a plan view depicting an enlarged part of the element 5a shown in FIG. 22. FIG. 23B is a vertical cross-sectional view depicted for illustrating the arrangement of the resistor bodies R of the element 5a in a length direction along line B-B of FIG. 23A. FIG. 23C is a vertical cross-sectional view depicted for illustrating the arrangement of the resistor bodies R of the element 5a in a width direction along line C-C of FIG. 23A.

The arrangement of the resistor bodies R will be described with reference to FIGS. 23A, 23B and 23C.

The resistors 6a of the chip resistor 1a further include an insulating film 20a and a resistor body film 21a in addition to the wiring film 22a, the passivation film 23a and the resin film 24a described above (see FIGS. 23B and 23C). The insulating film 20a, the resistor body film 21a, the wiring film 22a, the passivation film 23a and the resin film 24a are formed on the substrate 2a (the element formation surface 2Aa).

The insulating film 20a is formed of $SiO_2$ (oxide silicon). The insulating film 20a covers the entire region of the element formation surface 2Aa of the substrate 2a. The thickness of the insulating film 20a is about 10000 angstroms.

The resistor body film 21a is formed on the insulating film 20a. The resistor body film 21a is formed of TiN, TiON or TiSiON. The thickness of the resistor body film 21a is about 2000 angstroms. The resistor body film 21a forms a plurality of lines of resistor body film (hereinafter referred to as "resistor body film lines 21Aa") that extend linearly parallel to each other between the first connection electrode 3a and the second connection electrode 4a. The resistor body film line 21Aa may be cut in a predetermined position in the direction of the line (see FIG. 23A).

On the resistor body film line 21Aa, the wiring film 22a is laminated. The wiring film 22a is formed of Al (aluminum) or an alloy (AlCu alloy) of aluminum and Cu (copper). The thickness of the wiring film 22a is about 8000 angstroms. The wiring films 22a are laminated on the resistor body film line 21Aa a given distance R apart in the direction of the line, and are in contact with the resistor body film line 21Aa.

Figure 24A:
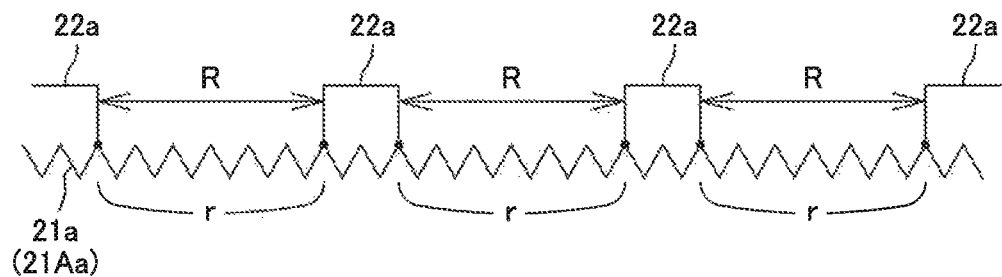
FIG. 24A, FIG. 24B, and FIG. 24C are drawings showing the electrical characteristics of a resistor body film line and a wiring film with circuit symbols and electrical circuit diagrams.
Figure 24B:
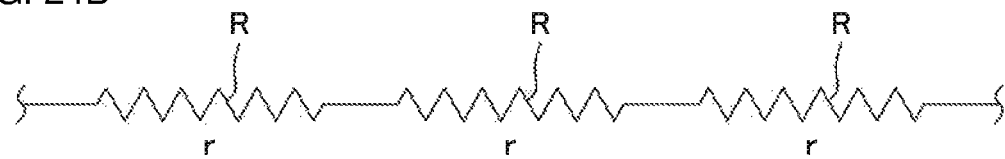

The electrical characteristics of the resistor body film line 21Aa and the wiring film 22a in this arrangement are shown with circuit symbols in FIG. 24. Specifically, as shown in FIG. 24(a), the part of the resistor body film line 21Aa in the region of the given distance R forms one resistor body R having a given resistance value r.

In the region where the wiring film 22a is laminated, the wiring film 22a electrically connects the adjacent resistor bodies R, and thus the resistor body film line 21Aa is short-circuited by the wiring film 22a. Consequently, the resistor circuit is formed that is formed with the resistor bodies R of the resistor portion r shown in FIG. 24(b) and connected in series.

Figure 24C:
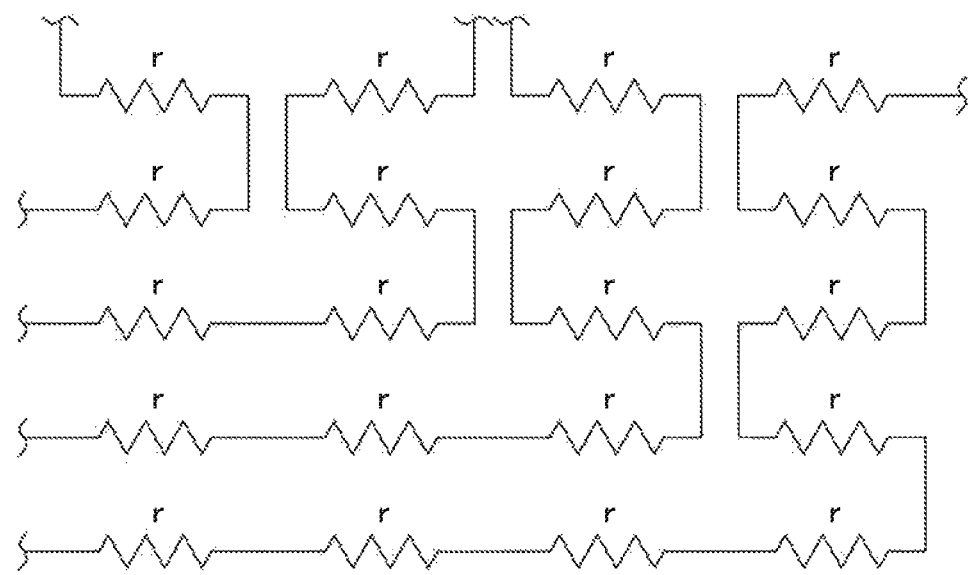

The adjacent resistor body film lines 21Aa are connected with the resistor body film 21a and the wiring film 22a, and thus the resistor circuit network of the element 5a shown in FIG. 23A forms the resistor circuit shown in FIG. 24(c) (formed with the unit resistor portions of the resistor bodies R described above). As described above, the resistor body film 21a and the wiring film 22a form the resistor bodies R and the resistor circuit (that is, the element 5a). Each resistor body R includes the resistor body film line 21Aa (the resistor body film 21a) and a plurality of wiring films 22a laminated the given distance apart on the resistor body film line 21Aa in the direction of the line, and the resistor body film line 21Aa in the part of the given distance R where the wiring film 22a is not laminated forms one resistor body R. All the shapes and the sizes of the resistor body film lines 21Aa in the parts forming the resistor bodies R are equal to each other. Hence, a large number of resistor bodies R arrayed in a matrix on the substrate 2a have equal resistance values.

The wiring film 22a laminated on the resistor body film line 21Aa forms the resistor bodies R and also functions as the conductive film D for forming the resistor circuit by connecting the plurality of resistor bodies R (see FIG. 22).

Figures 25A, 25B:
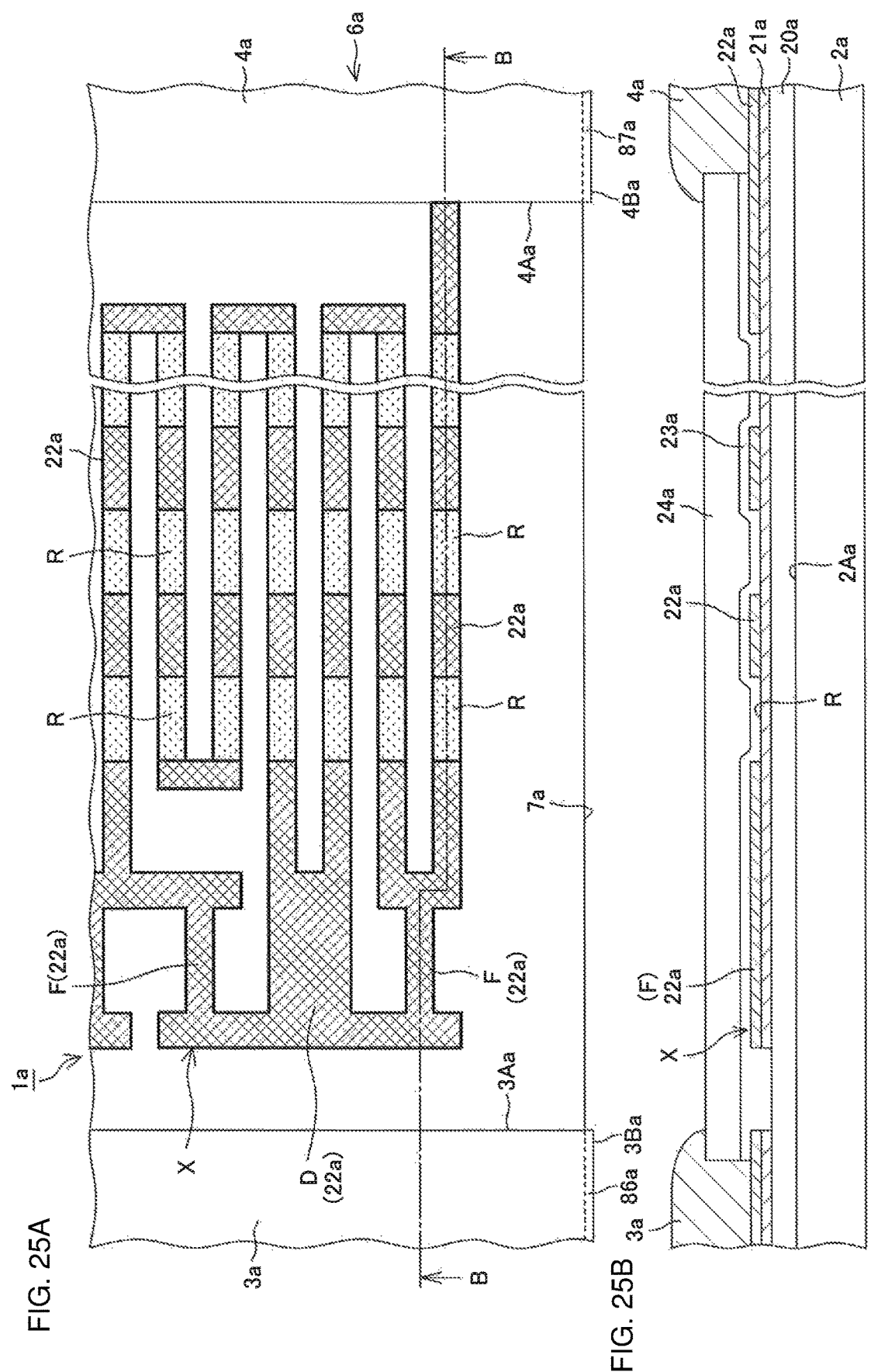
FIG. 25A is a partially enlarged plan view of a region including fuses depicting an enlarged part of a plan view of the resistor of FIG. 22.
FIG. 25B is a drawing showing a cross-sectional structure along line B-B of FIG. 25A.

FIG. 25(a) is a partially enlarged plan view of a region including fuses F depicting an enlarged part of a plan view of the resistor 6a of FIG. 22, and FIG. 25(b) is a drawing showing a cross-sectional structure along line B-B of FIG. 25(a).

As shown in FIGS. 25(a) and 25(b), the fuses F and the conductive film D described above are also formed with the wiring film 22a laminated on the resistor body film 21a forming the resistor bodies R. Specifically, in the same layer as the wiring film 22a laminated on the resistor body film line 21Aa forming the resistor bodies R, the fuses F and the conductive film D are formed of Al or AlCu alloy, which is the same metal material as the wiring film 22a. As described previously, in order to form the resistor circuit, the wiring film 22a is also used as the conductive film D electrically connecting the resistor bodies R.

In other words, in the same layer laminated on the resistor body film 21a, the wiring film for forming the resistor bodies R, the fuses F, the conductive film D and furthermore, the wiring film for connecting the element 5a to the first connection electrode 3a and the second connection electrode 4a are formed, as the wiring film 22a, of the same metal material (Al or AlCu alloy). The fuse F differs from (is distinguished from) the wiring film 22a in that the fuse F is formed to be thin so as to be easily cut and that other circuit elements are prevented from being arranged around the fuses F.

Here, in the wiring film 22a, a region where the fuse F is arranged is referred to as a trimming target region X (see FIGS. 22 and 25(a)). The trimming target region X is a linear region along the inner side of the first connection electrode 3a, and in the trimming target region X, not only the fuse F but also the conductive film D is arranged. Below the wiring film 22a in the trimming target region X, the resistor body film 21a is also formed (see FIG. 25(b)). The fuse F is a wiring in which a wiring-to-wiring distance is larger than that in the parts other than the trimming target region X in the wiring film 22a (which is separated from the surrounding area).

The fuse F may indicate not only part of the wiring film 22a but also a combination (fuse element) of a part of the resistor body R (the resistor body film 21a) and a part of the wiring film 22a on the resistor body film 21a.

Although only the case where in the fuse F, the same layer as the conductive film D is used is described, in the conductive film D, another conductive film may be further laminated thereon such that the resistance value of the entire conductive film D is lowered. Even in this case, unless the conductive film is laminated on the fuse F, the blowing property of the fuse F is prevented from being degraded.

Figure 26:
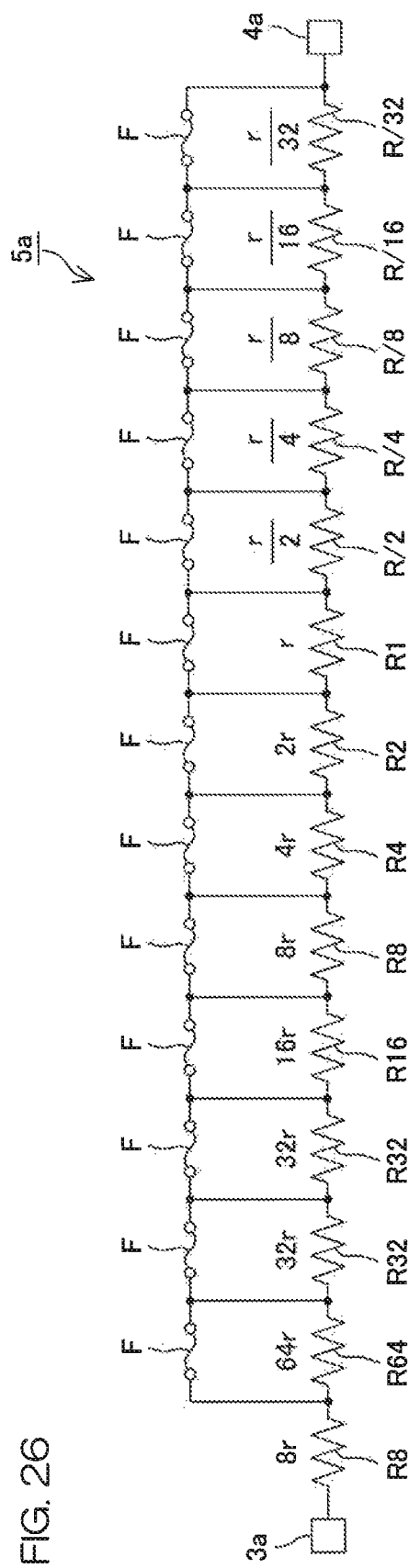
FIG. 26 is an electrical circuit diagram of an element according to a preferred embodiment of the first reference example.

FIG. 26 is an electrical circuit diagram of the element 5a according to a preferred embodiment of the first reference example.

With reference to FIG. 26, the element 5a is formed by connecting in series, from the first connection electrode 3a, in the following order, a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16 and a resistor circuit R/32. Each of the reference resistor circuit R8 and the resistor circuits R64 to R2 is formed by connecting in series the same number of resistor bodies R as the number at the end of itself (in the case of R64, "64"). The resistor circuit R1 is formed with one resistor body R. Each of the resistor circuits R/2 to R/32 is formed by connecting in parallel the same number of resistor bodies R as the number at the end of itself (in the case of R/32, "32"). The meaning of the number at the end of the resistor circuit is the same as in FIGS. 27 and 28, which will be described later.

One fuse F is connected in parallel to each of the resistor circuits R64 to R/32 other than the reference resistor circuit R8. The fuses F are connected in series either directly or via the conductive film D (see FIG. 25(a)).

As shown in FIG. 26, in a state where no fuses F are blown, the element 5a forms the resistor circuit of the reference resistor circuit R8 that is formed with 8 resistor bodies R connected in series provided between the first connection electrode 3a and the second connection electrode 4a. For example, when the resistance value r of one resistor body R is assumed to be r=8Ω, the resistor circuit (the reference resistor circuit R8) of 8r=64Ω forms the resistor 6a to which the first connection electrode 3a and the second connection electrode 4a are connected.

In the state where no fuses F are blown, a plurality of types of resistor circuits other than the reference resistor circuit R8 are short-circuited. Specifically, although 13 resistor circuits R64 to R/32 of 12 types are connected in series to the reference resistor circuit R8, since each of the resistor circuits is short-circuited by the fuse F which is connected in parallel thereto, the resistor circuits are not electrically incorporated into the element 5a.

In the resistor 6a according to the preferred embodiment, the fuse F is selectively blown by, for example, laser light according to the required resistance value. In this way, the resistor circuit in which the fuse F connected in parallel thereto is blown is incorporated into the element 5a. Hence, the resistance value of the entire element 5a can be changed into a resistance value obtained by connecting in series and incorporating the resistor circuit corresponding to the blown fuse F.

In particular, a plurality of types of resistor circuits include a plurality of types of series resistor circuits in which the resistor bodies R having equal resistance values are connected while the number of resistor bodies R is being increased geometrically with a geometric ratio of 2 such that 1 piece, 2 pieces, 4 pieces, 8 pieces, 16 pieces, 32 pieces, . . . are connected in series and a plurality of types of parallel resistor circuits in which the resistor bodies R having equal resistance values are connected while the number of resistor bodies R is being increased geometrically with a geometric ratio of 2 such that 2 pieces, 4 pieces, 8 pieces, 16 pieces, . . . are connected in parallel. Hence, the fuses F (including the fuse element described above) are selectively blown, and thus the resistance value of the entire element 5a (resistor portion 56a) is finely and digitally adjusted to be an arbitrary resistance value, with the result that the resistor portion of a desired value can be produced in each resistor 6a.

Figure 27:
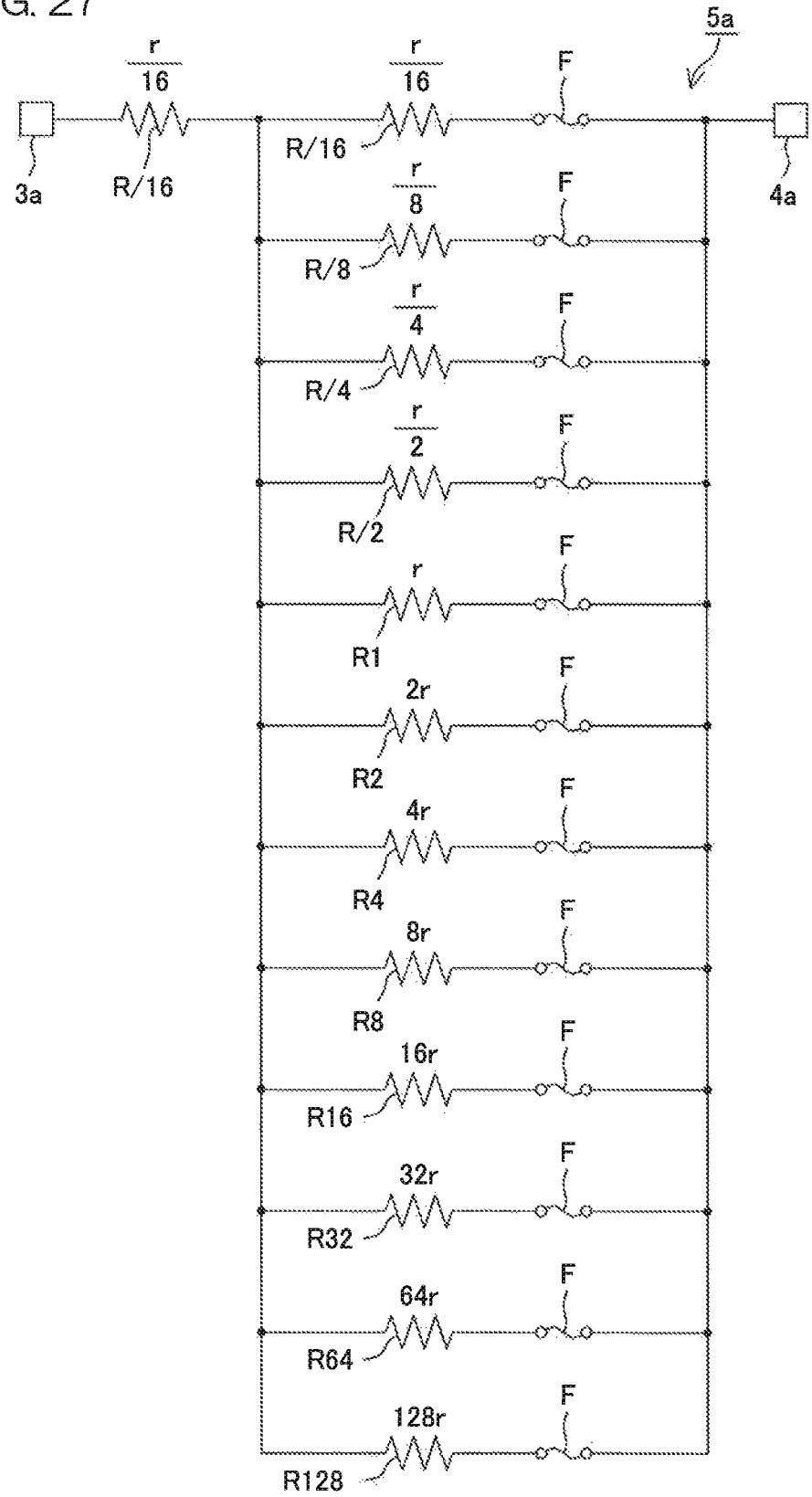
FIG. 27 is an electrical circuit diagram of an element according to another preferred embodiment of the first reference example.

FIG. 27 is an electrical circuit diagram of the element 5a according to another preferred embodiment of the first reference example.

Instead of forming the element 5a by connecting, in series, the reference resistor circuit R8 and the resistor circuits R64 to R/32 as shown in FIG. 26, as shown in FIG. 27, the element 5a may be formed. Specifically, between the first connection electrode 3a and the second connection electrode 4a, the element 5a may be formed with a series connection circuit of the reference resistor circuit R/16 and a parallel connection circuit of 12 types of resistor circuits R/16, R/8, R/4, R/2, R1, R2, R4, R8, R16, R32, R64 and R128.

In this case, the fuse F is connected in series to each of the 12 types of resistor circuits other than the reference resistor circuit R/16. In the state where no fuses F are blown, the resistor circuits are electrically incorporated into the element 5a. The fuses F are selectively blown by, for example, laser light according to the required resistance value, and thus the resistor circuits (the resistor circuits to which the fuses F are connected in series) corresponding to the blown fuses F are electrically separated from the element 5a, with the result that the resistance value of the entire resistors 6a can be adjusted.

Figure 28:
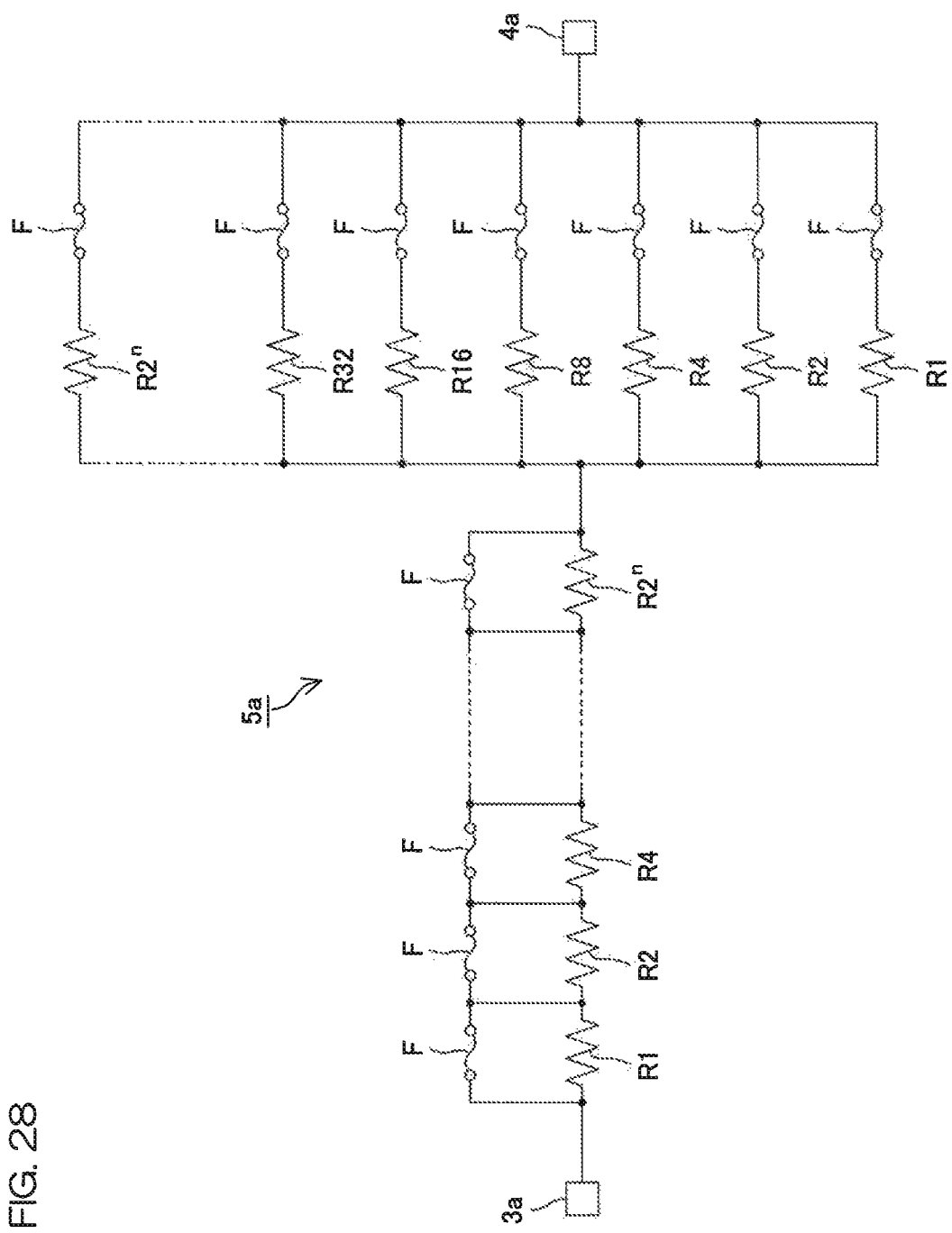
FIG. 28 is an electrical circuit diagram of an element according to yet another preferred embodiment of the first reference example.

FIG. 28 is an electrical circuit diagram of an element 5a according to yet another preferred embodiment of the first reference example.

The feature of the element 5a shown in FIG. 28 is a circuit arrangement in which a series connection of a plurality of types of resistor circuits and a parallel connection of a plurality of types of resistor circuits are connected in series. In the plurality of types of resistor circuits connected in series, as in the preferred embodiment described previously, the fuse F is connected in parallel to each of the resistor circuits, and all the types of the resistor circuits connected in series are short-circuited by the fuses F. Hence, when the fuse F is blown, the resistor circuit short-circuited by the blown fuse F is electrically incorporated into the element 5a.

On the other hand, the fuse F is connected in series to each of the plurality of types of resistor circuits connected in parallel. Hence, the fuse F is blown, and thus it is possible to electrically separate the resistor circuit to which the blown fuse F is connected in series from the parallel connection of the resistor circuits.

In the arrangement described above, for example, small resistor portions of 1 kΩ or less are produced on the side of the parallel connection, and the resistor circuits of 1 kΩ or more are produced on the side of the series connection, and thus the resistor circuits in a wide range from small resistor portions of a few ohms to large resistor portions of a few mega ohms can be produced with a resistor circuit network formed with the same basic design. That is, in each resistor 6a, one or a plurality of fuses F are selectively cut, and thus it is possible to easily and quickly cope with a plurality of types of resistance values. In other words, a plurality of resistor bodies R having different resistance values are combined, and thus it is possible to realize the resistors 6a of various resistance values with the common design.

As described above, in the chip resistor 1a, the state of the connection of a plurality of resistor bodies R (resistor circuits) can be changed in the trimming target region X.

Figure 29A:
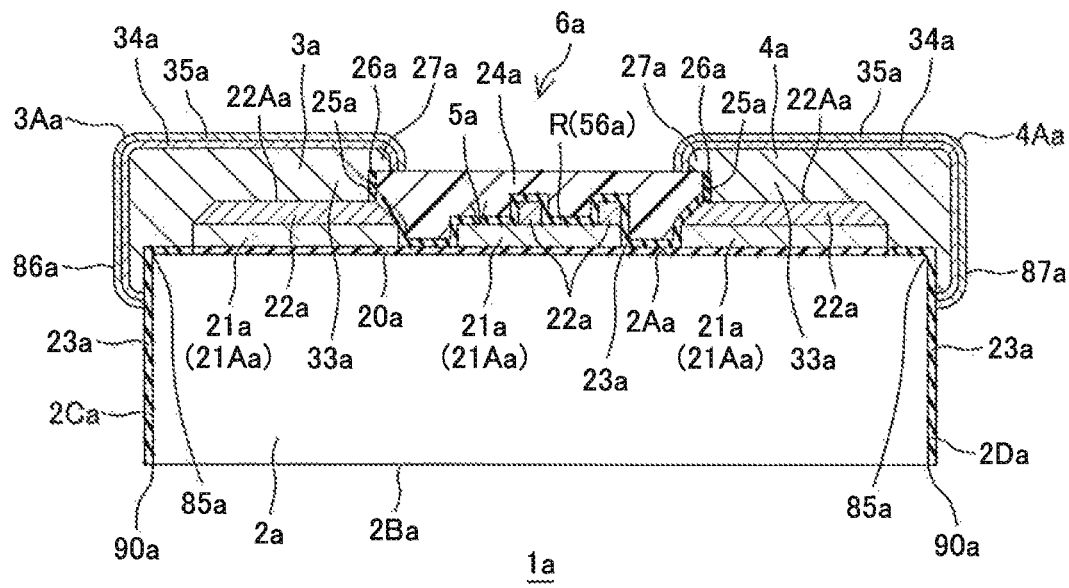
FIG. 29A is a schematic cross-sectional view of the chip resistor, a drawing showing a cross-sectional structure along line A-A of FIG. 21.
Figure 29B:
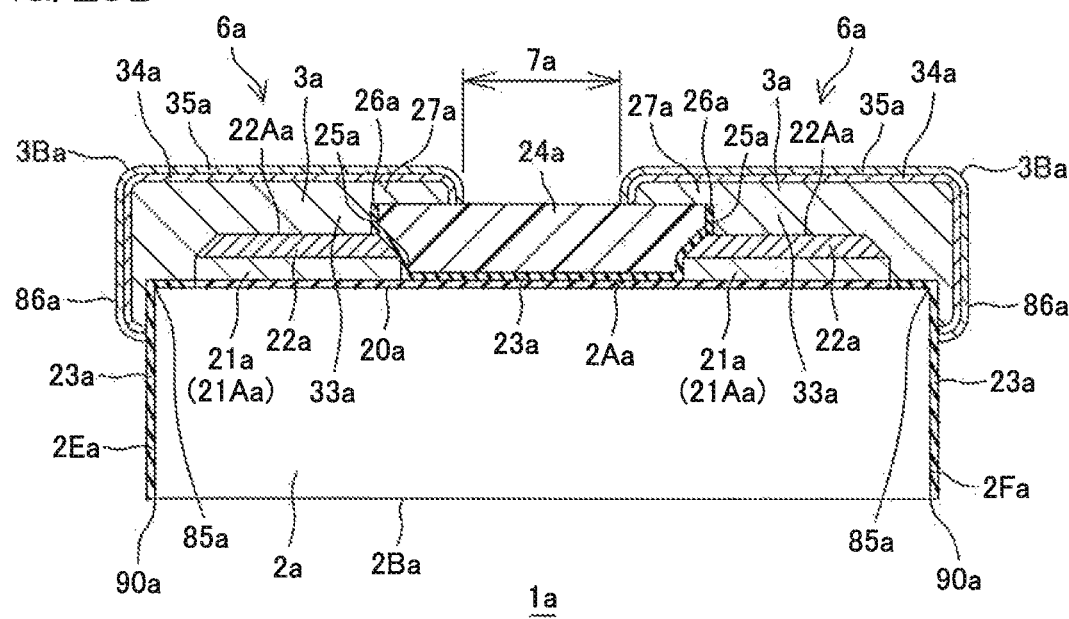
FIG. 29B is a schematic cross-sectional view of the chip resistor, a drawing showing a cross-sectional structure along line B-B of FIG. 21.

FIG. 29A is a schematic cross-sectional view of the chip resistor 1a, a drawing showing a cross-sectional structure along line A-A of FIG. 21. FIG. 29B is a schematic cross-sectional view of the chip resistor 1a, a drawing showing a cross-sectional structure along line B-B of FIG. 21.

The chip resistor 1a will then be described in more detail with reference to FIGS. 29A and 29B. For ease of description, in FIGS. 29A and 29B, the element 5a described above is shown by being simplified and the factors other than the substrate 2a are hatched.

Here, the insulating film 20a, the passivation film 23a and the resin film 24a discussed above will be described.

As described above, the insulating film 20a covers the entire region of the element formation surface 2Aa of the substrate 2a. Specifically, as shown in FIG. 29B, the insulating film 20a covers the boundary region 7a and is integrally formed so as to straddle a region for a pair of resistors 6a adjacent to each other. Here, the area between the boundary region 7a and a region for each resistor 6a is a continuous flat surface without any step, and the insulating film 20a is formed into the flat surface.

The passivation film 23a is formed of, for example, SiN (silicon nitride), and its thickness is 1000 to 5000 angstroms (here, about 3000 angstroms). The passivation film 23a is provided substantially over the entire region of the element formation surface 2Aa and the side surfaces 2Ca to 2Fa. As shown in FIG. 29A, the passivation film 23a on the element formation surface 2Aa coats, from the surface (the upper side of FIG. 29A), the resistor body film 21a and the wiring films 22a on the resistor body film 21a (that is, the element 5a) to cover the upper surface of the resistor bodies R in the element 5a. Hence, the passivation film 23a also covers the wiring film 22a in the trimming target region X described above (see FIG. 25(b)). The passivation film 23a is in contact with the element 5a (the wiring film 22a and the resistor body film 21a), and is also in contact with the insulating film 20a in the region other than the resistor body film 21a. The passivation film 23a also covers the boundary region 7a. In this way, the passivation film 23a on the element formation surface 2Aa functions as a protective film that covers the entire region of the element formation surface 2Aa to protect the element 5a and the insulating film 20a. On the element formation surface 2Aa, the passivation film 23a prevents the part other than the wiring film 22a between the resistor bodies R from being short-circuited (short-circuited between the adjacent resistor body film lines 21Aa).

On the other hand, the passivation film 23a provided on the side surfaces 2Ca to 2Fa is interposed between the side surface parts of the first connection electrode 3a and the second connection electrode 4a and the side surfaces 2Ca to 2Fa of the substrate 2a, and functions as a protective layer that protects the side surfaces 2Ca to 2Fa. In this way, when it is desired to prevent the first connection electrode 3a and the second connection electrode 4a and the substrate 2a from being short-circuited, it is possible to cope with such a requirement. Since the passivation film 23a is an extremely thin film, in the preferred embodiment, the passivation film 23a that covers the side surfaces 2Ca to 2Fa is assumed to be a part of the substrate 2a. Hence, the passivation film 23a that covers the side surfaces 2Ca to 2Fa is assumed to be the side surfaces 2Ca to 2Fa themselves.

The resin film 24a protects, together with the passivation film 23a, the element formation surface 2Aa of the chip resistor 1a, and is formed of a resin such as polyimide. The thickness of the resin film 24a is about 5 µm.

As shown in FIG. 29A, the resin film 24a coats the entire region of the surface (including the resistor body film 21a, the wiring film 22a and the boundary region 7a coated with the passivation film 23a) of the passivation film 23a on the element formation surface 2Aa.

In the resin film 24a, a cutout portion 25a that exposes a peripheral edge portion opposite the side surface parts of the first connection electrode 3a and the second connection electrode 4a in the wiring film 22a is individually formed in the resistor 6a. Each cutout portion 25a continuously penetrates the resin film 24a and the passivation film 23a in the direction of the thickness thereof. Hence, the cutout portions 25a are formed not only in the resin film 24a but also in the passivation film 23a. In this way, in each wiring film 22a, a peripheral edge portion on the inner side close to the element 5a and a peripheral edge portion opposite the adjacent resistor 6a are selectively covered by the resin film 24a, and the other peripheral edge portion along the peripheral edge portion 85a of the substrate 2a is selectively exposed via the cutout portion 25a. The surface exposed from each cutout portion 25a in the wiring film 22a serves as a pad region 22Aa for external connection. The wiring film 22a exposed from the cutout portion 25a is arranged a predetermined distance (for example, 3 to 6 µm) apart, inwardly from the peripheral edge portion 85a of the substrate 2a in the element formation surface 2Aa. On the side surface of the cutout portion 25a, an insulating film 26a is formed overall.

Among the two cutout portions 25a in the resistor 6a, the first connection electrode 3a is completely embedded in one cutout portion 25a, and the second connection electrode 4a is completely embedded in the other cutout portion 25a. As described previously, the first connection electrode 3a and the second connection electrode 4a include the peripheral edge portions 86a and 87a covering not only the element formation surface 2Aa but also the side surfaces 2Ca to 2Fa. The first connection electrode 3a and the second connection electrode 4a are formed so as to protrude from the resin film 24a, and include a drawing portion 27a that is drawn along the surface of the resin film 24a to the side of the element 5a and the side of the boundary region 7a of the substrate 2a.

Here, each of the first connection electrode 3a and the second connection electrode 4a has, from the side of the element formation surface 2Aa and the side of the side surfaces 2Ca to 2Fa, a Ni layer 33a, a Pd layer 34a and an Au layer 35a in this order. In other words, each of the first connection electrode 3a and the second connection electrode 4a has a laminated structure formed with the Ni layer 33a, the Pd layer 34a and the Au layer 35a not only in the region on the element formation surface 2Aa but also in the region on the side surfaces 2Ca to 2Fa. Hence, in each of the first connection electrode 3a and the second connection electrode 4a, the Pd layer 34a is interposed between the Ni layer 33a and the Au layer 35a. In each of the first connection electrode 3a and the second connection electrode 4a, the Ni layer 33a covers a large proportion of the connection electrodes, and the Pd layer 34a and the Au layer 35a are formed to be significantly thin as compared with the Ni layer 33a.

When the chip resistor 1a is mounted on the mounting substrate 9a (see FIGS. 21B to 21D), the Ni layer 33a has a role in relaying the Al of the wiring film 22a in the pad region 22Aa of each cutout portion 25a to the solder 13a described previously.

As described above, since in the first connection electrode 3a and the second connection electrode 4a, the surface of the Ni layer 33a is covered by the Au layer 35a, the Ni layer 33a is prevented from being oxidized. In the first connection electrode 3a and the second connection electrode 4a, even if the thickness of the Au layer 35a is reduced, and thus a through-hole (pinhole) is produced in the Au layer 35a, since the through-hole is blocked by the Pd layer 34a interposed between the Ni layer 33a and the Au layer 35a, it is possible to prevent the Ni layer 33a from being exposed from the through-hole to the outside so as to be oxidized.

In each of the first connection electrode 3a and the second connection electrode 4a, the Au layer 35a is exposed to the uppermost surface. The first connection electrode 3a is electrically connected via one cutout portion 25a to the wiring film 22a in the pad region 22Aa of this cutout portion 25a. The second connection electrode 4a is electrically connected via the other cutout portion 25a to the wiring film 22a in the pad region 22Aa of this cutout portion 25a. In each of the first connection electrode 3a and the second connection electrode 4a, the Ni layer 33a is connected to the pad region 22Aa. In this way, each of the first connection electrode 3a and the second connection electrode 4a is electrically connected to the element 5a. Here, the wiring film 22a forms the wiring connected to each of a collection (the resistor portions 56a) of the resistor bodies R, the first connection electrode 3a and the second connection electrode 4a.

As described above, the resin film 24a and the passivation film 23a where the cutout portions 25a are formed cover the element formation surface 2Aa with the first connection electrode 3a and the second connection electrode 4a exposed from the cutout portions 25a. Hence, via the first connection electrode 3a and the second connection electrode 4a projected (protruded) from the cutout portions 25a in the surface of the resin film 24a, electrical connection between the chip resistor 1a and the mounting substrate 9a can be achieved (see FIGS. 21B to 21D).

FIGS. 30A to 30I are schematic cross-sectional views showing a method of manufacturing the chip resistor 1a of FIGS. 29A and 29B. Although in FIGS. 30A to 30I, only the cross-sectional structure of one resistors 6a corresponding to FIG. 29A is shown, the other resistors 6a is produced simultaneously with the one resistors 6a.

Figure 30A:
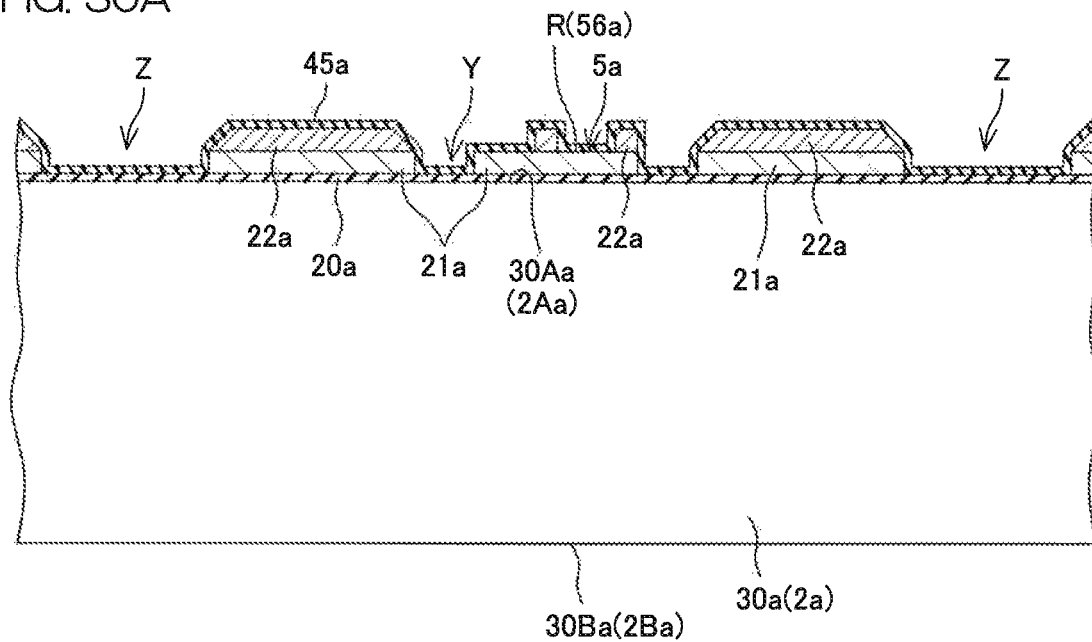
FIG. 30A is a cross-sectional view showing a method of manufacturing the chip resistor of FIGS. 29A and 29B, a diagram showing the same cross-sectional structure as in FIG. 29A.

At first, as shown in FIG. 30A, the substrate 30a that is the base of the substrate 2a is prepared. In this case, the surface 30Aa of the substrate 30a is the element formation surface 2Aa of the substrate 2a, and the back surface 30Ba of the substrate 30a is the back surface 2Ba of the substrate 2a.

Then, the surface 30Aa of the substrate 30a is thermally oxidized, and thus the insulating film 20a made of $SiO_2$ or the like is formed on the surface 30Aa, and the element 5a (the resistor bodies R and the wiring film 22a connected to the resistor bodies R) is formed on the insulating film 20a. Specifically, by sputtering, the resistor body film 21a of TiN, TiON or TiSiON is first formed on the entire surface of the insulating film 20a, and furthermore, the wiring film 22a of aluminum (Al) is laminated on the resistor body film 21a so as to make contact with the resistor body film 21a. Thereafter, a photolithography process is used, and for example, by dry etching such as RIE (Reactive Ion Etching), the resistor body film 21a and the wiring film 22a are selectively removed to perform patterning, with the result that as shown in FIG. 23A, in plan view, the resistor body film lines 21Aa in which the resistor body film 21a is laminated and which has a given width are arrayed a given distance apart in the column direction. Here, a region where the resistor body film line 21Aa and the wiring film 22a are partially cut is also formed, and in the trimming target region X described previously, the fuses F and the conductive film D are formed (see FIG. 22). Then, for example, by wet etching, the wiring film 22a laminated on the resistor body film line 21Aa is selectively removed. Consequently, it is possible to obtain the element 5a in which on the resistor body film line 21Aa, the wiring films 22a are laminated the given distance R apart. Here, the resistance value of the entire element 5a may be measured so that whether or not the resistor body film 21a and the wiring film 22a are formed to have target dimensions is checked.

With reference to FIG. 30A, the element 5a is formed at a large number of points on the surface 30Aa of the substrate 30a according to the number of chip resistors 1a formed on one substrate 30a. When on the substrate 30a, one region where the element 5a (the resistor portion 56a described previously) is formed is referred to as a chip part region Y, on the surface 30Aa of the substrate 30a, a plurality of chip part regions Y (that is, the elements 5a) having the resistor portions 56a are formed (set). One chip part region Y coincides with one completed chip resistor 1a (see FIGS. 29A and 29B) in plan view. On the surface 30Aa of the substrate 30a, a region between the chip part regions Y adjacent to each other is referred to as a boundary region Z. The boundary region Z is formed in the shape of a band, and extends in a lattice in plan view. One chip part region Y is arranged in one lattice unit partitioned by the boundary region Z. The width of the boundary region Z is extremely narrow so as to be 1 to 60 μm (for example, 20 μm), and thus a large number of chip part regions Y can be secured on the substrate 30a, with the result that it is possible to produce a large number of chip resistors 1a.

Then, as shown in FIG. 30A, by a CVD (Chemical Vapor Deposition) method, an insulating film 45a made of SiN is formed over the entire region of the surface 30Aa of the substrate 30a. The insulating film 45a covers and makes contact with all the insulating film 20a and the element 5a (such as the resistor body film 21a and the wiring film 22a) on the insulating film 20a. Hence, the insulating film 45a also covers the wiring film 22a in the trimming target region X described previously (see FIG. 22). Moreover, since the insulating film 45a is formed over the entire region of the surface 30Aa of the substrate 30a, on the surface 30Aa, the insulating film 45a is formed to extend to the regions other than the trimming target region X. In this way, the insulating film 45a serves as a protective film that protects the entire region of the surface 30Aa (including the element 5a on the surface 30Aa).

Figure 30B:
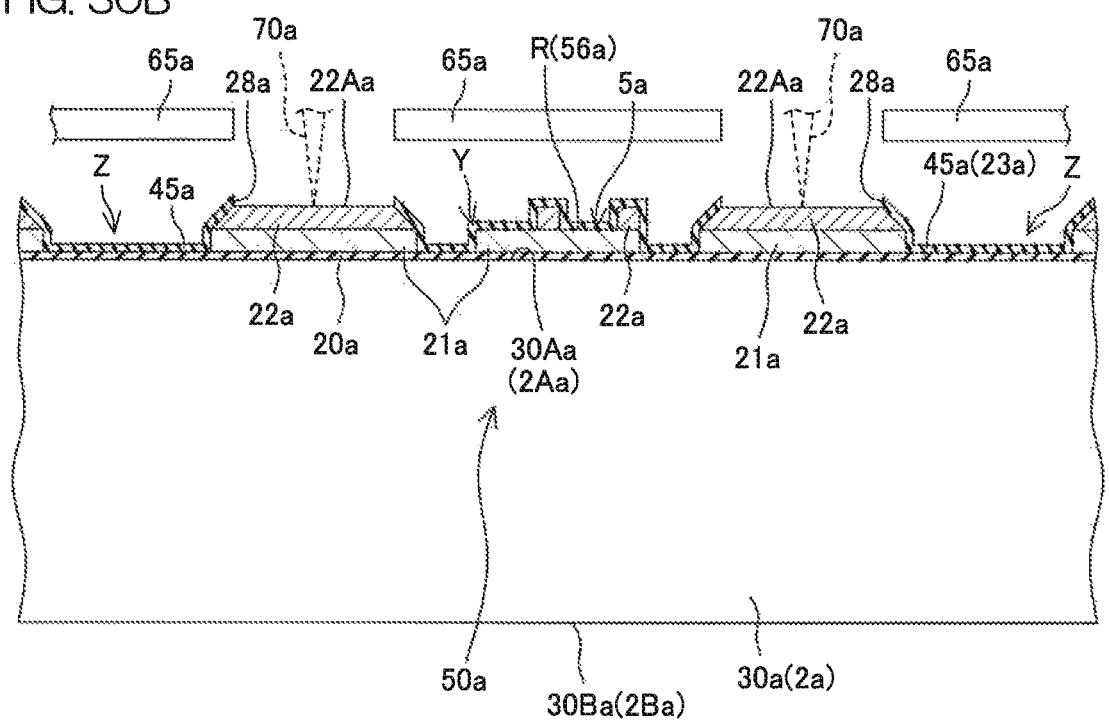
FIG. 30B is a cross-sectional view showing the subsequent step of FIG. 30A.

Then, as shown in FIG. 30B, by etching using a mask 65a, the insulating film 45a is selectively removed. In this way, an opening 28a is formed in a part of the insulating film 45a, and each pad region 22Aa is exposed through the opening 28a. For the semifinished product 50a of one chip resistor 1a, two openings 28a are formed in the resistor 6a.

In the semifinished product 50a, the opening 28a is formed in the insulating film 45a, and thereafter, a probe 70a of a resistance measuring device (not shown) is brought into contact with the pad region 22Aa of each opening 28a, and thus the resistance value of the entire element 5a is detected. Then, laser light (not shown) is applied to an arbitrary fuse F (see FIG. 22) through the insulating film 45a, and thus the wiring film 22a in the trimming target region X described previously is trimmed by the laser light, with the result that the fuse F is blown. As described above, the fuse F is blown (trimmed) such that a necessary resistance value is acquired, and thus as described previously, it is possible to adjust the resistance value of the entire semifinished product 50a (in other words, the chip resistor 1a). Here, since the insulating film 45a serves as a cover film for covering the element 5a, it is possible to prevent a short circuit from occurring as a result of the adherence of a fragment or the like produced in blowing to the element 5a. Since the insulating film 45a covers the fuse F (the resistor body film 21a), the energy of the laser light is stored in the fuse F, and thus it is possible to reliably blow the fuse F. Thereafter, as necessary, by a CVD method, SiN is formed on the insulating film 45a to increase the thickness of the insulating film 45a. The final insulating film 45a (the state shown in FIG. 30C) has a thickness of 1000 to 5000 angstroms (here, about 3000 angstroms). Here, a part of the insulating film 45a enters each opening 28a to block the opening 28a.

Figure 30C:
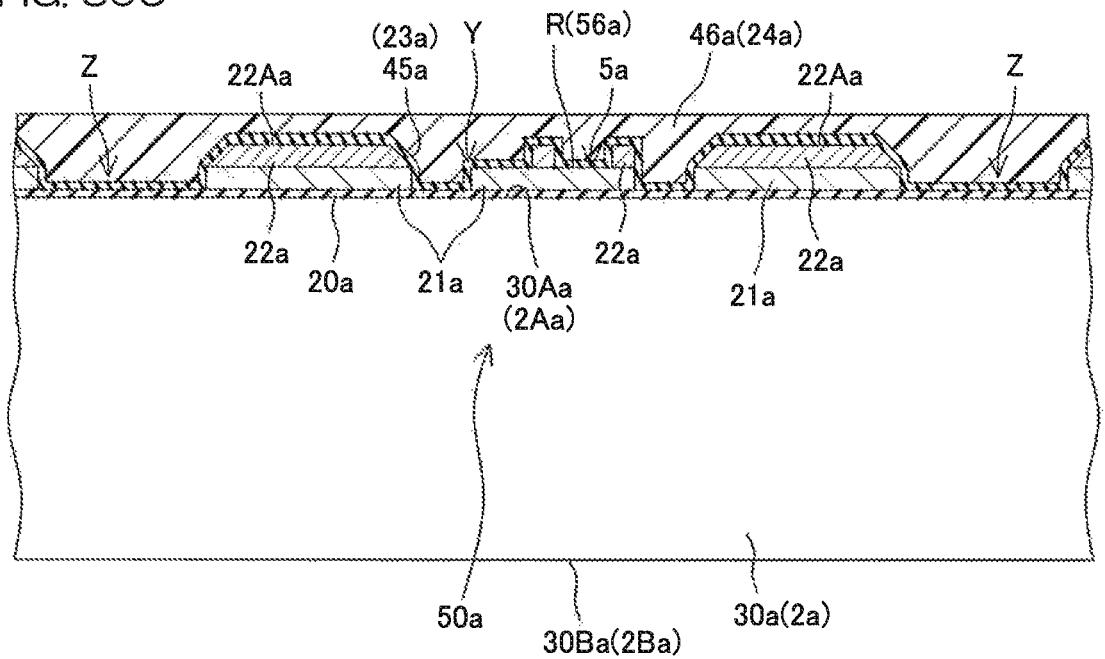
FIG. 30C is a cross-sectional view showing the subsequent step of FIG. 30B.

Then, as shown in FIG. 30C, a liquid of a light-sensitive resin formed of polyimide is sprayed on the substrate 30a from above the insulating film 45a to form the resin film 46a of the light-sensitive resin. The surface of the resin film 46a on the surface 30Aa is flat along the surface 30Aa. Then, thermal processing (cure processing) is performed on the resin film 46a. In this way, the thickness of the resin film 46a is thermally contracted, and the resin film 46a is cured, with the result that the film quality is stabilized.

Figure 30D:
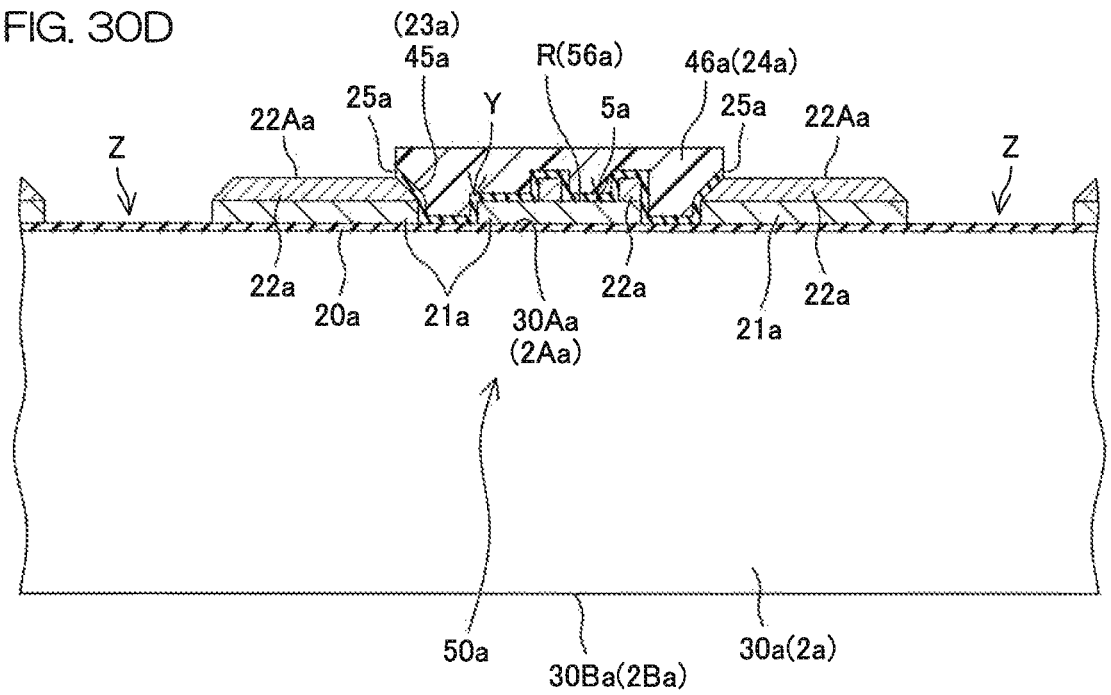
FIG. 30D is a cross-sectional view showing the subsequent step of FIG. 30C.

Then, as shown in FIG. 30D, the resin film 46a, the insulating film 45a and the insulating film 20a are patterned, and thus parts that coincide with the cutout portions 25a of these films are selectively removed. In this way, the cutout portions 25a are formed, and in the boundary region Z, the surface 30Aa (the insulating film 20a) is exposed.

Figure 30E:
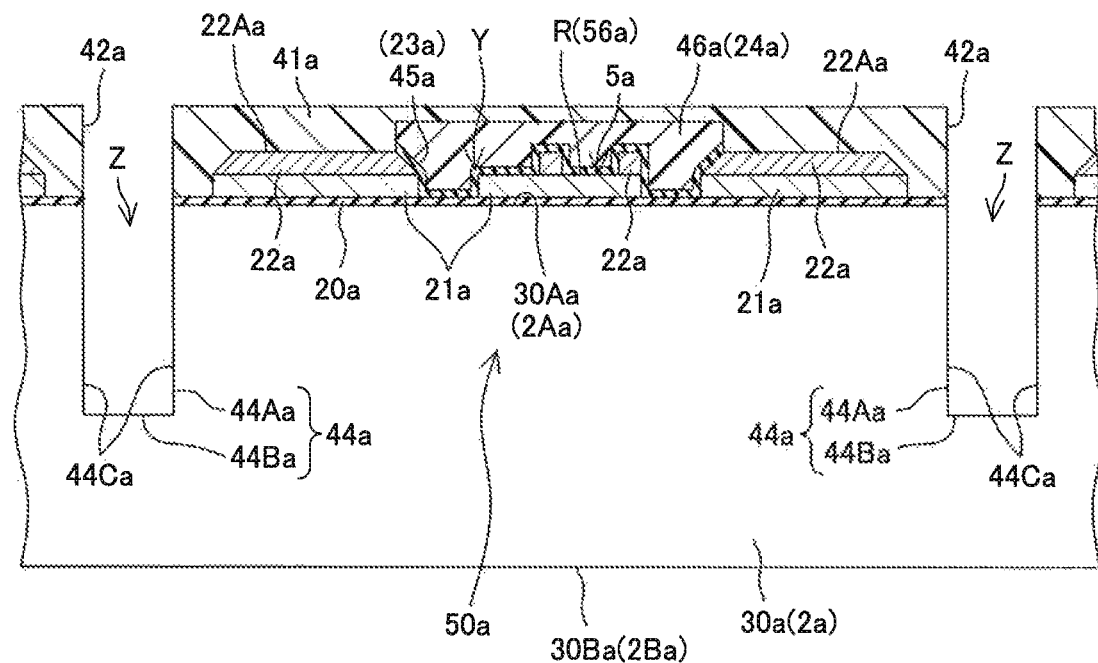
FIG. 30E is a cross-sectional view showing the subsequent step of FIG. 30D.

Then, as shown in FIG. 30E, a resist pattern 41a is formed over the entire region of the surface 30Aa of the substrate 30a. In the resist pattern 41a, an opening 42a is formed.

Figure 31:
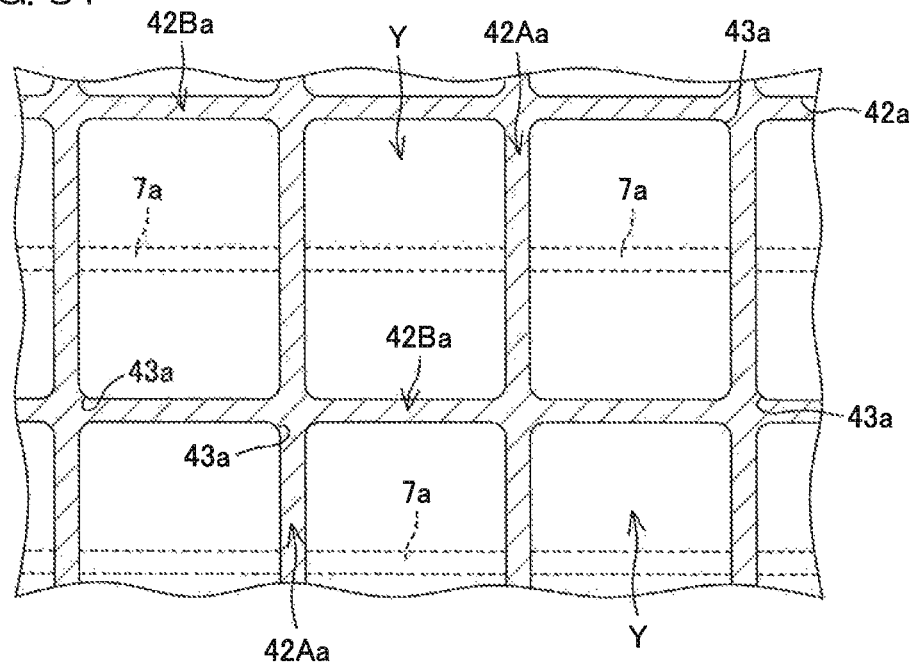
FIG. 31 is a schematic plan view of a part of a resist pattern used for formation of a groove in the step of FIG. 30E.

FIG. 31 is a schematic plan view of a part of the resist pattern used for formation of a groove in the step of FIG. 30E.

With reference to FIG. 31, when a large number of chip resistors 1a (that is, the chip part region Y described above) are arranged in a matrix (also in a lattice), in plan view, the opening 42a of the resist pattern 41a coincides with (corresponds to) a region (a hatched part of FIG. 31, that is, the boundary region Z) between the outlines of the adjacent chip resistors 1a. Hence, the overall shape of the opening 42a is the shape of a lattice that has a plurality of straight parts 42Aa and straight parts 42Ba perpendicular to each other.

In the resist pattern 41a, in positions touching the four corners of the chip part region Y, round shaped portions 43a in the shape of a convex curve are present outside the chip part region Y. The round shaped portion 43a is formed such that two sides adjacent to the chip part region Y are connected by a smooth curve. Hence, when a groove 44a (described later) is formed by plasma etching using the resist pattern 41a as a mask, the groove 44a includes, in the positions touching the four corners of the chip part region Y, the round shaped portions in the shape of a convex curve outside the chip part region Y. Hence, in the step of forming the groove 44a for cutting the chip part region Y out of the substrate 30a, it is possible to form the corner portions 11a of the chip part 1a into the round shape at the same time. In other words, it is possible to process the corner portions 11a into the round shape without addition of a dedicated step.

With reference to FIG. 30E, by plasma etching using the resist pattern 41a as a mask, the substrate 30a is selectively removed. In this way, the material of the substrate 30a is removed in a position a distance apart from the wiring film 22a in the boundary region Z between the elements 5a (the chip part regions Y) adjacent to each other. Consequently, in plan view, in a position (the boundary region Z) coinciding with the opening 42a of the resist pattern 41a, the groove 44a is formed which extends from the surface 30Aa of the substrate 30a halfway through the thickness of the substrate 30a and which has a predetermined depth. The groove 44a is partitioned by a pair of side walls 44Aa opposite each other and a bottom wall 44Ba that connects the lower ends (the ends on the side of the back surface 30Ba of the substrate 30a) of the pair of the side walls 44Aa. The depth of the groove 44a with respect to the surface 30Aa of the substrate 30a is about 100 µm, and the width (the distance between the side walls 44Aa opposite each other) of the groove 44a is about 20 µm and is constant over the entire region in the direction of the depth.

The overall shape of the groove 44a in the substrate 30a is formed in a lattice which coincides with the opening 42a (see FIG. 31) of the resist pattern 41a in plan view. On the surface 30Aa of the substrate 30a, the chip part region Y where each element 5a is formed is surrounded by a quadrangular frame part (the boundary region Z) of the groove 44a. The part of the substrate 30a where the element 5a is formed is the semifinished product 50a of the chip resistor 1a. On the surface 30Aa of the substrate 30a, one semifinished product 50a is located in each of the chip part regions Y surrounded by the grooves 44a, and these semifinished products 50a are arranged in a matrix. By forming the grooves 44a in this way, the substrate 30a is separated into a plurality of substrates 2a by the chip part regions Y. After the formation of the grooves 44a, the resist pattern 41a is removed.

Figure 30F:
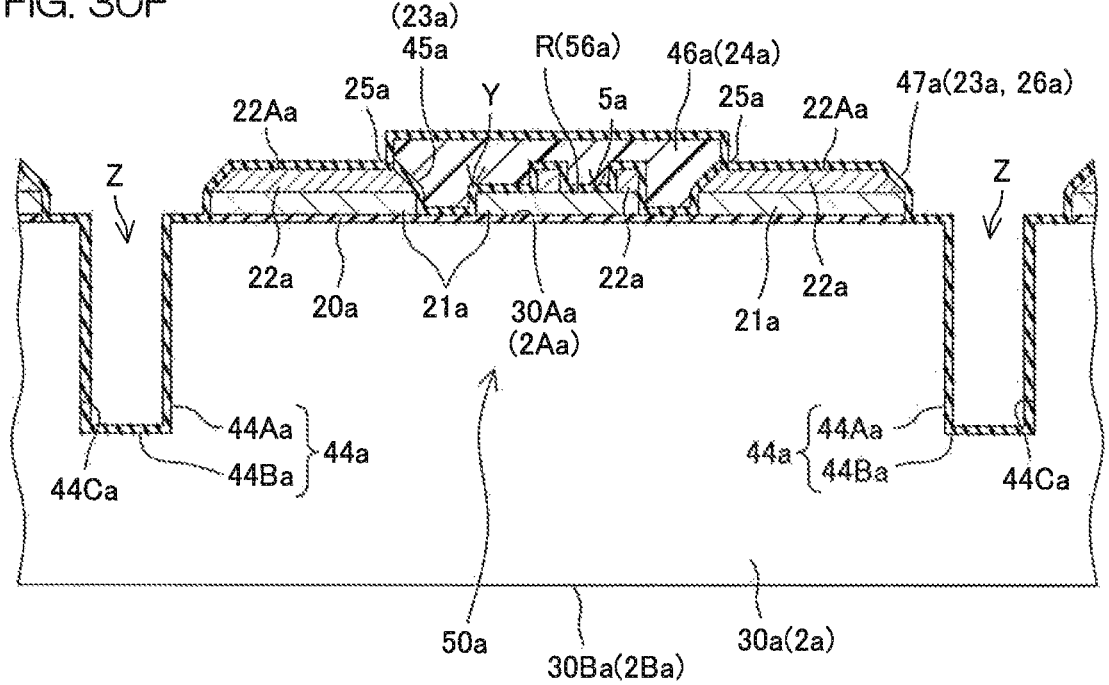
FIG. 30F is a cross-sectional view showing the subsequent step of FIG. 30E.

Then, as shown in FIG. 30F, by a CVD method, an insulating film 47a made of SiN is formed over the entire region of the surface 30Aa of the substrate 30a. Here, the insulating film 47a is also formed over the entire region of the inner peripheral surface (the partition surface 44Ca of the side wall 44Aa and the upper surface of the bottom wall 44Ba described above) of the groove 44a.

Figure 30G:
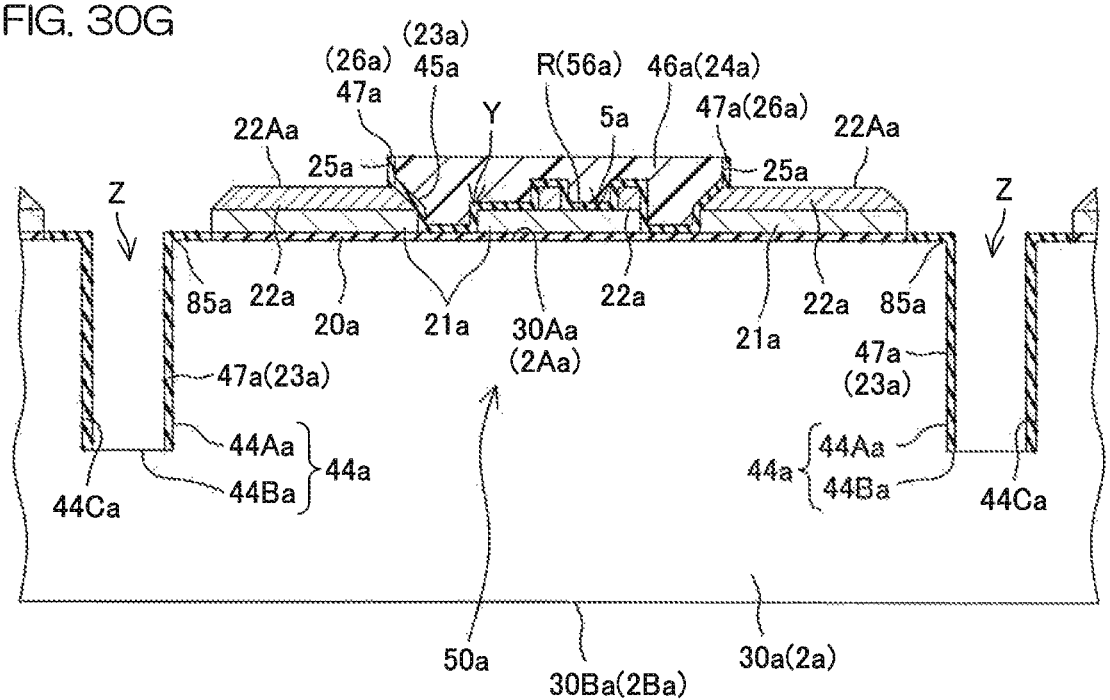
FIG. 30G is a cross-sectional view showing the subsequent step of FIG. 30F.

Then, as shown in FIG. 30G, the insulating film 47a is selectively etched. Specifically, the part of the insulating film 47a parallel to the surface 30Aa is selectively etched. In this way, the pad region 22Aa of the wiring film 22a is exposed, and in the groove 44a, the insulating film 47a on the bottom wall 44aB is removed.

Figure 30H:
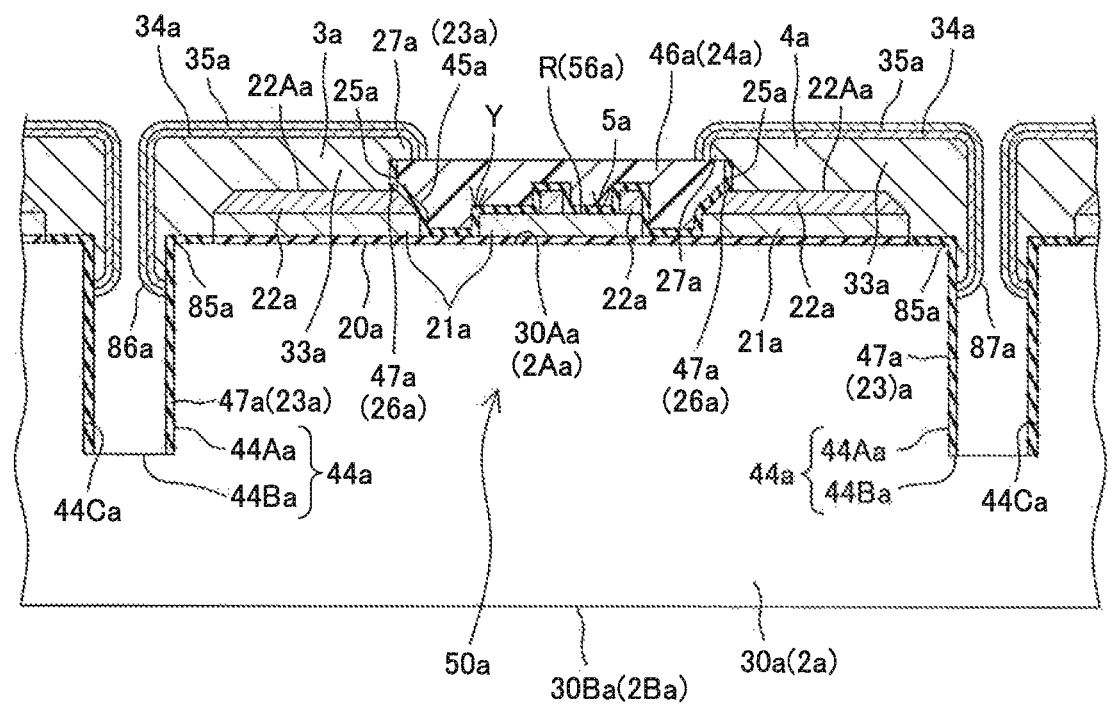
FIG. 30H is a cross-sectional view showing the subsequent step of FIG. 30G.
Figure 30:
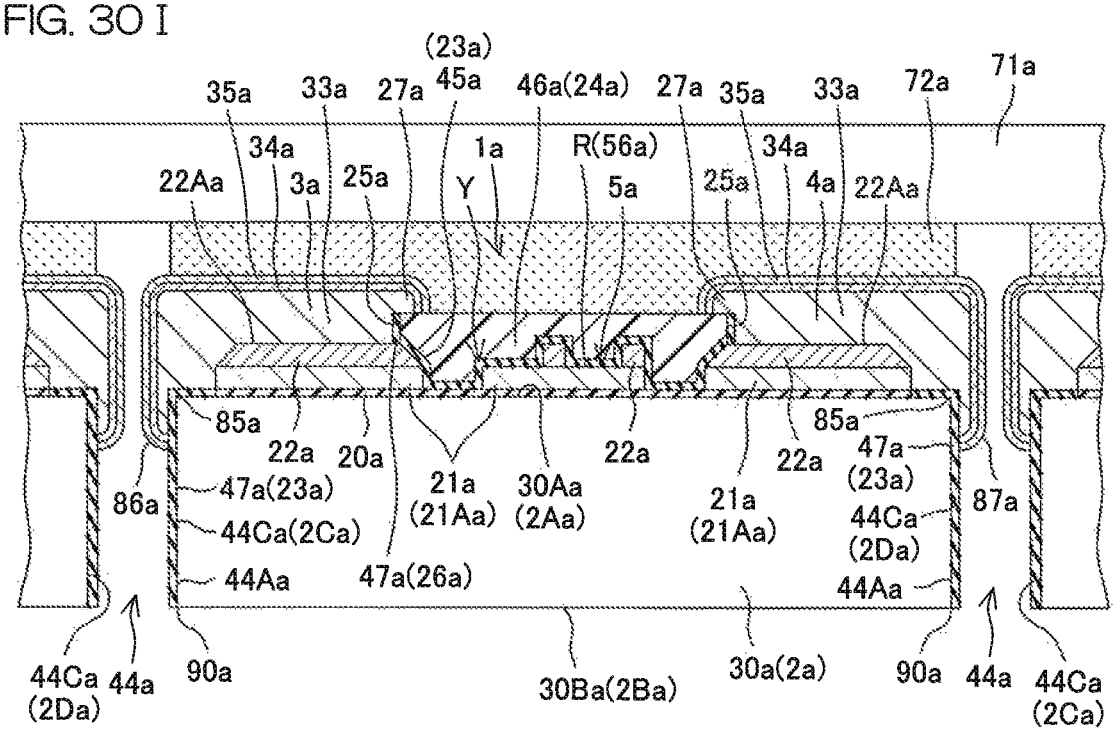
FIG. 30I is a cross-sectional view showing the subsequent step of FIG. 30H.

Then, by non-electrolytic plating, Ni, Pd and Au are sequentially grown by plating from the wiring film 22a exposed from each cutout portion 25a. The plating is continued until each plating film is grown in the horizontal direction along the surface 30Aa to cover the insulating film 47a on the side wall 44Aa of the groove 44a. In this way, as shown in FIG. 30H, the first connection electrode 3a and the second connection electrode 4a formed with Ni/Pd/Au laminated films are formed.

Figure 32:
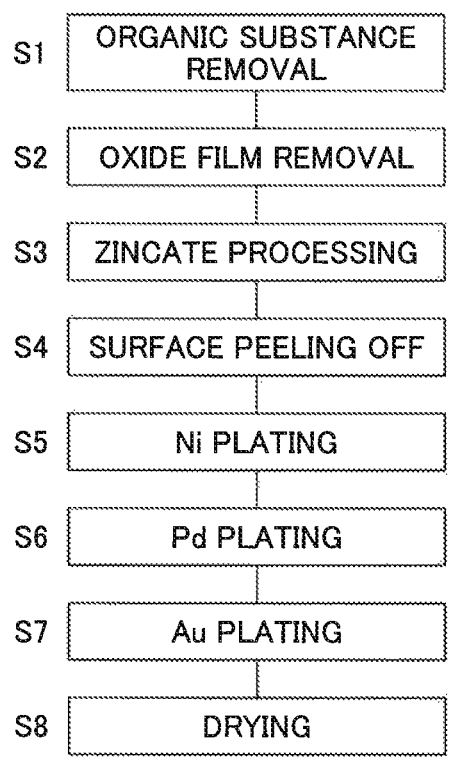
FIG. 32 is a drawing for illustrating a step of manufacturing the first connection electrode and the second connection electrode.

FIG. 32 is a drawing for illustrating a step of manufacturing the first connection electrode 3a and the second connection electrode 4a.

Specifically, with reference to FIG. 32, the surface of the pad region 22Aa is first purified, and thus organic substances (including smut such as a stain of carbon and greasy dirt) on the surface are removed (degreased) (step S1). Then, the oxide film on the surface is removed (step S2). Then, zincate processing is performed on the surface, and thus Al on the surface (of the wiring film 22a) is replaced by Zn (step S3). Then, Zn on the surface is peeled off with nitric acid or the like, and in the pad region 22Aa, new Al is exposed (step S4).

Then, the pad region 22Aa is immersed in a plating liquid, and thus Ni plating is applied to the surface of the new Al in the pad region 22Aa. In this way, Ni in the plating liquid is chemically reduced and precipitated, and thus the Ni layer 33a is formed on the surface (step S5).

Then, the Ni layer 33a is immersed in another plating liquid, and thus Pd plating is applied to the surface of the Ni layer 33a. In this way, Pd in the plating liquid is chemically reduced and precipitated, and thus a Pd layer 34a is formed on the surface of the Ni layer 33a (step S6).

Then, the Pd layer 34a is immersed in another plating liquid, and thus Au plating is applied to the surface of the Pd layer 34a. In this way, Au in the plating liquid is chemically reduced and precipitated, and thus the Au layer 35a is formed on the surface of the Pd layer 34a (step S7). In this way, the first connection electrode 3a and the second connection electrode 4a are formed, and when the formed first connection electrode 3a and the formed second connection electrode 4a are dried (step S8), the step of manufacturing the first connection electrode 3a and the second connection electrode 4a is completed. Between the preceding and subsequent steps, a step of washing the semifinished product 50a with water is performed as necessary. The zincate processing may be performed a plurality of times.

FIG. 30H shows a state where in each semifinished product 50a, the first connection electrode 3a and the second connection electrode 4a have already been formed.

As described above, since the first connection electrode 3a and the second connection electrode 4a are formed by non-electrolytic plating, Ni, Pd and Al serving as electrode materials can be satisfactorily grown on the insulating film 47a by plating. As compared with a case where the first connection electrode 3a and the second connection electrode 4a are formed by electrolytic plating, the number of steps (for example, a lithography step and a step of peeling off a resist mask necessary in electrolytic plating) in the step of forming the first connection electrode 3a and the second connection electrode 4a is reduced, with the result that it is possible to enhance the productivity of the chip resistor 1a. Furthermore, since in non-electrolytic plating, the resist mask necessary in electrolytic plating is not needed, the position of the formation of the first connection electrode 3a and the second connection electrode 4a is prevented from being displaced by the displacement of the position of the resist mask, and thus the accuracy of the position of the formation of the first connection electrode 3a and the second connection electrode 4a is enhanced, with the result that it is possible to enhance the yield.

In this method, the wiring film 22a is exposed from the cutout portion 25a, and there is no obstruction to the plating growth in a region from the wiring film 22a to the groove 44a. Hence, it is possible to perform plating growth straight from the wiring film 22a to the groove 44a. Consequently, it is possible to reduce the time necessary to form the electrode.

The first connection electrode 3a and the second connection electrode 4a are formed as described above, then an energization test is performed between the first connection electrode 3a and the second connection electrode 4a and thereafter the substrate 30a is ground from the back surface 30Ba.

Specifically, after the formation of the groove 44a, as shown in FIG. 30I, a support tape 71a that is formed of PET (polyethylene terephthalate), that is formed in the shape of a thin plate and that has an adhesive surface 72a is adhered, in the adhesive surface 72a, to the side (that is, the surface 30Aa) of the first connection electrode 3a and the second connection electrode 4a in each semifinished product 50a. In this way, each semifinished product 50a is supported by the support tape 71a. Here, as the support tape 71a, for example, a laminate tape can be used.

With each semifinished product 50a supported by the support tape 71a, the substrate 30a is grounded from the side of the back surface 30Ba. When by the grinding, the substrate 30a is decreased in thickness so as to reach the upper surface of the bottom wall 44Ba (see FIG. 30H) of the groove 44a, since there is nothing that couples the adjacent semifinished products 50a, the substrate 30a is divided with the groove 44a being a boundary and the semifinished products 50a are individually separated, with the result that the finished product of the chip resistor 1a is formed. In other words, the substrate 30a is cut (separated) in the groove 44a (that is, the boundary region Z), and thus the chip resistors 1a are individually cut out. By etching the substrate 30a from the side of the back surface 30Ba to the bottom wall 44Ba of the groove 44a, the chip resistor 1a may be cut out.

In each completed chip resistor 1a, the part serving as the partition surface 44Ca of the side wall 44Aa of the groove 44a is any one of the side surfaces 2Ca to 2Fa of the substrate 2a, and the back surface 30Ba is the back surface 2Ba. In other words, as described previously, the step (see FIG. 30E) of forming the groove 44a by etching is included in the step of forming the side surfaces 2Ca to 2Fa. Moreover, the insulating film 45a and a part of the insulating film 47a are the passivation film 23a, the resin film 46a is the resin film 24a and a part of the insulating film 47a is the insulating film 26a.

As described above, after the formation of the groove 44a, the substrate 30a is ground from the side of the back surface 30Ba, and thus a plurality of chip part regions Y formed in the substrate 30a can be simultaneously divided into individual chip resistors 1a (chip parts) (the individual pieces of a plurality of chip resistors 1a can be obtained at one time). Hence, the time in which the chip resistors 1a are manufactured is reduced, and thus it is possible to enhance the productivity of the chip resistor 1a.

By grinding or etching the back surface 2Ba of the substrate 2a in the completed chip resistor 1a into a mirror surface, the back surface 2Ba may be cleaned.

FIGS. 33A to 33D are schematic cross-sectional views showing a collection step of the chip resistor 1a after the step of FIG. 30I.

Figure 33A:
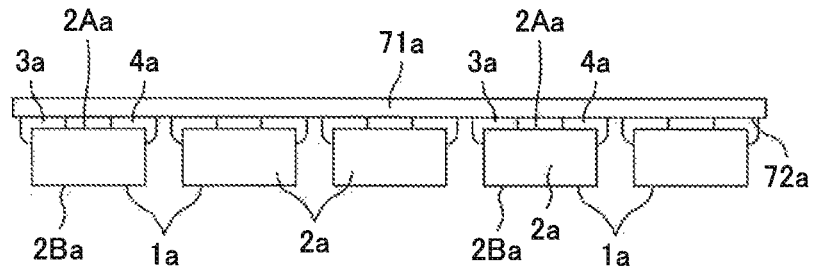
FIG. 33A is a schematic cross-sectional view showing the collection step of the chip resistor after the step of FIG. 30I.
Figure 33B:
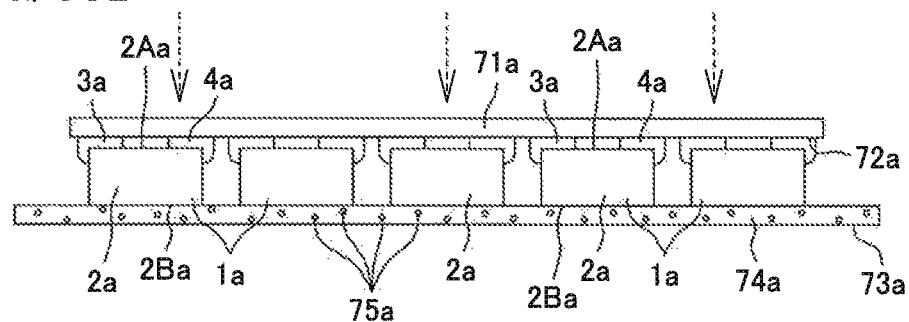
FIG. 33B is a cross-sectional view showing the subsequent step of FIG. 33A.

FIG. 33A shows a state where a plurality of chip resistors 1a separated into pieces still stick to the support tape 71a. In this state, as shown in FIG. 33B, a thermally foamed sheet 73a is adhered to the back surface 2Ba of the substrate 2a of each chip resistor 1a. The thermally foamed sheet 73a includes a sheet main body 74a in the shape of a sheet and a large number of foamed particles 75a kneaded into the sheet main body 74a.

Figure 33C:
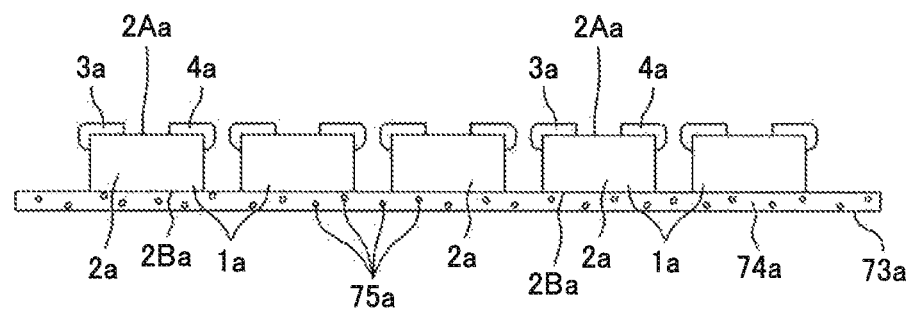
FIG. 33C is a cross-sectional view showing the subsequent step of FIG. 33B.

The adhesive force of the sheet main body 74a is greater than that of the adhesive surface 72a of the support tape 71a. Hence, after the thermally foamed sheet 73a is adhered to the back surface 2Ba of the substrate 2a of each chip resistor 1a, as shown in FIG. 33C, the support tape 71a is torn off from each chip resistor 1a, and the chip resistor 1a is transferred to the thermally foamed sheet 73a. Here, since the adherence property of the adhesive surface 72a is lowered by the application of ultraviolet rays to the support tape 71a (see dotted arrows in FIG. 33B), the support tape 71a is easily torn off from each chip resistor 1a.

Figure 33D:
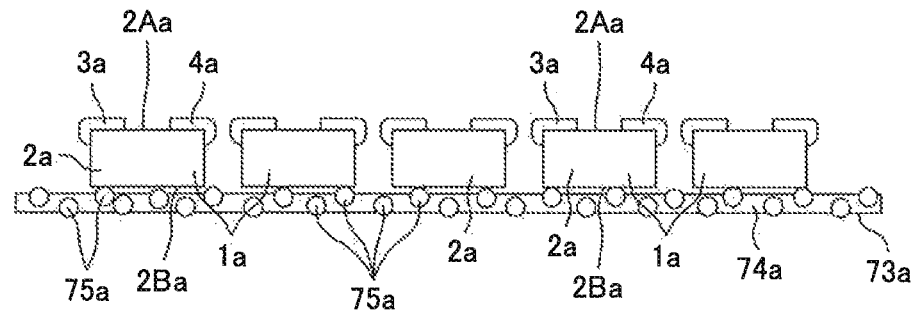
FIG. 33D is a cross-sectional view showing the subsequent step of FIG. 33C.

Then, the thermally foamed sheet 73a is heated. In this way, as shown in FIG. 33D, in the thermally foamed sheet 73a, the foamed particles 75a within the sheet main body 74a are foamed and are expanded out of the surface of the sheet main body 74a. Consequently, the contact area between the thermally foamed sheet 73a and the back surface 2Ba of the substrate 2a of each chip resistor 1a is decreased, and thus all the chip resistors 1a are naturally torn off from the thermally foamed sheet 73a (come off). The chip resistors 1a collected in this way are mounted on the mounting substrate 9a (see FIG. 21B) or are stored in a storage space formed on an emboss carrier tape (not shown). In this case, as compared with a case where the chip resistors 1a are torn off from the support tape 71a or the thermally foamed sheet 73a one by one, it is possible to reduce the processing time. As a matter of course, with a plurality of chip resistors 1a sticking to the support tape 71a (see FIG. 33A), without use of the thermally foamed sheet 73a, the chip resistors 1a may be directly torn off from the support tape 71a by a predetermined number of pieces.

Figure 34A:
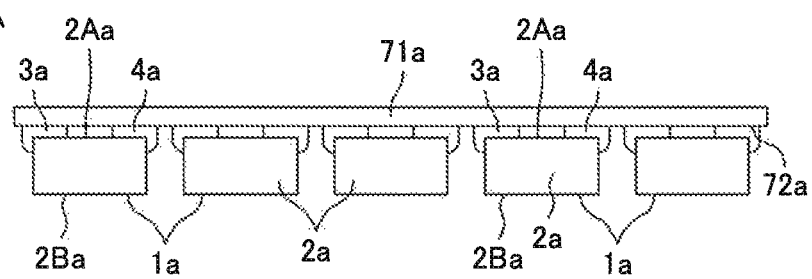
FIG. 34A is a schematic cross-sectional view showing the collection step (variation) of the chip resistor after the step of FIG. 30I.
Figure 34B:
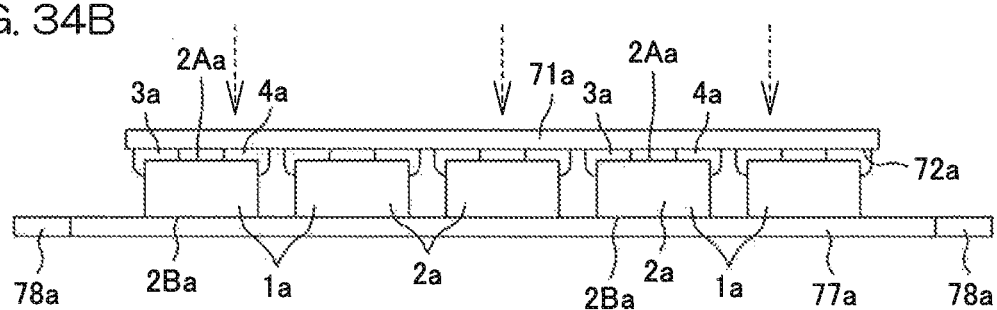
FIG. 34B is a cross-sectional view showing the subsequent step of FIG. 34A.
Figure 34C:
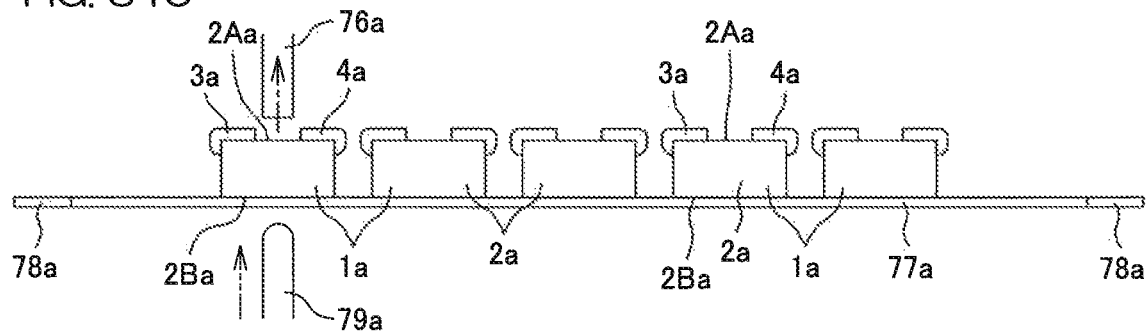
FIG. 34C is a cross-sectional view showing the subsequent step of FIG. 34B.

FIGS. 34A to 34C are schematic cross-sectional views showing the collection step (variation) of the chip resistor after the step of FIG. 30I.

Each chip resistor 1a can be collected by another method shown in FIGS. 34A to 34C.

As with FIG. 33A, FIG. 34A shows a state where a plurality of chip resistors 1a separated into pieces still stick to the support tape 71a. In this state, as shown in FIG. 34B, a transfer tape 77a is adhered to the back surface 2Ba of the substrate 2a of each chip resistor 1a. The transfer tape 77a has an adhesive force greater than that of the adhesive surface 72a of the support tape 71a. Hence, as shown in FIG. 34C, after the transfer tape 77a is adhered to each chip resistor 1a, the support tape 71a is torn off from each chip resistor 1a. Here, as described previously, ultraviolet rays (see dotted arrows in FIG. 34B) may be applied to the support tape 71a so that the adherence property of the adhesive surface 72a is lowered.

The frames 78a of a collection device (not shown) are adhered to both ends of the transfer tape 77a. The frames 78a on both sides can be moved either in a direction in which they approach each other or in a direction in which they are separated. After the support tape 71a is torn off from each composite chip 1, the frames 78a on both sides are moved in the direction in which they are separated, and thus the transfer tape 77a is extended so as to become thin. In this way, the adhesive force of the transfer tape 77a is lowered, and thus each chip resistor 1a is easily torn off from the transfer tape 77a. When in this state, the suction nozzle 76a of a transport device (not shown) is directed to the side of the element formation surface 2Aa of the chip resistor 1a, the chip resistor 1a is torn off from the transfer tape 77a by the suction force produced by the transport device (not shown) and is sucked by the suction nozzle 76a. Here, the chip resistor 1a is pushed up by a protrusion 79a shown in FIG. 34C from the side opposite to the suction nozzle 76a through the transfer tape 77a to the side of the suction nozzle 76a, and thus the chip resistor 1a can be smoothly torn off from the transfer tape 77a. The chip resistor 1a collected in this way is transported by the transport device (not shown) while being sucked by the suction nozzle 76a.

Although the preferred embodiments of the first reference example are described above, the first reference example can be carried out with still other preferred embodiments. For example, although in the preferred embodiments described above, as an example of the chip part of the first reference example, the chip resistor 1a is disclosed, the present invention can be applied to chip parts such as a chip capacitor, a chip diode and a chip inductor. A chip capacitor will be described below.

Figure 37:
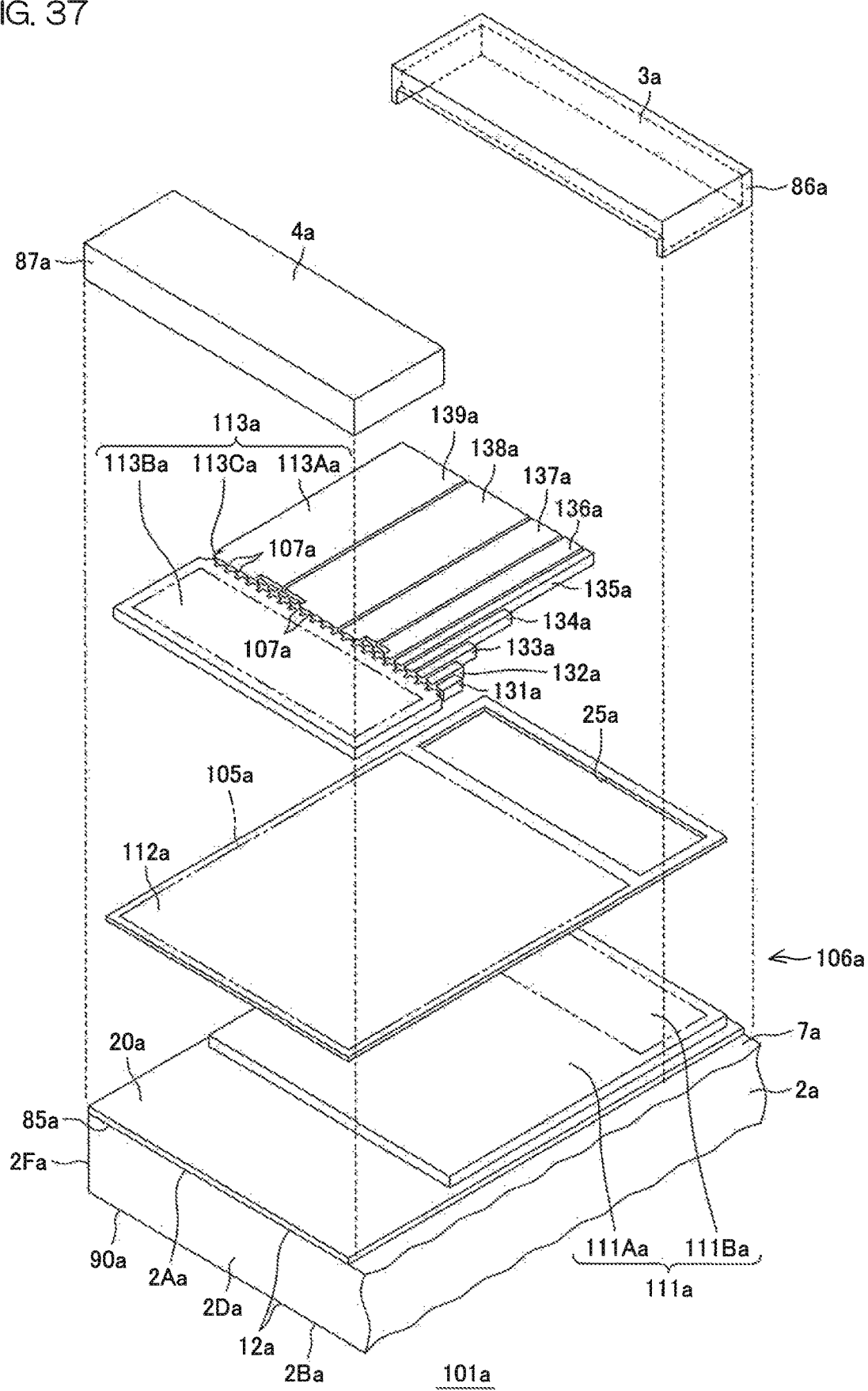
FIG. 37 is an exploded perspective view separately showing the arrangement of a part of the chip capacitor.

FIG. 35 is a plan view showing a chip capacitor 101a according to another preferred embodiment of the first reference example. FIG. 36 is a schematic cross-sectional view of the chip capacitor 101a, a drawing showing a cross-sectional structure along line A-A of FIG. 35. FIG. 37 is an exploded perspective view separately showing the arrangement of a part of the chip capacitor 101a.

In the chip capacitor 101a, which will be described below, parts corresponding to the parts of the chip resistor 1a described previously are identified with the same reference symbols, and the detailed description of the parts will be omitted. In the chip capacitor 101a, unless otherwise particularly mentioned, the parts identified with the same reference symbols as the parts of the chip resistor 1a described previously have the same arrangement as the parts of the chip resistor 1a described previously, and can achieve the same actions and effects as the parts of the chip resistor 1a described previously (in particular, on parts related to the first connection electrode 3a and the second connection electrode 4a).

With reference to FIG. 36, the chip capacitor 101a is a pair chip that incorporates, as with the chip resistor 1a, on the common substrate 2a, a pair of capacitors 106a (only one of them is shown in FIGS. 35 to 37) as an example of a plurality of chip elements in the first reference example.

Each capacitor 106a includes the substrate 2a, the first connection electrode 3a arranged on the substrate 2a (the side of the element formation surface 2Aa of the substrate 2a) and the second connection electrode 4a arranged on the same substrate 2a. In the chip capacitor 101a, as in the chip resistor 1a, the first connection electrode 3a and the second connection electrode 4a include the peripheral edge portions 86a and 87a that are formed so as to cover the peripheral edge portion 85a on the element formation surface 2Aa of the substrate 2a and to straddle the element formation surface 2Aa and the side surfaces 2Ca to 2Fa. Hence, since in a circuit assembly 100a (see FIGS. 21B and 21C) in which the chip capacitor 101a is mounted on the mounting substrate 9a, as in the case of the chip resistor 1a, the adsorbed amount of solder 13a to the first connection electrode 3a and the second connection electrode 4a can be increased, it is possible to enhance the adhesion strength.

In the element formation surface 2Aa of the substrate 2a, within a capacitor arrangement region 105a between the first connection electrode 3a and the second connection electrode 4a, a plurality of capacitor factors C1 to C9 are formed. The plurality of capacitor factors C1 to C9 are a plurality of element factors that form the element 5a (here, a capacitor element) described previously, and are connected between the first connection electrode 3a and the second connection electrode 4a. Specifically, the plurality of capacitor factors C1 to C9 are electrically connected via a plurality of fuse units 107a (corresponding to the fuses F described previously) to the second connection electrode 4a such that they can be separated from the second connection electrode 4a.

As shown in FIGS. 36 and 37, on the element formation surface 2Aa of the substrate 2a, the insulating film 20a is formed, and on the surface of the insulating film 20a, a lower electrode film 111a is formed. The lower electrode film 111a is extended substantially over the entire region of the capacitor arrangement region 105a. Furthermore, the lower electrode film 111a is formed so as to be extended to a region immediately below the first connection electrode 3a. More specifically, the lower electrode film 111a includes a capacitor electrode region 111Aa that functions as a lower electrode common to the capacitor factors C1 to C9 in the capacitor arrangement region 105a and a pad region 111Ba for drawing an external electrode arranged immediately below the first connection electrode 3a. The capacitor electrode region 111Aa is located in the capacitor arrangement region 105a, and the pad region 111Ba is located immediately below the first connection electrode 3a and is in contact with the first connection electrode 3a.

A capacitor film (dielectric film) 112a is formed so as to cover and make contact with the lower electrode film 111a (the capacitor electrode region 111Aa) in the capacitor arrangement region 105a. The capacitor film 112a is formed over the entire region of the capacitor electrode region 111Aa (the capacitor arrangement region 105a). In the preferred embodiment, the capacitor film 112a further covers the insulating film 20a outside the capacitor arrangement region 105a.

On the capacitor film 112a, an upper electrode film 113a is formed. In FIG. 35, for clarity, the upper electrode film 113a is shown by being colored. The upper electrode film 113a includes a capacitor electrode region 113Aa located in the capacitor arrangement region 105a, a pad region 113Ba that is located immediately below the second connection electrode 4a and that is in contact with the second connection electrode 4a and a fuse region 113Ca that is arranged between the capacitor electrode region 113Aa and the pad region 113Ba.

In the capacitor electrode region 113Aa, the upper electrode film 113a is divided (separated) into a plurality of electrode film parts (upper electrode film parts) 131a to 139a. In the preferred embodiment, each of the electrode film parts 131a to 139a is formed in the shape of a quadrangle, and extends in the shape of a band from the fuse region 113Ca toward the first connection electrode 3a. The electrode film parts 131a to 139a have a plurality of types of opposite areas, and are opposite the lower electrode film 111a through the capacitor film 112a (while being in contact with the capacitor film 112a). More specifically, the opposite areas of the electrode film parts 131a to 139a with respect to the lower electrode film 111a may be determined so as to be 1:2:4:8:16:32:64:128:128. In other words, the plurality of electrode film parts 131a to 139a include a plurality of electrode film parts having different opposite areas, and more specifically, include a plurality of electrode film parts 131a to 138a (or 131a to 137a and 139a) having opposite areas that are set so as to be geometric with a geometric ratio of 2. In this way, the plurality of capacitor factors C1 to C9 formed by electrode film parts 131a to 139a and the lower electrode film 111a opposite them through the capacitor film 112a include a plurality of capacitor factors having different capacitance values. When the ratio of the opposite areas in the electrode film parts 131a to 139a is as described above, the ratio of the capacitance values of the capacitor factors C1 to C9 is equal to the ratio of the opposite areas so as to be 1:2:4:8:16:32:64:128:128. In other words, the plurality of capacitor factors C1 to C9 include a plurality of capacitor factors C1 to C8 (or C1 to C7 and C9) in which the capacitance values are set so as to be geometric with a geometric ratio of 2.

In the preferred embodiment, the electrode film parts 131a to 135a are formed such that they are equal in width and that the ratio of the lengths thereof is set at 1:2:4:8:16. The electrode film parts 135a, 136a, 137a, 138a and 139a are formed such that they are equal in length and that the ratio of the widths thereof is set at 1:2:4:8:8. The electrode film parts 135a to 139a are formed to extend over the range from the end edge on the side of the second connection electrode 4a to the end edge on the side of the first connection electrode 3a in the capacitor arrangement region 105a, and the electrode film parts 131a to 134a are formed to be shorter than them.

The pad region 113Ba is formed in a shape substantially similar to the second connection electrode 4a and has a planar shape of an approximate quadrangle. As shown in FIG. 36, the upper electrode film 113a in the pad region 113Ba is in contact with the second connection electrode 4a.

On the substrate 2a, the fuse region 113Ca is arranged along one long side (the long side on the inner side with respect to the periphery of the substrate 2a) of the pad region 113Ba. The fuse region 113Ca includes a plurality of fuse units 107a arrayed along the one long side of the pad region 113Ba described above.

The fuse units 107a are integrally formed of the same material as the pad region 113Ba of the upper electrode film 113a. The plurality of electrode film parts 131a to 139a are integrally formed with one or a plurality of fuse units 107a, are connected via the fuse units 107a to the pad region 113Ba and are electrically connected via the pad region 113Ba to the second connection electrode 4a. As shown in FIG. 35, the electrode film parts 131a to 136a having relatively small areas are connected with one fuse unit 107a to the pad region 113Ba, and the electrode film parts 137a to 139a having relatively large areas are connected via a plurality of fuse units 107a to the pad region 113Ba. It is not necessary to use all the fuse units 107a, and in the preferred embodiment, one fuse unit 107a is not used.

The fuse unit 107a includes a first wide width portion 107Aa for connection to the pad region 113Ba, a second wide width portion 107Ba for connection to the electrode film parts 131a to 139a and a narrow width portion 107Ca for connection between the first and second wide width portions 107Aa and 107Ba. The narrow width portion 107Ca is formed such that it can be cut (blown) by laser light. In this way, it is possible to electrically separate, from the first and second connection electrodes 3a and 4a, unnecessary electrode film parts of the electrode film parts 131a to 139a by cutting the fuse units 107a.

Although not shown in FIGS. 35 and 37, as shown in FIG. 36, the surface of the chip capacitor 101a including the surface of the upper electrode film 113a is covered by the passivation film 23a described previously. The passivation film 23a is formed with, for example, a nitride film, extends not only to the upper surface of the chip capacitor 101a but also to the side surfaces 2Ca to 2Fa of the substrate 2a and is formed so as to cover the entire region of the side surfaces 2Ca to 2Fa. On the side surfaces 2Ca to 2Fa, the passivation film 23a is interposed between the substrate 2a and the first connection electrode 3a and the second connection electrode 4a. Furthermore, on the passivation film 23a, the resin film 24a described previously is formed. The resin film 24a covers the element formation surface 2Aa.

The passivation film 23a and the resin film 24a are protective films that protect the surface of the chip capacitor 101a. In these films, the cutout portions 25a described previously are formed in the regions corresponding to the first connection electrode 3a and the second connection electrode 4a. The cutout portion 25a penetrates the passivation film 23a and the resin film 24a. Furthermore, in the preferred embodiment, the cutout portion 25a corresponding to the first connection electrode 3a also penetrates the capacitor film 112a.

The first connection electrode 3a and the second connection electrode 4a are individually embedded in the cutout portions 25a. In this way, the first connection electrode 3a is joined to the pad region 111Ba of the lower electrode film 111a, and the second connection electrode 4a is joined to the pad region 113Ba of the upper electrode film 113a. The first and second connection electrodes 3a and 4a include the drawing portion 27a that protrudes from the surface of the resin film 24a and that is drawn along the surface of the resin film 24a inwardly (to the side of the element 5a) of the substrate 2a. In this way, it is possible to join the chip capacitor 101a to the mounting substrate by flip-chip.

Figure 38:
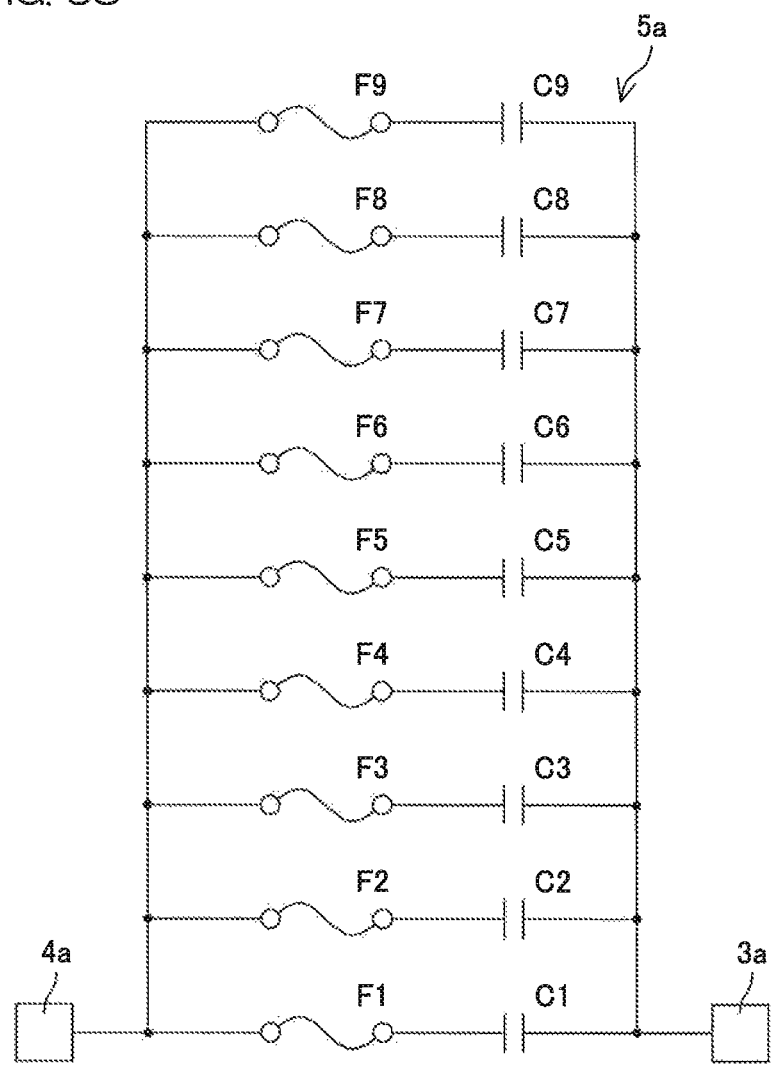
FIG. 38 is a circuit diagram showing the electrical arrangement of the interior of the capacitor.

FIG. 38 is a circuit diagram showing the electrical arrangement of the interior of each capacitor 106a. The capacitor factors C1 to C9 are connected in parallel between the first connection electrode 3a and the second connection electrode 4a. Between each of the capacitor factors C1 to C9 and the second connection electrode 4a, fuses F1 to F9 each of which is formed with one or a plurality of fuse units 107a are interposed in series.

When all the fuses F1 to F9 are connected, the capacitance value of each capacitor 106a is equal to the total of the capacitance values of the capacitor factors C1 to C9. When one or two or more of fuses selected from the plurality of fuses F1 to F9 are cut, the capacitor factors corresponding to the cut fuses are separated, and the capacitance value of the capacitor 106a is reduced only by the capacitance value of the separated capacitor factors.

Hence, the capacitance value (the total of the capacitance values of the capacitor factors C1 to C9) between the pad regions 111Ba and 113Ba is measured, and thereafter one or a plurality of fuses appropriately selected from the fuses F1 to F9 according to the desired capacitance value are blown by laser light, with the result that it is possible to perform conversion (laser trimming) into the desired capacitance value. In particular, when the capacitance values of the capacitor factors C1 to C8 are set so as to be geometric with a geometric ratio of 2, it is possible to finely adjust the capacitance value to perform conversion to the desired capacitance value with accuracy corresponding to the capacitance value of the capacitor factor C1 of the minimum capacitance value (the value of the first term of the geometric progression).

For example, the capacitance values of the capacitor factors C1 to C9 may be determined as follows.

C1=0.03125 pF
C2=0.0625 pF
C3=0.125 pF
C4=0.25 pF
C5=0.5 pF
C6=1 pF
C7=2 pF
C8=4 pF
C9=4 pF

In this case, it is possible to finely adjust the capacitance of the capacitor 106a with accuracy of conversion to the minimum of 0.03125 pF. Fuses to be cut are appropriately selected from the fuses F1 to F9, and thus it is possible to provide the capacitor 106a having an arbitrary capacitance value between 10 to 18 pF.

As described above, in the preferred embodiment, between the first connection electrode 3a and the second connection electrode 4a, the plurality of capacitor factors C1 to C9 that can be separated by the fuses F1 to F9 are provided. The capacitor factors C1 to C9 include a plurality of capacitor factors having different capacitance values, and more specifically, include a plurality of capacitor factors whose capacitance values are set so as to be geometric. In this way, one or a plurality of fuses are selected from the fuses F1 to F9 and are blown by laser light, and thus it is possible to cope with a plurality of types of capacitance values without any change in the design, and it is possible to accurately convert to the desired capacitance value, with the result that it is possible to realize the capacitor 106a with the common design.

The individual parts of the chip capacitor 101a will be described in more detail below.

With reference to FIG. 36, the substrate 2a may be a substrate whose thickness is reduced by grinding or polishing it from the side of the back surface (the surface where the capacitor factors C1 to C9 are not formed). As the material of the substrate 2, a semiconductor substrate such as a silicon substrate may be used, a glass substrate may be used or a resin film may be used.

The insulating film 20a may be an oxide film such as an oxide silicon film. The film thickness thereof may be about 500 to 2000 angstroms.

The lower electrode film 111a is a conductive film and is particularly preferably a metal film, and may be, for example, an aluminum film. The lower electrode film 111a formed with an aluminum film can be formed by a sputtering method. Likewise, the upper electrode film 113a is a conductive film and is particularly preferably a metal film, and may be, for example, an aluminum film. The upper electrode film 113a formed with an aluminum film can be formed by a sputtering method. The capacitor electrode region 113Aa of the upper electrode film 113a is divided into electrode film parts 131a to 139a, and furthermore, the patterning of the fuse region 113Ca to form a plurality of fuse units 107a can be performed by photolithography and an etching process.

The capacitor film 112a can be formed with, for example, a silicon nitride film, and the film thickness thereof can be 500 to 2000 angstroms (for example, 1000 angstroms). The capacitor film 112a may be a silicon nitride film formed by plasma CVD (chemical vapor deposition).

The passivation film 23a can be formed with, for example, a silicon nitride film, and can be formed by, for example, a plasma CVD method. The film thickness thereof may be set at about 8000 angstroms. As described previously, the resin film 24a can be formed with a polyimide film or another resin film.

The first and second connection electrodes 3a and 4a may be formed with a laminated structure film in which for example, a nickel layer in contact with the lower electrode film 111a or the upper electrode film 113a, a palladium layer laminated on the nickel layer and a gold layer laminated on the palladium layer are laminated. For example, it can be formed by a plating method (more specifically, an electroless plating method). The nickel layer contributes to the enhancement of the adhesion property to the lower electrode film 111a or the upper electrode film 113a, and the palladium layer functions as a diffusion prevention layer that reduces the mutual diffusion of the material of the upper electrode film or the lower electrode film and the gold in the uppermost layer of the first and second connection electrodes 3a and 4a.

A step of manufacturing such a chip capacitor 101a is the same as the step of manufacturing the chip resistor 1a after the formation of the element 5a.

When the element 5a (capacitor element) is formed in the chip capacitor 101a, the insulating film 20a formed with an oxide film (for example, a silicon oxide film) is first formed on the surface of the substrate 30a (the substrate 2a) described previously by a thermal oxidizing method and/or a CVD method. Then, for example, by a sputtering method, the lower electrode film 111a formed with an aluminum film is formed over the entire region of the surface of the insulating film 20a. The film thickness of the lower electrode film 111a may be set at about 8000 angstroms. Then, on the surface of the lower electrode film, a resist pattern corresponding to the final shape of the lower electrode film 111a is formed by photolithography. The resist pattern is used as a mask, and thus the lower electrode film is etched, with the result that it is possible to obtain the lower electrode film 111a having a pattern shown in FIG. 35 and the like. The etching of the lower electrode film 111a can be performed by, for example, reactive ion etching.

Then, for example, by a plasma CVD method, the capacitor film 112a formed with a silicon nitride film or the like is formed on the lower electrode film 111a. In the region where the lower electrode film 111a is not formed, on the surface of the insulating film 20a, the capacitor film 112a is formed. Then, on the capacitor film 112a, the upper electrode film 113a is formed. The upper electrode film 113a is formed with, for example, an aluminum film, and can be formed by a sputtering method. The film thickness thereof may be set at about 8000 angstroms. Then, on the surface of the upper electrode film 113a, a resist pattern corresponding to the final shape of the upper electrode film 113a is formed by photolithography. The resist pattern is used as a mask, and thus the upper electrode film 113a is etched, with the result that the upper electrode film 113a is patterned into the final shape (see FIG. 35 and the like). In this way, the upper electrode film 113a is formed into a pattern that has, in the capacitor electrode region 113Aa, the separated electrode film parts 131a to 139a, that has, in the fuse region 113Ca, the plurality of fuse units 107a and that has the pad region 113Ba connected to the fuse units 107a. The etching for patterning the upper electrode film 113a may be performed by wet etching using an etching solution such as phosphoric acid or may be performed by reactive ion etching.

As described above, the element 5a (the capacitor factors C1 to C9 and the fuse units 107a) in the chip capacitor 101a is formed.

In this state, the laser trimming for blowing the fuse unit 107a is performed (see FIG. 30B). Specifically, the laser light is applied to the fuse unit 107a forming the fuse that is selected according to the result of the measurement of the total capacitance value, and the narrow width portion 107Ca (see FIG. 35) of the fuse unit 107a is blown. In this way, the corresponding capacitor factor is separated from the pad region 113Ba. When the laser light is applied to the fuse unit 107a, by the action of the insulating film 45a serving as a cover film, the energy of the laser light is stored in the vicinity of the fuse unit 107a, and thus the fuse unit 107a is blown. In this way, the capacitance value of the chip capacitor 101a can be reliably changed into the desired capacitance value.

Thereafter, as in the steps of FIGS. 30C to 30I, the same steps as in the case of the chip resistor 1a are preferably performed.

Although the chip parts (the chip resistor 1a and the chip capacitor 101a) of the first reference example are described above, the first reference example can also be carried out with still other preferred embodiments.

For example, although in the preferred embodiments described above, an example of the pair chip having a pair of the resistor 6a and the capacitor 106a is described, for example, the chip resistor of the first reference example may be a three-arrayed chip where three resistors 6a and three capacitors 106a are arrayed, a four-arrayed chip where four resistors 6a and four capacitors 106a are arrayed or an N-arrayed chip (N is an integer of 5 or more).

Although in the preferred embodiments described above, in the case of the chip resistor 1a, the example where a plurality of resistor circuits having resistance values that are set so as to be geometric with a geometric ratio of r (0<r, r≠1)=2 are included is described, the geometric ratio in the geometric progression may be a number other than 2. Moreover, although in the case of the chip capacitor 101a, the example where a plurality of capacitor factors having capacitance values that are set so as to be geometric with a geometric ratio of r (0<r, r≠1)=2 are included is described, the geometric ratio in the geometric progression may be a number other than 2.

Although in the chip resistor 1a and the chip capacitor 101a, the insulating film 20a is formed on the surface of the substrate 2a, when the substrate 2a is an insulating substrate, the insulating film 20a can be omitted.

Although in the chip capacitor 101a, the arrangement in which only the upper electrode film 113a is divided into a plurality of electrode film parts is described, only the lower electrode film 111a may be divided into a plurality of electrode film parts or both the upper electrode film 113a and the lower electrode film 111a may be divided into a plurality of electrode film parts. Furthermore, although in the preferred embodiments described above, the example where the upper electrode film, the lower electrode film and the fuse unit are integrally formed is described, the fuse unit may be formed with a conductive film other than the upper electrode film and the lower electrode film. Although in the chip capacitor 101a described above, the capacitor structure of one layer having the upper electrode film 113a and the lower electrode film 111a is formed, on the upper electrode film 113a, another electrode film is laminated via the capacitor film, with the result that a plurality of capacitor structures may be laminated.

In the chip capacitor 101a, a conductive substrate may be used as the substrate 2a, the conductive substrate may be used as the lower electrode and the capacitor film 112a may be formed so as to be in contact with the surface of the conductive substrate. In this case, one external electrode may be drawn from the back surface of the conductive substrate.

When the first reference example is applied to the chip inductor, the element 5a formed on the substrate 2a described previously in the chip inductor includes an inductor element containing a plurality of inductor factors (element factors), and is connected between the first connection electrode 3a and the second connection electrode 4a. The element 5a is provided in the multilayer wiring of the multilayer substrate described previously, and is formed with the wiring film 22a. In the chip inductor, on the substrate 2a, a plurality of fuses F described previously are provided, and the inductor factors each are separably connected via the fuses F to the first connection electrode 3a and the second connection electrode 4a.

In this case, in the chip inductor, one or a plurality of fuses F are selected and cut, and thus a pattern of combinations of a plurality of inductor factors can be an arbitrary pattern, with the result that it is possible to realize chip inductors having various electrical characteristics with the common design.

When the first reference example is applied to the chip diode, the element 5a formed on the substrate 2a described previously in the chip diode includes a diode circuit network (diode element) containing a plurality of diode factors (element factors). The diode element is formed on the substrate 2a. In the chip diode, one or a plurality of fuses F are selected and cut, and thus a pattern of combinations of a plurality of diode elements in the diode circuit network can be an arbitrary pattern, with the result that it is possible to realize chip diodes in which the diode circuit network has various electrical characteristics with the common design.

Both in the chip inductor and in the chip diode, the same actions and effects as in the case of the chip resistor 1a and the chip capacitor 101a can be achieved.

In the first connection electrode 3a and the second connection electrode 4a described above, the Pd layer 34a interposed between the Ni layer 33a and the Au layer 35a can also be omitted. When the adhesion properties of the Ni layer 33a and the Au layer 35a are satisfactory, and thus the pinhole described previously is not produced in the Au layer 35a, the Pd layer 34a may be omitted.

Figure 39:
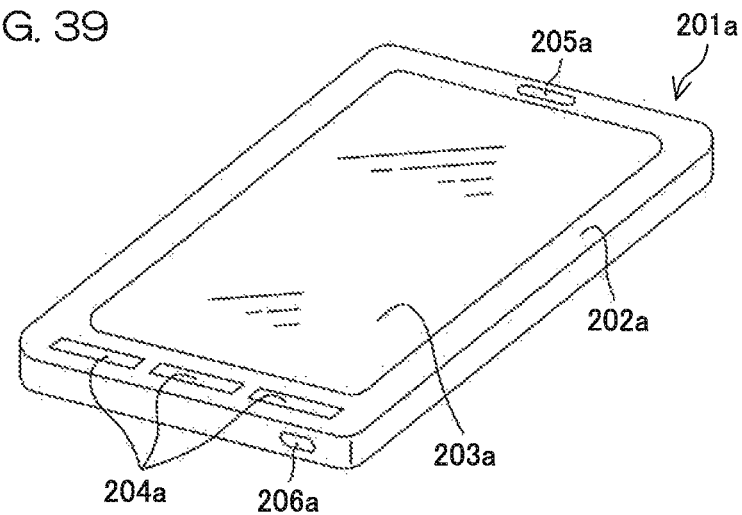
FIG. 39 is a perspective view showing an external view of a smartphone which is an example of an electronic device using the chip part of the first reference example.

FIG. 39 is a perspective view showing an external view of a smartphone which is an example of an electronic device using the chip part of the first reference example. In the smartphone 201a, electronic parts are stored within a housing 202a in the shape of a flat rectangular parallelepiped. In the housing 202a, a pair of rectangular main surfaces are provided on the front side and the back side, and the pair of main surfaces are coupled by four side surfaces. The display surface of a display panel 203a formed with a liquid crystal panel, an organic EL panel or the like is exposed to one of the main surfaces of the housing 202a. The display surface of the display panel 203a forms a touch panel, and provides an input interface for a user.

The display panel 203a is formed in the shape of a rectangle that covers a large proportion of the one main surface of the housing 202a. Operation buttons 204a are arranged along one short side of the display panel 203a. In the preferred embodiment, a plurality of (three) operation buttons 204a are arrayed along the short side of the display panel 203a. The user operates the operation buttons 204a and the touch panel to perform an operation on the smartphone 201a and thereby can call and perform the necessary function.

In the vicinity of the other short side of the display panel 203a, a speaker 205a is arranged. The speaker 205a provides an ear piece for a telephone function, and is also used as an acoustic unit for reproducing music data and the like. On the other hand, near the operation buttons 204a, a microphone 206a is arranged on one side surface of the housing 202a. The microphone 206a provides a mouth piece for the telephone function, and can also be used as a recording microphone.

Figure 40:
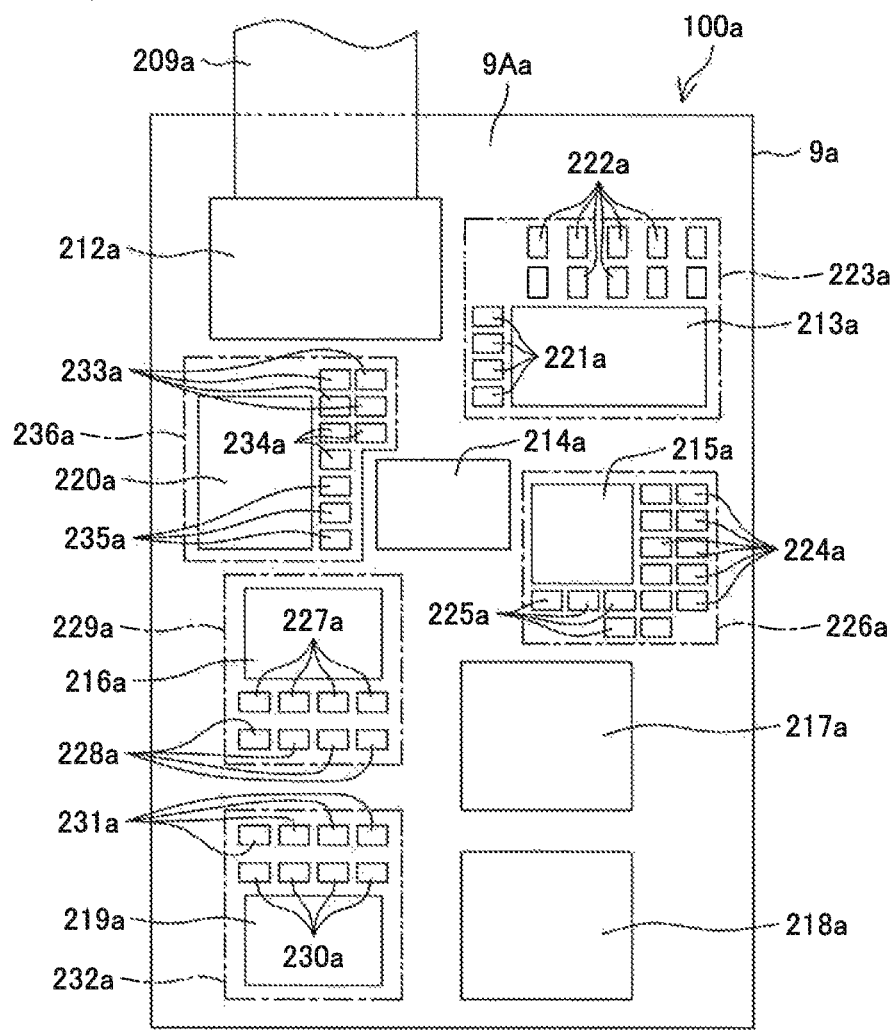
FIG. 40 is a schematic plan view showing the arrangement of the circuit assembly held within the housing of the smartphone.

FIG. 40 is a schematic plan view showing the arrangement of the circuit assembly 100a held within the housing 202a. The circuit assembly 100a includes the mounting substrate 9a described previously and circuit parts mounted on the mounting surface 9Aa of the mounting substrate 9a. A plurality of circuit parts include a plurality of integrated circuit elements (IC) 212a to 220a and a plurality of chip parts. The plurality of ICs include a transmission processing IC 212a, a one segment TV reception IC 213a, a GPS reception IC 214a, an FM tuner IC 215a, a power supply IC 216a, a flash memory 217a, a microcomputer 218a, a power supply IC 219a and a baseband IC 220a. The plurality of chip parts (corresponding to the chip parts of the invention of the present application) include chip inductors 221a, 225a and 235a, chip resistors 222a, 224a and 233a, chip capacitors 227a, 230a and 234a and chip diodes 228a and 231a.

The transmission processing IC 212a incorporates an electronic circuit for generating a display control signal for the display panel 203a and receiving an input signal from the touch panel on the surface of the display panel 203a. For connection to the display panel 203a, a flexible wiring 209a is connected to the transmission processing IC 212a.

The one segment TV reception IC 213a incorporates an electronic circuit forming a receiver for receiving radio waves of the one segment broadcasting (digital terrestrial TV broadcasting having a portable device as a reception target). In the vicinity of the one segment TV reception IC 213a, a plurality of chip inductors 221a and a plurality of chip resistors 222a are arranged. The one segment TV reception IC 213a, the chip inductor 221a and the chip resistor 222a form a one segment broadcasting reception circuit 223a. The chip inductor 221a and the chip resistor 222a respectively have an inductance and a resistor portion adjusted accurately, and provide an accurate circuit constant to the one segment broadcasting reception circuit 223a.

The GPS reception IC 214a incorporates an electronic circuit that receives radio waves from the GPS satellites to output positional information of the smartphone 201a.

The FM tuner IC 215a forms an FM broadcasting reception circuit 226a together with a plurality of chip resistors 224a and a plurality of chip inductors 225a mounted on the mounting substrate 9a in the vicinity thereof. The chip resistor 224a and the chip inductor 225a respectively have a resistance value and an inductance adjusted accurately, and provide an accurate circuit constant to the FM broadcasting reception circuit 226a.

In the vicinity of the power supply IC 216a, a plurality of chip capacitors 227a and a plurality of chip diodes 228a are mounted on the mounting surface of the mounting substrate 9a. The power supply IC 216a forms a power supply circuit 229a together with the chip capacitor 227a and the chip diode 228a.

The flash memory 217a is a storage device for recording an operating system program, data generated within the smartphone 201a, data and programs acquired by a communication function from the outside and the like.

The microcomputer 218a is a computation processing circuit that incorporates a CPU, a ROM and a RAM and that performs various types of computation processing to realize a plurality of functions in the smartphone 201a. More specifically, image processing and computation processing for various types of application programs are realized by the function of the microcomputer 218a.

Near the power supply IC 219a, a plurality of chip capacitors 230a and a plurality of chip diodes 231a are mounted on the mounting surface of the mounting substrate 9a. The power supply IC 219a forms a power supply circuit 232a together with the chip capacitor 230a and the chip diode 231a.

Near the baseband IC 220a, a plurality of chip resistors 233a, a plurality of chip capacitors 234a and a plurality of chip inductors 235a are mounted on the mounting surface 9Aa of the mounting substrate 9a. The baseband IC 220a forms a baseband communication circuit 236a together with the chip resistor 233a, the chip capacitor 234a and the chip inductor 235s. The baseband communication circuit 236a provides a communication function for telephone communication and data communication.

In the arrangement described above, power appropriately adjusted by the power supply circuits 229a and 232a is supplied to the transmission processing IC 212a, the GPS reception IC 214a, the one segment broadcasting reception circuit 223a, the FM broadcasting reception circuit 226a, the baseband communication circuit 236a, the flash memory 217a and the microcomputer 218a. The microcomputer 218a performs computation processing in response to an input signal input via the transmission processing IC 212a, and outputs a display control signal from the transmission processing IC 212a to the display panel 203a to make the display panel 203 produce various types of displays.

When an instruction to receive the one segment broadcasting is provided by the operation of the touch panel or the operation buttons 204a, the one segment broadcasting is received by the function of the one segment broadcasting reception circuit 223a. Then, computation processing for outputting an image received to the display panel 203a and converting sound received into acoustic sound from the speaker 205a is performed by the microcomputer 218a.

When the positional information of the smartphone 201a is needed, the microcomputer 218a acquires the positional information output by the GPS reception IC 214a, and performs computation processing using the positional information.

Furthermore, when an instruction to receive FM broadcasting is input by the operation of the touch panel or the operation buttons 204a, the microcomputer 218a starts up the FM broadcasting reception circuit 226a, and performs computation processing for outputting the received sound from the speaker 205a.

The flash memory 217a is used to store data acquired by communication and to store data produced by the computation of the microcomputer 218a and input from the touch panel. As necessary, the microcomputer 218a writes data into the flash memory 217a and reads data from the flash memory 217a.

The function of telephone communication or data communication is realized by the baseband communication circuit 236a. The microcomputer 218a controls the baseband communication circuit 236a to perform processing for receiving and transmitting sound or data.

It is possible to extract, from the details of the preferred embodiments of the first reference example, the following features other than the inventions recited in the scope of claims.

(Item 1)

A multiple-arrayed chip part including:

a plurality of chip elements which are arranged on a common substrate a distance apart from each other and whose size is less than a 0603 size where the planar dimension thereof is 0.6 mm×0.3 mm; and a pair of electrodes which are formed on the surface of the substrate in the chip element.

In this arrangement, in the multiple-arrayed chip, the plurality of chip elements are arranged on the common substrate, and furthermore, the planar dimension of each chip element is less than a 0603 size. In this way, as compared with a conventional one, it is possible to reduce the junction area (mounting area) in the mounting substrate.

Since the multiple-arrayed chip part is an N-arrayed chip (N is a positive integer), as compared with a case where a chip part (single chip) on which only one element is mounted N times, the chip part having the same function can be mounted by performing only one mounting operation. Furthermore, since as compared with a single chip, it is possible to increase the area per chip, it is possible to stabilize a suction operation by a chip mounter.

(Item 2)

The multiple-arrayed chip part according to item 1, where in the substrate, between a boundary region of the chip elements adjacent to each other and a region for each of the chip elements, a flat surface without any step is continuous.

In this arrangement, in the boundary region of the chip elements of the substrate, the same thickness as the region for each of the chip elements can be secured, with the result that it is possible to prevent the strength in the boundary region from being lowered.

(Item 3)

The multiple-arrayed chip part according to item 1 or 2, further including:

an insulating film which is interposed between the electrode and the substrate, where the insulating film is formed so as to cover the boundary region of the chip elements adjacent to each other in the surface of the substrate.

(Item 4)

The multiple-arrayed chip part according to any one of items 1 to 3, where the pair of electrodes are respectively arranged on one side surface side and the opposite side surface side on the substrate opposite each other, and each of the electrodes includes a peripheral edge portion which is formed so as to cover an edge portion of the substrate and to straddle the surface and the side surfaces of the substrate.

In this arrangement, since the electrode is formed not only on the surface of the substrate but also the side surfaces, it is possible to enlarge an adhesion area when the multiple-arrayed chip part is soldered to the mounting substrate. Consequently, since it is possible to increase the adsorbed amount of solder to the electrode, it is possible to enhance the adhesion strength. Since the solder is adsorbed so as to be moved from the surface of the substrate to the side surfaces, in the mounted state, it is possible to retain the chip part from two directions of the surface and the side surfaces of the substrate. Hence, it is possible to stabilize the mounting shape of the chip part.

(Item 5)

The multiple-arrayed chip part according to item 4, where the multiple-arrayed chip part is a pair chip part having a pair of the chip elements on the common substrate, and the peripheral edge portion of the electrode is formed so as to cover corner portions in the four corners of the substrate.

In this arrangement, since the pair chip part mounted on the mounting substrate can be supported by four points, it is possible to further stabilize the mounting shape.

(Item 6)

The multiple-arrayed chip part according to item 4 or 5, further including:

a wiring film which is formed a distance apart from the edge portion on the surface of the substrate and to which the electrode is electrically connected.

In this arrangement, since the wiring film is independent of the electrode for external connection, it is possible to perform wiring design corresponding to the element pattern formed on the surface of the substrate.

(Item 7)

The multiple-arrayed chip part according to item 6, where in the wiring film, a part opposite the edge portion of the substrate covered by the electrode is selectively exposed, and parts other than the exposed part are selectively covered by a resin film.

In this arrangement, it is possible to increase the junction area of the electrode and the wiring film, and thus it is possible to reduce the contact resistance.

(Item 8)

The multiple-arrayed chip part according to item 7, where the electrode is formed so as to protrude from the surface of the resin film.

(Item 9)

The multiple-arrayed chip part according to item 8, where the electrode is drawn along the surface of the resin film in a horizontal direction and includes a drawing portion which selectively covers the surface.

(Item 10)

The multiple-arrayed chip part according to any one of items 1 to 9, where the electrode includes a Ni layer and an Au layer, and the Au layer is exposed to the uppermost surface.

In this arrangement, the surface of the Ni layer is covered by the Au layer, and thus it is possible to prevent the Ni layer from being oxidized.

(Item 11)

The multiple-arrayed chip part according to item 10, where the electrode further includes a Pd layer interposed between the Ni layer and the Au layer.

In this arrangement, even when a through-hole (pinhole) is formed in the Au layer as a result of the thickness of the Au layer being reduced, the Pd layer interposed between the Ni layer and the Au layer blocks the through-hole and thus it is possible to prevent the Ni layer from being exposed from the through-hole to the outside to become oxidized.

(Item 12)

The multiple-arrayed chip part according to any one of items 1 to 11, where the plurality of chip elements include a chip element whose planar dimension is a 0402 size of 0.4 mm×0.2 mm.

(Item 13)

The multiple-arrayed chip part according to any one of items 1 to 12, where the plurality of chip elements include a chip element whose planar dimension is a 03015 size of 0.3 mm×0.15 mm.

In this arrangement, it is possible to further decrease the size of the multiple-arrayed chip part, and thus it is possible to further reduce the junction area (mounting area) in the mounting substrate.

(Item 14)

The multiple-arrayed chip part according to any one of items 1 to 13, where the plurality of chip elements include a resistor having a resistor body connected between the pair of electrodes.

(Item 15)

The multiple-arrayed chip part according to item 14, where the resistor includes:

a plurality of the resistor bodies; and a plurality of fuses which are provided on the substrate and which connect the plurality of resistor bodies to the electrode such that the resistor bodies can be individually separated.

In this arrangement, one or a plurality of fuses are selectively cut, and thus it is possible to easily and quickly cope with a plurality of types of resistance values. In other words, a plurality of resistor bodies having different resistance values are combined, and thus it is possible to realize the resistors of various resistance values with the common design.

(Item 16)

The multiple-arrayed chip part according to any one of items 1 to 15, where the plurality of chip elements include a capacitor having a capacitor connected to between the pair of electrodes.

(Item 17)

The multiple-arrayed chip part according to item 16, where the capacitor includes:

a plurality of capacitor factors which form the capacitor; and a plurality of fuses which are provided on the substrate and which connect the capacitor factors to the electrode such that the capacitor factors can be individually separated.

In this arrangement, one or a plurality of fuses are selectively cut, and thus it is possible to easily and quickly cope with a plurality of types of capacitance values. In other words, a plurality of capacitor factors having different capacitance values are combined, and thus it is possible to realize the capacitors of various capacitance values with the common design.

(Item 18)

A circuit assembly including:

the multiple-arrayed chip part according to any one of items 1 to 17; and a mounting substrate in which a land joined by solder to the electrode is included in a mounting surface opposite the surface of the substrate.

In this configuration, it is possible to provide a circuit assembly including the multiple-arrayed chip part that can reduce the junction area (mounting area) in the mounting substrate and that can enhance the efficiency of the mounting operation.

(Item 19)

An electronic device including:

the circuit assembly according to item 18; and a housing that holds the circuit assembly.

In this arrangement, it is possible to provide an electronic part including the multiple-arrayed chip part that can reduce the junction area (mounting area) in the mounting substrate and that can enhance the efficiency of the mounting operation.

Second Reference Example

An object of a second reference example is to provide a chip part that can provide an excellent insulating property to a substrate (underlying substrate) and that can reduce the lowering of a high-frequency characteristic.

Another object of the second reference example is to provide a circuit assembly that includes the chip part of the second reference example and an electronic device that includes such a circuit assembly.

Preferred embodiments of the second reference example will be described in detail below with reference to accompanying drawings.

Figure 41A:
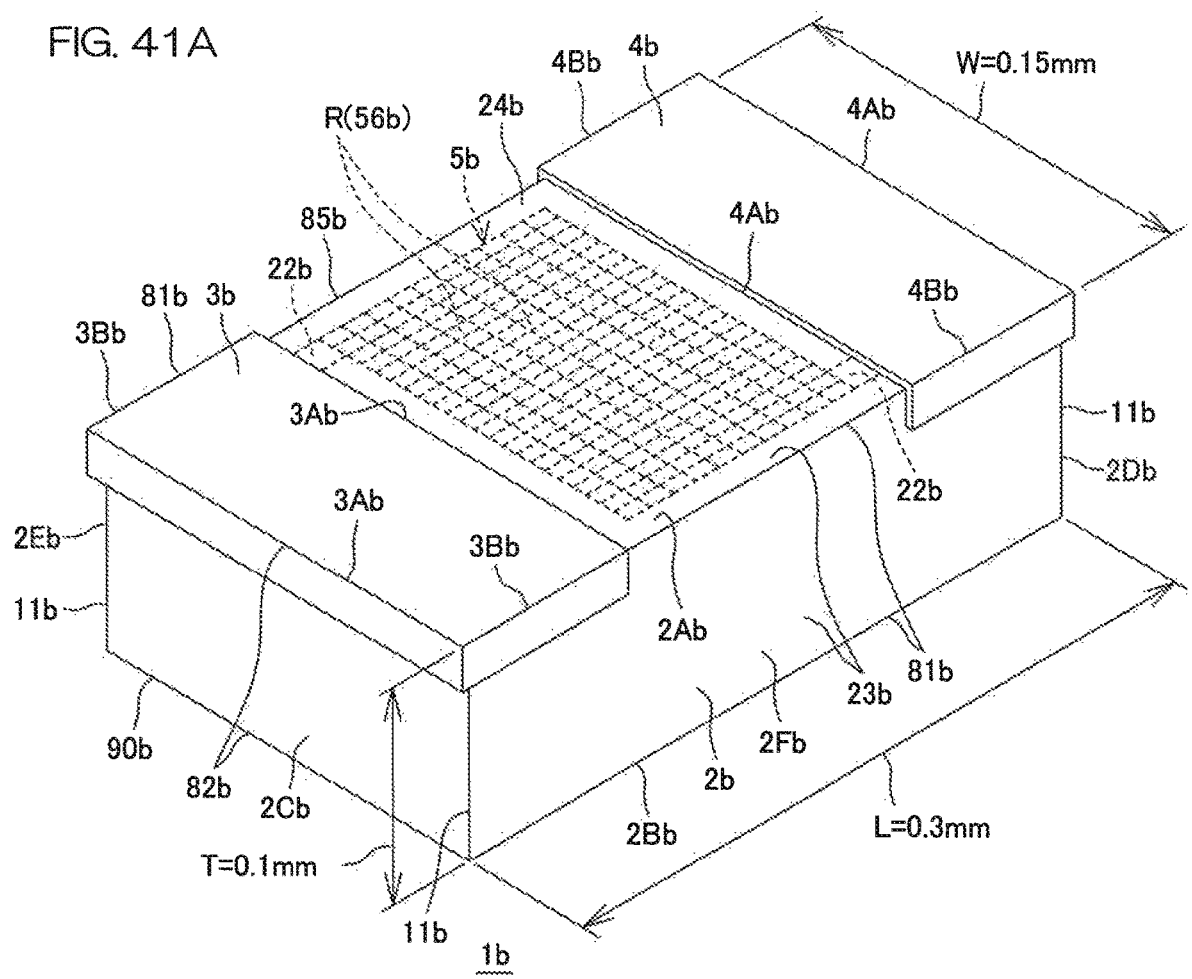
FIG. 41A is a schematic perspective view for illustrating the arrangement of a chip resistor according to a preferred embodiment of a second reference example.

FIG. 41A is a schematic perspective view for illustrating the arrangement of a chip resistor according to a preferred embodiment of the second reference example.

The chip resistor 1b is a minute chip part and is formed in the shape of a parallelepiped as shown in FIG. 41A. The planar shape of the chip resistor 1b is a rectangle in which the lengths of two sides (a long side 81b and a short side 82b) perpendicularly intersecting each other are 0.4 mm or less and 0.2 mm or less, respectively. Preferably, with respect to the dimensions of each chip resistor 1b, the length L (the length of the long side 81b) is about 0.3 mm, the width W (length of the short side 82b) is about 0.15 mm and the thickness T is about 0.1 mm.

The chip resistor 1b is obtained by forming, on the substrate, a large number of chip resistors 1b in a lattice, then forming grooves in the substrate, thereafter performing back polishing (or separating the substrate with the grooves) and thereby separating them into individual chip resistors 1b.

The chip resistor 1b mainly includes the substrate 2b forming the main body of the chip resistor 1b, a first connection electrode 3b and a second connection electrode 4b serving as external connection electrodes and an element 5b externally connected with the first connection electrode 3b and the second connection electrode 4b.

As the substrate 2b, a semiconductor substrate such as a silicon substrate that does not contain a dopant for determining the conductivity type may be used, a glass substrate may be used or a resin film may be used. In other words, an n-type impurity (for example, phosphorus, arsenic or antimony) or a p-type impurity (for example, boron) which dopes the substrate 2b such that the substrate 2b has an n-type or a p-type is not contained. In this way, the substrate 2b is a high-resistance substrate whose resistance value is 100Ω·cm or more, and is more preferably 1000Ω·cm or more. The substrate 2b described above can be produced without the underlying substrate (wafer) doped with an n-type impurity or a p-type impurity.

Such an arrangement is adopted in the substrate 2b, and thus it is possible to provide an excellent insulating property to the substrate 2b. Since the substrate 2b has a satisfactory insulating property, a parasitic capacitance formed between the substrate 2b and the first connection electrode 3b and the second connection electrode 4b opposite each other through an insulating film 20b to be described later can be changed to zero or can be reduced as compared with a case where a substrate containing a dopant is used. Consequently, it is possible to reduce the effects of the parasitic capacitance on the device properties, and thus it is possible to improve the high-frequency characteristic and the like of the chip resistor 1b.

The substrate 2b has a chip shape substantially in the form of a rectangular parallelepiped. In FIG. 41A, one surface of the substrate 2b that forms the upper surface is an element formation surface 2Ab. The element formation surface 2Ab is the surface of the substrate 2b on which the element 5b is formed, and is formed substantially in the shape of a rectangle. The surface on the opposite side to the element formation surface 2Ab in the direction of the thickness of the substrate 2b is a back surface 2Bb. The element formation surface 2Ab and the back surface 2Bb have substantially the same dimensions and shapes and are parallel to each other. It is assumed that a rectangular edge partitioned by a pair of the long side 81b and the short side 82b in the element formation surface 2Ab is referred to as a peripheral edge portion 85b, and that a rectangular edge partitioned by a pair of the long side 81b and the short side 82b in the back surface 2Bb is referred to as a peripheral edge portion 90b. When seen in a normal direction perpendicular to the element formation surface 2Ab (the back surface 2Bb), the peripheral edge portion 85b and the peripheral edge portion 90b are overlaid (see FIG. 41C that will be described later).

The substrate 2b has, as surfaces other than the element formation surface 2Ab and the back surface 2Bb, a plurality of side surfaces (a side surface 2Cb, a side surface 2Db, a side surface 2Eb and a side surface 2Fb). The plurality of side surfaces extend so as to intersect (specifically, perpendicularly intersect) the element formation surface 2Ab and the back surface 2Bb, and thereby connect the element formation surface 2Ab and the back surface 2Bb.

The side surface 2Cb is provided between the short sides 82b on one side (the left front side in FIG. 41A) in the longitudinal direction in the element formation surface 2Ab and the back surface 2Bb, and the side surface 2Db is provided between the short sides 82b on the other side (the right rear side in FIG. 41A) in the longitudinal direction in the element formation surface 2Ab and the back surface 2Bb. The side surface 2Cb and the side surface 2Db are both end surfaces of the substrate 2b in the longitudinal direction. The side surface 2Eb is provided between the long sides 81b on one side (the left rear side in FIG. 41A) in the lateral direction in the element formation surface 2Ab and the back surface 2Bb, and the side surface 2Fb is provided between the long sides 81b on the other side (the right front side in FIG. 41A) in the lateral direction in the element formation surface 2Ab and the back surface 2Bb. The side surface 2Eb and the side surface 2Fb are both end surfaces of the substrate 2b in the lateral direction. The side surface 2Cb and the side surface 2Db intersect (specifically, perpendicularly intersect) each of the side surface 2Eb and the side surface 2Fb. Hence, parts adjacent to each other in the area from the element formation surface 2Ab to the side surface 2Fb form a right angle.

In the substrate 2b, the entire region of the element formation surface 2Ab and the side surfaces 2Cb to 2Fb is covered by a passivation film 23b. Hence, strictly speaking, in FIG. 41A, the entire region of the element formation surface 2Ab and the side surfaces 2Cb to 2Fb is located on the inner side (back side) of the passivation film 23b, and is thereby prevented from being exposed to the outside. Furthermore, the chip resistor 1b includes a resin film 24b. The resin film 24b covers the entire region (the peripheral edge portion 85b and the inside region thereof) of the passivation film 23b on the element formation surface 2Ab. The passivation film 23b and the resin film 24b will be described in detail later.

The first connection electrode 3b and the second connection electrode 4b are formed so as to cover the peripheral edge portion 85b on the element formation surface 2Ab of the substrate 2b and to straddle the element formation surface 2Ab and the side surfaces 2Cb to 2Fb. Each of the first connection electrode 3b and the second connection electrode 4b is formed by laminating, for example, Ni (nickel), Pd (palladium) and Au (gold) in this order on the element formation surface 2Ab. The first connection electrode 3b and the second connection electrode 4b are arranged a distance apart from each other in the longitudinal direction of the element formation surface 2Ab. In the arrangement positions, the first connection electrode 3b is formed so as to integrally cover the three side surfaces 2Cb, 2Eb and 2Fb along one short side 82b (the short side 82b close to the side surface 2Cb) of the chip resistor 1b and along a pair of the long sides 81b on both sides. On the other hand, the second connection electrode 4b is formed so as to integrally cover the three side surfaces 2Db, 2Eb and 2Fb along the other short side 82b (the short side 82b close to the side surface 2Db) of the chip resistor 1b and along a pair of the long sides 81b on both sides. In this way, the corner portions 11b in which the side surfaces intersect each other in both end portions of the substrate 2b in the longitudinal direction are covered by the first connection electrode 3b or the second connection electrode 4b.

The first connection electrode 3b and the second connection electrode 4b have substantially the same dimensions and sizes in plan view when seen in the normal direction described previously. The first connection electrode 3b has a pair of long sides 3Ab and a pair of short sides 3Bb, which form four sides in plan view. The long sides 3Ab perpendicularly intersect the short sides 3Bb in plan view. The second connection electrode 4b has a pair of long sides 4Ab and a pair of short sides 4Bb, which form four sides in plan view. The long sides 4Ab perpendicularly intersect the short sides 4Bb in plan view. The long sides 3Ab and the long sides 4Ab extend in parallel to the short side 82b of the substrate 2b, and the short sides 3Bb and the short sides 4Bb extend parallel to the long side 81b of the substrate 2b. The chip resistor 1b has no electrode on the back surface 2Bb.

The element 5b is a circuit element, is formed in a region between the first connection electrode 3b and the second connection electrode 4b in the element formation surface 2Ab of the substrate 2b and is coated from above with the passivation film 23b and the resin film 24b. The element 5b of the preferred embodiment is a resistor portion 56b. The resistor portion 56b is formed with a circuit network in which a plurality of (unit) resistor bodies R having equal resistance values are arrayed on the element formation surface 2Ab in a matrix. The resistor body R is formed of TiN (titanium nitride), TiON (titanium oxide nitride) or TiSiON. The element 5b is electrically connected to the wiring film 22b which will be described later, and is electrically connected via the wiring film 22b to the first connection electrode 3b and the second connection electrode 4b. In other words, the element 5b is formed on the substrate 2b and is connected between the first connection electrode 3b and the second connection electrode 4b.

Figure 41B:
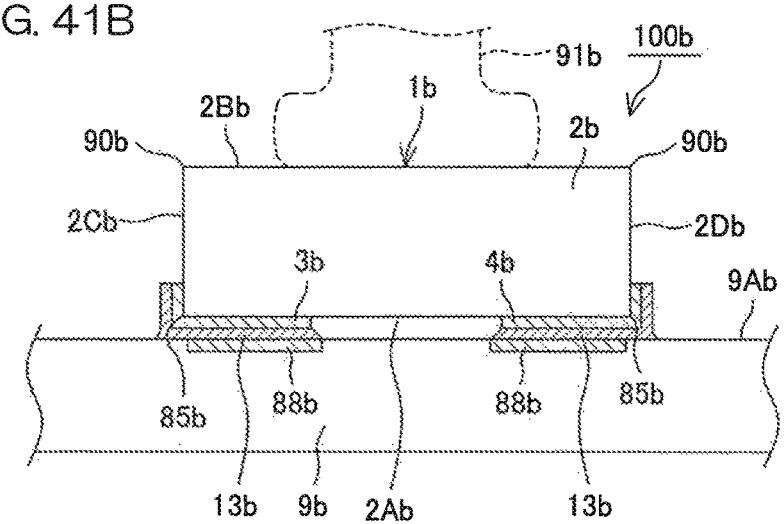
FIG. 41B is a schematic cross-sectional view taken by cutting the circuit assembly with the chip resistor mounted on the mounting substrate along the longitudinal direction of the chip resistor.

FIG. 41B is a schematic cross-sectional view taken by cutting the circuit assembly with the chip resistor mounted on the mounting substrate along the longitudinal direction of the chip resistor. In FIG. 41B, only main portions are shown in cross section.

As shown in FIG. 41B, the chip resistor 1b is mounted on the mounting substrate 9b. The chip resistor 1b and the mounting substrate 9b in this state form the circuit assembly 100b. The upper surface of the mounting substrate 9b in FIG. 41B is a mounting surface 9Ab. A pair of (two) lands 88b connected to the internal circuit (not shown) of the mounting substrate 9b are formed. Each land 88b is formed of, for example, Cu. On the surface of each land 88b, a solder 13b is provided so as to protrude from the surface thereof.

When the chip resistor 1b is mounted on the mounting substrate 9b, the suction nozzle 91b of an automatic mounting machine (not shown) is made to suck the back surface 2Bb of the chip resistor 1b, then the suction nozzle 91b is moved and thus the chip resistor 1b is transported. Here, the suction nozzle 91b sucks a substantially center part of the back surface 2Bb in the longitudinal direction. As described above, the first connection electrode 3b and the second connection electrode 4b are provided on only one surface (the element formation surface 2Ab) of the chip resistor 1b and the end portions of the side surfaces 2Cb to 2Fb on the side of the element formation surface 2Ab, and thus in the chip resistor 1b, the back surface 2Bb is a flat surface without any electrode (projections and recesses). Hence, when the suction nozzle 91b is made to suck the chip resistor 1b and is moved, the suction nozzle 91b can be made to suck the flat back surface 2Bb. In other words, when the back surface 2Bb is flat, it is possible to increase the margin of a part that the suction nozzle 91b can suck. In this way, it is possible to reliably make the suction nozzle 91b suck the chip resistor 1b and to reliably transport the chip resistor 1b without the chip resistor 1b being dropped from the suction nozzle 91b halfway through.

Then, the suction nozzle 91*b* sucking the chip resistor 1*b* is moved to the mounting substrate 9*b*. Here, the element formation surface 2Ab of the chip resistor 1*b* and the mounting surface 9Ab of the mounting substrate 9*b* are opposite each other. In this state, the suction nozzle 91*b* is moved to be pressed onto the mounting substrate 9*b*, and thus in the chip resistor 1*b*, the first connection electrode 3*b* is brought into contact with the solder 13*b* of one land 88*b* and the second connection electrode 4*b* is brought into contact with the solder 13*b* of the other land 88*b*. Then, when the solder 13*b* is heated, the solder 13*b* is melted. Thereafter, when the solder 13*b* is cooled to be solidified, the first connection electrode 3*b* and the one land 88*b* are joined via the solder 13*b*, the second connection electrode 4*a* and the other land 88*b* are joined via the solder 13*b*. In other words, the two lands 88*b* are joined by solder to the corresponding electrodes in the first connection electrode 3*b* and the second connection electrode 4*b*. In this way, the mounting (flip-chip connection) of the chip resistor 1*b* on the mounting substrate 9*b* is finished, with the result that the circuit assembly 100*b* is completed. Preferably, the first connection electrode 3*b* and the second connection electrode 4*b* serving as the external connection electrodes are formed of gold (Au) or the surfaces thereof are gold-plated as will be described later to improve solder wettability and reliability.

Figure 41C:
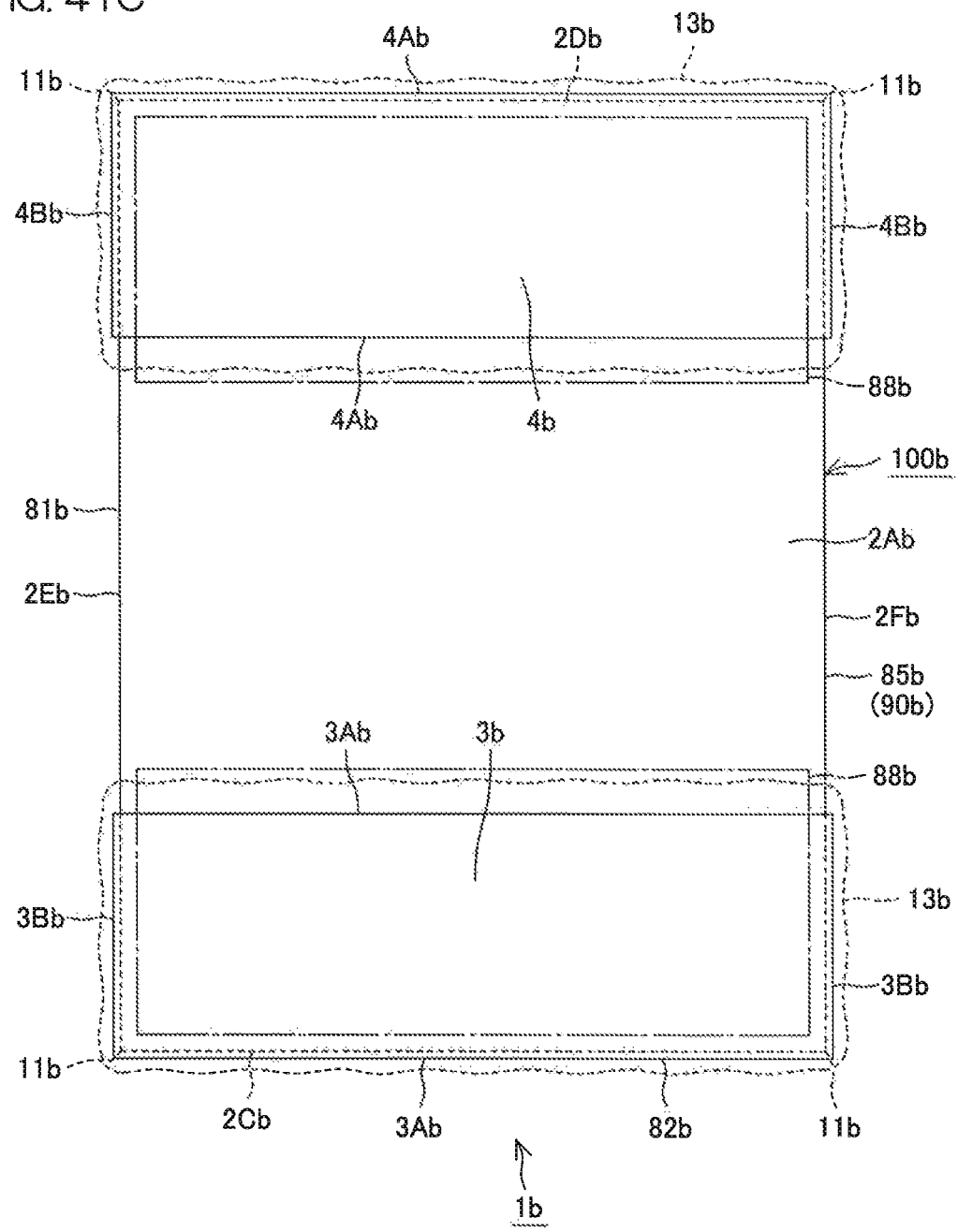
FIG. 41C is a schematic plan view when the chip resistor mounted on the mounting substrate is seen from the side of the element formation surface of the chip resistor.

In the completed circuit assembly 100*b*, the element formation surface 2Ab of the chip resistor 1*b* and the mounting surface 9Ab of the mounting substrate 9*b* are opposite each other through a gap, and extend parallel to each other (also see FIG. 41C). In the first connection electrode 3*b* and the second connection electrode 4*b*, the dimension of the gap corresponds to the total of the thickness of a part protruding from the element formation surface 2Ab and the thickness of the solder 13*b*.

FIG. 41C is a schematic plan view when the chip resistor mounted on the mounting substrate is seen from the side of the element formation surface. The mounting shape of the chip resistor 1*b* will then be described with reference to FIGS. 41B and 41C.

As shown in FIG. 41B, in cross section, for example, the first connection electrode 3*b* and the second connection electrode 4*b* are formed in the shape of the letter L by integrally forming the surface part on the element formation surface 2Ab and the side surface part on the side surfaces 2Cb and 2Db. Hence, as shown in FIG. 41C, when the circuit assembly 100*b* (strictly speaking, the junction part of the chip resistor 1*b* and the mounting substrate 9*b*) is seen in a normal direction (the direction perpendicularly intersecting these surfaces) of the mounting surface 9Ab (the element formation surface 2Ab), the solder 13*b* for joining the first connection electrode 3*b* and one land 88*b* is adsorbed not only to the surface part of the first connection electrode 3*b* but also to the side surface part. Likewise, the solder 13*b* for joining the second connection electrode 4*b* and the other land 88*b* is also adsorbed not only to the surface part of the second connection electrode 4*b* but also to the side surface part.

As described above, in the chip resistor 1*b*, the first connection electrode 3*b* is formed so as to integrally cover the three side surfaces 2Cb, 2Eb and 2Fb of the substrate 2*b*, and the second connection electrode 4*b* is formed so as to integrally cover the three side surfaces 2Db, 2Eb and 2Fb of the substrate 2*b*. In other words, since the electrodes are formed not only on the element formation surface 2Ab but also on the side surfaces 2Cb to 2Fb of the substrate 2*b*, it is possible to enlarge the adhesion area when the chip resistor 1*b* is soldered to the mounting substrate 9*b*. Consequently, since it is possible to increase the adsorbed amount of solder 13*b* to the first connection electrode 3*b* and the second connection electrode 4*b*, it is possible to enhance the adhesion strength.

As shown in FIG. 41C, the solder 13*b* is adsorbed so as to be moved from the element formation surface 2Ab of the substrate 2*b* to the side surfaces 2Cb to 2Fb. Hence, in the mounted state, it is possible to retain the first connection electrode 3*b* from the three side surfaces 2Cb, 2Eb and 2Fb with the solder 13*b*, and to retain the second connection electrode 4*b* from the three side surfaces 2Db, 2Eb and 2Fb with the solder 13*b*, and thus all the side surfaces 2Cb to 2Fb of the rectangular chip resistor 1*b* can be fixed by the solder 13*b*. In this way, it is possible to stabilize the mounting shape of the chip resistor 1*b*.

Another arrangement of the chip resistor 1*b* will then be mainly described.

Figure 42:
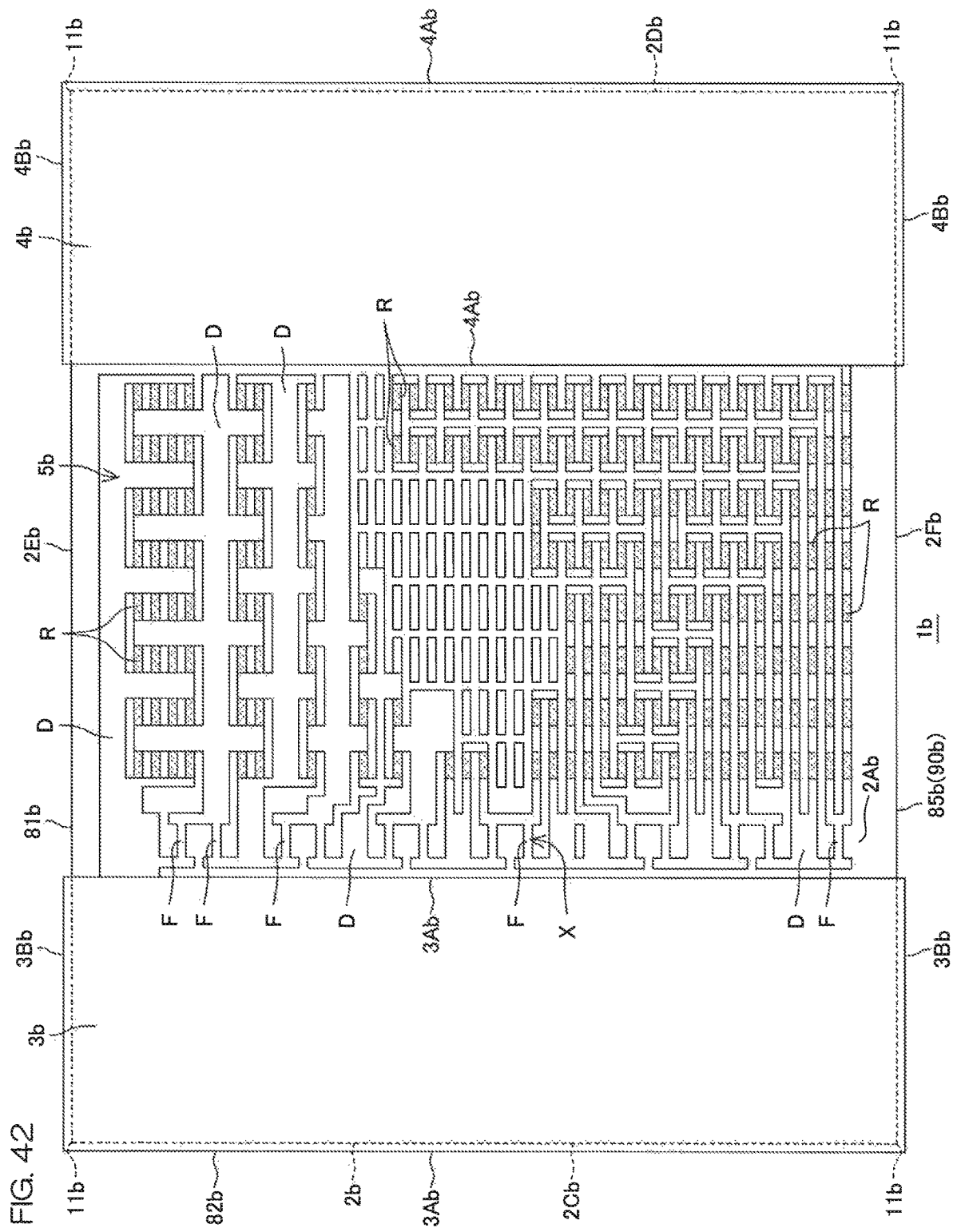
FIG. 42 is a plan view of the chip resistor, a drawing showing a positional relationship between a first connection electrode, a second connection electrode and an element and the arrangement of the element in plan view.

FIG. 42 is a plan view of the chip capacitor, a drawing showing a positional relationship between the first connection electrode, the second connection electrode and the element and the arrangement (layout pattern) of the element in plan view.

With reference to FIG. 42, the element 5*b* is a resistor circuit network. Specifically, the element 5*b* includes a total of 352 resistor bodies R formed with 8 resistor bodies R arrayed along a row direction (the longitudinal direction of the substrate 2*b*) and 44 resistor bodies R arrayed along a column direction (the width direction of the substrate 2*b*). These resistor bodies R are a plurality of element factors that form the resistor circuit network of the element 5*b*.

A large number of resistor bodies R described above are collected every predetermined number of 1 to 64 pieces and are electrically connected, and thus a plurality of types of resistor circuits are formed. The plurality of types of resistor circuits formed are connected by a conductive film D (wiring film formed with a conductor) so as to have a predetermined aspect. Furthermore, in the element formation surface 2Ab of the substrate 2*b*, a plurality of fuses F are provided which can be cut (blown) such that the resistor circuit is electrically incorporated into the element 5*b* or is electrically separated from the element 5*b*. The plurality of fuses F and the conductive film D are arrayed along the inner side of the first connection electrode 3*b* such that the arrangement region thereof is formed linearly. More specifically, the plurality of fuses F and the conductive film D are arranged so as to be adjacent to each other, and the direction of the array thereof is linear. The plurality of fuses F connect the plurality of types of resistor circuits (a plurality of resistor bodies R per resistor circuit) to the first connection electrode 3*b* such that the types of resistor circuits can be individually cut (separated) from the first connection electrode 3*b*.

Figure 43C:
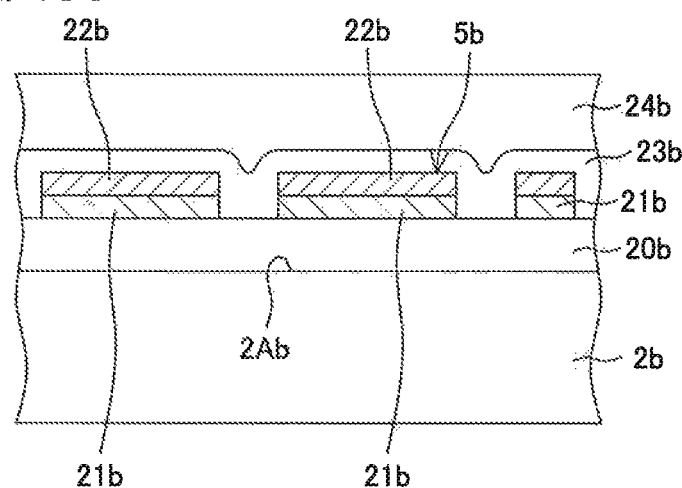
FIG. 43C is a vertical cross-sectional view depicted for illustrating the arrangement of the resistor bodies of the element in a width direction along line C-C of FIG. 43A.

FIG. 43A is a plan view depicting an enlarged part of the element shown in FIG. 42. FIG. 43B is a vertical cross-sectional view depicted for illustrating the arrangement of the resistor bodies of the element in a length direction along line B-B of FIG. 43A. FIG. 43C is a vertical cross-sectional view depicted for illustrating the arrangement of the resistor bodies of the element in a width direction along line C-C of FIG. 43A.

The arrangement of the resistor bodies R will be described with reference to FIGS. 43A, 43B and 43C.

The chip resistor 1*b* further includes an insulating film 20*b* and a resistor body film 21*b* in addition to the wiring film 22*b*, the passivation film 23*b* and the resin film 24*b* described above (see FIGS. 43B and 43C). The insulating film 20b, the resistor body film 21b, the wiring film 22b, the passivation film 23b and the resin film 24b are formed on the substrate 2b (the element formation surface 2Ab).

The insulating film 20b is formed of $SiO_2$ (oxide silicon). The insulating film 20b covers the entire region of the element formation surface 2Ab of the substrate 2b. The thickness of the insulating film 20b is about 10000 angstroms.

The resistor body film 21b is formed on the insulating film 20b. The resistor body film 21b is formed of TiN, TiON or TiSiON. The thickness of the resistor body film 21b is about 2000 angstroms. The resistor body film 21b forms a plurality of lines of resistor body film (hereinafter referred to as "resistor body film lines 21Ab") that extend linearly parallel to each other between the first connection electrode 3b and the second connection electrode 4b. The resistor body film line 21Ab may be cut in a predetermined position in the direction of the line (see FIG. 43A).

On the resistor body film line 21Ab, the wiring film 22b is laminated. The wiring film 22b is formed of Al (aluminum) or an alloy (AlCu alloy) of aluminum and Cu (copper). The thickness of the wiring film 22b is about 8000 angstroms. The wiring films 22b are laminated on the resistor body film line 21Ab a given distance R apart in the direction of the line, and are in contact with the resistor body film line 21Ab.

Figure 44A:
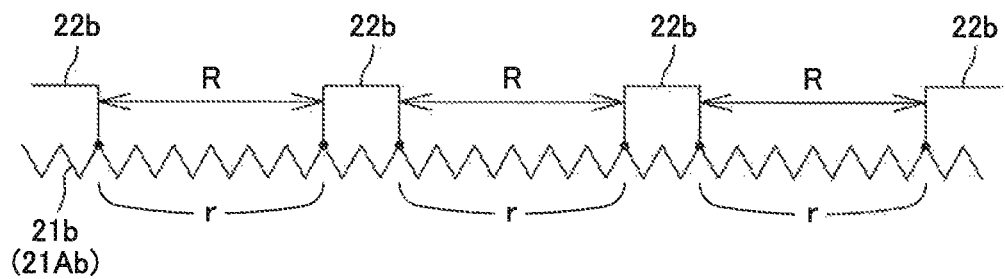
FIG. 44A, FIG. 44B, and FIG. 44C are drawings showing the electrical characteristics of a resistor body film line and a wiring film with circuit symbols and electrical circuit diagrams.
Figure 44B:
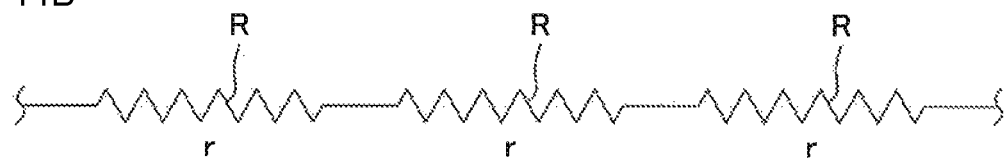

The electrical characteristics of the resistor body film line 21Ab and the wiring film 22b in this arrangement are shown with circuit symbols in FIG. 44. Specifically, as shown in FIG. 44(a), the part of the resistor body film line 21Ab in the region of the given distance R forms one resistor body R having a given resistance value r.

In the region where the wiring film 22b is laminated, the wiring film 22b electrically connects the adjacent resistor bodies R, and thus the resistor body film line 21Ab is short-circuited by the wiring film 22b. Consequently, the resistor circuit is formed that is formed with the resistor bodies R of the resistor portion r shown in FIG. 44(b) and connected in series.

Figure 44C:
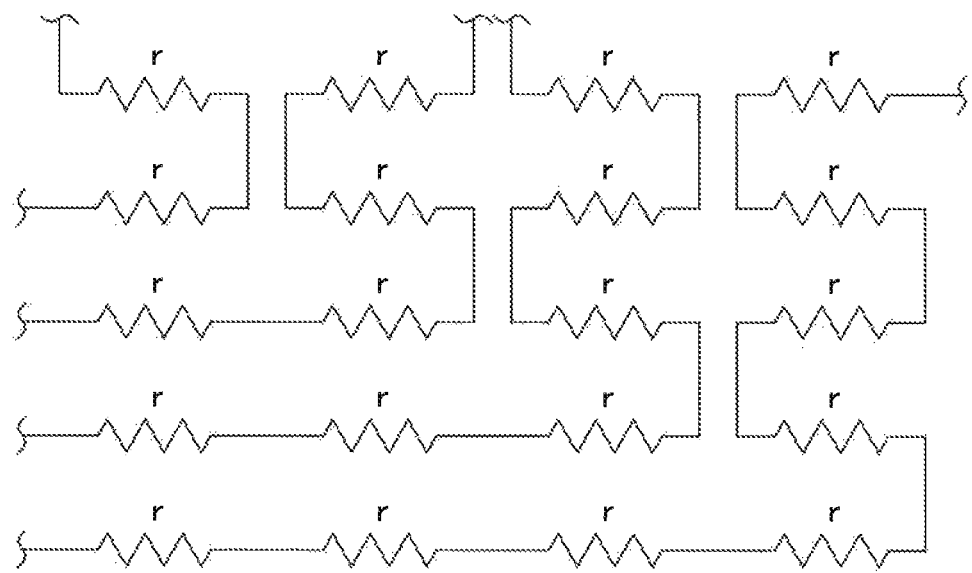

The adjacent resistor body film lines 21Ab are connected with the resistor body film 21b and the wiring film 22b, and thus the resistor circuit network of the element 5b shown in FIG. 43A forms the resistor circuit shown in FIG. 44(c) (formed with the unit resistor portions of the resistor bodies R described above). As described above, the resistor body film 21b and the wiring film 22b form the resistor bodies R and the resistor circuit (that is, the element 5b). Each resistor body R includes the resistor body film line 21Ab (the resistor body film 21b) and a plurality of wiring films 22b laminated the given distance apart on the resistor body film line 21Ab in the direction of the line, and the resistor body film line 21Ab in the part of the given distance R where the wiring film 22b is not laminated forms one resistor body R. All the shapes and the sizes of the resistor body film lines 21Ab in the parts forming the resistor bodies R are equal to each other. Hence, a large number of resistor bodies R arrayed in a matrix on the substrate 2b have equal resistance values.

The wiring film 22b laminated on the resistor body film line 21Ab forms the resistor bodies R and also functions as the conductive film D for forming the resistor circuit by connecting the plurality of resistor bodies R (see FIG. 42).

Figures 45A, 45B:
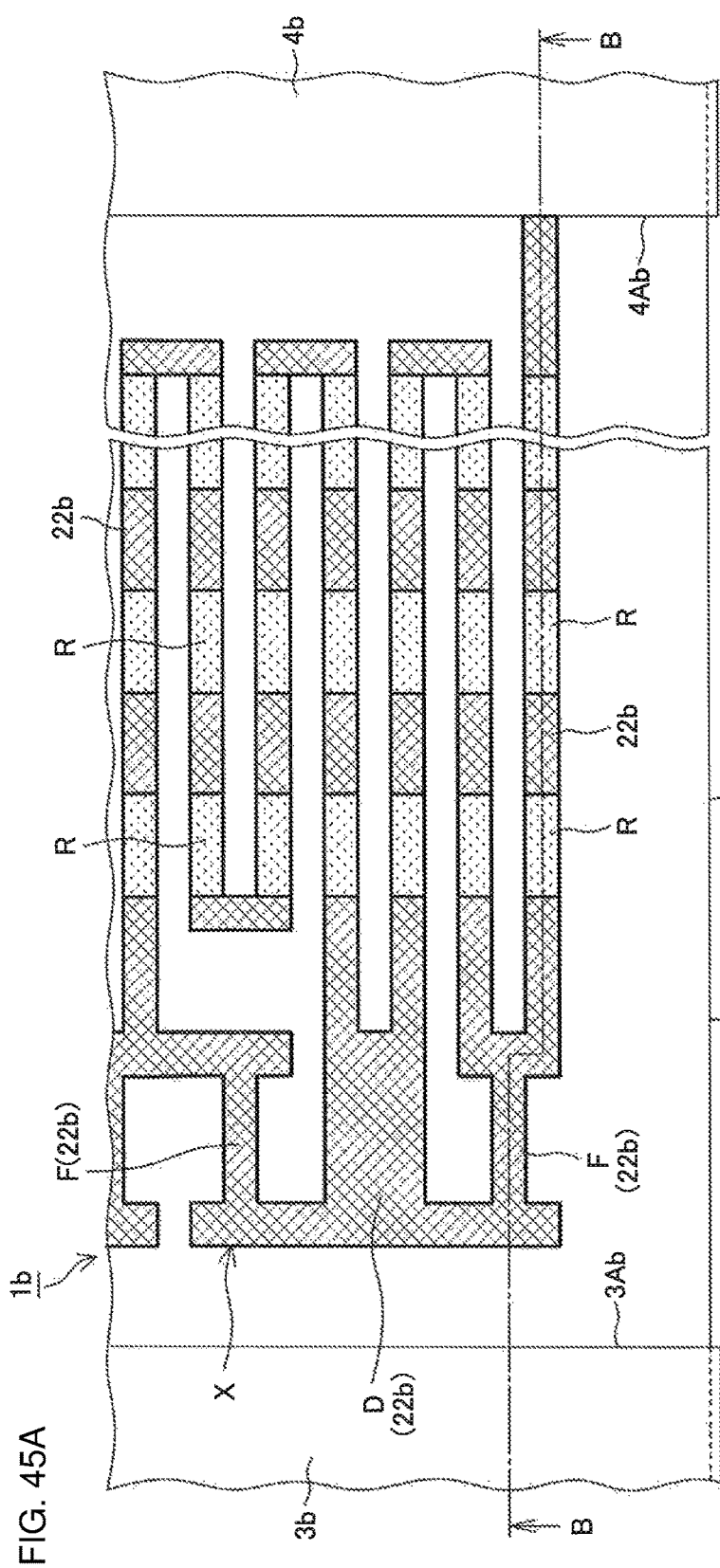
FIG. 45A is a partially enlarged plan view of a region including fuses depicting an enlarged part of a plan view of the chip resistor of FIG. 2.
FIG. 45B is a diagram showing a cross-sectional structure along line B-B of FIG. 45A.

FIG. 45(a) is a partially enlarged plan view of a region including fuses depicting an enlarged part of a plan view of the chip resistor shown in FIG. 42, and FIG. 45(b) is a drawing showing a cross-sectional structure along line B-B of FIG. 45(a).

As shown in FIGS. 45(a) and 45(b), the fuses F and the conductive film D described above are also formed with the wiring film 22b laminated on the resistor body film 21b forming the resistor bodies R. Specifically, in the same layer as the wiring film 22b laminated on the resistor body film line 21Ab forming the resistor bodies R, the fuses F and the conductive film D are formed of Al or AlCu alloy, which is the same metal material as the wiring film 22b. As described previously, in order to form the resistor circuit, the wiring film 22b is also used as the conductive film D electrically connecting the plurality of resistor bodies R.

In other words, in the same layer laminated on the resistor body film 21b, the wiring film for forming the resistor bodies R, the fuses F, the conductive film D and furthermore, the wiring film for connecting the element 5b to the first connection electrode 3b and the second connection electrode 4b are formed, as the wiring film 22b, of the same metal material (Al or AlCu alloy). The fuse F differs from (is distinguished from) the wiring film 22b in that the fuse F is formed to be thin so as to be easily cut and that other circuit elements are prevented from being present around the fuses F.

Here, in the wiring film 22b, a region where the fuse F is arranged is referred to as a trimming target region X (see FIGS. 42 and 45(a). The trimming target region X is a linear region along the inner side of the first connection electrode 3b, and in the trimming target region X, not only the fuse F but also the conductive film D is arranged. Below the wiring film 22b in the trimming target region X, the resistor body film 21b is also formed (see FIG. 45(b)). The fuse F is a wiring in which a wiring-to-wiring distance is larger than that in the parts other than the trimming target region X in the wiring film 22b (which is separated from the surrounding area).

The fuse F may indicate not only apart of the wiring film 22b but also a combination (fuse element) of a part of the resistor body R (the resistor body film 21b) and a part of the wiring film 22b on the resistor body film 21b.

Although only the case where in the fuse F, the same layer as the conductive film D is used is described, in the conductive film D, another conductive film may be further laminated thereon such that the resistance value of the entire conductive film D is lowered. Even in this case, unless the conductive film is laminated on the fuse F, the blowing property of the fuse F is prevented from being degraded.

Figure 46:
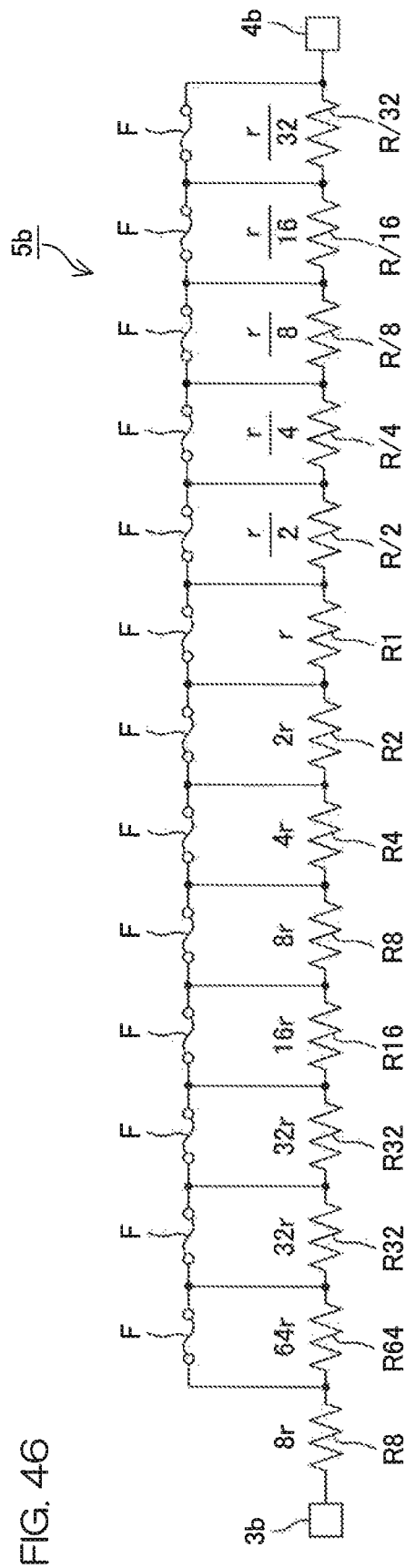
FIG. 46 is an electrical circuit diagram according to a preferred embodiment of the second reference example.

FIG. 46 is an electrical circuit diagram of the element according to a preferred embodiment of the second reference example.

With reference to FIG. 46, the element 5b is formed by connecting in series, from the first connection electrode 3b, in the following order, a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16 and a resistor circuit R/32. Each of the reference resistor circuit R8 and the resistor circuits R64 to R2 is formed by connecting in series the same number of resistor bodies R as the number at the end of itself (in the case of R64, "64"). The resistor circuit R1 is formed with one resistor body R. Each of the resistor circuits R/2 to R/32 is formed by connecting in parallel the same number of resistor bodies R as the number at the end of itself (in the case of R/32, "32"). The meaning of the number at the end of the resistor circuit is the same as in FIGS. 47 and 48, which will be described later.

One fuse F is connected in parallel to each of the resistor circuits R64 to R/32 other than the reference resistor circuit R8. The fuses F are connected in series either directly or via the conductive film D (see FIG. 45(a)).

As shown in FIG. 46, in a state where no fuses F are blown, the element 5b forms the resistor circuit of the reference resistor circuit R8 connected in series that is formed with 8 resistor bodies R provided between the first connection electrode 3b and the second connection electrode 4b. For example, when the resistance value r of one resistor body R is assumed to be r=8Ω, the resistor circuit (the reference resistor circuit R8) of 8r=64Ω forms the chip resistor 1b to which the first connection electrode 3b and the second connection electrode 4b are connected.

In the state where no fuses F are blown, a plurality of types of resistor circuits other than the reference resistor circuit R8 are short-circuited. Specifically, although 13 resistor circuits R64 to R/32 of 12 types are connected in series to the reference resistor circuit R8, since each of the resistor circuits is short-circuited by the fuse F which is connected in parallel thereto, the resistor circuits are not electrically incorporated into the element 5b.

In the chip resistor 1b according to the preferred embodiment, the fuse F is selectively blown by, for example, laser light according to the required resistance value. In this way, the resistor circuit in which the fuse F connected in parallel thereto is blown is incorporated into the element 5b. Hence, the resistance value of the entire element 5b can be changed into a resistance value obtained by connecting in series and incorporating the resistor circuit corresponding to the blown fuse F.

In particular, a plurality of types of resistor circuits include a plurality of types of series resistor circuits in which the resistor bodies R having equal resistance values are connected while the number of resistor bodies R is being increased geometrically with a geometric ratio of 2 such that 1 piece, 2 pieces, 4 pieces, 8 pieces, 16 pieces, 32 pieces, . . . are connected in series and a plurality of types of parallel resistor circuits in which the resistor bodies R having equal resistance values are connected while the number of resistor bodies R is being increased geometrically with a geometric ratio of 2 such that 2 pieces, 4 pieces, 8 pieces, 16 pieces, . . . are connected in parallel. Hence, the fuses F (including the fuse element described above) are selectively blown, and thus the resistance value of the entire element 5b (resistor portion 56b) is finely and digitally adjusted to be an arbitrary resistance value, with the result that the resistor portion of a desired value can be produced in the chip resistor 1b.

Figure 47:
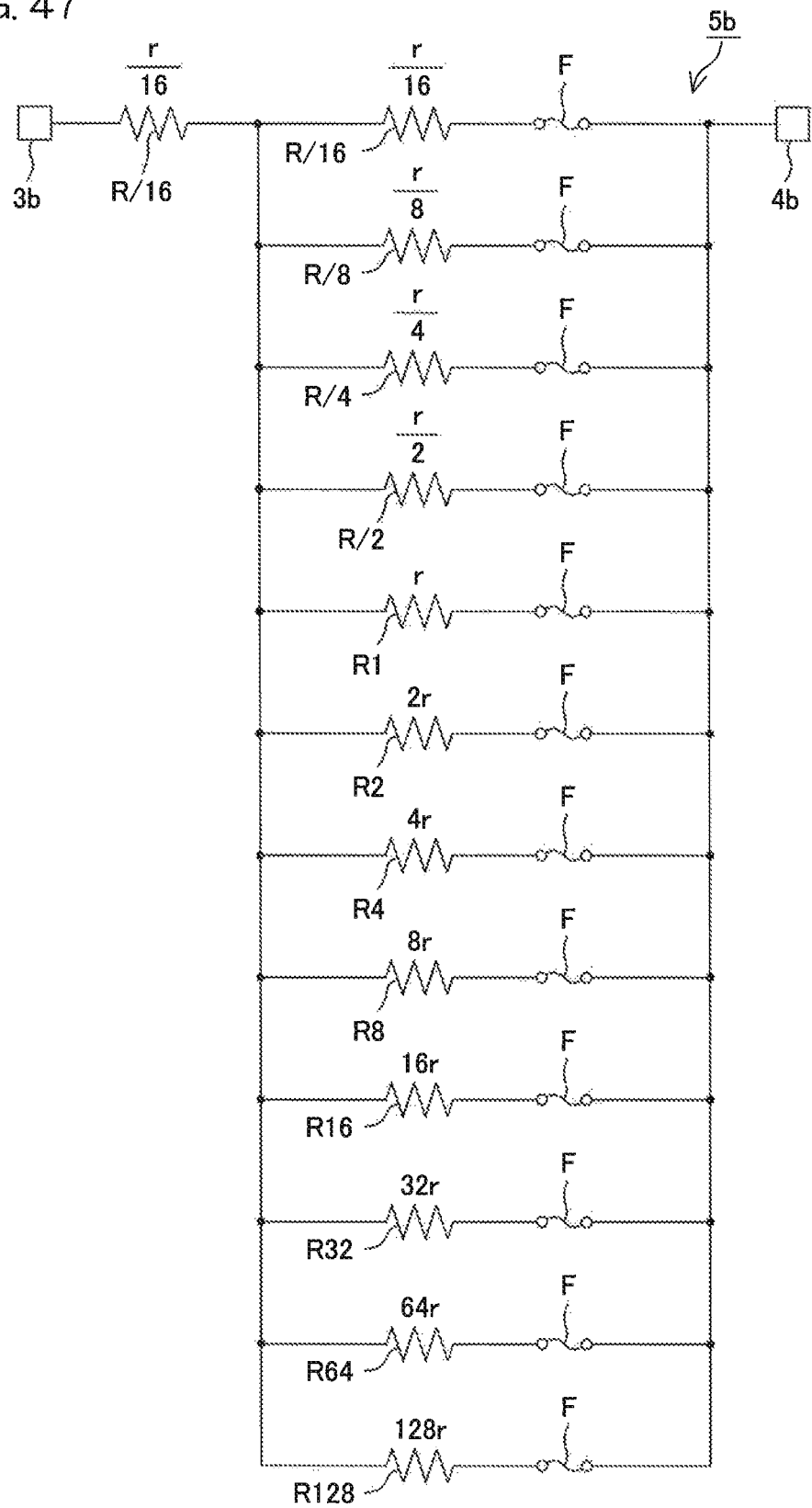
FIG. 47 is an electrical circuit diagram according to another preferred embodiment of the second reference example.

FIG. 47 is an electrical circuit diagram of the element according to another preferred embodiment of the second reference example.

Instead of forming the element 5b by connecting, in series, the reference resistor circuit R8 and the resistor circuits R64 to R/32 as shown in FIG. 46, as shown in FIG. 47, the element 5b may be formed. Specifically, between the first connection electrode 3b and the second connection electrode 4b, the element 5b may be formed with a series connection circuit of the reference resistor circuit R/16 and a parallel connection circuit of 12 types of resistor circuits R/16, R/8, R/4, R/2, R1, R2, R4, R8, R16, R32, R64 and R128.

In this case, the fuse F is connected in series to each of the 12 types of resistor circuits other than the reference resistor circuit R/16. In the state where no fuses F are blown, the resistor circuits are electrically incorporated into the element 5b. The fuses F are selectively blown by, for example, laser light according to the required resistance value, and thus the resistor circuits (the resistor circuits to which the fuses F are connected in series) corresponding to the blown fuses F are electrically separated from the element 5b, with the result that the resistance value of the entire chip resistor 1b can be adjusted.

Figure 48:
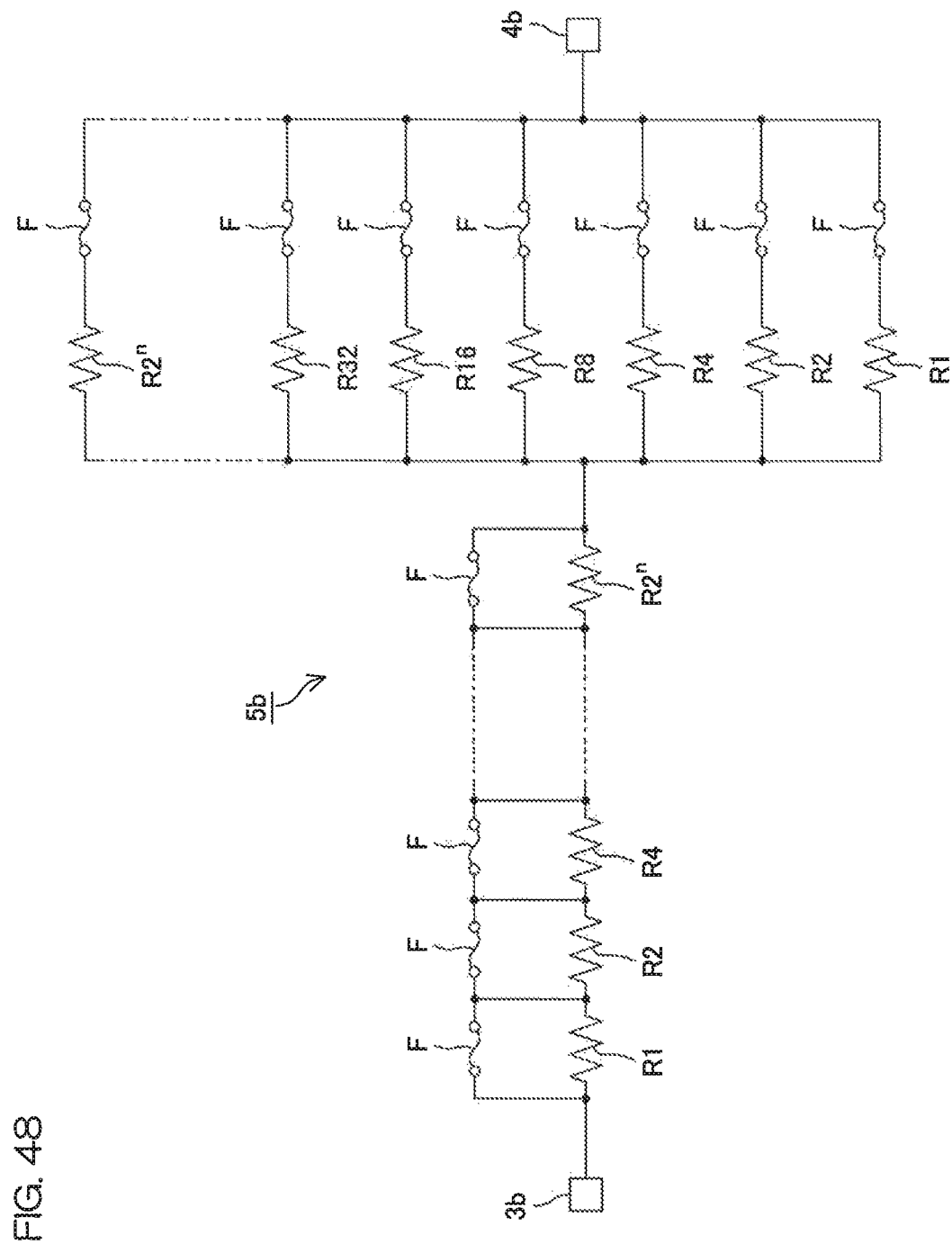
FIG. 48 is an electrical circuit diagram according to yet another preferred embodiment of the second reference example.

FIG. 48 is an electrical circuit diagram of an element according to yet another preferred embodiment of the second reference example.

The feature of the element 5b shown in FIG. 48 is a circuit arrangement in which a series connection of a plurality of types of resistor circuits and a parallel connection of a plurality of types of resistor circuits are connected in series. In the types of resistor circuits connected in series, as in the preferred embodiment described previously, the fuse F is connected in parallel to each of the resistor circuits, and all the types of the resistor circuits connected in series are short-circuited by the fuses F. Hence, when the fuse F is blown, the resistor circuit short-circuited by the blown fuse F is electrically incorporated into the element 5b.

On the other hand, the fuse F is connected in series to each of the plurality of types of resistor circuits connected in parallel. Hence, the fuse F is blown, and thus it is possible to electrically separate the resistor circuit to which the blown fuse F is connected in series from the parallel connection of the resistor circuits.

In the arrangement described above, for example, small resistor portions of 1 kΩ or less are produced on the side of the parallel connection, and the resistor circuits of 1 kΩ or more are produced on the side of the series connection, and thus the resistor circuits in a wide range from small resistor portions of a few ohms to large resistor portions of a few mega ohms can be produced with a resistor circuit network formed with the same basic design. That is, in the chip resistor 1b, one or a plurality of fuses F are selectively cut, and thus it is possible to easily and quickly cope with a plurality of types of resistance values. In other words, a plurality of resistor bodies R having different resistance values are combined, and thus it is possible to realize the chip resistors 1b of various resistance values with the common design.

As described above, in the chip resistor 1b, the state of the connection of a plurality of resistor bodies R (resistor circuits) can be changed in the trimming target region X.

Figure 49:
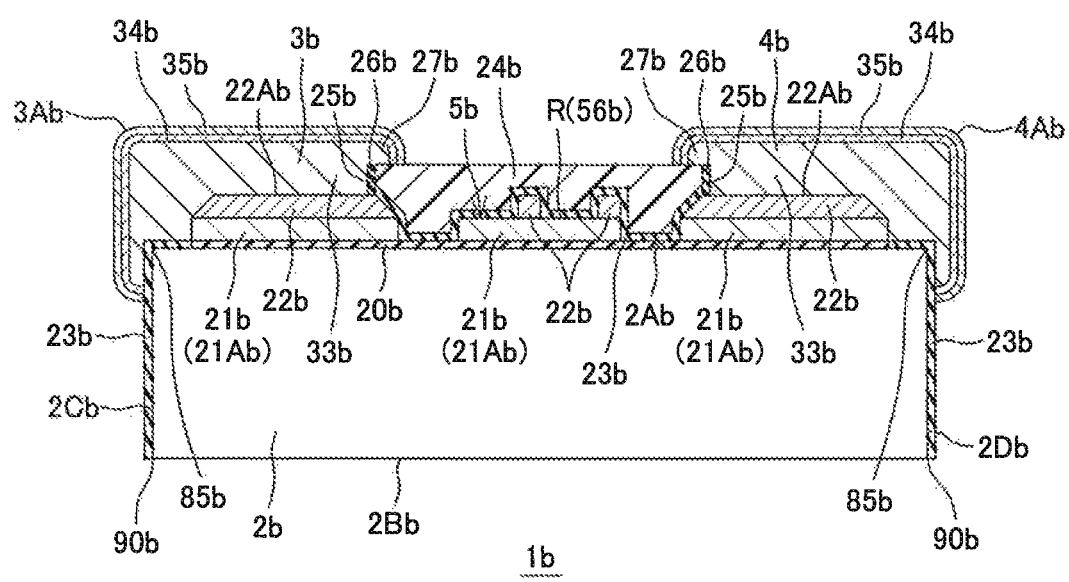
FIG. 49 is a schematic cross-sectional view of the chip resistor.

FIG. 49 is a schematic cross-sectional view of the chip resistor.

The chip resistor 1b will then be described in more detail with reference to FIG. 49. For ease of description, in FIG. 49, the element 5b described above is shown by being simplified and the factors other than the substrate 2b are hatched.

Here, the passivation film 23b and the resin film 24b discussed above will be described.

The passivation film 23b is formed of, for example, SiN (silicon nitride), and its thickness is 1000 to 5000 angstroms (here, about 3000 angstroms). The passivation film 23b is provided substantially over the entire region of the element formation surface 2Ab and the side surfaces 2Cb to 2Fb. The passivation film 23b on the element formation surface 2Ab coats, from the surface (the upper side of FIG. 49), the resistor body film 21b and the wiring films 22b on the resistor body film 21b (that is, the element 5b) to cover the upper surface of the resistor bodies R in the element 5b. Hence, the passivation film 23b also covers the wiring film 22b in the trimming target region X described above (see FIG. 45(b)). The passivation film 23b is in contact with the element 5b (the wiring film 22b and the resistor body film 21b), and is also in contact with the insulating film 20b in the region other than the resistor body film 21b. In this way, the passivation film 23b on the element formation surface 2Ab functions as a protective film that covers the entire region of the element formation surface 2Ab to protect the element 5b and the insulating film 20b. On the element formation surface 2Ab, the passivation film 23b prevents the part other than the wiring film 22b between the resistor bodies R from being short-circuited (short-circuited between the adjacent resistor body film lines 21Ab).

On the other hand, the passivation film 23b provided on the side surfaces 2Cb to 2Fb is interposed between the side surface parts of the first connection electrode 3b and the second connection electrode 4b and the side surfaces 2Cb to 2Fb of the substrate 2b, and functions as a protective layer that protects the side surfaces 2Cb to 2Fb. In this way, when it is desired to prevent the first connection electrode 3b and the second connection electrode 4b and the substrate 2b from being short-circuited, it is possible to cope with such a requirement. However, since in the preferred embodiment, the substrate 2b of high resistor portion is used, even when the passivation film 23b is not present, the first connection electrode 3b and the second connection electrode 4b and the substrate 2b are prevented from being short-circuited satisfactorily. Since the passivation film 23b is an extremely thin film, in the preferred embodiment, the passivation film 23b that covers the side surfaces 2Cb to 2Fb is assumed to be a part of the substrate 2b. Hence, the passivation film 23b that covers the side surfaces 2Cb to 2Fb is assumed to be the side surfaces 2Cb to 2Fb themselves.

The resin film 24b protects, together with the passivation film 23b, the element formation surface 2Ab of the chip resistor 1b, and is formed of a resin such as polyimide. The thickness of the resin film 24b is about 5 μm.

The resin film 24b coats the entire region of the surface (including the resistor body film 21b and the wiring film 22b coated with the passivation film 23b) of the passivation film 23b on the element formation surface 2Ab.

In the resin film 24b, a cutout portion 25b that exposes a peripheral edge portion opposite the side surface parts of the first connection electrode 3b and the second connection electrode 4b in the wiring film 22b is individually formed. Each cutout portion 25b continuously penetrates the resin film 24b and the passivation film 23b in the direction of the thickness thereof. Hence, the cutout portions 25b are formed not only in the resin film 24b but also in the passivation film 23b. In this way, in each wiring film 22b, only a peripheral edge portion on the inner side close to the element 5b is selectively covered by the resin film 24b, and the other peripheral edge portion along the peripheral edge portion 85b of the substrate 2b is selectively exposed via the cutout portion 25b. The surface exposed from each cutout portion 25b in the wiring film 22b serves as a pad region 22Ab for external connection. The wiring film 22b exposed from the cutout portion 25b is arranged a predetermined distance (for example, 3 to 6 μm) apart, inwardly from the peripheral edge portion 85b of the substrate 2b in the element formation surface 2Ab. On the side surface of the cutout portion 25b, an insulating film 26b is formed overall from one short side 82b to the other short side 82b of the chip resistor 1b.

Among the two cutout portions 25b, the first connection electrode 3b is completely embedded in one cutout portion 25b, and the second connection electrode 4b is completely embedded in the other cutout portion 25b. As described previously, the first connection electrode 3b and the second connection electrode 4b are formed so as to cover not only the element formation surface 2Ab but also the side surfaces 2Cb to 2Fb. The first connection electrode 3b and the second connection electrode 4b are formed so as to protrude from the resin film 24b, and include a drawing portion 27b that is drawn along the surface of the resin film 24b to the inner side of the substrate 2b (the side of the element 5b).

Here, each of the first connection electrode 3b and the second connection electrode 4b has, from the side of the element formation surface 2Ab and the side of the side surfaces 2Cb to 2Fb, a Ni layer 33b, a Pd layer 34b and an Au layer 35b in this order. In other words, each of the first connection electrode 3b and the second connection electrode 4b has a laminated structure formed with the Ni layer 33b, the Pd layer 34b and the Au layer 35b not only in the region on the element formation surface 2Ab but also in the region on the side surfaces 2Cb to 2Fb. Hence, in each of the first connection electrode 3b and the second connection electrode 4b, the Pd layer 34b is interposed between the Ni layer 33b and the Au layer 35b. In each of the first connection electrode 3b and the second connection electrode 4b, the Ni layer 33b covers a large proportion of the connection electrodes, and the Pd layer 34b and the Au layer 35b are formed to be significantly thin as compared with the Ni layer 33b. When the chip resistor 1b is mounted on the mounting substrate 9b (see FIGS. 41B to 41D), the Ni layer 33b has a role in relaying the Al of the wiring film 22b in the pad region 22Ab of each cutout portion 25b to the solder 13b described previously.

As described above, since in the first connection electrode 3b and the second connection electrode 4b, the surface of the Ni layer 33b is covered by the Au layer 35b, the Ni layer 33b is prevented from being oxidized. In the first connection electrode 3b and the second connection electrode 4b, even if the thickness of the Au layer 35b is reduced, and thus a through-hole (pinhole) is produced in the Au layer 35b, since the through-hole is blocked by the Pd layer 34b interposed between the Ni layer 33b and the Au layer 35b, it is possible to prevent the Ni layer 33b from being exposed from the through-hole to the outside so as to be oxidized.

In each of the first connection electrode 3b and the second connection electrode 4b, the Au layer 35b is exposed to the uppermost surface. The first connection electrode 3b is electrically connected via one cutout portion 25b to the wiring film 22b in the pad region 22Ab of this cutout portion 25b. The second connection electrode 4b is electrically connected via the other cutout portion 25b to the wiring film 22b in the pad region 22Ab of this cutout portion 25b. In each of the first connection electrode 3b and the second connection electrode 4b, the Ni layer 33b is connected to the pad region 22Ab. In this way, each of the first connection electrode 3b and the second connection electrode 4b is electrically connected to the element 5b. Here, the wiring film 22b forms the wiring connected to each of a collection (the resistor portions 56b) of the resistor bodies R, the first connection electrode 3b and the second connection electrode 4b.

As described above, the resin film 24b and the passivation film 23b where the cutout portions 25b are formed cover the element formation surface 2Ab with the first connection electrode 3b and the second connection electrode 4b exposed from the cutout portions 25b. Hence, via the first connection electrode 3b and the second connection electrode 4b projected (protruded) from the cutout portions 25b in the surface of the resin film 24b, electrical connection between the chip resistor 1b and the mounting substrate 9b can be achieved (see FIGS. 41B to 41C).

FIGS. 50A to 50I are schematic cross-sectional views showing a method of manufacturing the chip resistor of FIG. 49.

As shown in FIG. 50A, the substrate 30b that is the base of the substrate 2b is prepared. In this case, the surface 30Ab of the substrate 30b is the element formation surface 2Ab of the substrate 2b, and the back surface 30Bb of the substrate 30b is the back surface 2Bb of the substrate 2b.

Then, the surface 30Ab of the substrate 30b is thermally oxidized, and thus the insulating film 20b made of $SiO_2$ or the like is formed on the surface 30Ab, and the element 5b (the resistor bodies R and the wiring film 22b connected to the resistor bodies R) is formed on the insulating film 20b. Specifically, by sputtering, the resistor body film 21b of TiN, TiON or TiSiON is first formed on the entire surface of the insulating film 20b, and furthermore, the wiring film 22b of aluminum (Al) is laminated on the resistor body film 21b so as to make contact with the resistor body film 21b. Thereafter, a photolithography process is used, and for example, by dry etching such as RIE (Reactive Ion Etching), the resistor body film 21b and the wiring film 22b are selectively removed to perform patterning, with the result that as shown in FIG. 43A, in plan view, the resistor body film lines 21Ab in which the resistor body film 21b is laminated and which has a given width are arrayed a given distance apart in the column direction. Here, a region where the resistor body film line 21Ab and the wiring film 22b are partially cut is also formed, and in the trimming target region X described previously, the fuses F and the conductive film D are formed (see FIG. 42). Then, for example, by wet etching, the wiring film 22b laminated on the resistor body film line 21Ab is selectively removed. Consequently, it is possible to obtain the element 5b in which on the resistor body film line 21Ab, the wiring films 22b are laminated the given distance R apart. Here, the resistance value of the entire element 5b may be measured so that whether or not the resistor body film 21b and the wiring film 22b are formed to have target dimensions is checked.

With reference to FIG. 50A, the element 5b is formed at a large number of points on the surface 30Ab of the substrate 30b according to the number of chip resistors 1b formed on one substrate 30b. When on the substrate 30b, one region where the element 5b (the resistor portion 56b described previously) is formed is referred to as a chip part region Y, on the surface 30Ab of the substrate 30b, a plurality of chip part regions Y (that is, the elements 5b) having the resistor portions 56b are formed (set). One chip part region Y coincides with one completed chip resistor 1b (see FIG. 49) in plan view. On the surface 30Ab of the substrate 30b, a region between the chip part regions Y adjacent to each other is referred to as a boundary region Z. The boundary region Z is formed in the shape of a band, and extends in a lattice in plan view. One chip part region Y is arranged in one lattice unit partitioned by the boundary region Z. The width of the boundary region Z is extremely narrow so as to be 1 μm to 60 μm (for example, 20 μm), and thus a large number of chip part regions Y can be secured on the substrate 30b, with the result that it is possible to produce a large number of chip resistors 1b.

Then, as shown in FIG. 50A, by a CVD (Chemical Vapor Deposition) method, an insulating film 45b made of SiN is formed over the entire region of the surface 30Ab of the substrate 30b. The insulating film 45b covers and makes contact with all the insulating film 20b and the element 5b (such as the resistor body film 21b and the wiring film 22b) on the insulating film 20b. Hence, the insulating film 45b also covers the wiring film 22b in the trimming target region X described previously (see FIG. 42). Moreover, since the insulating film 45b is formed over the entire region of the surface 30Ab of the substrate 30b, on the surface 30Ab, the insulating film 45b is formed to extend to the regions other than the trimming target region X. In this way, the insulating film 45b serves as a protective film that protects the entire region of the surface 30Ab (including the element 5b on the surface 30Ab).

Then, as shown in FIG. 50B, by etching using a mask 65b, the insulating film 45b is selectively removed. In this way, an opening 28b is formed in a part of the insulating film 45b, and each pad region 22Ab is exposed through the opening 28b. For one semifinished product 50b, two openings 28b are formed.

In the semifinished product 50b, the two openings 28b are formed in the insulating film 45b, and thereafter, a probe 70b of a resistance measuring device (not shown) is brought into contact with the pad region 22Ab of each opening 28b, and thus the resistance value of the entire element 5b is detected. Then, laser light (not shown) is applied to an arbitrary fuse F (see FIG. 42) through the insulating film 45b, and thus the wiring film 22b in the trimming target region X described previously is trimmed by the laser light, with the result that the fuse F is blown. As described above, the fuse F is blown (trimmed) such that a necessary resistance value is acquired, and thus as described previously, it is possible to adjust the resistance value of the entire semifinished product 50b (in other words, the chip resistor 1b). Here, since the insulating film 45b serves as a cover film for covering the element 5b, it is possible to prevent a short circuit from occurring as a result of the adherence of a fragment or the like produced in blowing to the element 5b. Since the insulating film 45b covers the fuse F (the resistor body film 21b), the energy of the laser light is stored in the fuse F, and thus it is possible to reliably blow the fuse F. Thereafter, as necessary, by a CVD method, SiN is formed on the insulating film 45b to increase the thickness of the insulating film 45b. The final insulating film 45b (the state shown in FIG. 50C) has a thickness of 1000 to 5000 angstroms (here, about 3000 angstroms). Here, a part of the insulating film 45b enters each opening 28b to block the opening 28b.

Figure 50C:
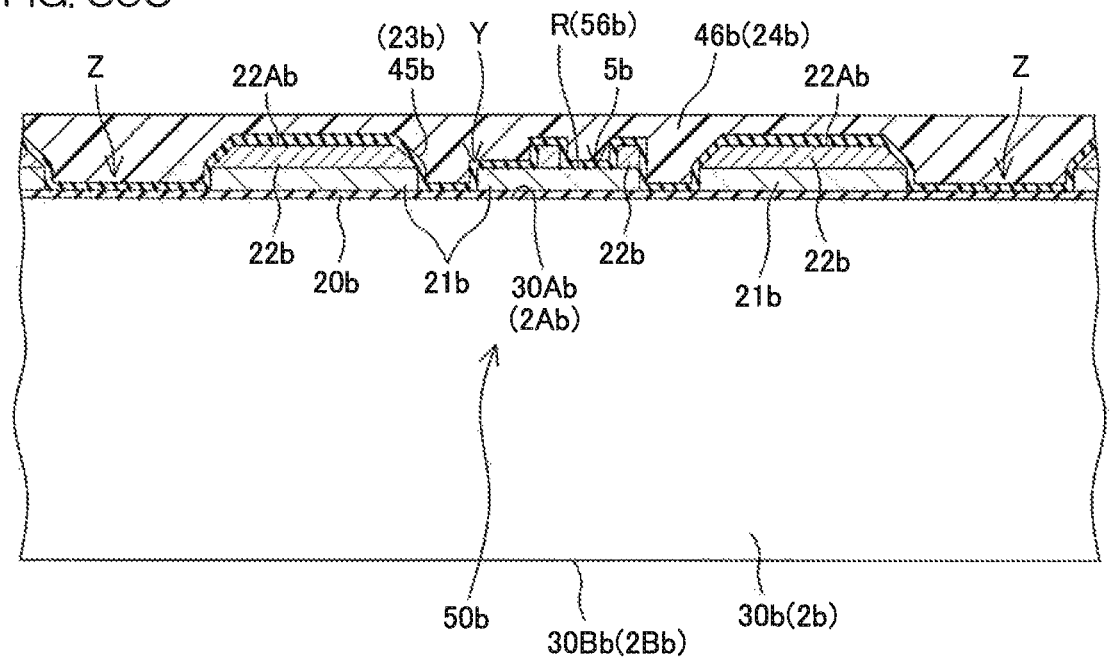
FIG. 50C is a cross-sectional view showing the subsequent step of FIG. 50B.

Then, as shown in FIG. 50C, a liquid of a light-sensitive resin formed of polyimide is sprayed on the substrate 30b from above the insulating film 45b to form the resin film 46b of the light-sensitive resin. The surface of the resin film 46b on the surface 30Ab is flat along the surface 30Ab. Then, thermal processing (cure processing) is performed on the resin film 46b. In this way, the thickness of the resin film 46b is thermally contracted, and the resin film 46b is cured, with the result that the film quality is stabilized.

Figure 50D:
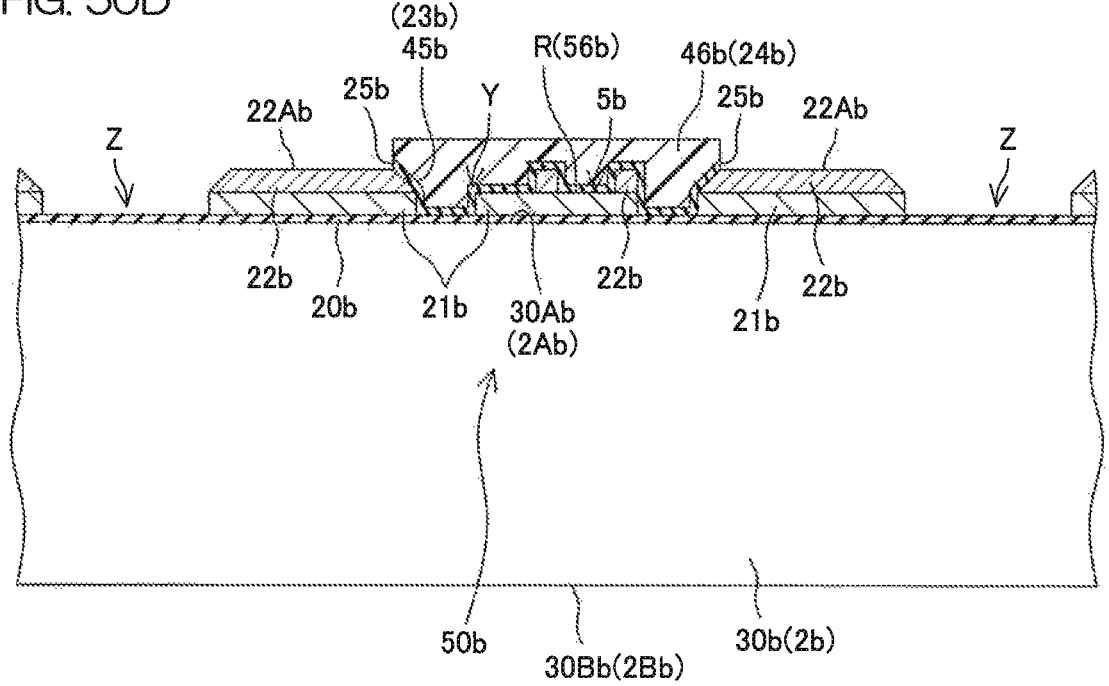
FIG. 50D is a cross-sectional view showing the subsequent step of FIG. 50C.

Then, as shown in FIG. 50D, the resin film 46b, the insulating film 45b and the insulating film 20b are patterned, and thus parts that coincide with the cutout portions 25b of these films are selectively removed. In this way, the cutout portions 25b are formed, and in the boundary region Z, the surface 30Ab (the insulating film 20b) is exposed.

Figure 50E:
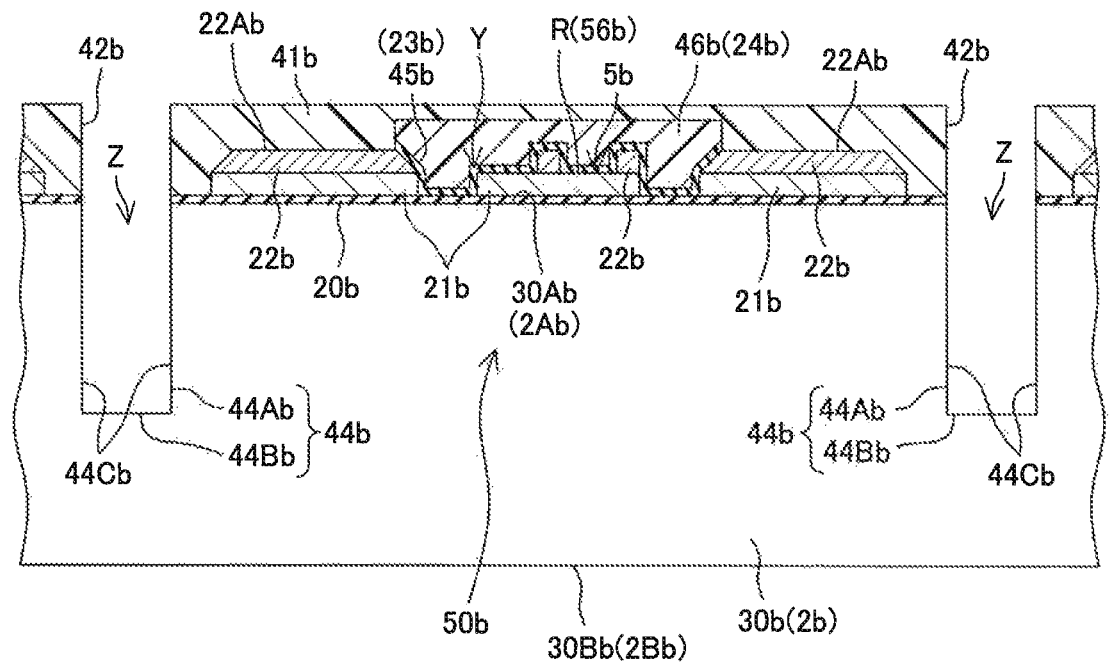
FIG. 50E is a cross-sectional view showing the subsequent step of FIG. 50D.

Then, as shown in FIG. 50E, a resist pattern 41b is formed over the entire region of the surface 30Ab of the substrate 30b. In the resist pattern 41b, an opening 42b is formed.

Figure 51:
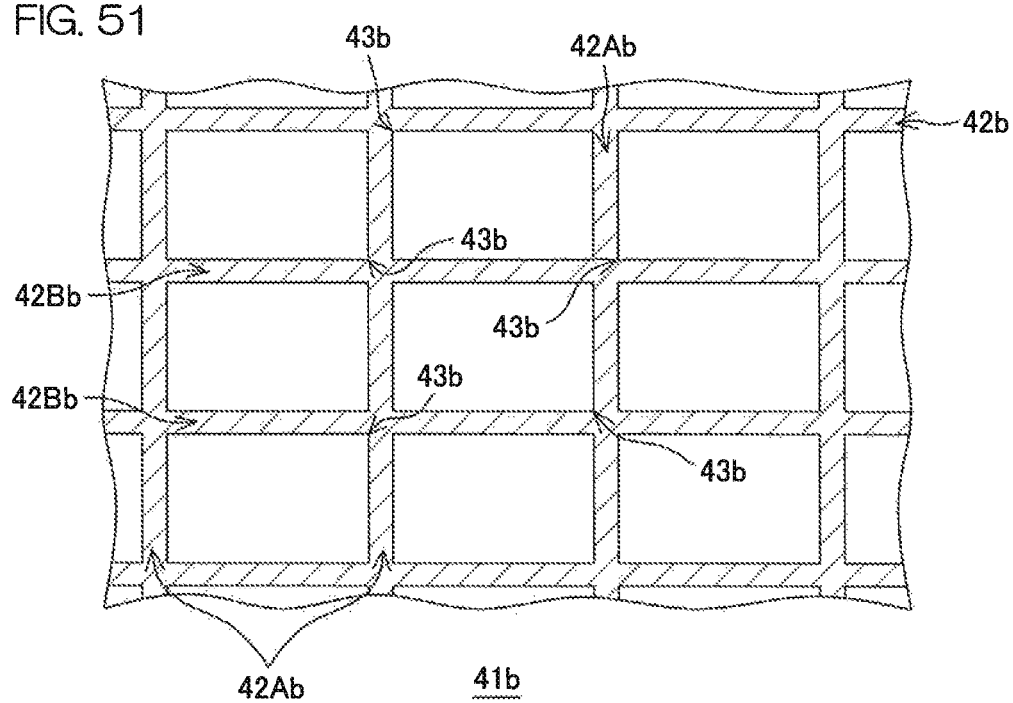
FIG. 51 is a schematic plan view of a part of a resist pattern used for formation of a groove in the step of FIG. 50E.

FIG. 51 is a schematic plan view of a part of the resist pattern used for formation of a groove in the step of FIG. 50E.

With reference to FIG. 51, when a large number of chip resistors 1b (that is, the chip part region Y described above) are arranged in a matrix (also in a lattice), in plan view, the opening 42b of the resist pattern 41b coincides with (corresponds to) a region (a hatched part of FIG. 51, that is, the boundary region Z) between the outlines of the adjacent chip resistors 1b. Hence, the overall shape of the opening 42b is the shape of a lattice that has a plurality of straight parts 42Ab and straight parts 42Bb perpendicular to each other.

In the resist pattern 41b, the straight parts 42Ab and 42Bb perpendicular to each other in the opening 42b are connected while they are kept perpendicular to each other (without being curved). Hence, the intersection part 43b of the straight parts 42Ab and 42Bb is pointed so as to have an angle of an approximate 90° in plan view.

With reference to FIG. 50E, by plasma etching using the resist pattern 41b as a mask, the substrate 30b is selectively removed. In this way, the material of the substrate 30b is removed in a position a distance apart from the wiring film 22b in the boundary region Z between the elements 5b (the chip part regions Y) adjacent to each other. Consequently, in plan view, in a position (the boundary region Z) coinciding with the opening 42b of the resist pattern 41b, the groove 44b is formed which extends from the surface 30Ab of the substrate 30b halfway through the thickness of the substrate 30b and which has a predetermined depth. The groove 44b is partitioned by a pair of side walls 44Ab opposite each other and a bottom wall 44Bb that connects the lower ends (the ends on the side of the back surface 30Bb of the substrate 30b) of the pair of side walls 44Ab. The depth of the groove 44b with respect to the surface 30Ab of the substrate 30b is about 100 μm, and the width (the distance between the side walls 44Ab opposite each other) of the groove 44b is about 20 μm and is constant over the entire region in the direction of the depth.

The overall shape of the groove 44b in the substrate 30b is formed in a lattice which coincides with the opening 42b (see FIG. 51) of the resist pattern 41b in plan view. On the surface 30Ab of the substrate 30b, the chip part region Y where each element 5b is formed is surrounded by a rectangular frame part (the boundary region Z) of the groove 44b. The part of the substrate 30b where the element 5b is formed is the semifinished product 50b of the chip resistor 1b. On the surface 30Ab of the substrate 30b, one semifinished product 50b is located in each of the chip part regions Y surrounded by the grooves 44b, and these semifinished products 50b are arranged in a matrix. By forming the grooves 44b in this way, the substrate 30b is separated into a plurality of substrates 2b by the chip part regions Y. After the formation of the grooves 44b, the resist pattern 41b is removed.

Figure 50F:
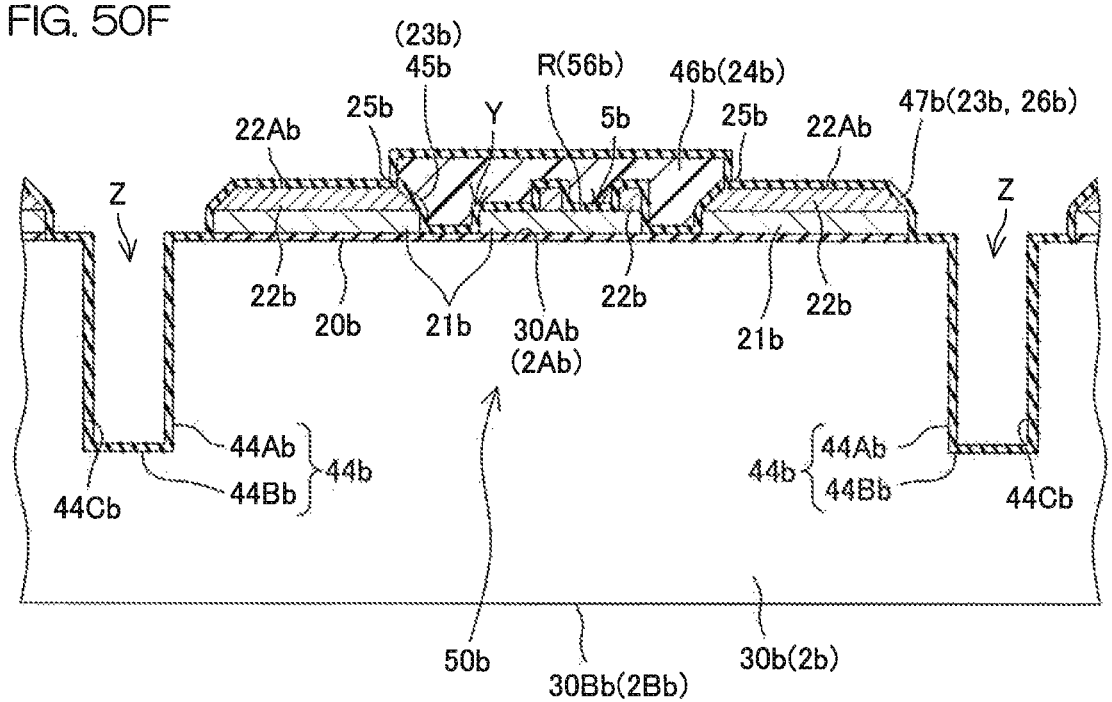
FIG. 50F is a cross-sectional view showing the subsequent step of FIG. 50E.

Then, as shown in FIG. 50F, by a CVD method, an insulating film 47b made of SiN is formed over the entire region of the surface 30Ab of the substrate 30b. Here, the insulating film 47b is also formed over the entire region of the inner peripheral surface (the partition surface 44Cb of the side wall 44Ab and the upper surface of the bottom wall 44Bb described above) of the groove 44b.

Figure 50G:
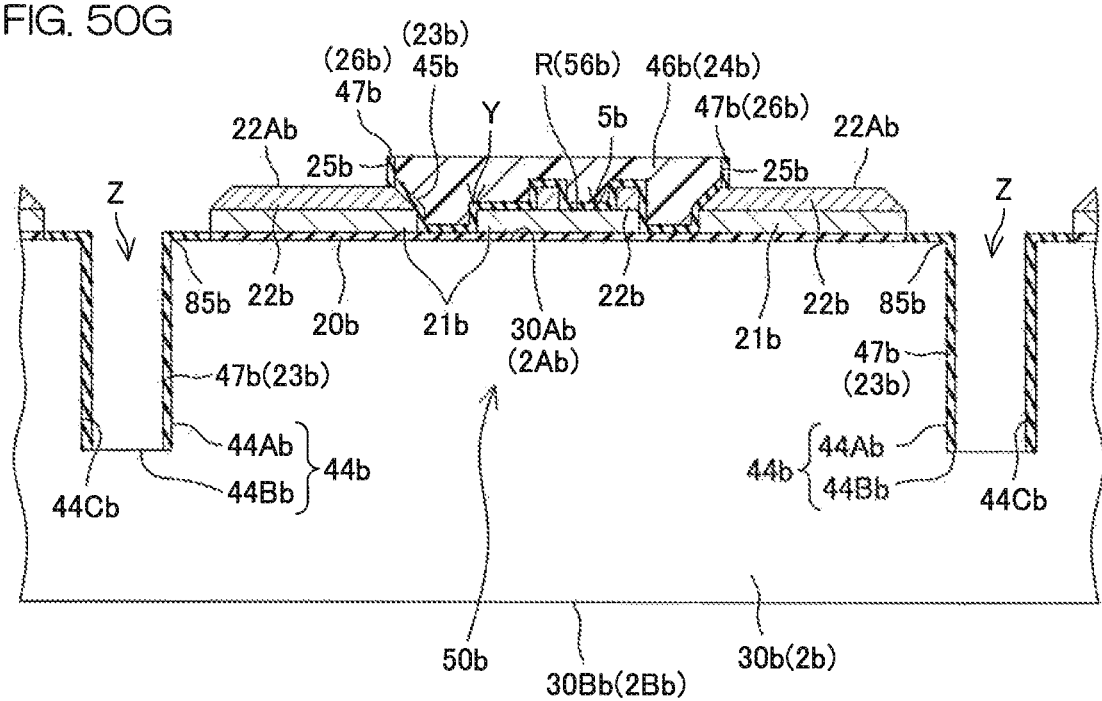
FIG. 50G is a cross-sectional view showing the subsequent step of FIG. 50F.

Then, as shown in FIG. 50G, the insulating film 47b is selectively etched. Specifically, the part of the insulating film 47b parallel to the surface 30Ab is selectively etched. In this way, the pad region 22Ab of the wiring film 22b is exposed, and in the groove 44b, the insulating film 47b on the bottom wall 44Bb is removed.

Figure 50H:
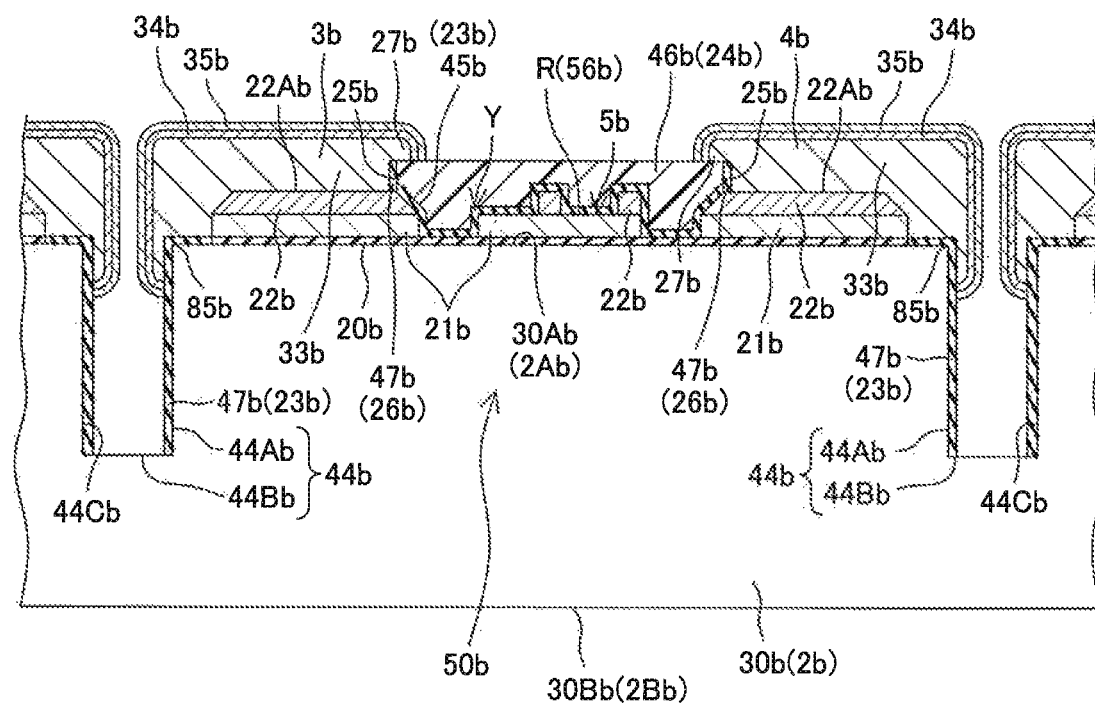
FIG. 50H is a cross-sectional view showing the subsequent step of FIG. 50G.
Figure 50:
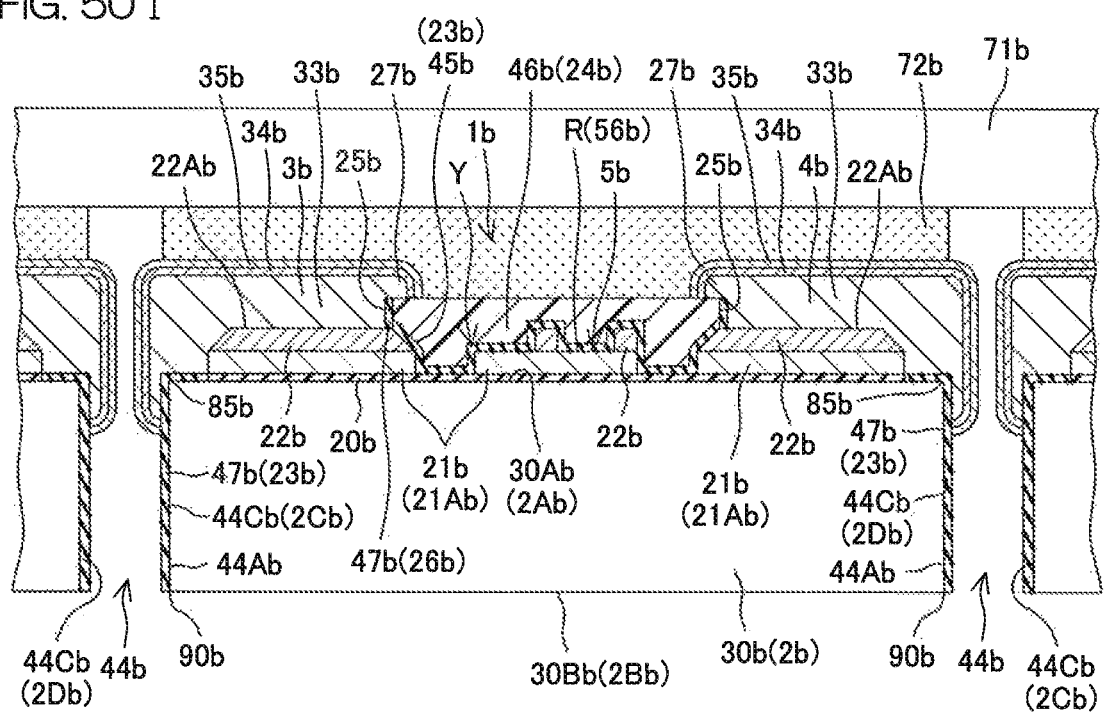
FIG. 50A is a cross-sectional view showing a method of manufacturing the chip resistor of FIG. 49.
FIG. 50B is a cross-sectional view showing the subsequent step of FIG. 50A.
FIG. 50I is a cross-sectional view showing the subsequent step of FIG. 50H.

Then, by non-electrolytic plating, Ni, Pd and Au are sequentially grown by plating from the wiring film 22b exposed from each cutout portion 25b. The plating is continued until each plating film is grown in the horizontal direction along the surface 30Ab to cover the insulating film 47b on the side wall 44Ab of the groove 44b. In this way, as shown in FIG. 50H, the first connection electrode 3b and the second connection electrode 4b formed with Ni/Pd/Au laminated films are formed.

Figure 52:
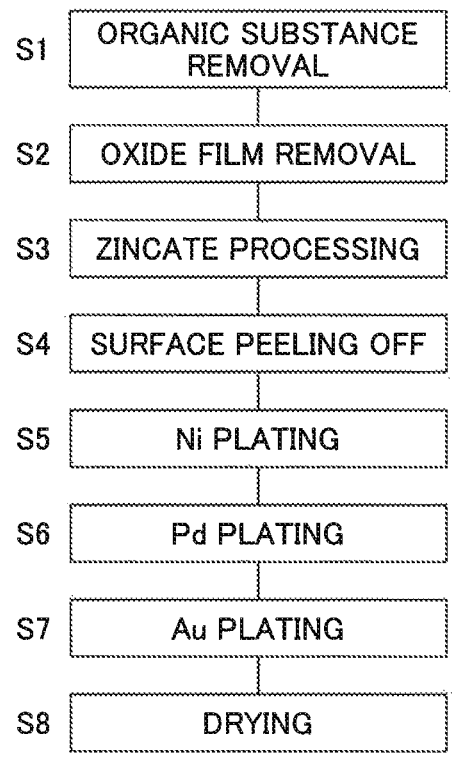
FIG. 52 is a drawing for illustrating a step of manufacturing the first connection electrode and the second connection electrode.

FIG. 52 is a drawing for illustrating a step of manufacturing the first connection electrode and the second connection electrode.

Specifically, with reference to FIG. 52, the surface of the pad region 22Ab is first purified, and thus organic substances (including smut such as a stain of carbon and greasy dirt) on the surface are removed (degreased) (step S1). Then, the oxide film on the surface is removed (step S2). Then, zincate processing is performed on the surface, and thus Al on the surface (of the wiring film 22b) is replaced by Zn (step S3). Then, Zn on the surface is peeled off with nitric acid or the like, and in the pad region 22Ab, new Al is exposed (step S4).

Then, the pad region 22Ab is immersed in a plating liquid, and thus Ni plating is applied to the surface of the new Al in the pad region 22Ab. In this way, Ni in the plating liquid is chemically reduced and precipitated, and thus the Ni layer 33b is formed on the surface (step S5).

Then, the Ni layer 33b is immersed in another plating liquid, and thus Pd plating is applied to the surface of the Ni layer 33b. In this way, Pd in the plating liquid is chemically reduced and precipitated, and thus a Pd layer 34b is formed on the surface of the Ni layer 33b (step S6).

Then, the Pd layer 34b is immersed in another plating liquid, and thus Au plating is applied to the surface of the Pd layer 34b. In this way, Au in the plating liquid is chemically reduced and precipitated, and thus the Au layer 35b is formed on the surface of the Pd layer 34b (step S7). In this way, the first connection electrode 3b and the second connection electrode 4b are formed, and when the formed first connection electrode 3b and the formed second connection electrode 4b are dried (step S8), the step of manufacturing the first connection electrode 3b and the second connection electrode 4b is completed. Between the preceding and subsequent steps, a step of washing the semifinished product 50b with water is performed as necessary. The zincate processing may be performed a plurality of times.

FIG. 50H shows a state where in each semifinished product 50b, the first connection electrode 3b and the second connection electrode 4b have already been formed.

As described above, since the first connection electrode 3b and the second connection electrode 4b are formed by non-electrolytic plating, Ni, Pd and Al serving as electrode materials can be satisfactorily grown on the insulating film 47b by plating. As compared with a case where the first connection electrode 3b and the second connection electrode 4b are formed by electrolytic plating, the number of steps (for example, a lithography step and a step of peeling off a resist mask necessary in electrolytic plating) in the step of forming the first connection electrode 3b and the second connection electrode 4b is reduced, with the result that it is possible to enhance the productivity of the chip resistor 1b. Furthermore, since in non-electrolytic plating, the resist mask necessary in electrolytic plating is not needed, the position of the formation of the first connection electrode 3b and the second connection electrode 4b is prevented from being displaced by the displacement of the position of the resist mask, and thus the accuracy of the position of the formation of the first connection electrode 3b and the second connection electrode 4b is enhanced, with the result that it is possible to enhance the yield.

In this method, the wiring film 22b is exposed from the cutout portion 25b, and there is no obstruction to the plating growth in a region from the wiring film 22b to the groove 44b. Hence, it is possible to perform plating growth straight from the wiring film 22b to the groove 44b. Consequently, it is possible to reduce the time necessary to form the electrode.

The first connection electrode 3b and the second connection electrode 4b are formed as described above, then an energization test is performed between the first connection electrode 3b and the second connection electrode 4b and thereafter the substrate 30b is ground from the back surface 30Bb.

Specifically, after the formation of the groove 44b, as shown in FIG. 50I, a support tape 71b that is formed of PET (polyethylene terephthalate), that is formed in the shape of a thin plate and that has an adhesive surface 72b is adhered, in the adhesive surface 72b, to the side (that is, the surface 30Ab) of the first connection electrode 3b and the second connection electrode 4b in each semifinished product 50b. In this way, each semifinished product 50b is supported by the support tape 71b. Here, as the support tape 71b, for example, a laminate tape can be used.

With each semifinished product 50b supported by the support tape 71b, the substrate 30b is grounded from the side of the back surface 30Bb. When by the grinding, the substrate 30b is decreased in thickness so as to reach the upper surface of the bottom wall 44Bb (see FIG. 50H) of the groove 44b, since there is nothing that couples the adjacent semifinished products 50b, the substrate 30b is separated with the groove 44b being a boundary and the semifinished products 50b are individually separated, with the result that the finished product of the chip resistor 1b is formed. In other words, the substrate 30b is cut (separated) in the groove 44b (that is, the boundary region Z), and thus the chip resistors 1b are individually cut out. By etching the substrate 30b from the side of the back surface 30Bb to the bottom wall 44Bb of the groove 44b, the chip resistor 1b may be cut out.

In each completed chip resistor 1b, the part serving as the partition surface 44Cb of the side wall 44Ab of the groove 44b is any one of the side surfaces 2Cb to 2Fb of the substrate 2b, and the back surface 30Bb is the back surface 2Bb. In other words, as described previously, the step (see FIG. 50E) of forming the groove 44b by etching is included in the step of forming the side surfaces 2Cb to 2Fb. Moreover, the insulating film 45b and a part of the insulating film 47b are the passivation film 23b, the resin film 46b is the resin film 24b and a part of the insulating film 47b is the insulating film 26b.

As described above, after the formation of the groove 44b, the substrate 30b is ground from the side of the back surface 30Bb, and thus a plurality of chip part regions Y formed in the substrate 30b can be simultaneously divided into individual chip resistors 1b (chip parts) (the individual pieces of a plurality of chip resistors 1b can be obtained at one time). Hence, the time in which the chip resistors 1b are manufactured is reduced, and thus it is possible to enhance the productivity of the chip resistor 1b.

By grinding or etching the back surface 2Bb of the substrate 2b in the completed chip resistor 1b into a mirror surface, the back surface 2Bb may be cleaned.

FIGS. 53A to 53D are schematic cross-sectional views showing a collection step of the chip resistor after the step of FIG. 50I.

Figure 53A:
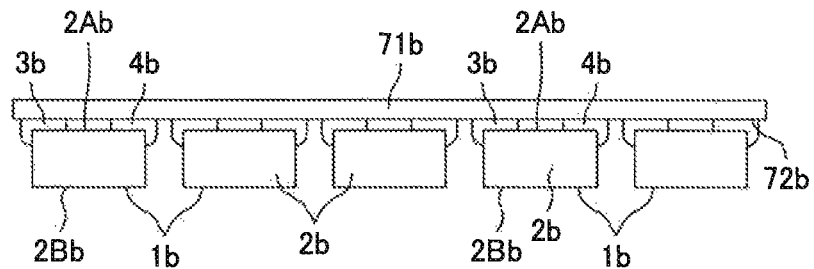
FIG. 53A is a schematic cross-sectional view showing the collection step of the chip resistor after the step of FIG. 50I.
Figure 53B:
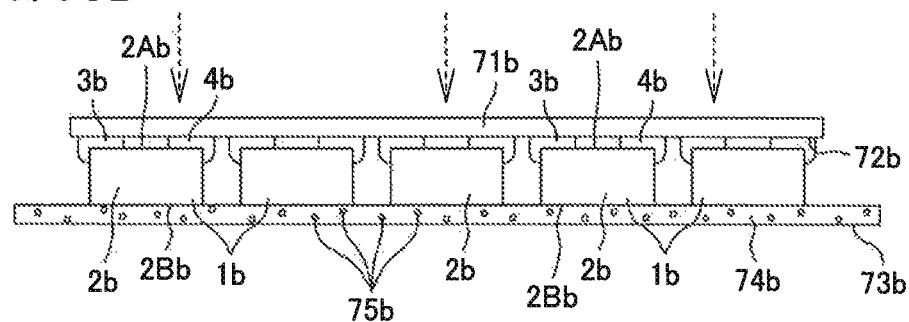
FIG. 53B is a cross-sectional view showing the subsequent step of FIG. 53A.

FIG. 53A shows a state where a plurality of chip resistors 1b separated into pieces still stick to the support tape 71b. In this state, as shown in FIG. 53B, a thermally foamed sheet 73b is adhered to the back surface 2Bb of the substrate 2b of each chip resistor 1b. The thermally foamed sheet 73b includes a sheet main body 74b in the shape of a sheet and a large number of foamed particles 75b kneaded into the sheet main body 74b.

Figure 53C:
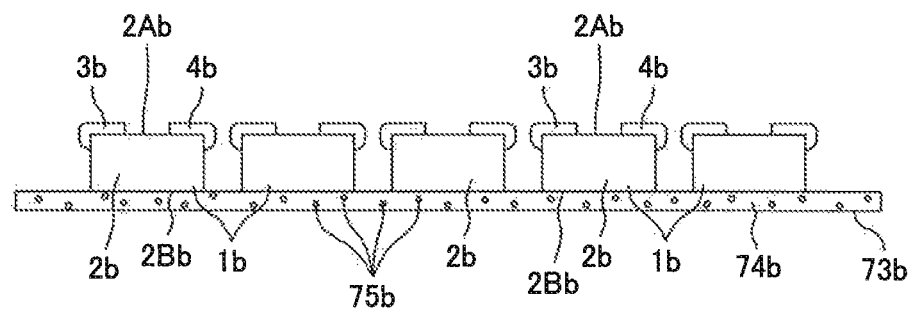
FIG. 53C is a cross-sectional view showing the subsequent step of FIG. 53B.

The adhesive force of the sheet main body 74b is greater than that of the adhesive surface 72b of the support tape 71b. Hence, after the thermally foamed sheet 73b is adhered to the back surface 2Bb of the substrate 2b of each chip resistor 1b, as shown in FIG. 53C, the support tape 71b is torn off from each chip resistor 1b, and the chip resistor 1b is transferred to the thermally foamed sheet 73b. Here, since the adherence property of the adhesive surface 72b is lowered by the application of ultraviolet rays to the support tape 71b (see dotted arrows in FIG. 53B), the support tape 71b is easily torn off from each chip resistor 1b.

Figure 53D:
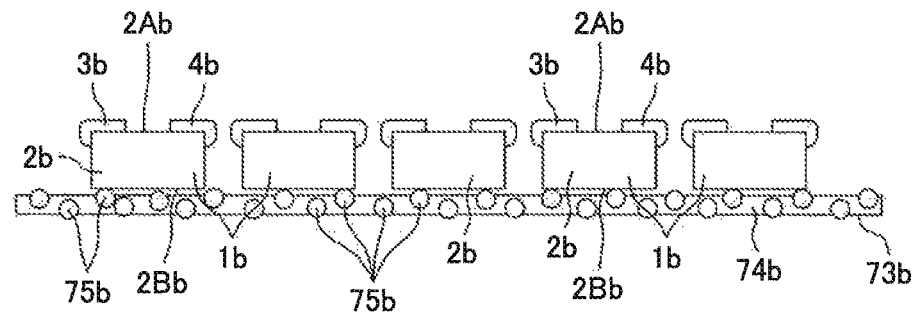
FIG. 53D is a cross-sectional view showing the subsequent step of FIG. 53C.

Then, the thermally foamed sheet 73b is heated. In this way, as shown in FIG. 53D, in the thermally foamed sheet 73b, the foamed particles 75b within the sheet main body 74b are foamed and are expanded out of the surface of the sheet main body 74b. Consequently, the contact area between the thermally foamed sheet 73b and the back surface 2Bb of the substrate 2b of each chip resistor 1b is decreased, and thus all the chip resistors 1b are naturally torn off from the thermally foamed sheet 73b (come off). The chip resistors 1b collected in this way are mounted on the mounting substrate 9b (see FIG. 41B) or are stored in a storage space formed on an emboss carrier tape (not shown). In this case, as compared with a case where the chip resistors 1b are torn off from the support tape 71b or the thermally foamed sheet 73b one by one, it is possible to reduce the processing time. As a matter of course, with a plurality of chip resistors 1b sticking to the support tape 71b (see FIG. 53A), without use of the thermally foamed sheet 73b, the chip resistors 1b may be directly torn off from the support tape 71b by a predetermined number of pieces.

Figure 54A:
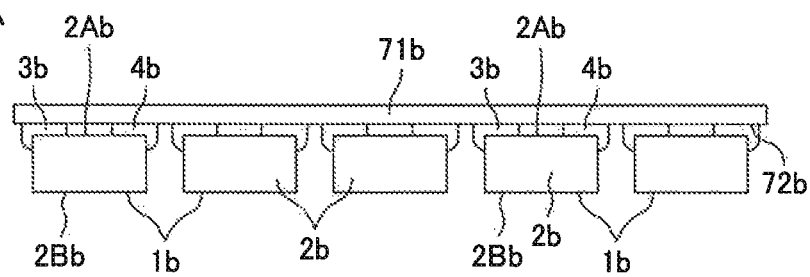
FIG. 54A is a schematic cross-sectional view showing the collection step (variation) of the chip resistor after the step of FIG. 50I.
Figure 54B:
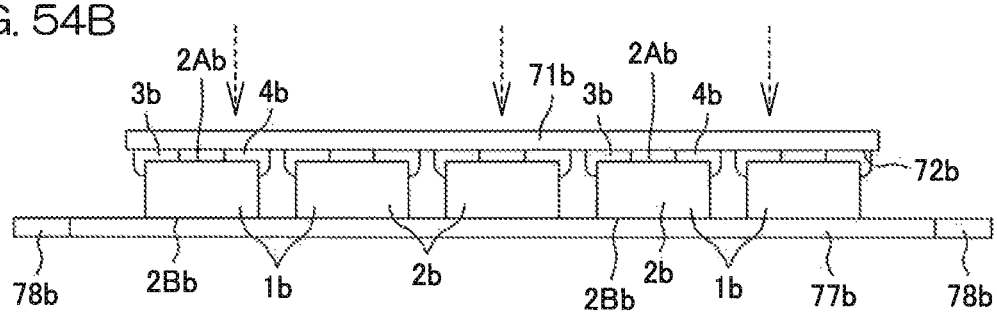
FIG. 54B is a cross-sectional view showing the subsequent step of FIG. 54A.
Figure 54C:
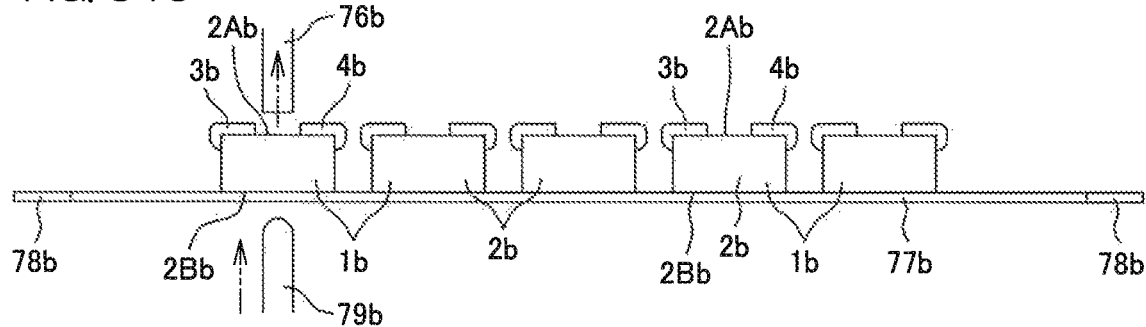
FIG. 54C is a cross-sectional view showing the subsequent step of FIG. 54B.

FIGS. 54A to 54C are schematic cross-sectional views showing the collection step (variation) of the chip resistor after the step of FIG. 50I.

Each chip resistor 1b can be collected by another method shown in FIGS. 54A to 54C.

As with FIG. 53A, FIG. 54A shows a state where a plurality of chip resistors 1b separated into pieces still stick to the support tape 71b. In this state, as shown in FIG. 54B, a transfer tape 77b is adhered to the back surface 2Bb of the substrate 2b of each chip resistor 1b. The transfer tape 77b has an adhesive force greater than that of the adhesive surface 72b of the support tape 71b. Hence, as shown in FIG. 54C, after the transfer tape 77b is adhered to each chip resistor 1b, the support tape 71b is torn off from each chip resistor 1b. Here, as described previously, ultraviolet rays (see dotted arrows in FIG. 54B) may be applied to the support tape 71b so that the adherence property of the adhesive surface 72b is lowered.

The frames 78b of a collection device (not shown) are adhered to both ends of the transfer tape 77b. The frames 78b on both sides can be moved either in a direction in which they approach each other or in a direction in which they are separated. After the support tape 71b is torn off from each chip resistor 1b, the frames 78b on both sides are moved in the direction in which they are separated, and thus the transfer tape 77b is extended so as to become thin. In this way, the adhesive force of the transfer tape 77b is lowered, and thus each chip resistor 1b is easily torn off from the transfer tape 77b. When in this state, the suction nozzle 76b of a transport device (not shown) is directed to the side of the element formation surface 2Ab of the chip resistor 1b, the chip resistor 1b is torn off from the transfer tape 77b by the suction force produced by the transport device (not shown)

and is sucked by the suction nozzle 76b. Here, the chip resistor 1b is pushed up by a protrusion 79b shown in FIG. 54C from the side opposite to the suction nozzle 76b through the transfer tape 77b to the side of the suction nozzle 76b, and thus the chip resistor 1b can be smoothly torn off from the transfer tape 77b. The chip resistor 1b collected in this way is transported by the transport device (not shown) while being sucked by the suction nozzle 76b.

Although the preferred embodiments of the second reference example are described above, the second reference example can be carried out with still other preferred embodiments. For example, although in the preferred embodiments described above, as an example of the chip part of the second reference example, the chip resistor 1b is disclosed, the second reference example can be applied to chip parts such as a chip capacitor and a chip inductor. A chip capacitor will be described below.

Figure 57:
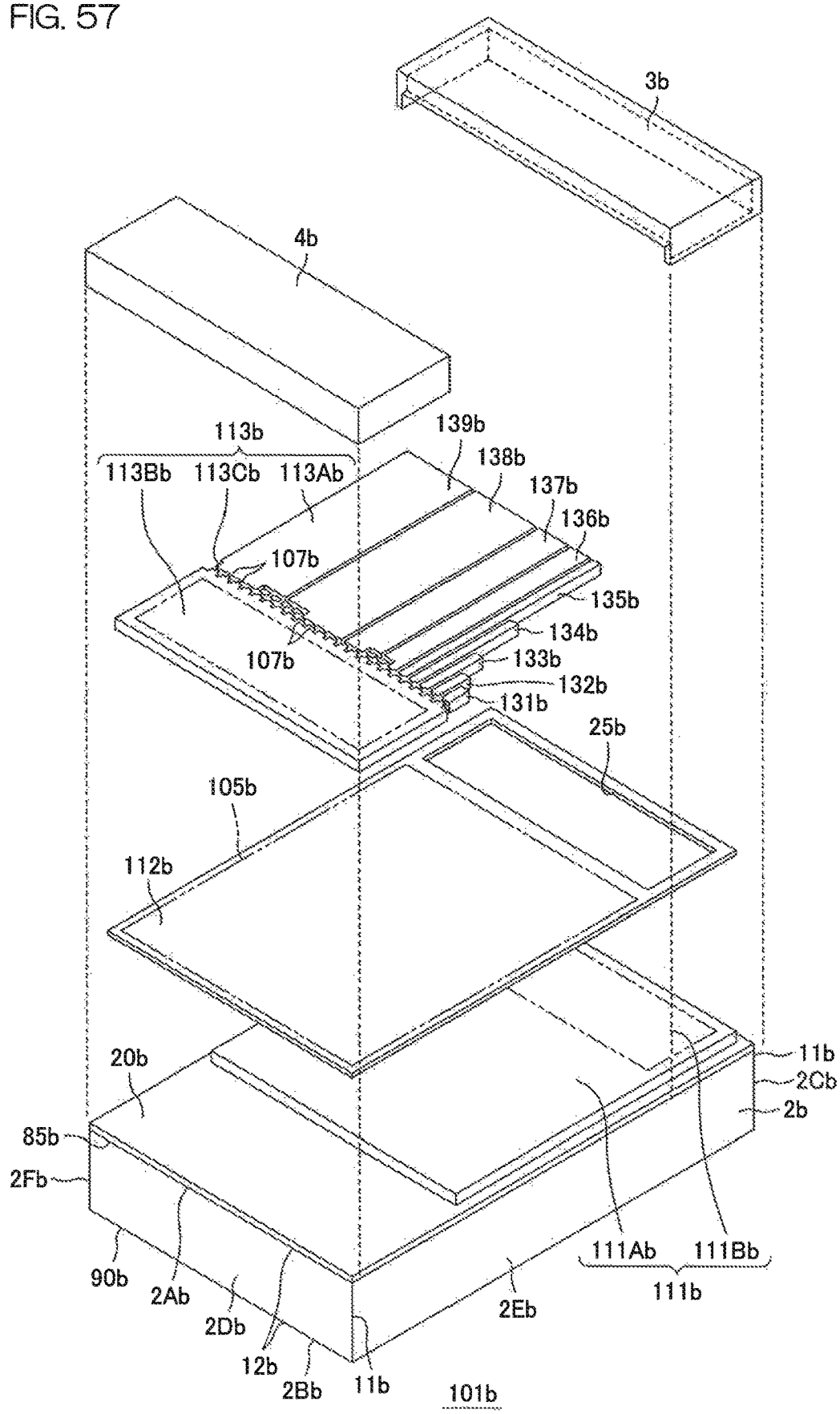
FIG. 57 is an exploded perspective view separately showing the arrangement of a part of the chip capacitor.

FIG. 55 is a plan view showing a chip capacitor according to another preferred embodiment of the second reference example. FIG. 56 is a schematic cross-sectional view taken along line A-A of FIG. 55. FIG. 57 is an exploded perspective view separately showing the arrangement of a part of the chip capacitor.

In the chip capacitor 101b, which will be described below, parts corresponding to the parts of the chip resistor 1b described previously are identified with the same reference symbols, and the detailed description of the parts will be omitted. In the chip capacitor 101b, unless otherwise particularly mentioned, the parts identified with the same reference symbols as the parts of the chip resistor 1b described previously have the same arrangement as the parts of the chip resistor 1b described previously, and can achieve the same actions and effects as the parts of the chip resistor 1b described previously (in particular, on parts related to the first connection electrode 3b and the second connection electrode 4b).

With reference to FIG. 53, the chip capacitor 101b includes, as with the chip resistor 1b, the substrate 2b, the first connection electrode 3b arranged on the substrate 2b (on the side of the element formation surface 2Ab of the substrate 2b) and the second connection electrode 4b arranged on the same substrate 2b. In the preferred embodiment, the substrate 2b is formed, in plan view, in the shape of a rectangle. In both end portions of the substrate 2b in the longitudinal direction, the first connection electrode 3b and the second connection electrode 4b are arranged. In the preferred embodiment, the first connection electrode 3b and the second connection electrode 4b have a substantially rectangular planar shape extending in the lateral direction of the substrate 2b. In the chip capacitor 101b, as in the chip resistor 1b, the first connection electrode 3b and the second connection electrode 4b are integrally formed on the element formation surface 2Ab and the side surfaces 2Cb to 2Fb so as to cover the peripheral edge portion 85b. Hence, since in a circuit assembly 100b (see FIGS. 41B and 41C) in which the chip capacitor 101b is mounted on the mounting substrate 9b, as in the case of the chip resistor 1b, the adsorbed amount of solder 13b to the first connection electrode 3b and the second connection electrode 4b can be increased, it is possible to enhance the adhesion strength. The first connection electrode 3b is retained from the three side surfaces 2Cb, 2Eb and 2Fb with the solder 13b, and the second connection electrode 4b is retained from the three side surfaces 2Db, 2Eb and 2Fb with the solder 13b, and thus all the side surfaces 2Cb to 2Fb of the rectangular chip capacitor 101b can be fixed by the solder 13b. In this way, it is possible to stabilize the mounting shape of the chip capacitor 101b.

In the element formation surface 2Ab of the substrate 2b, within a capacitor arrangement region 105b between the first connection electrode 3b and the second connection electrode 4b, a plurality of capacitor factors C1 to C9 are formed. The plurality of capacitor factors C1 to C9 are a plurality of element factors that form the element 5b (here, a capacitor element) described previously, and are connected between the first connection electrode 3b and the second connection electrode 4b. Specifically, the plurality of capacitor factors C1 to C9 are electrically connected via a plurality of fuse units 107b (corresponding to the fuses F described previously) to the second connection electrode 4b such that they can be separated from the second connection electrode 4b.

As shown in FIGS. 56 and 57, on the element formation surface 2Ab of the substrate 2b, the insulating film 20b is formed, and on the surface of the insulating film 20b, a lower electrode film 111b is formed. The lower electrode film 111b is extended substantially over the entire region of the capacitor arrangement region 105b. Furthermore, the lower electrode film 111b is formed so as to be extended to a region immediately below the first connection electrode 3b. More specifically, the lower electrode film 111b includes a capacitor electrode region 111Ab that functions as a lower electrode common to the capacitor factors C1 to C9 in the capacitor arrangement region 105b and a pad region 111Bb for drawing an external electrode arranged immediately below the first connection electrode 3b. The capacitor electrode region 111Ab is located in the capacitor arrangement region 105b, and the pad region 111Bb is located immediately below the first connection electrode 3b and is in contact with the first connection electrode 3b.

A capacitor film (dielectric film) 112b is formed so as to cover and make contact with the lower electrode film 111b (the capacitor electrode region 111Ab) in the capacitor arrangement region 105b. The capacitor film 112b is formed over the entire region of the capacitor electrode region 111Ab (the capacitor arrangement region 105b). In the preferred embodiment, the capacitor film 112b further covers the insulating film 20b outside the capacitor arrangement region 105b.

On the capacitor film 112b, an upper electrode film 113b is formed. In FIG. 55, for clarity, the upper electrode film 113b is shown by being colored. The upper electrode film 113b includes a capacitor electrode region 113Ab located in the capacitor arrangement region 105b, a pad region 113Bb that is located immediately below the second connection electrode 4b and that is in contact with the second connection electrode 4b and a fuse region 113Cb that is arranged between the capacitor electrode region 113Ab and the pad region 113Bb.

In the capacitor electrode region 113Ab, the upper electrode film 113b is divided (separated) into a plurality of electrode film parts (upper electrode film parts) 131b to 139b. In the preferred embodiment, each of the electrode film parts 131b to 139b is formed in the shape of a rectangle, and extends in the shape of a band from the fuse region 113Cb toward the first connection electrode 3b. The plurality of electrode film parts 131b to 139b have a plurality of types of opposite areas, and are opposite the lower electrode film 111b through the capacitor film 112b (while being in contact with the capacitor film 112b). More specifically, the opposite areas of the electrode film parts 131b to 139b with respect to the lower electrode film 111b may be determined so as to be 1:2:4:8:16:32:64:128:128. In other words, the plurality of electrode film parts 131*b* to 139*b* include a plurality of electrode film parts having different opposite areas, and more specifically, include a plurality of electrode film parts 131*b* to 138*b* (or 131*b* to 137*b* and 139*b*) having opposite areas that are set so as to be geometric with a geometric ratio of 2. In this way, the plurality of capacitor factors C1 to C9 formed by electrode film parts 131*b* to 139*b* and the lower electrode film 111*b* opposite them through the capacitor film 112*b* include a plurality of capacitor factors having different capacitance values. When the ratio of the opposite areas in the electrode film parts 131*b* to 139*b* is as described above, the ratio of the capacitance values of the capacitor factors C1 to C9 is equal to the ratio of the opposite areas so as to be 1:2:4:8:16:32:64:128:128. In other words, the plurality of capacitor factors C1 to C9 include a plurality of capacitor factors C1 to C8 (or C1 to C7 and C9) in which the capacitance values are set so as to be geometric with a geometric ratio of 2.

In the preferred embodiment, the electrode film parts 131*b* to 135*b* are formed such that they are equal in width and that the ratio of the lengths thereof is set at 1:2:4:8:16. The electrode film parts 135*b*, 136*b*, 137*b*, 138*b* and 139*b* are formed such that they are equal in length and that the ratio of the widths thereof is set at 1:2:4:8:8. The electrode film parts 135*b* to 139*b* are formed to extend over the range from the end edge on the side of the second connection electrode 4*b* to the end edge on the side of the first connection electrode 3*b* in the capacitor arrangement region 105*b*, and the electrode film parts 131*b* to 134*b* are formed to be shorter than them.

The pad region 113Bb is formed in a shape substantially similar to the second connection electrode 4*b* and has a planar shape of an approximate rectangle. As shown in FIG. 56, the upper electrode film 113*b* in the pad region 113Bb is in contact with the second connection electrode 4*b*.

On the substrate 2*b*, the fuse region 113Cb is arranged along one long side (the long side on the inner side with respect to the periphery of the substrate 2*b*) of the pad region 113Bb. The fuse region 113Cb includes a plurality of fuse units 107*b* arrayed along the one long side of the pad region 113Bb described above.

The fuse units 107*b* are integrally formed of the same material as the pad region 113Bb of the upper electrode film 113*b*. The plurality of electrode film parts 131*b* to 139*b* are integrally formed with one or a plurality of fuse units 107*b*, are connected via the fuse units 107*b* to the pad region 113Bb and are electrically connected via the pad region 113Bb to the second connection electrode 4*b*. As shown in FIG. 55, the electrode film parts 131*b* to 136*b* having relatively small areas are connected with one fuse unit 107*b* to the pad region 113Bb, and the electrode film parts 137*b* to 139*b* having relatively large areas are connected via a plurality of fuse units 107*b* to the pad region 113Bb. It is not necessary to use all the fuse units 107*b*, and in the preferred embodiment, one fuse unit 107*b* is not used.

The fuse unit 107*b* includes a first wide width portion 107Ab for connection to the pad region 113Bb, a second wide width portion 107Bb for connection to the electrode film parts 131*b* to 139*b* and a narrow width portion 107Cb for connection between the first and second wide width portions 107Ab and 107Bb. The narrow width portion 107Cb is formed such that it can be cut (blown) by laser light. In this way, it is possible to electrically separate, from the first and second connection electrodes 3*b* and 4*b*, unnecessary electrode film parts of the electrode film parts 131*b* to 139*b* by cutting the fuse units 107*b*.

Although not shown in FIGS. 55 and 57, as shown in FIG. 56, the surface of the chip capacitor 101*b* including the surface of the upper electrode film 113*b* is covered by the passivation film 23*b* described previously. The passivation film 23*b* is formed with, for example, a nitride film, extends not only to the upper surface of the chip capacitor 101*b* but also to the side surfaces 2Cb to 2Fb of the substrate 2*b* and is formed so as to cover the entire region of the side surfaces 2Cb to 2Fb. On the side surfaces 2Cb to 2Fb, the passivation film 23*b* is interposed between the substrate 2*b* and the first connection electrode 3*b* and the second connection electrode 4*b*. Furthermore, on the passivation film 23*b*, the resin film 24*b* described previously is formed. The resin film 24*b* covers the element formation surface 2Ab.

The passivation film 23*b* and the resin film 24*b* are protective films that protect the surface of the chip capacitor 101*b*. In these films, the cutout portions 25*b* described previously are formed in the regions corresponding to the first connection electrode 3*b* and the second connection electrode 4*b*. The cutout portion 25*b* penetrates the passivation film 23*b* and the resin film 24*b*. Furthermore, in the preferred embodiment, the cutout portion 25*b* corresponding to the first connection electrode 3*b* also penetrates the capacitor film 112*b*.

The first connection electrode 3*b* and the second connection electrode 4*b* are individually embedded in the cutout portions 25*b*. In this way, the first connection electrode 3*b* is joined to the pad region 111Bb of the lower electrode film 111*b*, and the second connection electrode 4*b* is joined to the pad region 113Bb of the upper electrode film 113*b*. The first and second connection electrodes 3*b* and 4*b* include the drawing portion 27*b* that protrudes from the surface of the resin film 24*b* and that is drawn along the surface of the resin film 24*b* inwardly (to the side of the element 5*b*) of the substrate 2*b*. In this way, it is possible to join the chip capacitor 101*b* to the mounting substrate by flip-chip.

Figure 58:
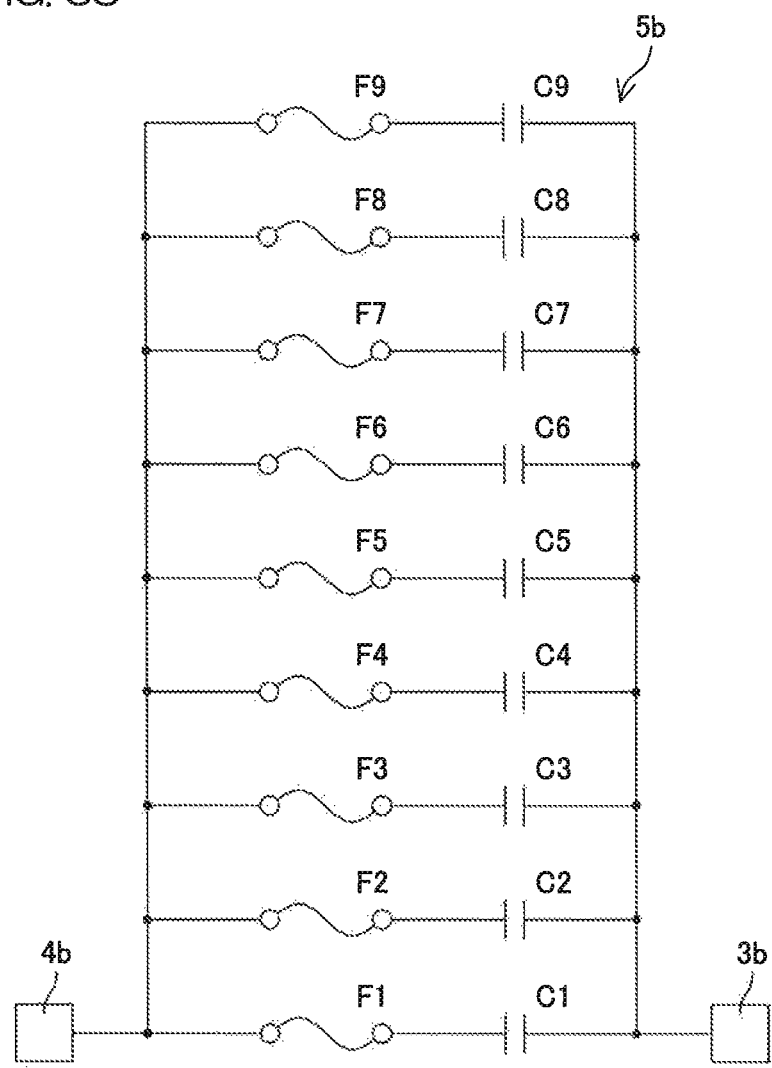
FIG. 58 is a circuit diagram showing the electrical arrangement of the interior of the chip capacitor.

FIG. 58 is a circuit diagram showing the electrical arrangement of the interior of the chip capacitor. The plurality of capacitor factors C1 to C9 are connected in parallel between the first connection electrode 3*b* and the second connection electrode 4*b*. Between each of the capacitor factors C1 to C9 and the second connection electrode 4*b*, fuses F1 to F9 each of which is formed with one or a plurality of fuse units 107*b* are interposed in series.

When all the fuses F1 to F9 are connected, the capacitance value of each chip capacitor 101*b* is equal to the total of the capacitance values of the capacitor factors C1 to C9. When one or two or more of fuses selected from the plurality of fuses F1 to F9 are cut, the capacitor factors corresponding to the cut fuses are separated, and the capacitance value of the chip capacitor 101*b* is reduced only by the capacitance value of the separated capacitor factors.

Hence, the capacitance value (the total of the capacitance values of the capacitor factors C1 to C9) between the pad regions 111Bb and 113Bb is measured, and thereafter one or a plurality of fuses appropriately selected from the fuses F1 to F9 according to the desired capacitance value are blown by laser light, with the result that it is possible to perform conversion (laser trimming) into the desired capacitance value. In particular, when the capacitance values of the capacitor factors C1 to C8 are set so as to be geometric with a geometric ratio of 2, it is possible to finely adjust the capacitance value to perform conversion to the desired capacitance value with accuracy corresponding to the capacitance value of the capacitor factor C1 of the minimum capacitance value (the value of the first term of the geometric progression).

For example, the capacitance values of the capacitor factors C1 to C9 may be determined as follows.

C1=0.03125 pF
C2=0.0625 pF
C3=0.125 pF
C4=0.25 pF
C5=0.5 pF
C6=1 pF
C7=2 pF
C8=4 pF
C9=4 pF

In this case, it is possible to finely adjust the capacitance of the chip capacitor 101b with accuracy of conversion to the minimum of 0.03125 pF. Fuses to be cut are appropriately selected from the fuses F1 to F9, and thus it is possible to provide the chip capacitor 101b having an arbitrary capacitance value between 10 pF to 18 pF.

As described above, in the preferred embodiment, between the first connection electrode 3b and the second connection electrode 4b, the plurality of capacitor factors C1 to C9 that can be separated by the fuses F1 to F9 are provided. The capacitor factors C1 to C9 include a plurality of capacitor factors having different capacitance values, and more specifically, include a plurality of capacitor factors whose capacitance values are set so as to be geometric. In this way, one or a plurality of fuses are selected from the fuses F1 to F9 and are blown by laser light, and thus it is possible to cope with a plurality of types of capacitance values without any change in the design, and it is possible to accurately convert to the desired capacitance value, with the result that it is possible to realize the chip capacitor 101b with the common design.

The individual parts of the chip capacitor 101b will be described in more detail below.

With reference to FIG. 55, for example, the substrate 2b may have, in plan view, a rectangular shape such as 0.3 mm×0.15 mm or 0.4 mm×0.2 mm (preferably 0.4 mm×0.2 mm or less). The capacitor arrangement region 105b is substantially a square region having one side corresponding to the short side of the substrate 2b. The thickness of the substrate 2b may be about 150 μm. With reference to FIG. 56, the substrate 2b may be a substrate whose thickness is reduced by grinding or polishing it from the side of the back surface (the surface where the capacitor factors C1 to C9 are not formed).

The insulating film 20b may be an oxide film such as an oxide silicon film. The film thickness thereof may be about 500 to 2000 angstroms.

The lower electrode film 111b is a conductive film and is particularly preferably a metal film, and may be, for example, an aluminum film. The lower electrode film 111b formed with an aluminum film can be formed by a sputtering method. Likewise, the upper electrode film 113b is a conductive film and is particularly preferably a metal film, and may be, an aluminum film. The upper electrode film 113b formed with an aluminum film can be formed by a sputtering method. The capacitor electrode region 113Ab of the upper electrode film 113b is divided into electrode film parts 131b to 139b, and furthermore, the patterning of the fuse region 113Cb to form a plurality of fuse units 107b can be performed by photolithography and an etching process.

The capacitor film 112b can be formed with, for example, a silicon nitride film, and the film thickness thereof can be 500 to 2000 angstroms (for example, 1000 angstroms). The capacitor film 112b may be a silicon nitride film formed by plasma CVD (chemical vapor deposition).

The passivation film 23b can be formed with, for example, a silicon nitride film, and can be formed by, for example, a plasma CVD method. The film thickness thereof may be set at about 8000 angstroms. As described previously, the resin film 24b can be formed with a polyimide film or another resin film.

The first and second connection electrodes 3b and 4b may be formed with a laminated structure film in which for example, a nickel layer in contact with the lower electrode film 111b or the upper electrode film 113b, a palladium layer laminated on the nickel layer and a gold layer laminated on the palladium layer are laminated. For example, it can be formed by a plating method (more specifically, an electroless plating method). The nickel layer contributes to the enhancement of the adhesion property to the lower electrode film 111b or the upper electrode film 113b, and the palladium layer functions as a diffusion prevention layer that reduces the mutual diffusion of the material of the upper electrode film or the lower electrode film and the gold in the uppermost layer of the first and second connection electrodes 3b and 4b.

A step of manufacturing such a chip capacitor 101b is the same as the step of manufacturing the chip resistor 1b after the formation of the element 5b.

When the element 5b (capacitor element) is formed in the chip capacitor 101b, the insulating film 20b formed with an oxide film (for example, a silicon oxide film) is first formed on the surface of the substrate 30b (the substrate 2b) described previously by a thermal oxidizing method and/or a CVD method. Then, for example, by a sputtering method, the lower electrode film 111b formed with an aluminum film is formed over the entire region of the surface of the insulating film 20b. The film thickness of the lower electrode film 111b may be set at about 8000 angstroms. Then, on the surface of the lower electrode film, a resist pattern corresponding to the final shape of the lower electrode film 111b is formed by photolithography. This resist pattern is used as a mask, and thus the lower electrode film is etched, with the result that it is possible to obtain the lower electrode film 111b having a pattern shown in FIG. 55 and the like. The etching of the lower electrode film 111b can be performed by, for example, reactive ion etching.

Then, for example, by a plasma CVD method, the capacitor film 112b formed with a silicon nitride film or the like is formed on the lower electrode film 111b. In the region where the lower electrode film 111b is not formed, on the surface of the insulating film 20b, the capacitor film 112b is formed. Then, on the capacitor film 112b, the upper electrode film 113b is formed. The upper electrode film 113b is formed with, for example, an aluminum film, and can be formed by a sputtering method. The film thickness thereof may be set at about 8000 angstroms. Then, on the surface of the upper electrode film 113b, a resist pattern corresponding to the final shape of the upper electrode film 113b is formed by photolithography. The resist pattern is used as a mask, and thus the upper electrode film 113b is etched, with the result that the upper electrode film 113b is patterned into the final shape (see FIG. 55 and the like). In this way, the upper electrode film 113b is formed into a pattern that has, in the capacitor electrode region 113Ab, the plurality of separated electrode film parts 131b to 139b, that has, in the fuse region 113Cb, the plurality of fuse units 107b and that has the pad region 113Bb connected to the fuse units 107b. The etching for patterning the upper electrode film 113b may be performed by wet etching using an etching solution such as phosphoric acid or may be performed by reactive ion etching.

As described above, the element 5b (the capacitor factors C1 to C9 and the fuse units 107b) in the chip capacitor 101b is formed.

In this state, the laser trimming for blowing the fuse unit 107b is performed (see FIG. 50B). Specifically, the laser light is applied to the fuse unit 107b forming the fuse that is selected according to the result of the measurement of the total capacitance value, and the narrow width portion 107Cb (see FIG. 55) of the fuse unit 107b is blown. In this way, the corresponding capacitor factor is separated from the pad region 113Bb. When the laser light is applied to the fuse unit 107b, by the action of the insulating film 45b serving as a cover film, the energy of the laser light is stored in the vicinity of the fuse unit 107b, and thus the fuse unit 107a is blown. In this way, the capacitance value of the chip capacitor 101b can be reliably changed into the desired capacitance value.

Thereafter, as in the steps of FIGS. 50C to 50I, the same steps as in the case of the chip resistor 1b are preferably performed.

Although the chip parts (the chip resistor 1b and the chip capacitor 101b) of the second reference example are described above, the second reference example can also be carried out with still other preferred embodiments.

For example, although in the preferred embodiments described above, in the case of the chip resistor 1b, the example where a plurality of resistor circuits having resistance values that are set so as to be geometric with a geometric ratio of r (0<r, r≠1)=2 are included is described, the geometric ratio in the geometric progression may be a number other than 2. Moreover, although in the case of the chip capacitor 101b, the example where a plurality of capacitor factors having capacitance values that are set so as to be geometric with a geometric ratio of r (0<r, r≠1)=2 are included is described, the geometric ratio in the geometric progression may be a number other than 2.

Although in the chip resistor 1b and the chip capacitor 101b, the insulating film 20b is formed on the surface of the substrate 2b, since the substrate 2b has a high resistance, the insulating film 20b can be omitted.

Although in the chip capacitor 101b, the arrangement in which only the upper electrode film 113b is divided into a plurality of electrode film parts is described, only the lower electrode film 111b may be divided into a plurality of electrode film parts or both the upper electrode film 113b and the lower electrode film 111b may be divided into a plurality of electrode film parts. Furthermore, although in the preferred embodiments described above, the example where the upper electrode film, the lower electrode film and the fuse unit are integrally formed is described, the fuse unit may be formed with a conductive film other than the upper electrode film and the lower electrode film. Although in the chip capacitor 101b described above, the capacitor structure of one layer having the upper electrode film 113b and the lower electrode film 111b is formed, on the upper electrode film 113b, another electrode film is laminated via the capacitor film, with the result that a plurality of capacitor structures may be laminated.

When the second reference example is applied to the chip inductor, the element 5b formed on the substrate 2b described previously in the chip inductor includes an inductor element containing a plurality of inductor factors (element factors), and is connected between the first connection electrode 3b and the second connection electrode 4b. The element 5b is provided in the multilayer wiring of the multilayer substrate described previously, and is formed with the wiring film 22b. In the chip inductor, on the substrate 2b, a plurality of fuses F described previously are provided, and the inductor factors each are separably connected via the fuses F to the first connection electrode 3b and the second connection electrode 4b.

In this case, in the chip inductor, one or a plurality of fuses F are selected and cut, and thus a pattern of combinations of a plurality of inductor factors can be an arbitrary pattern, with the result that it is possible to realize chip inductors having various electrical characteristics with the common design.

Even in the chip inductor, the same actions and effects as in the case of the chip resistor 1b and the chip capacitor 101b can be achieved.

In the first connection electrode 3b and the second connection electrode 4b described above, the Pd layer 34b interposed between the Ni layer 33b and the Au layer 35b can also be omitted. When the adhesion properties of the Ni layer 33b and the Au layer 35b are satisfactory, and thus the pinhole described previously is not produced in the Au layer 35b, the Pd layer 34b may be omitted.

Figure 59:
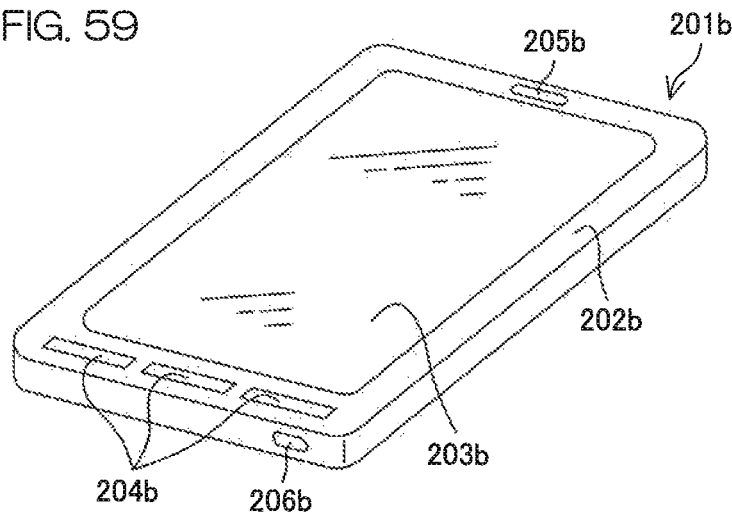
FIG. 59 is a perspective view showing an external view of a smartphone which is an example of an electronic device using the chip part of the second reference example.

FIG. 59 is a perspective view showing an external view of a smartphone which is an example of an electronic device using the chip part of the second reference example. In the smartphone 201b, electronic parts are stored within a housing 202b in the shape of a flat rectangular parallelepiped. In the housing 202b, a pair of rectangular main surfaces are provided on the front side and the back side, and the pair of main surfaces are coupled by four side surfaces. The display surface of a display panel 203b formed with a liquid crystal panel, an organic EL panel or the like is exposed to one of the main surfaces of the housing 202b. The display surface of the display panel 203b forms a touch panel, and provides an input interface for a user.

The display panel 203b is formed in the shape of a rectangle that covers a large proportion of the one main surface of the housing 202b. Operation buttons 204b are arranged along one short side of the display panel 203b. In the preferred embodiment, a plurality of (three) operation buttons 204b are arrayed along the short side of the display panel 203b. The user operates the operation buttons 204b and the touch panel to perform an operation on the smartphone 201b and thereby can call and perform the necessary function.

In the vicinity of the other short side of the display panel 203b, a speaker 205b is arranged. The speaker 205b provides an ear piece for a telephone function, and is also used as an acoustic unit for reproducing music data and the like. On the other hand, near the operation buttons 204b, a microphone 206b is arranged on one side surface of the housing 202b. The microphone 206b provides a mouth piece for the telephone function, and can also be used as a recording microphone.

Figure 60:
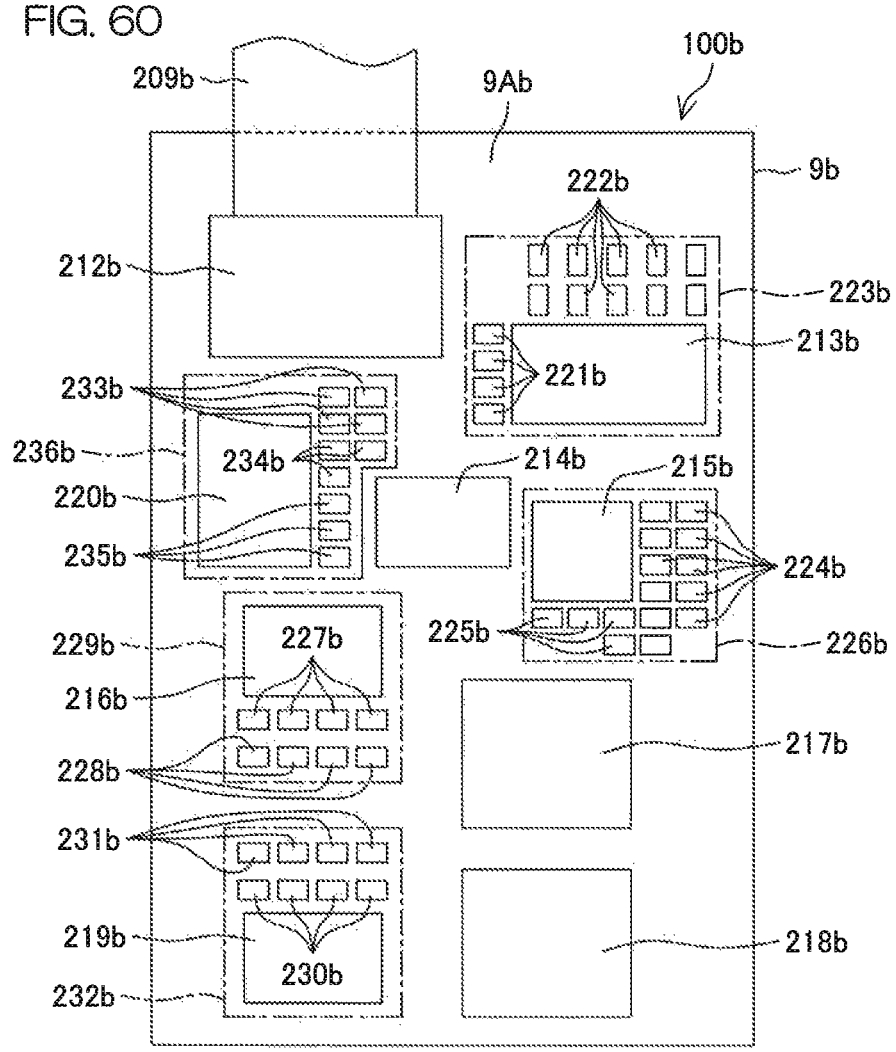
FIG. 60 is a schematic plan view showing the arrangement of the circuit assembly held within the housing of the smartphone.

FIG. 60 is a schematic plan view showing the arrangement of the circuit assembly 100b held within the housing 202b. The circuit assembly 100b includes the mounting substrate 9b described above and circuit parts mounted on the mounting surface 9Ab of the mounting substrate 9b. A plurality of circuit parts include a plurality of integrated circuit elements (IC) 212b to 220b and a plurality of chip parts. The plurality of ICs include a transmission processing IC 212b, a one segment TV reception IC 213b, a GPS reception IC 214b, an FM tuner IC 215b, a power supply IC 216b, a flash memory 217b, a microcomputer 218b, a power supply IC 219b and a baseband IC 220b. The plurality of chip parts include chip inductors 221b, 225b and 235b, chip resistors 222b, 224b and 233b, chip capacitors 227b, 230b and 234b and chip diodes 228b and 231b.

The transmission processing IC 212*b* incorporates an electronic circuit for generating a display control signal for the display panel 203*b* and receiving an input signal from the touch panel on the surface of the display panel 203*b*. For connection to the display panel 203*b*, a flexible wiring 209*b* is connected to the transmission processing IC 212*b*.

The one segment TV reception IC 213*b* incorporates an electronic circuit of a receiver for receiving radio waves of the one segment broadcasting (digital terrestrial TV broadcasting having a portable device as a reception target). In the vicinity of the one segment TV reception IC 213*b*, a plurality of chip inductors 221*b* and a plurality of chip resistors 222*b* are arranged. The one segment TV reception IC 213*b*, the chip inductor 221*b* and the chip resistor 222*b* form a one segment broadcasting reception circuit 223*b*. The chip inductor 221*b* and the chip resistor 222*b* respectively have an inductance and a resistor portion adjusted accurately, and provide an accurate circuit constant to the one segment broadcasting reception circuit 223*b*.

The GPS reception IC 214*b* incorporates an electronic circuit that receives radio waves from the GPS satellites to output positional information of the smartphone 201*b*.

The FM tuner IC 215*b* forms an FM broadcasting reception circuit 226*b* together with a plurality of chip resistors 224*b* and a plurality of chip inductors 225*b* mounted on the mounting substrate 9*b* in the vicinity thereof. The chip resistor 224*b* and the chip inductor 225*b* respectively have a resistance value and an inductance adjusted accurately, and provide an accurate circuit constant to the FM broadcasting reception circuit 226*b*.

In the vicinity of the power supply IC 216*b*, a plurality of chip capacitors 227*b* and a plurality of chip diodes 228*b* are mounted on the mounting surface of the mounting substrate 9*b*. The power supply IC 216*b* forms a power supply circuit 229*b* together with the chip capacitor 227*b* and the chip diode 228*b*.

The flash memory 217*b* is a storage device for recording an operating system program, data generated within the smartphone 201*b*, data and programs acquired by a communication function from the outside and the like.

The microcomputer 218*b* is a computation processing circuit that incorporates a CPU, a ROM and a RAM and that performs various types of computation processing to realize a plurality of functions in the smartphone 201*b*. More specifically, image processing and computation processing for various types of application programs are realized by the function of the microcomputer 218*b*.

Near the power supply IC 219*b*, a plurality of chip capacitors 230*b* and a plurality of chip diodes 231*b* are mounted on the mounting surface of the mounting substrate 9*b*. The power supply IC 219*b* forms a power supply circuit 232*b* together with the chip capacitor 230*b* and the chip diode 231*b*.

Near the baseband IC 220*b*, a plurality of chip resistors 233*b*, a plurality of chip capacitors 234*b* and a plurality of chip inductors 235*b* are mounted on the mounting surface 9A*b* of the mounting substrate 9*b*. The baseband IC 220*b* forms a baseband communication circuit 236*b* together with the chip resistor 233*b*, the chip capacitor 234*b* and the chip inductor 235*b*. The baseband communication circuit 236*b* provides a communication function for telephone communication and data communication.

In the arrangement described above, power appropriately adjusted by the power supply circuits 229*b* and 232*b* is supplied to the transmission processing IC 212*b*, the GPS reception IC 214*b*, the one segment broadcasting reception circuit 223*b*, the FM broadcasting reception circuit 226*b*, the baseband communication circuit 236*b*, the flash memory 217*b* and the microcomputer 218*b*. The microcomputer 218*b* performs computation processing in response to an input signal input via the transmission processing IC 212*b*, and outputs a display control signal from the transmission processing IC 212*b* to the display panel 203*b* to make the display panel 203*b* produce various types of displays.

When an instruction to receive the one segment broadcasting is provided by the operation of the touch panel or the operation buttons 204*b*, the one segment broadcasting is received by the function of the one segment broadcasting reception circuit 223*b*. Then, computation processing for outputting an image received to the display panel 203*b* and converting sound received into acoustic sound from the speaker 205*a* is performed by the microcomputer 218*b*.

When the positional information of the smartphone 201*b* is needed, the microcomputer 218*b* acquires the positional information output by the GPS reception IC 214*b*, and performs computation processing using the positional information.

Furthermore, when an instruction to receive FM broadcasting is input by the operation of the touch panel or the operation buttons 204*b*, the microcomputer 218*b* starts up the FM broadcasting reception circuit 226*b*, and performs computation processing for outputting the received sound from the speaker 205*b*.

The flash memory 217*b* is used to store data acquired by communication and to store data produced by the computation of the microcomputer 218*b* and input from the touch panel. As necessary, the microcomputer 218*b* writes data into the flash memory 217*b* and reads data from the flash memory 217*b*.

The function of telephone communication or data communication is realized by the baseband communication circuit 236*b*. The microcomputer 218*b* controls the baseband communication circuit 236*b* to perform processing for transmitting and receiving sound or data.

It is possible to extract, from the details of the preferred embodiments of the second reference example, the following features other than the inventions recited in the scope of claims.

(Item 1)

A chip part including:

a silicon substrate which has a surface and a side surface; and an electrode which is formed on the silicon substrate, where the silicon substrate does not contain a dopant that determines a conductive type thereof.

(Item 2)

A chip part including:

a silicon substrate which has a surface and a side surface; and an electrode which is formed on the silicon substrate, where a resistance value of the silicon substrate is 100Ω·cm or more.

In this arrangement, the silicon substrate does not contain the dopant that determines the conductive type or the resistance value of the silicon substrate is 100Ω·cm or more. In this way, it is possible to provide an excellent insulating property to the silicon substrate serving as an underlying substrate of the chip part. Since the silicon substrate provides a satisfactory insulating property, even when an insulating film is interposed between the silicon substrate and the electrode, it is possible to change the parasitic capacitance formed therebetween to zero or to reduce the parasitic capacitance as compared with a case where a silicon substrate containing a dopant is used. Consequently, it is possible to reduce the impact of the parasitic capacitance on the device properties, and thus it is possible to improve the high-frequency characteristic and the like.

The dopant for determining the conductivity of the silicon substrate refers to an impurity with which the silicon is doped to have an n-type or a p-type. Examples of the impurity include n-type impurities such as phosphorus, arsenic and antimony and p-type impurities such as boron. Hence, the silicon substrate of the second reference example may contain a small amount of impurity that does not impact the conductive type of the silicon.

(Item 3)

The chip part according to item 1 or 2 further including:

an insulating film which is interposed between the electrode and the silicon substrate.

Since in the chip part of the second reference example, the resistance value of the silicon substrate is very high, even when the electrode is formed so as to make contact with the silicon substrate, it is possible to avoid an unnecessary short circuit. However, an insulating film is provided between the electrode and the silicon substrate, and thus it is possible to reliably prevent the occurrence of such a short circuit.

(Item 4)

The chip part according to item 3, where the electrode is integrally formed with the surface and the side surface so as to cover an edge portion of the surface of the silicon substrate.

In this arrangement, since the electrode is formed not only on the surface of the silicon substrate but also on the side surface, it is possible to enlarge the adhesion area when the chip part is soldered to the mounting substrate. Consequently, since it is possible to increase the adsorbed amount of solder to the electrode, it is possible to enhance the adhesion strength. Since the solder is adsorbed so as to be moved from the surface of the silicon substrate to the side surface, in the mounted state, it is possible to retain the chip part from the two directions of the surface and the side surface of the silicon substrate. Thus, it is possible to stabilize the mounting shape of the chip part.

Moreover, not only is the electrode formed on the side surface of the silicon substrate but also the insulating film is interposed between the electrode and the silicon substrate. In this way, for example, when it is desired to prevent the silicon substrate and the electrode from being short-circuited, it is possible to cope with such a requirement.

(Item 5)

The chip part according to item 4, where the silicon substrate is formed, in plan view, in the shape of a rectangle, and the electrode is formed so as to cover the three edge portions of the silicon substrate.

In this arrangement, since in the mounted state, the chip part can be retained from the three directions of the side surfaces of the silicon substrate, it is possible to further stabilize the mounting shape of the chip part.

(Item 6)

The chip part according to item 4 or 5 further including:

a wiring film which is formed a distance apart from the edge portion on the surface of the silicon substrate and to which the electrode is electrically connected.

In this arrangement, since the wiring film is independent of the electrode for external connection, it is possible to perform a wiring design corresponding to an element pattern formed on the surface of the silicon substrate.

(Item 7)

The chip part according to item 6, where in the wiring film, a peripheral edge portion opposite the edge portion of the silicon substrate covered by the electrode is selectively exposed, and the peripheral edge portion other than the exposed part is selectively covered by a resin film.

In this arrangement, since it is possible to increase the junction area between the electrode and the wiring film, it is possible to reduce the contact resistance.

(Item 8)

The chip part according to item 7, where the electrode is formed so as to protrude from the surface of the resin film.

(Item 9)

The chip part according to item 8, where the electrode includes a drawing portion which is drawn in a lateral direction along the surface of the resin film and which selectively covers the surface.

(Item 10)

The chip part according to any one of items 1 to 9, where the electrode includes a Ni layer and an Au layer, and the Au layer is exposed to the uppermost surface.

With the electrode of this arrangement, since the surface of the Ni layer is covered by the Au layer, it is possible to prevent the Ni layer from being oxidized.

(Item 11)

The chip part according to item 10, where the electrode further includes a Pd layer which is interposed between the Ni layer and the Au layer.

With the electrode of this arrangement, even when the Au layer is reduced in thickness, and thus a through-hole (pin hole) is produced, since the Pd layer interposed between the Ni layer and the Au layer blocks the through-hole, it is possible to prevent the Ni layer from being exposed from the through-hole to the outside so as to be oxidized.

(Item 12)

The chip part according to any one of items 1 to 11, where the two electrodes are provided a distance apart from each other, and the chip part is a chip resistor which includes a resistor body connected between the two electrodes formed on the silicon substrate.

(Item 13)

The chip part according to item 12 further including:

a plurality of the resistor bodies; and a plurality of fuses which are formed on the silicon substrate and which connect the resistor bodies to the electrode such that each of the resistor bodies can be separated.

In this chip part (chip resistor), one or a plurality of fuses are selectively cut, and thus it is possible to easily and quickly cope with a plurality of types of resistance values. In other words, a plurality of resistor bodies having different resistance values are combined, and thus it is possible to realize the chip resistors of various resistance values with the common design.

(Item 14)

The chip part according to any one of items 1 to 11, where the two electrodes are provided a distance apart from each other, and the chip part is a chip capacitor which includes a capacitor element connected between the two electrodes formed on the silicon substrate.

(Item 15)

The chip part according to item 14 further including:

a plurality of capacitor factors which form the capacitor element; and a plurality of fuses which are formed on the silicon substrate and which connect the capacitor factors to the electrode such that each of the capacitor factors can be separated.

In this chip part (chip capacitor), one or a plurality of fuses are selectively cut, and thus it is possible to easily and quickly cope with a plurality of types of capacitance values. In other words, a plurality of capacitor factors having different capacitance values are combined, and thus it is possible to realize the chip capacitors of various capacitance values with the common design.

(Item 16)

A circuit assembly including:

the chip part according to any one of items 1 to 15; and a mounting substrate which has, on a mounting surface opposite the surface of the silicon substrate, a land joined by solder to the electrode.

In this arrangement, it is possible to provide the circuit assembly including the chip part that can provide an excellent insulating property to the silicon substrate (underlying substrate) and that can reduce the lowering of the high-frequency characteristic.

(Item 17)

The circuit assembly according to item 16, where the chip part is the chip part according to any one of items 4 to 9, and the solder is formed so as to cover the surface part and the side surface part of the electrode when seen in a normal direction from the mounting surface.

In this arrangement, since it is possible to increase the adsorbed amount of solder to the electrode, it is possible to enhance the adhesion strength. Since the solder is adsorbed so as to be moved from the surface part of the electrode to the side surface part, it is possible to retain the chip part from the two directions of the surface and the side surfaces of the silicon substrate. Hence, it is possible to stabilize the mounting shape of the chip part.

(Item 18)

An electronic device including:

the circuit assembly according to item 16 or 17; and a housing which holds the circuit assembly.

In this arrangement, it is possible to provide an electronic part including the chip part that can provide an excellent insulating property to the silicon substrate (underlying substrate) and that can reduce the lowering of the high-frequency characteristic.

Third Reference Example

An object of a third reference example is to provide a chip-type fuse that can reliably blow a fuse factor at a fusible portion when an overcurrent flows in and a method of manufacturing such a chip-type fuse.

Preferred embodiments of the third reference example will be described in detail below with reference to accompanying drawings.

Figure 61:
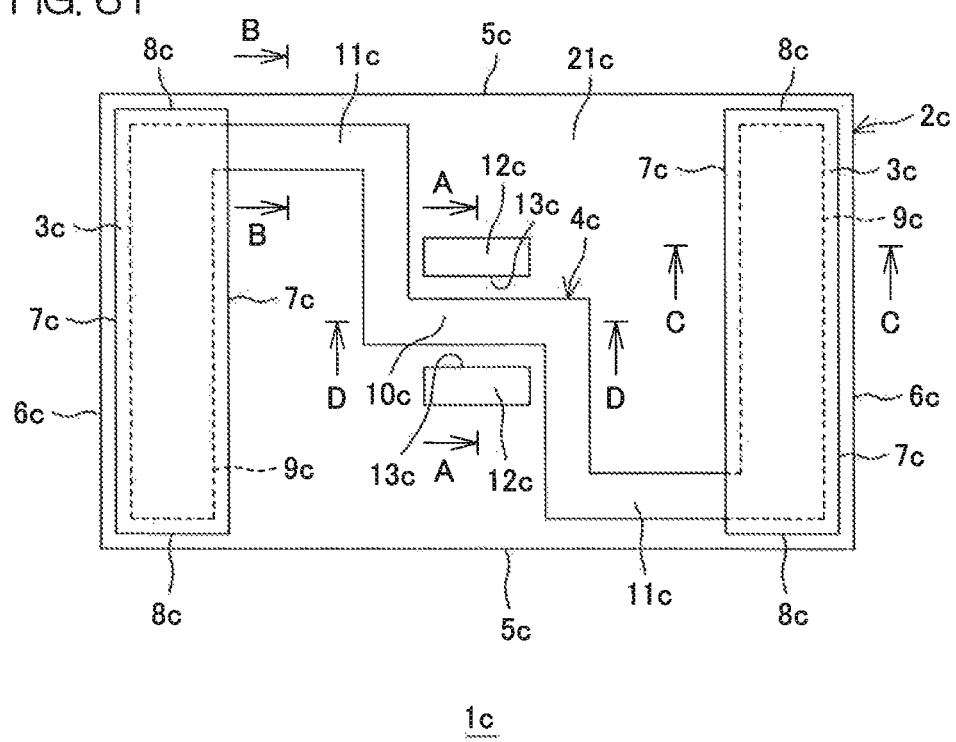
FIG. 61 is a schematic plan view of a chip-type fuse according to a preferred embodiment of a third reference example.

FIG. 61 is a schematic plan view of a chip-type fuse 1c according to a preferred embodiment of the third reference example. The planar layout of the chip-type fuse 1c will first be described with reference to FIG. 61.

The chip-type fuse 1c includes a substrate 2c, a pair of electrodes 3c formed on the substrate 2c and a fuse factor 4c both ends of which are connected between the pair of electrodes 3c on the substrate 2c.

The substrate 2c is, for example, a high-resistance substrate having a resistance value of 100Ω·cm or more. In the preferred embodiment, the substrate 2c is formed in the shape of a rectangular plate which has a pair of long sides 5c and a pair of short sides 6c opposite each other in plan view when seen in a normal direction from the surface 21c thereof.

The pair of electrodes 3c are arranged at both end portions along the long sides 5c of the substrate 2c. Each of the electrodes 3c is formed, in plan view, in the shape of a rectangle which has a pair of long sides 7c parallel to the pair of short sides 6c and a pair of short sides 8c parallel to the pair of long sides 5c.

The fuse factor 4c integrally includes a pair of pad portions 9c which are arranged below the pair of electrodes 3c, a fusible portion 10c which is arranged between the pair of pad portions 9c and a pair of wiring portions 11c which connect the fusible portion 10c and each of the pad portions 9c. Although in the preferred embodiment, the fuse factor 4c is formed of an Al—Cu alloy, it may be formed of another metal material.

Each of the pad portions 9c is formed, in plan view, in the shape of a rectangle which is slightly smaller than each of the electrodes 3c such that the entire region thereof is within the inner region of each of the electrodes 3c.

The fusible portion 10c is formed in the shape of a line which extends along the longitudinal direction of the substrate 2c, and the wiring portions 11c are connected to both end portions thereof. Although in the preferred embodiment, the fusible portion 10c is formed in the shape of a straight line along the longitudinal direction of the substrate 2c, it may naturally be formed in the shape of a curve which is formed in the shape of, for example, the letter S. Although in the preferred embodiment, the fusible portion 10c is formed to have substantially the same width as the wiring portion 11c, in terms of more easily blowing the fusible portion 10c, the fusible portion 10c may be formed to have a width narrower than the wiring portion 11c.

On both sides in a width direction perpendicularly intersecting the longitudinal direction of the fusible portion 10c, as an example of a wall portion in the third reference example, a pair of dummy metals 12c are arranged. The pair of dummy metals 12c are formed of the same metal material as the fuse factor 4c (in the preferred embodiment, the Al—Cu alloy). The pair of dummy metals 12c likewise extend in the shape of a line (in the shape of a straight line) along the fusible portion 10c in the shape of a line, and are arranged at a gap 13c on the sides apart from the fusible portion 10c. In the preferred embodiment, the fusible portion 10c in the shape of a line and the pair of dummy metals 12c are formed along the longitudinal direction of the substrate 2c, and thus as compared with a case where they are formed along the width direction of the substrate 2c, in a region on the substrate 2c whose size is limited, the fusible portion 10c and the pair of dummy metals 12c which are relatively long can be formed. In this way, the gap 13c on the side can be formed over a somewhat long distance, and thus it is possible to increase the region where the heat of the fusible portion 10c is stored.

In the width direction of the substrate 2c, the pair of the wiring portions 11c each are arranged, on one side of the fusible portion 10c and the other on the opposite side thereof. In the preferred embodiment, each of the wiring portions 11c is formed in the shape of a hook (the letter L) having a part perpendicularly extending from the end portion of the fusible portion 10c to the long side 5c of the substrate 2c and a part extending parallel to the long side 5c, and the part parallel to the long side 5c is connected to the pad portion 9c.

Figure 62:
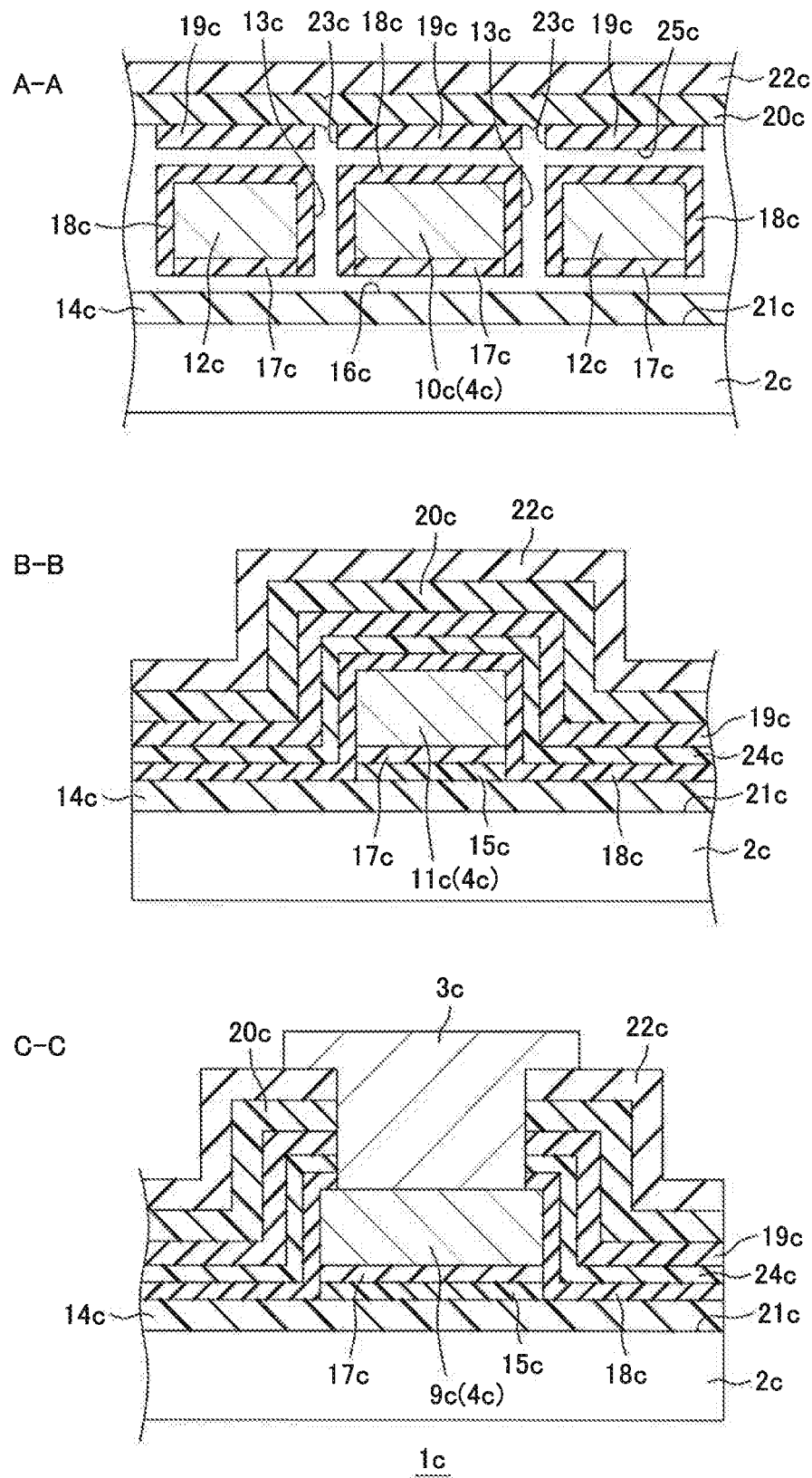
FIG. 62 is a cross-sectional views taken along line A-A, line B-B and line C-C of the chip-type fuse of FIG. 61.
Figure 63:
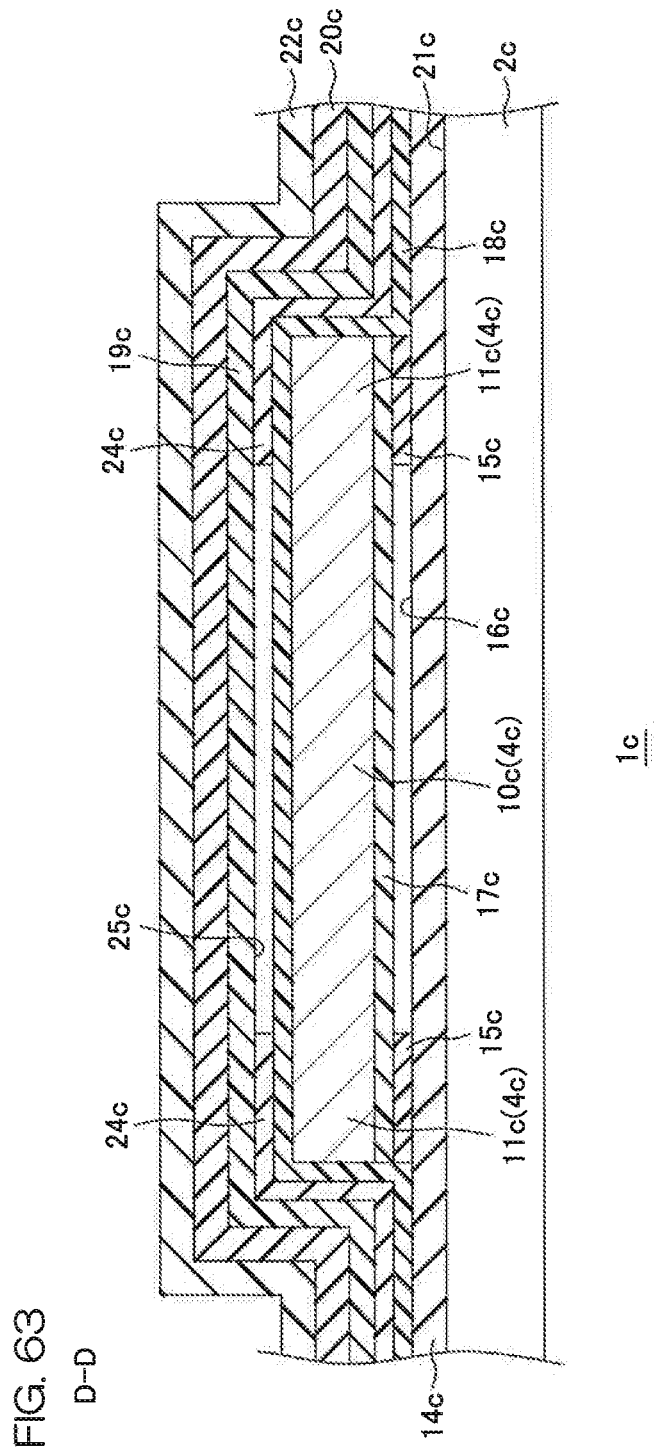
FIG. 63 is a cross-sectional view taken along line D-D of the chip-type fuse of FIG. 61.

FIG. 62 is cross-sectional views taken along line A-A, line B-B and line C-C of the chip-type fuse 1c of FIG. 61, the cross-sectional view along line A-A shows the structure of the fusible portion 10c and the dummy metal 12c, the cross-sectional view along line B-B shows the structure of the wiring portion 11c and the cross-sectional view along line C-C shows the structure of the pad portion 9C. FIG. 63 is a cross-sectional view taken along line D-D of the chip-type fuse 1c of FIG. 61, and shows the connection portion of the fusible portion 10c and the wiring portions 11c. The cross-sectional structure of the chip-type fuse 1c will then be described with reference to FIGS. 62 and 63.

On the entire region of the surface 21c of the substrate 2c, a pad oxide film 14c is formed. The pad oxide film 14c is formed of silicon oxide ($SiO_2$), and has, for example, a thickness of 1000 to 30000 angstroms. Here, the entire region of the surface 21c on which the pad oxide film 14c is formed is flat without the formation of a concave portion.

On the pad oxide film 14c, via a nitride film 15c, the fuse factor 4c is formed. The nitride film 15c is formed of silicon nitride (SiN), and has, for example, a thickness of 8000 or less angstroms. The nitride film 15c is selectively formed in the lower region of a portion (in the preferred embodiment, the pad portion 9c and the wiring portion 11c) other than the fusible portion 10c of the fuse factor 4c such that the nitride film 15c is removed in the lower region of the fuse factor 4c from below the fusible portion 10c. As described above, since the portion other than the fusible portion 10c is selectively supported by a support film made of the nitride film 15c from the lower side, the fusible portion 10c is supported at both ends by the portion (in the preferred embodiment, the wiring portion 11c) connected to both end portions thereof in a state where the fusible portion 10c is floated with respect to the substrate 2c. In this way, the fusible portion 10c is arranged at a gap 16c on the lower side apart from the substrate 2c covered by the pad oxide film 14c. Likewise, the dummy metal 12c on the side of the fusible portion 10c is arranged at the gap 16c on the lower side apart from the substrate 2c. Here, as shown in the cross-sectional view along line A-A of FIG. 62, with consideration given to the thickness of a coating oxide film 18c which will be described later, the gap 13c on the side between the fusible portion 10c and the dummy metal 12c is 0.6 μm or less.

In the preferred embodiment, in the fuse factor 4c and the dummy metal 12c, the lower surface thereof is coated with a underlying oxide film 17c as an example of a first insulating film in the third reference example, and furthermore, the coating oxide film 18c is formed as an example of a second insulating film in the third reference example so as to coat the entire fuse factor 4c. The fuse factor 4c is completely coated with the underlying oxide film 17c and the coating oxide film 18c, and thus it is possible to reliably insulate the fusible portion 10c from the surrounding area. The coating oxide film 18c is formed over the entire region of the surface 21c of the substrate 2c, and as shown in the cross-sectional view along line B-B of FIG. 62, the cross-sectional view along line C-C of FIG. 62 and the cross-sectional view along line D-D of FIG. 63, in the region other than the formation region of the fuse factor 4c and the dummy metal 12c, the coating oxide film 18c is fixed to the pad oxide film 14c. The dummy metal 12c is coated with the coating oxide film 18c, and is thereby supported so as to be floated by the portion fixed to the pad oxide film 14c of the coating oxide film 18c with respect to the substrate 2c.

Laminated film of an oxide film 19c, a nitride film 20c and a surface protective film 22c is formed as an example of a ceiling portion in the third reference example so as to cover the fusible portion 10c and the dummy metal 12c. The oxide film 19c is formed of silicon oxide ($SiO_2$), and has, for example, a thickness of 10000 angstroms or less. The nitride film 20c is formed of silicon nitride (SiN), and has, for example, a thickness of 11000 to 13000 angstroms. The surface protective film 22c is formed of polyimide, and has, for example, a thickness of 20000 to 100000 angstroms.

The laminated films 19c, 20c and 22c are formed above the fusible portion 10c and the dummy metal 12c so as to straddle the pair of the dummy metals 12c, as shown in the cross-sectional view along line A-A of FIG. 62, via the fusible portion 10c. In this way, in the gap 13c on the side between the fusible portion 10c and the pair of the dummy metals 12c, the upper portion thereof is blocked by the laminated films 19c, 20c and 22c. In the laminated films 19c, 20c and 22c, the portion of the oxide film 19c opposite the gap 13c on the side is selectively removed. In this way, in the oxide film 19c, a gap 23c having the same pattern as the gap 13c on the side is formed.

Between the laminated films 19c, 20c and 22c and the coating oxide film 18c, a nitride film 24c is interposed. The nitride film 24c is selectively removed from the upper region of the fusible portion 10c and the dummy metal 12c. In this way, the laminated films 19c, 20c and 22c are arranged at a gap 25c on the upper side apart from the fusible portion 10c coated with the coating oxide film 18c.

As shown in the cross-sectional view along line C-C of FIG. 62, the pair of the electrodes 3c penetrate the laminated films 19c, 20c and 22c, the nitride film 24c and the coating oxide film 18c, and the lower surface thereof is connected to the pad portion 9c.

As described above, in the chip-type fuse 1c, as shown in the cross-sectional view along line A-A of FIG. 62, the gaps 13c, 16c and 25C are formed on all four sides of the fusible portion 10c, that is, on both sides and furthermore, on the upper and lower sides. Hence, heat produced in the fusible portion 10c can be efficiently stored in the surrounding area (the gaps 13c, 16c and 25C). Therefore, when an overcurrent flows in between the pair of electrodes 3c in the chip-type fuse 1c, the fuse factor 4c can be reliably blown at the fusible portion 10c.

All the four sides of the fusible portion 10c are surrounded by the gaps 13c, 16c and 25C, and thus it is possible to ensure a space that can cope with the movement or the curving of the fusible portion 10c.

Furthermore, since as the substrate 2c, the high-resistance substrate having a resistance value of 100Ω·cm or more is adopted, even if the pad oxide film 14c is broken when the fusible portion 10c is blown, it is possible to prevent a leak current from being passed via the substrate 2c exposed from the broken area.

FIGS. 64 to 70 are cross-sectional views for illustrating a part of a step of manufacturing the chip-type fuse 1c of FIG. 61 in order of steps, and show cross-sectional views taken along line A-A, line B-B and line C-C as in FIG. 62. The step of manufacturing the chip-type fuse 1c will then be described with reference to FIGS. 64 to 70.

In the manufacturing of the chip-type fuse 1c, as shown in FIG. 64, for example, by a thermal oxidizing method, the pad oxide film 14c is first formed on the substrate 2c. Then, for example, by a CVD method, silicon oxide (SiN) is deposited on the pad oxide film 14c, and thus the nitride film 15c, which is an example of a first sacrificial layer in the third reference example, is formed. The thickness of the nitride film 15c is set such that in the following etching step (see FIG. 67), side etching can be performed, and is, for example, 8000 angstroms. Then, for example, by a CVD method, USG (Un-doped Silicate Glass) is deposited on the nitride film 15c, and thus the underlying oxide film 17c, which is an example of a first insulating film in the third reference example, is formed. The thickness of the underlying oxide film 17c is set such that in the following etching step (see FIGS. 67 and 69), the underlying oxide film 17c is prevented from disappearing, and is, for example, 7000 to 9000 angstroms. However, the underlying oxide film 17c may be omitted, and a fuse factor material film 26c which will be described later may be directly deposited on the nitride film 15c. Then, for example, by a sputtering method, the Al—Cu alloy is deposited on the underlying oxide film 17c, and thus the fuse factor material film 26c is formed. The thickness of the fuse factor material film 26c is, for example, 4000 to 6000 angstroms.

Then, as shown in FIG. 65, on the fuse factor material film 26c, a mask (not shown) that selectively covers a region where the fuse factor 4c and the dummy metal 12c need to be formed is formed, and by dry etching utilizing the mask, the fuse factor material film 26c is selectively removed. In this way, the fuse factor 4c (the pad portion 9c, the fusible portion 10c and the wiring portions 11c) and the dummy metal 12c are formed at the same time. Then, by dry etching utilizing the mask utilized for the formation of the fuse factor 4c, the underlying oxide film 17c and the nitride film 15c other than the lower region of the fuse factor 4c and the dummy metal 12c are selectively removed.

Then, as shown in FIG. 66, for example, by a CVD method, USG (Un-doped Silicate Glass) is deposited on the substrate 2c, and thus the coating oxide film 18c, which is an example of a second insulating film in the third reference example, is formed. In the coating oxide film 18c, one surface and the other surface thereof are formed along the upper surface and the side surface of the fuse factor 4c and the dummy metal 12c such that the gap 13c on the side is formed between the fuse factor 4c (the fusible portion 10c) and the pair of dummy metals 12c adjacent to each other. Here, the thickness of the coating oxide film 18c is set such that in the following two etching steps (see FIGS. 67 and 69), the coating oxide film 18c is prevented from disappearing, and that in the following step of depositing the nitride film 24c (see FIG. 68), the gap 13c on the side is prevented from being filled. In the preferred embodiment, the thickness is set at, for example, 7000 to 9000 angstroms such that the gap 13c on the side is 0.6 μm or less.

Then, as shown in FIG. 67, for example, an etching gas or an etching solution that has an etching rate relatively faster on silicon nitride (SiN) than silicon oxide (SiO$_2$) is used, the nitride film 15c in the lower region of the fuse factor 4c and the dummy metal 12c is selectively removed. In the preferred embodiment, the coating oxide film 18c present in the gap 13c on the side is removed, and thereafter by dry etching utilizing a fluorine-based gas, the nitride film 15c is removed by being isotropically etched (side-etched) from the bottom portion of the gap 13c on the side. In this way, the gap 16c on the lower side is formed in the lower region of the fuse factor 4c and the dummy metal 12c, and thus the fuse factor 4c and the dummy metal 12c are floated with respect to the substrate 2c.

Then, as shown in FIG. 68, for example, by a CVD method, silicon nitride (SiN) and USG (Un-doped Silicate Glass) are sequentially deposited on the substrate 2c, and thus the nitride film 24c and the oxide film 19c are formed as an example of a second sacrificial layer in the third reference example. Here, since the gap 13c on the side is 0.6 μm or less, the nitride film 24c and the oxide film 19c are formed to straddle the pair of dummy metals 12c so as to cover the fusible portion 10c.

Then, as shown in FIG. 69, for example, an etching gas or an etching solution that has an etching rate relatively faster on silicon nitride (SiN) than silicon oxide (SiO$_2$) is used, the nitride film 24c in the upper region of the fuse factor 4c and the dummy metal 12c is selectively removed. In the preferred embodiment, the gap 23c having the same pattern as the gap 13c on the side is formed in the oxide film 19c, and thereafter by dry etching utilizing a fluorine-based gas, the nitride film 24c is removed by being isotropically etched (side-etched) from the bottom portion of the gap 23c. In this way, the gap 25c on the upper side is formed in the upper region of the fuse factor 4c and the dummy metal 12c.

Then, as shown in FIG. 70, for example, by a CVD method, silicon nitride (SiN) is deposited on the oxide film 19c, and thus the nitride film 20c is formed. Then, polyimide is applied onto the nitride film 20c, the polyimide is cured and thus the surface protective film 22c is formed. Then, the laminated films 18C, 24c, 19c, 20c and 22c on the pad portion 9c of the fuse factor 4c are selectively removed by etching, and thus a contact hole 27c for the electrode 3c is formed.

Thereafter, the pad portion 9c exposed from the contact hole 27c is plated, and thus the pair of electrodes 3c are formed at the same time. The steps described above are performed, and thus the chip-type fuse 1c is obtained.

As described above, in the method of manufacturing the chip-type fuse 1c, the difference in etching rate between the nitride film 15c, the underlying oxide film 17c and the coating oxide film 18c is utilized, and thus the nitride film 15c in the lower region of the fuse factor 4c and the dummy metal 12c can be easily etched by isotropic etching (see FIG. 67). Likewise, the difference in etching rate is utilized, and thus the nitride film 24c in the upper region of the fuse factor 4c and the dummy metal 12c can be easily etched (see FIG. 69). Furthermore, since the fuse factor 4c and the dummy metal 12c are formed of the same material, that is, the Al—Cu alloy, as shown in FIG. 65, these can be formed in the same step.

Hence, it is possible to efficiently manufacture the chip-type fuse 1c in which the fuse factor 4c can be reliably blown at the fusible portion 10c when an overcurrent flows in.

Although the preferred embodiment of the third reference example is described above, the third reference example can be carried out with still other preferred embodiments.

For example, as the substrate serving as the base of the chip-type fuse 1c, a semiconductor substrate such as a silicon substrate may be used, and instead of the semiconductor substrate, an insulating substrate such as a ceramic substrate may be used.

The wall portion which is formed on both sides of the fusible portion 10c and which is an example of the dummy metal 12c does not need to be floated with respect to the substrate 2c and may be fixed on the substrate 2c.

Although in the preferred embodiments described above, the gap 16c on the lower side and the gap 25c on the upper side are formed by isotropic dry etching, the gaps 16c and 25c may be formed by wet etching.

It is possible to extract, from the details of the preferred embodiments of the third reference example, the following features other than the inventions recited in the scope of claims.

(Item 1)

A chip-type fuse including:

a substrate;

a pair of electrodes which are formed on the substrate;

a metal fuse factor both ends of which are connected between the pair of electrodes on the substrate and which selectively has a fusible portion formed at a gap on a lower side apart from the substrate; and a pair of wall portions which are formed so as to sandwich the fusible portion from both sides in a width direction perpendicularly intersecting a longitudinal direction of the fuse factor and each of which is arranged at a gap on a side apart from the fusible portion.

In this arrangement, since the gaps are formed at least on three sides of the fusible portion, that is, on the lower side and on both sides, heat produced in the fusible portion can be efficiently stored in the surrounding area (the gaps). Hence, when an overcurrent flows into the chip-type fuse, the fuse factor can be reliably blown at the fusible portion.

(Item 2)

The chip-type fuse according to item 1, where the fuse factor includes a wiring portion which is integrally formed of the same metal material as the fusible portion and which is arranged so as to be in contact with a region on the substrate, and the fusible portion is supported by the wiring portion while being floated with respect to the substrate.

(Item 3)

The chip-type fuse according to item 1 or 2, where the wall portion includes a dummy metal which is formed of the same metal material as the fuse factor.

In this arrangement, since the wall portion can be formed in the same step as the fuse factor, it is possible to form a structure capable of reliably blowing the fuse factor at the fusible portion without increasing the number of steps in the manufacturing step.

(Item 4)

The chip-type fuse according to any one of items 1 to 3, further including:

a ceiling portion which is formed to straddle the pair of wall portions so as to cover the fusible portion, which is arranged at a gap on an upper side apart from the fusible portion and which is formed of an insulating material.

In this arrangement, since the gap is also formed on the upper side of the fusible portion, all the four sides of the fusible portion can be surrounded by the gaps. Hence, it is possible to more effectively realize the effect of reliably blowing the fuse factor at the fusible portion in the third reference example.

(Item 5)

The chip-type fuse according to item 4, including:

a surface protective film which covers the surface thereof, where the ceiling portion is formed by utilizing a part of the surface protective film which covers the fusible portion.

In this arrangement, since it is possible to form the ceiling portion in the same step as the surface protective film, it is possible to prevent the number of steps in the manufacturing step from being increased.

(Item 6)

The chip-type fuse according to any one of items 1 to 5, where the fuse factor includes a pad portion which is integrally formed of the same metal material as the fusible portion and which is connected to a lower surface of each of the electrodes on the lower side of each of the pair of electrodes.

In the third reference example, since the fuse factor can be reliably blown at the fusible portion, even when as in this arrangement, the pad portion is integrally formed of the same metal material as the fusible portion, the pad portion is little blown when an overcurrent flows in. Hence, it is possible to form the fusible portion and the pad portion at the same step.

(Item 7)

The chip-type fuse according to any one of items 1 to 6, further including:

an insulating film which coats the fusible portion.

In this arrangement, the fusible portion can be reliably insulated from the surrounding area.

(Item 8)

The chip-type fuse according to any one of items 1 to 7, where the fuse factor is formed of an Al—Cu alloy.

(Item 9)

The chip-type fuse according to any one of items 1 to 8, where the substrate includes a silicon substrate.

(Item 10)

A method of manufacturing a chip-type fuse, the method including:

a step of forming a first sacrificial layer on a substrate;

a step of forming, on the first sacrificial layer, a metallic fuse factor having one end and the other end;

a step of selectively forming a pair of wall portions in the first sacrificial layer on both sides of an intermediate portion in a longitudinal direction of the fuse factor in a width direction perpendicularly intersecting the longitudinal direction such that the pair of wall portions are formed at a gap on a side apart from the intermediate portion;

a step of removing at least the first sacrificial layer below the intermediate portion of the fuse factor to form a gap on a lower side between the intermediate portion and the substrate; and a step of forming, on the substrate, a pair of electrodes such that the electrodes are connected to the one end and the other end of the fuse factor.

In this method, since the gaps are formed at least on the three sides of the intermediate portion of the fuse factor, that is, on the lower side and on both sides, it is possible to manufacture the chip-type fuse of the third reference example in which the intermediate portion is the fusible portion.

(Item 11)

The method of manufacturing a chip-type fuse according to item 10, where the step of forming the gap on the lower side includes removing the first sacrificial layer by isotropic etching to form the gap on the lower side.

In this method, by adopting isotropic etching, it is possible to efficiently supply an etching gas or an etching solution to below the intermediate portion of the fuse factor, with the result that it is possible to easily etch the first sacrificial layer.

(Item 12)

The method of manufacturing a chip-type fuse according to item 10 or 11, where the step of forming the wall portions including forming a dummy metal using the same metal material as the fuse factor at the same time when the fuse factor is formed.

In this method, since it is possible to form the wall portions in the same step as the fuse factor, it is possible to form a structure capable of reliably blowing the fuse factor at the fusible portion (the intermediate portion of the fuse factor) without increasing the number of steps in the manufacturing step.

(Item 13)

The method of manufacturing a chip-type fuse according to any one of items 10 to 12, the method further including:

a step of forming a second sacrificial layer to cover the intermediate portion and straddle the pair of wall portions such that the gap on the side is prevented from being filled;

a step of forming, on the second sacrificial layer, a ceiling portion formed of an insulating material such that the ceiling portion is opposite the intermediate portion of the fuse factor; and a step of removing the second sacrificial layer below the ceiling portion to form a gap on an upper side between the intermediate portion and the ceiling portion.

In this method, since the gap is formed on the upper side of the intermediate portion (fusible portion) of the fuse factor, it is possible to manufacture the chip-type fuse of the third reference example further including the ceiling portion.

(Item 14)

The method of manufacturing a chip-type fuse according to item 13, where the step of forming the wall portions includes forming the wall portions such that a distance between the fuse factor and the intermediate portion is 0.6 μm or less, and the step of forming the second sacrificial layer includes forming the second sacrificial layer by depositing the material of the second sacrificial layer by a CVD method.

In this method, the distance between the intermediate portion of the fuse factor and the wall portion is set at 0.6 μm or less, and thus when the material of the second sacrificial layer is deposited by a CVD method, the gap between the intermediate portion and the wall portion can be prevented from being filled with the material.

(Item 15)

The method of manufacturing a chip-type fuse according to any one of items 10 to 14, the method further including:

a step of forming, before the formation of the fuse factor, on the first sacrificial layer, a first insulating film having an etching selection ratio with respect to the first sacrificial layer; and a step of forming the fuse factor on the first insulating film and forming a second insulating film having an etching selection ratio with respect to the first sacrificial layer at the gap on the side apart from the pair of wall portions such that the fuse factor is coated.

In this method, the fuse factor is protected from an etching gas and the like by the first and second insulating films, and the difference in etching rate between the first and second insulating films and the first sacrificial layer is utilized, and thus it is possible to selectively remove the first sacrificial layer.

(Item 16)

The method of manufacturing a chip-type fuse according to item 15, where the first sacrificial layer is formed of silicon nitride (SiN), and the first insulating film and the second insulating film are formed of silicon oxide ($SiO_2$).

Although the present invention and the preferred embodiments of the first to third reference examples are described above, the preferred embodiments described above are simply specific examples used to clarify the technical details of the present invention and the first to third reference examples. The present invention and the first to third reference examples should not be interpreted by being limited to these specific examples, and the spirit and the scope of the present invention are limited only by the scope of claims attached.

For example, the features grasped from the disclosure of the preferred embodiments described above can be combined between different preferred embodiments.

The present application corresponds to Japanese Patent Application No. 2013-078825 filed in the Patent Office of Japan on Apr. 4, 2013, Japanese Patent Application No. 2013-085087 filed in the Patent Office of Japan on Apr. 15, 2013, Japanese Patent Application No. 2013-088586 filed in the Patent Office of Japan on Apr. 19, 2013 and Japanese Patent Application No. 2013-097950 filed in the Patent Office of Japan on May 7, 2013, and the entire disclosure of these applications is incorporated herein by reference.

DESCRIPTION OF THE SYMBOLS 1 composite chip
2 substrate
2A element formation surface
2C side surface
2D side surface
2E side surface
2F side surface
3 first connection electrode
4 second connection electrode
5 element
6 resistor
7 boundary region
9 mounting substrate
9A mounting surface
11 corner portion
13 solder
20 insulating film
21 resistor body film
22 wiring film
23 passivation film
24 resin film
27 drawing portion
33 Ni layer
34 Pd layer
35 Au layer
85 peripheral edge portion
86 peripheral edge portion
87 peripheral edge portion
88 land
100 circuit assembly
101 capacitor
111 lower electrode film
113 upper electrode film
C1 to C9 capacitor factor
F (F1 to F9) fuse
R resistor body

What is claimed is:

1. A chip part, comprising:

a silicon substrate which has a surface and a side surface;

two electrodes which are formed on the silicon substrate, the two electrodes being provided a distance apart from each other;

an insulating film which is interposed between the two electrodes electrode and the silicon substrate, the insulating film covering the surface and the side surface of the silicon substrate such that the surface and the side surface of the silicon substrate are prevented from being exposed to the outside;

a plurality of the resistor bodies which are formed on the silicon substrate and which are connected between the two electrodes; and a plurality of fuses which are formed on the silicon substrate and which connect the plurality of the resistor bodies to the two electrodes such that cutting a fuse among the plurality of fuses separates a resistor body of the plurality of resistor bodies from one of the two electrodes, the plurality of fuses including trimming regions which are arranged in a straight line, wherein the silicon substrate does not contain a dopant that determines a conductive type thereof, a resistance value of the silicon substrate is 100 Ω·cm or more.

2. The chip part according to claim 1, wherein each electrode is integrally formed with the surface and the side surface so as to cover an edge portion of the surface of the silicon substrate.

3. The chip part according to claim 2, wherein the silicon substrate is formed, in plan view, in the shape of a rectangle, and each electrode is formed so as to cover three of the edge portions of the silicon substrate.

4. The chip part according to claim 2, further comprising:

a wiring film which is formed a distance apart from the edge portion on the surface of the silicon substrate and to which each electrode is electrically connected.

5. The chip part according to claim 4, wherein in the wiring film, a peripheral edge portion opposite the edge portion of the silicon substrate covered by each electrode is selectively exposed, and the peripheral edge portion other than the exposed part is selectively covered by a resin film.

6. The chip part according to claim 5, wherein each electrode is formed so as to protrude from the surface of the resin film.

7. The chip part according to claim 6, wherein each electrode includes a drawing portion which is drawn in a lateral direction along the surface of the resin film and which selectively covers the surface.

8. The chip part according to claim 1, wherein each electrode includes a Ni layer and an Au layer, and the Au layer is exposed to the uppermost surface.

9. The chip part according to claim 8, wherein each electrode further includes a Pd layer which is interposed between the Ni layer and the Au layer.

10. A circuit assembly, comprising:

the chip part according to claim 1; and a mounting substrate which has, on a mounting surface opposite the surface of the silicon substrate, a land joined by solder to the electrode.

11. The circuit assembly according to claim 10, wherein the chip part is the chip part according to claim 2, and the solder is formed so as to cover the surface part and the side surface part of the electrode when seen in a normal direction from the mounting surface.

12. An electronic device, comprising:

the circuit assembly according to claim 10; and a housing which holds the circuit assembly.

13. A chip part, comprising:

a silicon substrate which has a surface and a side surface;

two electrodes which are formed on the silicon substrate, the two electrodes being provided a distance apart from each other;

an insulating film which is interposed between the two electrodes and the silicon substrate, the insulating film covering the surface and the side surface of the silicon substrate such that the surface and the side surface of the silicon substrate are prevented from being exposed to the outside;

a plurality of the capacitor factors which are formed on the silicon substrate and which forms capacitor element connected between the two electrodes; and a plurality of fuses which are formed on the silicon substrate and which connect the plurality of the capacitor factors to the two electrodes such that cutting a fuse among the plurality of fuses separates a capacitor factor among the plurality of capacitor factors from one of the two electrodes, the plurality of fuses including trimming regions which are arranged in a straight line, wherein the silicon substrate does not contain a dopant that determines a conductive type thereof, and a resistance value of the silicon substrate is 100Ω·cm or more.

* * * * *